(12) United States Patent
Fukuzaki

(10) Patent No.: US 10,629,828 B2
(45) Date of Patent: Apr. 21, 2020

(54) ORGANIC ELECTROLUMINESCENCE DEVICE

(71) Applicant: UDC Ireland Limited, Dublin (IE)

(72) Inventor: Eiji Fukuzaki, Kanagawa (JP)

(73) Assignee: UDC IRELAND LIMITED, Dublin 4 (IE)

( * ) Notice: Subject to any disclaimer, the term of this patent is extended or adjusted under 35 U.S.C. 154(b) by 903 days.

(21) Appl. No.: 14/159,614

(22) Filed: Jan. 21, 2014

(65) Prior Publication Data

US 2014/0135498 A1    May 15, 2014

Related U.S. Application Data

(62) Division of application No. 12/872,603, filed on Aug. 31, 2010, now abandoned.

(30) Foreign Application Priority Data

Aug. 31, 2009  (JP) .................................. 2009-201144
Sep. 28, 2009  (JP) .................................. 2009-223455
Mar. 29, 2010  (JP) .................................. 2010-076447

(51) Int. Cl.
*H01L 51/00*  (2006.01)
*C07F 15/00*  (2006.01)
(Continued)

(52) U.S. Cl.
CPC ...... *H01L 51/0087* (2013.01); *C07F 15/0033* (2013.01); *C09K 11/06* (2013.01);
(Continued)

(58) Field of Classification Search
None
See application file for complete search history.

(56) References Cited

U.S. PATENT DOCUMENTS 8,216,698 B2 *  7/2012  Murakami et al. .... C09K 11/06
                                                  257/E51.044
2003/0059646 A1  3/2003  Kamatani et al.
(Continued)

FOREIGN PATENT DOCUMENTS

JP  2001247859   9/2001
JP  2006013222   1/2006
(Continued)

*Primary Examiner* — Jennifer A Chriss
*Assistant Examiner* — Elizabeth M. Dahlburg
(74) *Attorney, Agent, or Firm* — Riverside Law LLP

(57) ABSTRACT

An organic electroluminescence device material comprising a metal complex having a neopentyl group, for example, as shown below; and an organic electroluminescence device comprising a substrate having thereon a pair of electrodes and at least one organic layer between the electrodes, the organic layer containing a light emitting layer, wherein any one of the organic layer contains the organic electroluminescence device material.

(Continued)

-continued

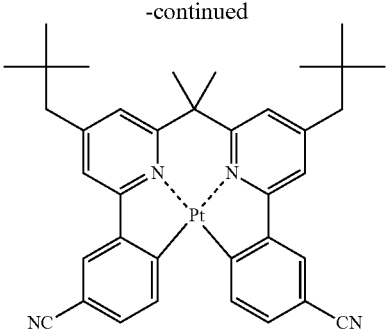

3 Claims, 1 Drawing Sheet

(51) Int. Cl.
  *C09K 11/06* (2006.01)
  *H05B 33/14* (2006.01)
  *H01L 51/50* (2006.01)
(52) U.S. Cl.
  CPC ...... *H01L 51/0083* (2013.01); *H01L 51/0085* (2013.01); *H01L 51/0086* (2013.01); *H01L 51/0088* (2013.01); *H05B 33/14* (2013.01); *C09K 2211/1029* (2013.01); *C09K 2211/1033* (2013.01); *C09K 2211/1044* (2013.01); *C09K 2211/1088* (2013.01); *C09K 2211/185* (2013.01); *H01L 51/0059* (2013.01); *H01L 51/0081* (2013.01); *H01L 51/5012* (2013.01); *H01L 51/5016* (2013.01)

(56) References Cited

U.S. PATENT DOCUMENTS

| | | | |
|---|---|---|---|
| 2006/0073359 A1* | 4/2006 | Ise et al. | C07F 15/0086 428/690 |
| 2006/0177694 A1 | 8/2006 | Kamatani et al. | |
| 2006/0202197 A1* | 9/2006 | Nakayama et al. | C07F 15/0086 257/40 |
| 2008/0001530 A1* | 1/2008 | Ise et al. | C09K 11/06 313/504 |
| 2008/0036373 A1* | 2/2008 | Itoh et al. | C07D 231/12 313/504 |
| 2008/0261076 A1 | 10/2008 | Kwong et al. | |
| 2009/0261721 A1* | 10/2009 | Murakami et al. | C09K 11/06 313/504 |

FOREIGN PATENT DOCUMENTS

| | | |
|---|---|---|
| JP | 2007019462 | 1/2007 |
| JP | 2008016827 | 1/2008 |
| JP | 2008505925 | 2/2008 |
| JP | 2008210941 | 9/2008 |
| JP | 2008239759 | 10/2008 |
| JP | 2008311608 | 12/2008 |
| JP | 2009102533 | 5/2009 |
| JP | 2009526071 | 7/2009 |
| WO | 2006008976 | 1/2006 |
| WO | WO 2006/098505 A1 * | 9/2006 |
| WO | 2007029461 | 3/2007 |
| WO | 2008140069 | 11/2008 |
| WO | 2008140114 | 11/2008 |
| WO | 2008140115 | 11/2008 |
| WO | 2008143059 | 11/2008 |

* cited by examiner

ORGANIC ELECTROLUMINESCENCE DEVICE

CROSS-REFERENCE TO RELATED APPLICATION(S)

The present application is a divisional of U.S. patent application Ser. No. 12/872,603, filed 31-Aug. 2010, now pending, which in turn claims priority benefit from Japanese Patent Application Nos. 2009-201144, filed on Aug. 31, 2009, 2009-223455, filed on Sep. 28, 2009, and 2010-076447, filed on Mar. 29, 2010, the entire contents of which are incorporated herein by reference.

BACKGROUND

1. Field

The present invention relates to a luminescence device capable of converting an electric energy into light and thereby producing luminescence. More specifically, the present invention relates to an organic electroluminescence device (luminescence device or EL device).

2. Description of the Related Art

An organic electroluminescence device (EL) is attracting as a promising display device because high-luminance luminescence can be obtained with a low voltage. An important characteristic value of this organic electroluminescence device is a power consumption. The power consumption is represented by a product of a voltage and a current, and as the voltage value necessary for obtaining desired brightness is lower and at the same time, as the current value is smaller, the power consumption of the device can be more reduced.

In the manufacturing of an organic electroluminescence device, as for the method to form a thin film that is an organic layer provided between a pair of electrodes, a vapor deposition process such as vacuum deposition and a wet process such as spin coating method, printing method and an inkjet method are being performed.

Among these, when a wet process is used, an organic compound polymer whose deposition is difficult by a dry process such as vapor deposition can be used, and in the case of use for a flexible display or the like, the wet process is suitable in view of durability such as flexibility and film strength and is preferred particularly when fabricating a large-area device.

However, an organic electroluminescence device obtained by the wet process has a problem that the luminous efficiency or device durability is poor.

In recent years, the device efficiency is progressively increased by using a phosphorescent material. As for the phosphorescent material, an iridium complex, a platinum complex and the like are known (see, for example, JP-A-2001-247859 and JP-A-2007-19462), but a device satisfying both high efficiency and high durability has not yet been developed.

Also, an organic EL device where a phosphorescence material substituted with a specific kind of an alkyl group at a specific position with an attempt to obtain a material capable of realizing high efficiency and low voltage of a device is used as a light emitting material has been reported (see, for example, JP-A-2008-210941 and JP-T-2008-505925), but this is insufficient in view of luminescence quantum efficiency, drive voltage, durability and chromaticity shift after device deterioration, and more improvements are being demanded.

SUMMARY

An object of the present invention is to provide an organic electroluminescence device having high efficiency and high durability and causing little chromaticity shift after device deterioration. Another object of the present invention is to provide a branched alkyl group-substituted phosphorescence material suitable for use in the device.

These objects have been attained by the following techniques.

[1]

An organic electroluminescence device material that is a compound represented by the following formula (3):

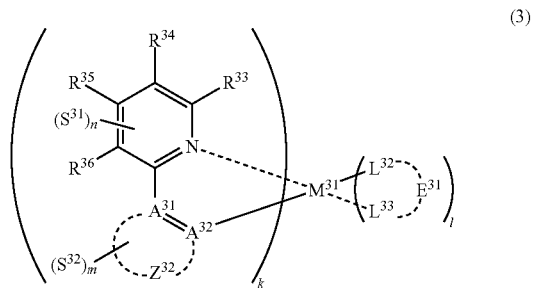

(3)

(In formula (3), wherein $M^{31}$ represents iridium; each of $A^{31}$ and $A^{32}$ independently represents a nitrogen atom or a carbon atom, each of $R^{33}$ to $R^{36}$ independently represents a hydrogen atom, a methyl group, an ethyl group, an isopropyl group, a tert-butyl group, a trifluoromethyl group, a fluorine atom, an alkyl group-substitutable aryl group, or a cyano group; any combination selected from $R^{33}$ and $R^{34}$, $R^{34}$ and $R^{35}$, and $R^{35}$ and $R^{36}$ may combine with each other to form a benzene ring, and the benzene ring may have at least one substituent selected from a methyl group, an ethyl group, an isopropyl group, a tert-butyl group, a trifluoromethyl group, a fluorine atom, an alkyl group-substitutable aryl group, and a cyano group; $Z^{32}$ represents an atomic group for forming a benzene ring, a pyrazole ring, a pyridine ring or a thiophene ring together with $A^{31}$ and $A^{32}$, and the benzene ring, pyrazole ring, pyridine ring or thiophene ring may have at least one substituent selected from a methyl group, an ethyl group, an isopropyl group, a tert-butyl group, a trifluoromethyl group, a fluorine atom, an alkyl group-substitutable aryl group, and a cyano group; each of $L^{32}$ and $L^{33}$ independently represents a carbon atom, a nitrogen atom, an oxygen atom or a phosphorus atom; $E^{31}$ represents an atomic group for forming a bidentate ligand represented by the following formula (1-1), (1-4), (1-10), (1-15), (1-16) or (1-17) together with $L^{32}$ and $L^{33}$; k represents an integer of 1 to 3, l represents an integer of 0 to 2, k+l is 3; each of $S^{31}$ and $S^{32}$ represents a substituent shown by (a) below; each of n and m represents an integer of 0 to 4, and n+m is an integer of 1 to 4.)

(a)

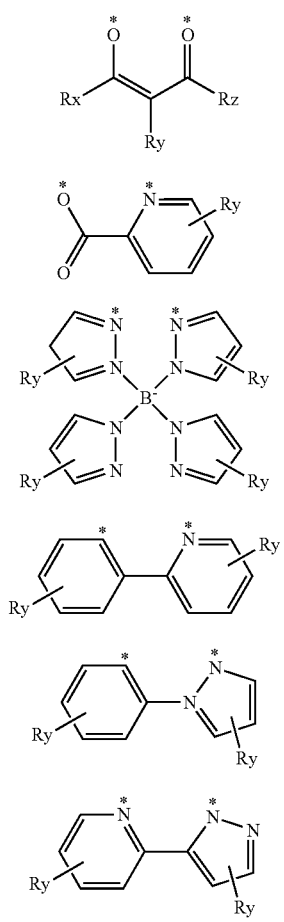

(wherein each of Rx, Ry and Rz independently represents a hydrogen atom, an alkyl group, a trifluoromethyl group, a fluorine atom, an alkyl group-substitutable aryl group, or a cyano group.)

[2]

The organic electroluminescence device material according to [1], wherein the compound represented by formula (3) is represented by the following formula (4):

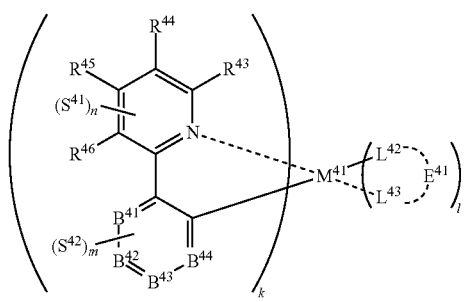

(In formula (4), wherein $M^{41}$ represents iridium; each of $R^{43}$ to $R^{46}$ independently represents a hydrogen atom, a methyl group, an ethyl group, an isopropyl group, a tert-butyl group, a trifluoromethyl group, a fluorine atom, an alkyl group-substitutable aryl group, or a cyano group; any combination selected from $R^{43}$ and $R^{44}$, $R^{44}$ and $R^{45}$, and $R^{45}$ and $R^{46}$ may combine with each other to form a benzene ring, and the benzene ring may have at least one substituent selected from a methyl group, an ethyl group, an isopropyl group, a tert-butyl group, a trifluoromethyl group, a fluorine atom, an alkyl group-substitutable aryl group, and a cyano group; each of $B^{41}$ to $B^{44}$ independently represents a nitrogen atom or C—$R^{47}$, provided that two or more of $B^{41}$ to $B^{44}$ are not a nitrogen atom at the same time; $R^{47}$ represents a hydrogen atom, a methyl group, an ethyl group, an isopropyl group, a tert-butyl group, a trifluoromethyl group, a fluorine atom, an alkyl group-substitutable aryl group, or a cyano group, each $R^{47}$ may be the same as or different from every other $R^{47}$; each of $L^{42}$ and $L^{43}$ independently represents a carbon atom, a nitrogen atom, an oxygen atom or a phosphorus atom; $E^{41}$ represents an atomic group for forming a bidentate ligand represented by formula (1-1), (1-4), (1-10), (1-15), (1-16) or (1-17) together with $L^{42}$ and $L^{43}$; k represents an integer of 1 to 3, l represents an integer of 0 to 2, k+l is 3; each of $S^{41}$ and $S^{42}$ represents a substituent shown by (a); each of n and m represents an integer of 0 to 4, and n+m is an integer of 1 to 4.)

[3]

The organic electroluminescence device material according to [2], wherein the compound represented by formula (4) is represented by the following formula (5):

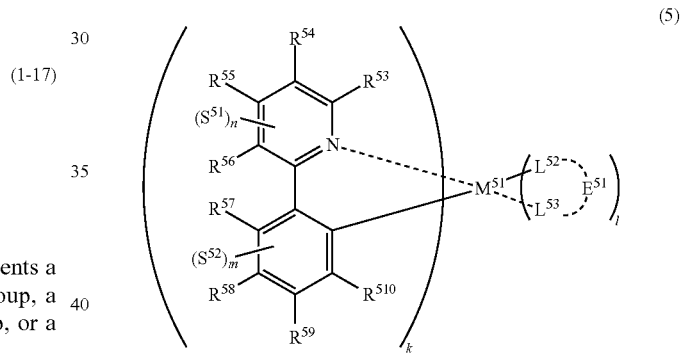

(In formula (5), wherein $M^{51}$ represents iridium; each of $R^{53}$ to $R^{510}$ independently represents a hydrogen atom, a methyl group, an ethyl group, an isopropyl group, a tert-butyl group, a trifluoromethyl group, a fluorine atom, an alkyl group-substitutable aryl group, or a cyano group; any combination selected from $R^{53}$ and $R^{54}$, $R^{54}$ and $R^{55}$, and $R^{55}$ and $R^{56}$ may combine with each other to form a benzene ring, and the benzene ring may have at least one substituent selected from a methyl group, an ethyl group, an isopropyl group, a tert-butyl group, a trifluoromethyl group, a fluorine atom, an alkyl group-substitutable aryl group, and a cyano group: each of $L^{52}$ and $L^{53}$ independently represents a carbon atom, a nitrogen atom, an oxygen atom or a phosphorus atom; $E^{51}$ represents an atomic group for forming a bidentate ligand represented by formula (1-1), (1-4), (1-15), (1-16) or (1-17) together with $L^{52}$ and $L^{53}$; k represents an integer of 1 to 3, l represents an integer of 0 to 2, k+l is 3; each of $S^{51}$ and $S^{52}$ represents a substituent shown by (a); each of n and m represents an integer of 0 to 4, and n+m is an integer of 1 to 4.)

[4]

The organic electroluminescence device material according to [3], wherein the compound represented by formula (5) is represented by the following formula (5-4):

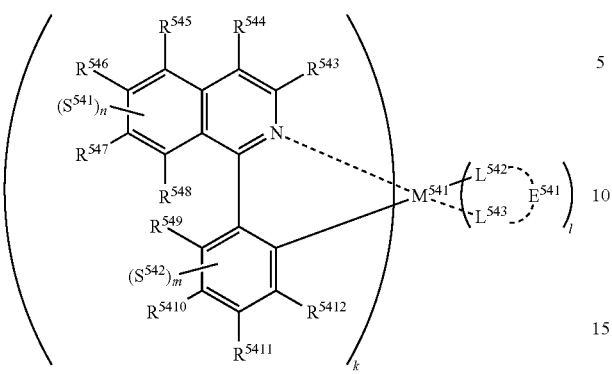

(5-4)

(In formula (5-4), wherein $M^{541}$ represents iridium; each of $R^{543}$ to $R^{5412}$ independently represents a hydrogen atom, a methyl group, an ethyl group, an isopropyl group, a tert-butyl group, a trifluoromethyl group, a fluorine atom, an alkyl group-substitutable aryl group, or a cyano group; each of $L^{542}$ and $L^{543}$ independently represents a carbon atom, a nitrogen atom, an oxygen atom or a phosphorus atom; $E^{541}$ represents an atomic group for forming a bidentate ligand represented by formula (1-1), (1-4), (1-10), (1-15), (1-16) or (1-17) together with $L^{542}$ and $L^{543}$; k represents an integer of 1 to 3, l represents an integer of 0 to 2, k+l is 3; each of $S^{541}$ and $S^{542}$ represents a substituent shown by (a); each of n and m represents an integer of 0 to 4, and n+m is an integer of 1 to 4.)

[5]

The organic electroluminescence device material according to [3], wherein the compound represented by formula (5) is represented by the following formula (5-7):

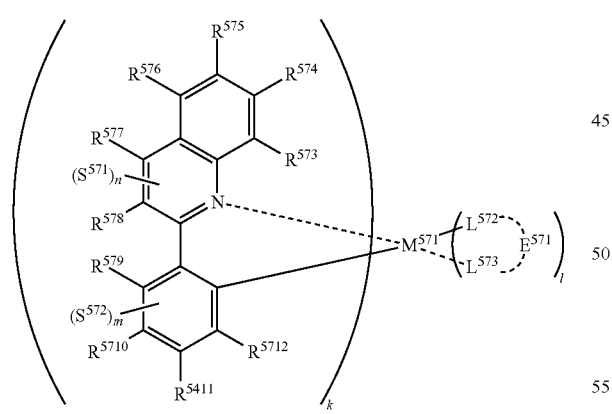

(5-7)

(In formula (5-7), wherein $M^{571}$ represents iridium; each of $R^{573}$ to $R^{5712}$ independently represents a hydrogen atom, a methyl group, an ethyl group, an isopropyl group, a tert-butyl group, a trifluoromethyl group, a fluorine atom, an alkyl group-substitutable aryl group, or a cyano group; each of $L^{572}$ and $L^{573}$ independently represents a carbon atom, a nitrogen atom, an oxygen atom or a phosphorus atom; $E^{571}$ represents an atomic group for forming a bidentate ligand represented by formula (1-1), (1-4), (1-10), (1-15), (1-16) or (1-17) together with $L^{572}$ and $L^{573}$; k represents an integer of 1 to 3, l represents an integer of 0 to 2, k+l is 3; each of $S^{571}$ and $S^{572}$ represents a substituent shown by (a); each of n and m represents an integer of 0 to 4, and n+m is an integer of 1 to 4.)

[6]

The organic electroluminescence device material according to [2], wherein the compound represented by formula (4) is represented by the following formula (6):

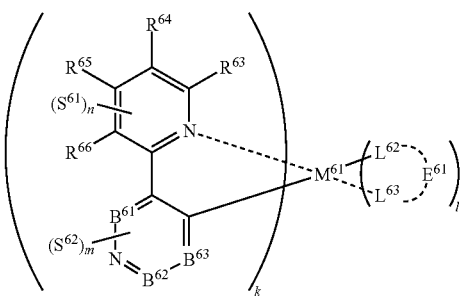

(6)

(In formula (6), wherein $M^{61}$ represents iridium; each of $R^{63}$ to $R^{66}$ independently represents a hydrogen atom, a methyl group, an ethyl group, an isopropyl group, a tert-butyl group, a trifluoromethyl group, a fluorine atom, an alkyl group-substitutable aryl group, or a cyano group; each of $B^{61}$ to $B^{63}$ independently represents C—$R^{67}$, $R^{67}$ represents a hydrogen atom, a methyl group, an ethyl group, an isopropyl group, a tert-butyl group, a trifluoromethyl group, a fluorine atom, an alkyl group-substitutable aryl group, or a cyano group; each $R^{67}$ may be the same as or different from every other $R^{67}$; each of $L^{62}$ and $L^{63}$ independently represents a carbon atom, a nitrogen atom, an oxygen atom or a phosphorus atom; $E^{61}$ represents an atomic group for forming a bidentate ligand represented by formula (1-1), (1-4), (1-10), (1-15), (1-16) or (1-17) together with $L^{62}$ and $L^{63}$; k represents an integer of 1 to 3, l represents an integer of 0 to 2, k+l is 3; each of $S^{61}$ and $S^{62}$ represents a substituent shown by (a); each of n and m represents an integer of 0 to 4, and n+m is an integer of 1 to 4.)

[7]

The organic electroluminescence device material according to [1], wherein the compound represented by formula (3) is represented by the following formula (7):

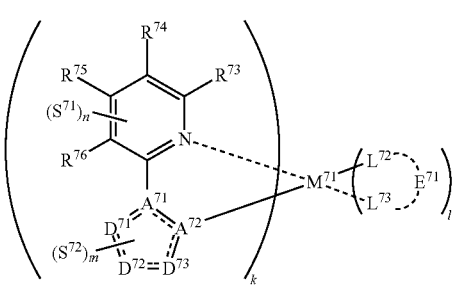

(7)

(In formula (7), wherein $M^{71}$ represents iridium; each of $R^{73}$ to $R^{76}$ independently represents a hydrogen atom, a methyl group, an ethyl group, an isopropyl group, a tert-butyl group, a trifluoromethyl group, a fluorine atom, an alkyl group-substitutable aryl group, or a cyano group; each of $A^{71}$ and $A^{72}$ independently represents a nitrogen atom or a carbon atom, each of $D^{71}$ to $D^{73}$ independently represents an atom selected from carbon, nitrogen and sulfur, provided that the 5-membered ring formed by $D^{71}$ to $D^{73}$, $A^{71}$ and $A^{72}$ represents a pyrazole ring or a thiophene ring, and the bond between atoms in the 5-membered ring formed by $D^{71}$ to $D^{73}$, $A^{71}$ and $A^{72}$ represents a single bond or a double bond; each of $D^{71}$ to $D^{73}$ when these can be further substituted may have at least one substituent selected from a methyl group, an ethyl group, an isopropyl group, a tert-butyl group, a trifluoromethyl group, a fluorine atom, an alkyl group-substitutable aryl group, and a cyano group; each of $L^{72}$ and $L^{73}$ independently represents a carbon atom, a nitrogen atom, an oxygen atom or a phosphorus atom; $E^{71}$ represents an atomic group for forming a bidentate ligand represented by formula (1-1), (1-4), (1-15), (1-16) or (1-17) together with $L^{72}$ and $L^{73}$; k represents an integer of 1 to 3, 1 represents an integer of 0 to 2, k+1 is 3; each of $S^{71}$ and $S^{72}$ represents a substituent shown by (a); each of n and m represents an integer of 0 to 4, and n+m is an integer of 1 to 4.)

[8]
The organic electroluminescence device material according to [1], wherein each of $R^{33}$ to $R^{36}$, $R^{43}$ to $R^{46}$, $R^{53}$ to $R^{510}$, $R^{543}$ to $R^{5412}$, $R^{573}$ to $R^{5712}$, $R^{63}$ to $R^{66}$ and $R^{73}$, to $R^{76}$ independently represents a methyl group, a fluorine atom or a phenyl group.

[9]
The organic electroluminescence device material according to [1], wherein said bidentate ligand is represented by formula (1-1), (1-4) or (1-15).

[10]
An organic electroluminescence device material represented by the following formula (13):

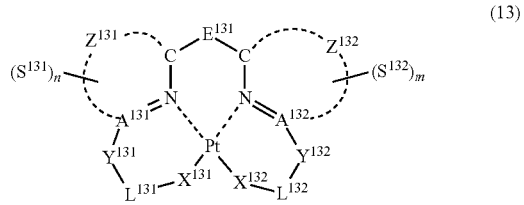

(13)

(In formula (13), wherein each of $A^{131}$ and $A^{132}$ independently represents a nitrogen atom or a carbon atom; each of $Y^{131}$ and $Y^{132}$ represents a single bond; $L^{131}$ represents, together with $X^{131}$ and a carbon atom, a substituted or unsubstituted arylene group bonded to $A^{131}$ through a carbon atom adjacent to the carbon atom bonded to $X^{131}$, together with $X^{131}$ and a carbon atom, a substituted or unsubstituted pyridylene group bonded to $A^{131}$ through a carbon atom adjacent to the carbon atom bonded to $X^{131}$, together with $X^{131}$ and a carbon atom, a substituted or unsubstituted benzofurandiyl group bonded to $A^{131}$ through a carbon atom adjacent to the carbon atom bonded to $X^{131}$, together with $X^{131}$ and a carbon atom, a pyrazolediyl group bonded to $A^{131}$ through a nitrogen atom adjacent to the carbon atom bonded to $X^{131}$, or together with $X^{131}$ and an oxygen atom, a carboxylato group bonded to $A^{131}$ through a carbon atom adjacent to the carbon atom bonded to $X^{131}$, $L^{132}$ represents, together with $X^{132}$ and a carbon atom, a substituted or unsubstituted arylene group bonded to $A^{132}$ through a carbon atom adjacent to the carbon atom bonded to $X^{132}$, together with $X^{132}$ and a carbon atom, a substituted or unsubstituted pyridylene group bonded to $A^{132}$ through a carbon atom adjacent to the carbon atom bonded to $X^{132}$, together with $X^{132}$ and a carbon atom, a substituted or unsubstituted benzofurandiyl group bonded to $A^{132}$ through a carbon atom adjacent to the carbon atom bonded to $X^{132}$, together with $X^{132}$ and a carbon atom, a pyrazolediyl group bonded to $A^{132}$ through a nitrogen atom adjacent to the carbon atom bonded to $X^{132}$, or together with $X^{132}$ and an oxygen atom, a carboxylato group bonded to $A^{132}$ through a carbon atom, provided that the substituent in $L^{131}$ and $L^{132}$ is at least one group selected from a methyl group, a tert-butyl group, a trifluoromethyl group, an alkyl group-substitutable aryl group, a fluorine atom and a cyano group; each of $Z^{131}$ and $Z^{132}$ independently represents a pyridine ring, an imidazole ring or a pyrazole ring, each of $Z^{131}$ and $Z^{132}$ may further have at least one substituent selected from a methyl group, a tert-butyl group, a trifluoromethyl group, an alkyl group-substitutable aryl group, a fluorine atom and a cyano group; each of $X^{131}$ and $X^{132}$ independently represents an oxygen atom or a single bond; $E^{131}$ represents a divalent linking group represented by —C($R^1$)($R^2$)—, each of $R^1$ and $R^2$ independently represents an alkyl group or a phenyl group; each of $S^{131}$ and $S^{132}$ represents a substituent shown by (a) below; each of n and m independently represents an integer of 0 to 4, and n+m is an integer of 1 to 4.)

(a)

*—⟨

[11]
The organic electroluminescence device material according to [10], wherein the compound represented by formula (13) is represented by the following formula (14):

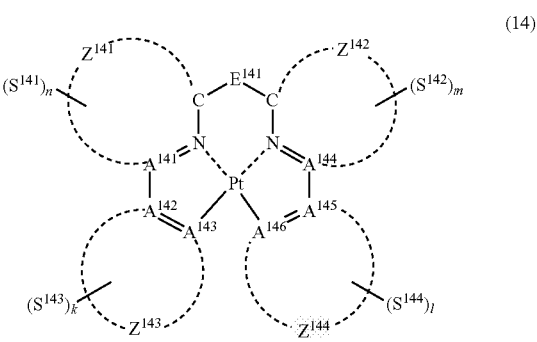

(14)

(In formula (14), wherein each of $A^{141}$ to $A^{146}$ independently represents a nitrogen atom or a carbon atom; each of $Z^{141}$ and $Z^{142}$ independently represents a pyridine ring, an imidazole ring or a pyrazole ring, and may further have at least one substituent selected from a methyl group, a tert-butyl group, a trifluoromethyl group, an alkyl group-substitutable aryl group, a fluorine atom and a cyano group; $Z^{143}$ represents an atomic group for forming an aryl group, a pyridyl group, a benzofuranyl group or a pyrazolyl group together with $A^{142}$ and $A^{143}$; $Z^{144}$ represents an atomic group for forming an aryl group, a pyridyl group, a benzofuranyl group or a pyrazolyl group together with $A^{145}$ and $A^{146}$; $E^{141}$ represents a divalent linking group represented by —C($R^1$)($R^2$)—; each of $R^1$ and $R^2$ independently represents an alkyl group or a phenyl group; each of $S^{141}$ to $S^{144}$ represents a substituent shown by (a), each of n, m, k and l represents an integer of 0 to 4, and n+m+k+l is an integer of 1 to 4.)

[12]
The organic electroluminescence device material according to [11], wherein the compound represented by formula (14) is represented by the following formula (15):

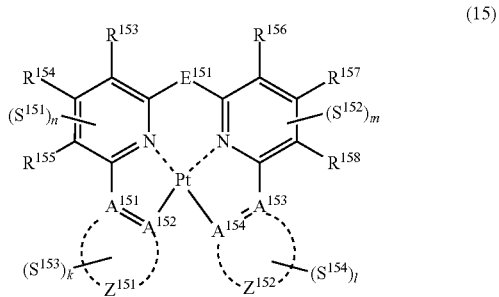

(15)

(In formula (15), wherein each of $A^{151}$ and $A^{154}$ independently represents a nitrogen atom or a carbon atom; each of $R^{153}$ to $R^{158}$ independently represents a hydrogen atom, a methyl group, a tert-butyl group, a trifluoromethyl group, an alkyl group-substitutable aryl group, a fluorine atom, or a cyano group; $Z^{151}$ represents an atomic group for forming an aryl group, a pyridyl group, a benzofuranyl group or a pyrazolyl group together with $A^{151}$ and $A^{152}$; $Z^{152}$ represents an atomic group for forming an aryl group, a pyridyl group, a benzofuranyl group or a pyrazolyl group together with $A^{153}$ and $A^{154}$; $E^{151}$ represents a divalent linking group represented by —C($R^1$)($R^2$)—; each of $R^1$ and $R^2$ independently represents an alkyl group or a phenyl group; each of $S^{151}$ to $S^{154}$ represents a substituent shown by (a); each of n, m, k and l represents an integer of 0 to 4, and n+m+k+l is an integer of 1 to 4.)

[13]
The organic electroluminescence device material according to [12], wherein the compound represented by formula (15) is represented by the following formula (16):

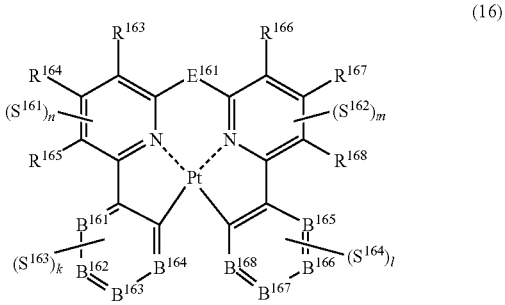

(16)

(In formula (16), wherein each of $R^{163}$ to $R^{168}$ independently represents a hydrogen atom, a methyl group, a tert-butyl group, a trifluoromethyl group, an alkyl group-substitutable aryl group, a fluorine atom, or a cyano group; each of $B^{161}$ to $B^{168}$ independently represents a nitrogen atom or C—$R^{169}$, provided that two or more of $B^{161}$ to $B^{164}$ are not a nitrogen atom at the same time and two or more of $B^{165}$ to $B^{168}$ are not a nitrogen atom at the same time; $R^{169}$ represents a hydrogen atom, a methyl group, a tert-butyl group, a trifluoromethyl group, an alkyl group-substitutable aryl group, a fluorine atom, or a cyano group; each $R^{169}$ may be the same as or different from every other $R^{169}$; $E^{161}$ represents a divalent linking group represented by —C($R^1$)($R^2$)—; each of $R^1$ and $R^2$ independently represents an alkyl group or a phenyl group; each of $S^{161}$ to $S^{164}$ represents a substituent shown by (a); each of n, m, k and l represents an integer of 0 to 4, and n+m+k+l is an integer of 1 to 4.)

[14]
The organic electroluminescence device material according to [12], wherein the compound represented by formula (15) is represented by the following formula (17):

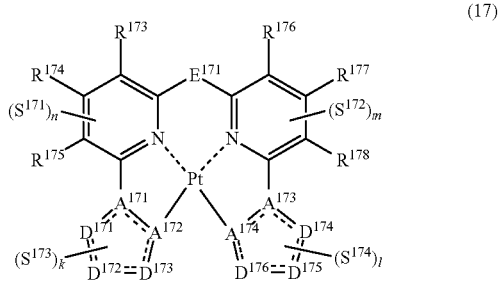

(17)

(In formula (17), wherein each of $R^{173}$ to $R^{178}$ independently represents a hydrogen atom, a methyl group, a tert-butyl group, a trifluoromethyl group, an alkyl group-substitutable aryl group, a fluorine atom, or a cyano group; each of $A^{171}$ and $A^{173}$ represents a nitrogen atom; each of $A^{172}$ and $A^{174}$ represents a carbon atom; each of $D^{171}$ and $D^{174}$ represents a nitrogen atom; each of $D^{72}$, $D^{173}$, $D^{175}$ and $D^{176}$ represents C—$R^{179}$, $R^{179}$ represents a hydrogen atom, a methyl group, a tert-butyl group, a trifluoromethyl group, an alkyl group-substitutable aryl group, a fluorine atom, or a cyano group; $E^{171}$ represents a divalent linking group represented by —C($R^1$)($R^2$)—; each of $R^1$ and $R^2$ independently represents an alkyl group or a phenyl group; each of $S^{171}$ to $S^{174}$ represents a substituent shown by (a); each of n, m, k and l represents an integer of 0 to 4, and n+m+k+l is an integer of 1 to 4.)

[15]
The organic electroluminescence device material according to [11], wherein the compound represented by formula (14) is represented by the following formula (18):

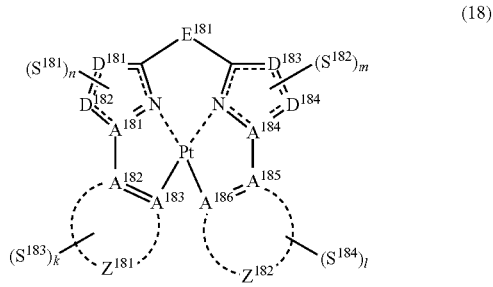

(18)

(In formula (18), wherein each of $A^{181}$ to $A^{186}$ independently represents a nitrogen atom or a carbon atom; each of $D^{181}$ to $D^{184}$ represents a nitrogen atom or C—$R^{18}$, $R^{18}$ represents a hydrogen atom, a methyl group, a tert-butyl group, a trifluoromethyl group, an alkyl group-substitutable aryl group, a fluorine atom, or a cyano group, provided that each of the 5-membered rings formed by $D^{181}$, $D^{182}$, $A^{181}$, the nitrogen atom and the carbon atom and by $D^{183}$, $D^{184}$, $A^{184}$, the nitrogen atom and the carbon atom represents an imidazole ring or a pyrazole ring; $Z^{181}$ represents an atomic group for forming an aryl group, a pyridyl group, a benzofuranyl group or a pyrazolyl group together with $A^{182}$ and $A^{183}$; $Z^{182}$ represents an atomic group for forming an aryl group, a pyridyl group, a benzofuranyl group or a pyrazolyl group together with $A^{185}$ and $A^{186}$; $B^{181}$ represents a divalent linking group represented by —C($R^1$)($R^2$)—; each of $R^1$ and $R^2$ independently represents an alkyl group or a phenyl group; each of $S^{181}$ to $S^{184}$ represents a substituent shown by (a); each of n, m, k and l represents an integer of 0 to 4, and n+m+k+l is an integer of 1 to 4.)

[16]

The organic electroluminescence device material according to [11], wherein the compound represented by formula (14) is a compound represented by the following formula (19):

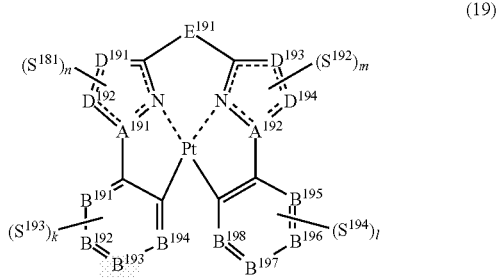

(19)

(In formula (19), wherein each of $A^{191}$ and $A^{192}$ independently represents a nitrogen atom or a carbon atom; each of $D^{191}$ to $D^{194}$ represents a nitrogen atom or C—$R^{19}$, $R^{19}$ represents a hydrogen atom, a methyl group, a tert-butyl group, a trifluoromethyl group, an alkyl group-substitutable aryl group, a fluorine atom, or a cyano group, provided that each of the 5-membered rings formed by $D^{191}$, $D^{192}$, $A^{191}$, the nitrogen atom and the carbon atom and by $D^{193}$, $D^{194}$, $A^{194}$, the nitrogen atom and the carbon atom represents an imidazole ring or a pyrazole ring; each of $B^{191}$ to $B^{198}$ independently represents a nitrogen atom or C—$R^{199}$, provided that two or more of $B^{191}$ to $B^{194}$ are not a nitrogen atom at the same time and two or more of $B^{195}$ to $B^{198}$ are not a nitrogen atom at the same time; $R^{199}$ represents a hydrogen atom, a methyl group, a tert-butyl group, a trifluoromethyl group, an alkyl group-substitutable aryl group, a fluorine atom, or a cyano group, each $R^{199}$ may be the same as or different from every other $R^{199}$; $E^{191}$ represents a divalent linking group represented by —C($R^1$)($R^2$)—; each of $R^1$ and $R^2$ independently represents an alkyl group or a phenyl group; each of $S^{191}$ to $S^{194}$ represents a substituent shown by (a); each of n, m, k and l represents an integer of 0 to 4, and n+m+k+l is an integer of 1 to 4.)

[17]

The organic electroluminescence device material according to [16], wherein the compound represented by formula (19) is represented by the following formula (20):

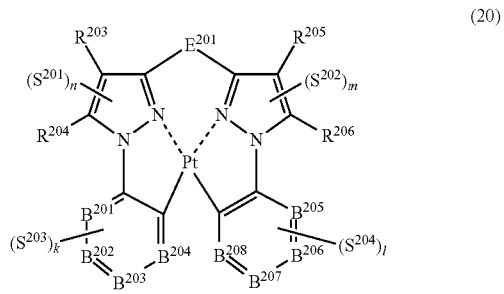

(20)

(In formula (20), wherein each of $R^{203}$ to $R^{206}$ independently represents a hydrogen atom, a methyl group, a tert-butyl group, a trifluoromethyl group, an alkyl group-substitutable aryl group, a fluorine atom, or a cyano group; each of $B^{201}$ to $B^{208}$ independently represents a nitrogen atom or C—$R^{207}$, provided that two or more of $B^{201}$ to $B^{204}$ are not a nitrogen atom at the same time and two or more of $B^{205}$ to $B^{208}$ are not a nitrogen atom at the same time; $R^{207}$ represents a hydrogen atom, a methyl group, a tert-butyl group, a trifluoromethyl group, an alkyl group-substitutable aryl group, a fluorine atom, or a cyano group, each $R^{207}$ may be the same as or different from every other $R^{207}$; $E^{201}$ represents a divalent linking group represented by —C($R^1$)($R^2$)—; each of $R^1$ and $R^2$ independently represents an alkyl group or a phenyl group; each of $S^{201}$ to $S^{204}$ represents a substituent shown by (a); each of n, m, k and l represents an integer of 0 to 4, and n+m+k+l is an integer of 1 to 4.)

[18]

The organic electroluminescence device material according to [16], wherein the compound represented by formula (19) is represented by the following formula (21):

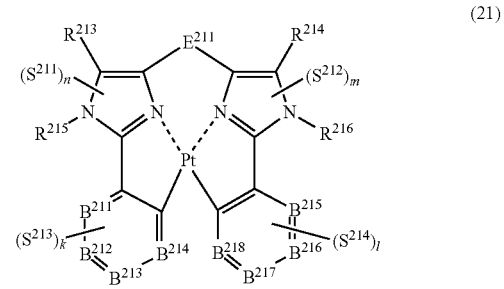

(21)

(In formula (21), wherein each of $R^{213}$ and $R^{214}$ independently represents a hydrogen atom, a methyl group, a tert-butyl group, a trifluoromethyl group, an alkyl group-substitutable aryl group, a fluorine atom, or a cyano group; each of $R^{215}$ and $R^{216}$ independently represents a hydrogen atom, a methyl group, a tert-butyl group, a trifluoromethyl group, an alkyl group-substitutable aryl group, a fluorine atom, or a cyano group; each of $B^{211}$ to $B^{218}$ independently represents a nitrogen atom or C—$R^{217}$, provided that two or more of $B^{211}$ to $B^{214}$ are not a nitrogen atom at the same time and two or more of $B^{215}$ to $B^{218}$ are not a nitrogen atom at the same time; $R^{217}$ represents a hydrogen atom, a methyl group, a tert-butyl group, a trifluoromethyl group, an alkyl group-substitutable aryl group, a fluorine atom, or a cyano group, each $R^{217}$ may be the same as or different from every other $R^{217}$; $E^{211}$ represents a divalent linking group represented by —C($R^1$)($R^2$)—; each of $R^1$ and $R^2$ independently represents an alkyl group or a phenyl group; each of $S^{211}$ to $S^{214}$ represents a substituent shown by (a); each of n, m, k and l represents an integer of 0 to 4, and n+m+k+l is an integer of 1 to 4.)

[19]

A light emitting layer containing at least one compound represented by any one of formulae (3) to (21) in [1] to [18].

[20]

An organic electroluminescence device containing: a substrate; a pair of electrodes on the substrate; and at least one organic containing a light emitting layer between the electrodes, wherein the organic layer contains the organic electroluminescence device material according to any one of [1] to [18].

[21]

The organic electroluminescence device according to [20], wherein at least one compound represented by any one of formulae (3) to (21) in [1] to [18] is contained in the light emitting layer.

[22]

The organic electroluminescence device according to [20], wherein a carbazole or indole structure-containing material is further contained in any one of the organic layer.

[23]

The organic electroluminescence device according to [20], wherein a carbazole or indole structure-containing material is further contained in the light emitting layer.

[24]

The organic electroluminescence device according to [20], wherein the maximum luminescence wavelength is from 400 to 465 nm.

[25]

The organic electroluminescence device according to any one of [20], wherein the content of the organic electroluminescence device material in the light emitting layer is from 5 to 30 mass %.

[26]

The organic electroluminescence device according to any one of [20], wherein at least one layer of the organic layer is formed by a wet process.

[27]

A display apparatus using the organic electroluminescence device according to any one of [20] to [26].

[28]

An illumination apparatus using the organic electroluminescence device according to any one of [20] to [26].

The organic electroluminescence device of the present invention contains at least one kind of a compound represented by formula (1) or a tautomer of formula (1) in the organic compound layer. Thanks to this configuration, an organic electroluminescence device (in the context of the present invention, this term is used with the same meaning as "the device of the present invention") having high luminous efficiency (for example, external quantum efficiency) and high durability and causing little chromaticity shift after device deterioration can be provided.

BRIEF DESCRIPTION OF DRAWINGS

A general configuration that implements the various features of the invention will be described with reference to the drawings. The drawings and the associated descriptions are provided to illustrate embodiments of the invention and not to limit the scope of the invention.

DETAILED DESCRIPTION OF EXEMPLARY EMBODIMENTS

Figure 1:
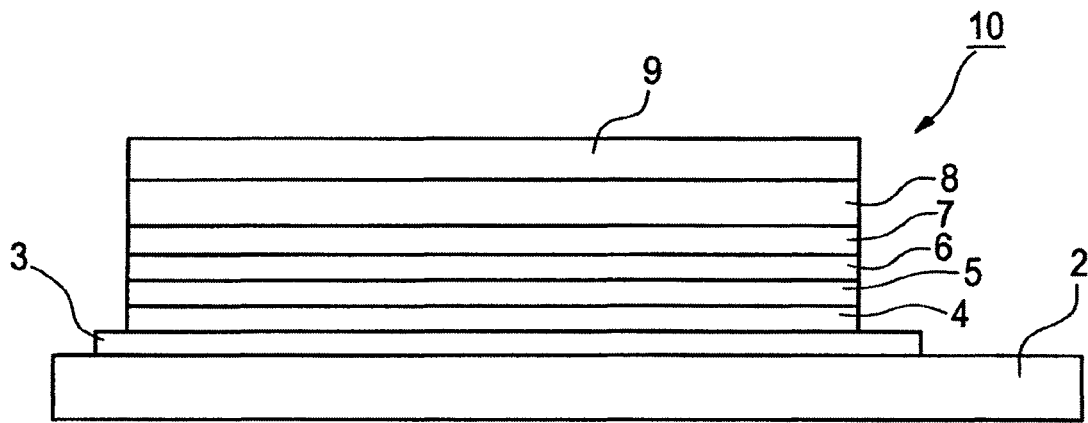
FIG. 1 is a schematic view showing one example of the configuration of the organic electroluminescence device according to the present invention.

The present invention relates to an organic electroluminescence device material that is a compound represented by the following formula (3):

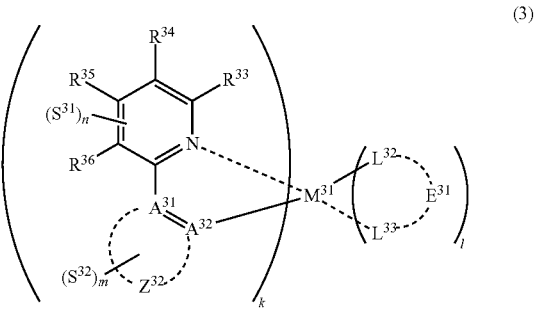

(3)

(In formula (3), $M^{31}$ represents iridium, each of $A^{31}$ and $A^{32}$ independently represents a nitrogen atom or a carbon atom, each of $R^{33}$ to $R^{36}$ independently represents a hydrogen atom, a methyl group, an ethyl group, an isopropyl group, a tert-butyl group, a trifluoromethyl group, a fluorine atom, or a cyano group, an alkyl group-substitutable aryl group, or a cyano group, any combination selected from $R^{33}$ and $R^{34}$, $R^{34}$ and $R^{35}$, and $R^{35}$ and $R^{36}$ may combine with each other to form a benzene ring, the benzene ring may have at least one substituent selected from a methyl group, an ethyl group, an isopropyl group, a tert-butyl group, a trifluoromethyl group, a fluorine atom, an alkyl group-substitutable aryl group, and a cyano group, $Z^{32}$ represents an atomic group for forming a benzene ring, a pyrazole ring, a pyridine ring or a thiophene ring together with $A^{31}$ and $A^{32}$, the benzene ring, pyrazole ring, pyridine ring or thiophene ring may have at least one substituent selected from a methyl group, an ethyl group, an isopropyl group, a tert-butyl group, a trifluoromethyl group, a fluorine atom, an alkyl group-substitutable aryl group, and a cyano group, each of $L^{32}$ and $L^{33}$ independently represents a carbon atom, a nitrogen atom, an oxygen atom or a phosphorus atom, $E^{31}$ represents an atomic group for forming a bidentate ligand represented by the following formula (1-1), (1-4), (1-10), (I-15), (1-16) or (1-17) together with $L^{32}$ and $L^{33}$, k represents an integer of 1 to 3, l represents an integer of 0 to 2, k+l is 3, each of $S^{31}$ and $S^{32}$ represents a substituent shown by (a) below, each of n and m represents an integer of 0 to 4, and n+m is an integer of 1 to 4):

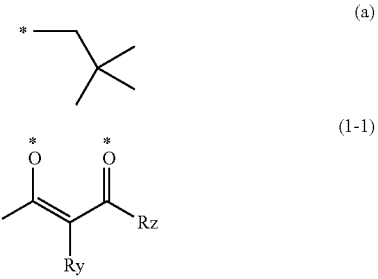

(a)

(1-1)

-continued

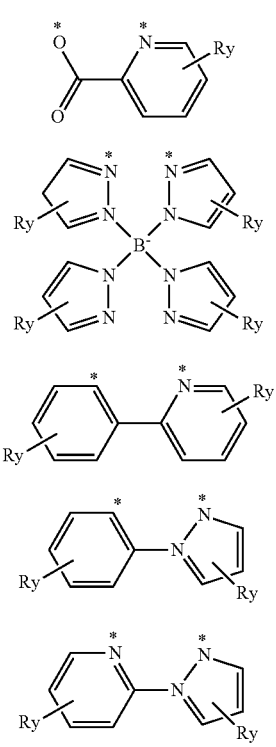

(1-4)

(1-10)

(1-15)

(1-16)

(1-17)

(In formula (22), each of Rx, Ry and Rz independently represents a hydrogen atom, an alkyl group, a trifluoromethyl group, a fluorine atom, an alkyl group-substitutable aryl group, or a cyano group).

The present invention also relates to an organic electroluminescence device material represented by the following formula (13):

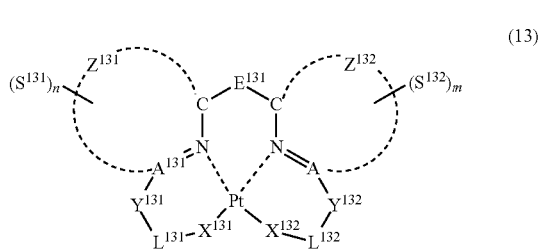

(13)

(In formula (13), each of $A^{131}$ and $A^{132}$ independently represents a nitrogen atom or a carbon atom, each of $Y^{131}$ and $Y^{132}$ represents a single bond, $L^{131}$ represents, together with $X^{131}$ and a carbon atom, a substituted or unsubstituted arylene group bonded to $A^{131}$ through a carbon atom adjacent to the carbon atom bonded to $X^{131}$, together with $X^{131}$ and a carbon atom, a substituted or unsubstituted pyridylene group bonded to $A^{131}$ through a carbon atom adjacent to the carbon atom bonded to $X^{131}$, together with $X^{131}$ and a carbon atom, a substituted or unsubstituted benzofurandiyl group bonded to $A^{131}$ through a carbon atom adjacent to the carbon atom bonded to $X^{131}$, together with $X^{131}$ and a carbon atom, a pyrazolediyl group bonded to $A^{131}$ through a nitrogen atom adjacent to the carbon atom bonded to $X^{131}$, or together with $X^{131}$ and an oxygen atom, a carboxylato group bonded to $A^{131}$ through a carbon atom adjacent to the carbon atom bonded to $X^{131}$, $L^{132}$ represents, together with $X^{132}$ and a carbon atom, a substituted or unsubstituted arylene group bonded to $A^{132}$ through a carbon atom adjacent to the carbon atom bonded to $X^{132}$, together with $X^{132}$ and a carbon atom, a substituted or unsubstituted pyridylene group bonded to $A^{132}$ through a carbon atom adjacent to the carbon atom bonded to $X^{132}$, together with $X^{132}$ and a carbon atom, a substituted or unsubstituted benzofurandiyl group bonded to $A^{132}$ through a carbon atom adjacent to the carbon atom bonded to $X^{132}$, together with $X^{132}$ and a carbon atom, a pyrazolediyl group bonded to $A^{132}$ through a nitrogen atom adjacent to the carbon atom bonded to $X^{132}$, or together with $X^{132}$ and an oxygen atom, a carboxylato group bonded to $A^{132}$ through a carbon atom, provided that the substituent in $L^{131}$ and $L^{132}$ is at least one group selected from a methyl group, a tert-butyl group, a trifluoromethyl group, an alkyl group-substitutable aryl group, a fluorine atom and a cyano group, each of $Z^{131}$ and $Z^{132}$ independently represents a pyridine ring, an imidazole ring or a pyrazole ring, each of $Z^{131}$ and $Z^{132}$ may further have at least one substituent selected from a methyl group, a tert-butyl group, a trifluoromethyl group, an alkyl group-substitutable aryl group, a fluorine atom and a cyano group, each of $X^{131}$ and $X^{132}$ independently represents an oxygen atom or a single bond, $E^{131}$ represents a divalent linking group represented by —C($R^1$)($R^2$)—, each of $R^1$ and $R^2$ independently represents an alkyl group or a phenyl group, each of $S^{131}$ and $S^{132}$ represents a substituent shown by (a) below, each of n and m independently represents an integer of 0 to 4, and n+m is an integer of 1 to 4):

(a)

The present invention is described in detail below. For the sake of reference, matters other than the present invention are also described.

The compound represented by formula (1) is described.

In an organic electroluminescence device including a substrate having thereon a pair of electrodes and at least one light emitting layer-containing organic layer between the electrodes, the compound represented by formula (1) is preferably contained in the organic layer.

The compound represented by formula (1) includes its tautomers and is a metal complex having a specific branched alkyl group. In particular, a secondary or tertiary carbon in the branched alkyl group is directly substituted on a ligand, that is, an aromatic heterocyclic ring or an aromatic hydrocarbon ring. Usually, when an alkyl group is substituted on an aromatic heterocyclic ring or an aromatic hydrocarbon ring, the benzylic position of the alkyl group has been considered to cause a deteriorative reaction (for example, a hydrogen elimination reaction or a dimerization reaction) from the excited state, giving rise to decrease in the device life. In the present invention, a sterically bulky branched alkyl group is introduced so as to spatially protect the benzylic position, suppress the deteriorative reaction of the alkyl group and enhance the device life. When a metal complex is substituted with this specific branched alkyl group kept from a deteriorative reaction, thanks to the reaction active site-protecting effect and the spatial separation distance between metal complexes, it is expected that a hydrogen elimination reaction or dimerization reaction of the metal complex is suppressed and the device life is prolonged.

Also, by the linkage to a ligand through a secondary or tertiary carbon in the branched alkyl group, the flexibility of the branched alkyl group is increased and the dispersibility of the light emitting material to the organic layer is enhanced as compared with the conventional alkyl group-substituted phosphorescent material, as a result, interaction of light emitting material molecules with each other is suppressed. These improved dispersibility and reduced interaction are presumed to enable realizing enhancement of the device efficiency and decrease in the chromaticity shift at the device deterioration.

Thanks to the introduction of a branched alkyl group having high flexibility, the solubility of the phosphorescent material in an organic solvent can be increased, and a high-concentration solution can be prepared. The coating step using a high-concentration solution is advantageous for improvement of the film homogeneity and reduction in impurities (dissolved oxygen, water), and an enhanced efficiency and a long life of a device fabricated by a wet process can be realized.

[Compound Represented by Formula (1)]

The compound represented by formula (1) is described in detail below.

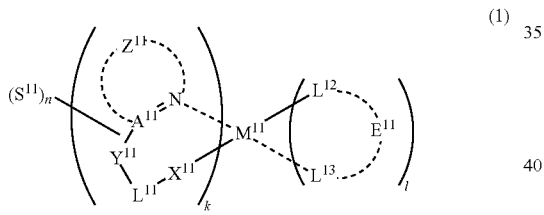

(1)

(In formula (1), $M^{11}$ represents a metal belong to Groups 8 to 11 in the periodic table of elements, $A^{11}$ represents a nitrogen atom or a carbon atom, $X^{11}$ represents an oxygen atom, a sulfur atom, a substituted or unsubstituted nitrogen atom or a single bond, $Y^{11}$ represents a linking group or a single bond, $L^{11}$ represents a partial structure having an atom bonded to $X^{11}$, $Z^{11}$ represents an aromatic nitrogen-containing heterocyclic ring, each of $L^{12}$ and $L^{13}$ represents a carbon atom, a nitrogen atom, an oxygen atom or a phosphorus atom, $E^{11}$ represents an atomic group for forming a bidentate ligand together with $L^{12}$ and $L^{13}$, k represents an integer of 1 to 3, l represents an integer of 0 to 2, k+l is 2 or 3, $S^{11}$ is a substituent for substituting on at least either one of $L^{11}$ and $Z^{11}$ and represents a substituent selected from (a) to (w) shown below, n represents an integer of 1 to 4, and each $S^{11}$ may be the same as or different from every other $S^{11}$):

 (a)

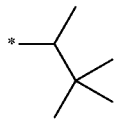 (b)

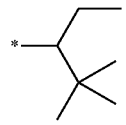 (c)

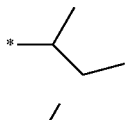 (d)

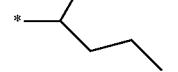 (e)

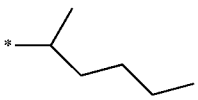 (f)

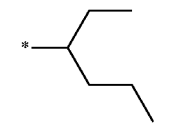 (g)

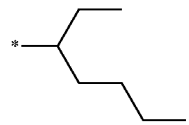 (h)

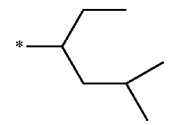 (i)

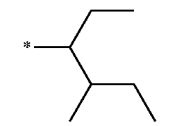 (j)

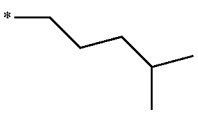 (k)

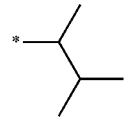 (l)

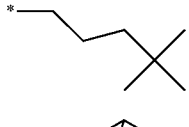 (m)

 (n)

-continued

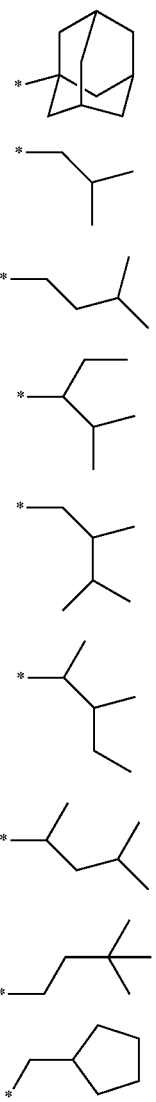

(o)

(p)

(q)

(r)

(s)

(t)

(u)

(v)

(w)

$M^{11}$ represents a metal (may be a metal atom or ion) belonging to Groups 8 to 11 in the periodic table of elements and is preferably gold, copper, platinum, palladium, nickel, iridium rhodium, osmium or ruthenium, more preferably gold, platinum, palladium iridium or ruthenium, still more preferably gold, platinum, palladium or iridium, and most preferably platinum or iridium.

$A^{11}$ represents a nitrogen atom or a carbon atom and forms an aromatic nitrogen-containing heterocyclic ring together with the N atom and $Z^{11}$.

Examples of the aromatic nitrogen-containing heterocyclic ring represented by $Z^{11}$ in formula (1) include a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an oxazole ring, a benzimidazole ring, a benzothiazole ring, a benzoxazole ring, a quinoxaline ring, a quinazoline ring, a phthalazine ring, a carboline ring, and a ring where a carbon atom of a hydrocarbon ring constituting a carboline ring is further substituted with a nitrogen atom.

$Z^{11}$ is preferably a pyridine ring, a pyrimidine ring, a pyrazine ring, a benzimidazole ring, an oxadiazole ring, a triazole ring, an imidazole ring, a pyrazole ring, a thiazole ring, an oxazole ring, a benzimidazole ring, a benzothiazole ring, a benzoxazole ring, an isoquinoline ring or a quinoxaline ring, more preferably a pyridine ring, a pyrimidine ring, a pyrazine ring, an imidazole ring, a pyrazole ring, an isoquinoline ring or a quinoxaline ring, still more preferably an isoquinoline ring, a benzoxazole ring, a pyridine ring, an imidazole ring or a pyrazole ring, yet still more preferably a pyridine ring, an imidazole ring or a pyrazole ring.

The aromatic nitrogen-containing heterocyclic ring may have a substituent, and those described below as Substituent Group A can be applied to the substituent.

(Substituent Group A)

An alkyl group (preferably having a carbon number of 1 to 30, more preferably from 1 to 20, still more preferably from 1 to 10, e.g., methyl, ethyl, isopropyl, tert-butyl, n-octyl, n-decyl, n-hexadecyl, trifluoromethyl, pentafluoroethyl), a cycloalkyl group (preferably having a carbon number of 3 to 30, more preferably from 3 to 20, still more preferably from 3 to 10, e.g., cyclopropyl, cyclopentyl, cyclohexyl), an alkenyl group (preferably having a carbon number of 2 to 30, more preferably from 2 to 20, still more preferably from 2 to 10, e.g., vinyl, allyl, 2-butenyl, 3-pentenyl), an alkynyl group (preferably having a carbon number of 2 to 30, more preferably from 2 to 20, still more preferably from 2 to 10, e.g., propargyl, 3-pentynyl), an aryl group (preferably having a carbon number of 6 to 30, more preferably from 6 to 20, still more preferably from 6 to 12, e.g., phenyl, p-methylphenyl, naphthyl, anthranyl), an amino group (preferably having a carbon number of 0 to 30, more preferably from 0 to 20, still more preferably from 0 to 10, e.g., amino, methylamino, dimethylamino, diethylamino, dibenzylamino, diphenylamino, ditolylamino), an alkoxy group (preferably having a carbon number of 1 to 30, more preferably from 1 to 20, still more preferably from 1 to 10, e.g., methoxy, ethoxy, butoxy, 2-ethylhexyloxy), an aryloxy group (preferably having a carbon number of 6 to 30, more preferably from 6 to 20, still more preferably from 6 to 12, e.g., phenyloxy, 1-naphthyloxy, 2-naphthyloxy), a heterocyclic oxy group (preferably having a carbon number of 1 to 30, more preferably from 1 to 20, still more preferably from 1 to 12, e.g., pyridyloxy, pyrazyloxy, pyrimidyloxy, quinolyloxy), an acyl group (preferably having a carbon number of 1 to 30, more preferably from 1 to 20, still more preferably from 1 to 12, e.g., acetyl, benzoyl, formyl, pivaloyl), an alkoxycarbonyl group (preferably having a carbon number of 2 to 30, more preferably from 2 to 20, still more preferably from 2 to 12, e.g., methoxycarbonyl, ethoxycarbonyl), an aryloxycarbonyl group (preferably having a carbon number of 7 to 30, more preferably from 7 to 20, still more preferably from 7 to 12, e.g., phenyloxycarbonyl), an acyloxy group (preferably having a carbon number of 2 to 30, more preferably from 2 to 20, still more preferably from 2 to 10, e.g., acetoxy, benzoyloxy), an acylamino group (preferably having a carbon number of 2 to 30, more preferably from 2 to 20, still more preferably from 2 to 10, e.g., acetylamino, benzoylamino), an alkoxycarbonylamino group (preferably having a carbon number of 2 to 30, more preferably from 2 to 20, still more preferably from 2 to 12, e.g., methoxycarbonylamino), an aryloxycarbonylamino group (preferably having a carbon number of 7 to 30, more preferably from 7 to 20, still more preferably from 7 to 12, e.g., phenyloxycarbonylamino), a sulfonylamino group (preferably having a carbon number of 1 to 30, more preferably from 1 to 20, still more preferably from 1 to 12, e.g., methanesulfonylamino, benzenesulfonylamino), a sulfamoyl group (preferably having a carbon number of 0 to 30, more preferably from 0 to 20, still more preferably from 0 to 12, e.g., sulfamoyl, methylsulfamoyl, dimethylsulfamoyl, phenylsulfamoyl), a carbamoyl group (preferably having a carbon number of 1 to 30, more preferably from 1 to 20, still more preferably from 1 to 12, e.g., carbamoyl, methylcarbamoyl, diethylcarbamoyl, phenylcarbamoyl), an alkylthio group (preferably having a carbon number of 1 to 30, more preferably from 1 to 20, still more preferably from 1 to 12, e.g., methylthio, ethylthio), an arylthio group (preferably having a carbon number of 6 to 30, more preferably from 6 to 20, still more preferably from 6 to 12, e.g., phenylthio), a heterocyclic thio group (preferably having a carbon number of 1 to 30, more preferably from 1 to 20, still more preferably from 1 to 12, e.g., pyridylthio, 2-benzimizolylthio, 2-benzoxazolylthio, 2-benzothiazolylthio), a sulfonyl group (preferably having a carbon number of 1 to 30, more preferably from 1 to 20, still more preferably from 1 to 12, e.g., mesyl, tosyl), a sulfinyl group (preferably having a carbon number of 1 to 30, more preferably from 1 to 20, still more preferably from 1 to 12, e.g., methanesulfinyl, benzenesulfinyl), an ureido group (preferably having a carbon number of 1 to 30, more preferably from 1 to 20, still more preferably from 1 to 12, e.g., ureido, methylureido, phenylureido), a phosphoric acid amido group (preferably having a carbon number of 1 to 30, more preferably from 1 to 20, still more preferably from 1 to 12, e.g., diethylphosphoric acid amido, phenylphosphoric acid amido), a hydroxy group, a mercapto group, a halogen atom (for example, a fluorine atom, a chlorine atom, a bromine atom and an iodine atom, preferably a fluorine atom), a cyano group, a sulfo group, a carboxyl group, a nitro group, a hydroxamic acid group, a sulfino group, a hydrazino group, an imino group, a heterocyclic group (preferably having a carbon number of 1 to 30, more preferably from 1 to 12; examples of the heteroatom include a nitrogen atom, an oxygen atom and a sulfur atom; specifically an imidazolyl group, a pyridyl group, a quinolyl group, a furyl group, a thienyl group, a piperidyl group, a morpholino group, a benzoxazolyl group, a benzimidazolyl group, a benzothiazolyl group, a carbazolyl group, an azepinyl group and the like), a silyl group (preferably having a carbon number of 3 to 40, more preferably from 3 to 30, still more preferably from 3 to 24, e.g., trimethylsilyl, triphenylsilyl), and a silyloxy group (preferably having a carbon number of 3 to 40, more preferably from 3 to 30, still more preferably from 3 to 24, e.g., trimethylsilyloxy, triphenylsilyloxy). These substituents may be further substituted.

Also, a plurality of these substituents may combine with each other to form a ring.

The substituent of the aromatic nitrogen-containing heterocyclic ring is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, an ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

$X^{11}$ represents an oxygen atom, a sulfur atom, a substituted or unsubstituted nitrogen atom or a single bond and is preferably an oxygen atom, a sulfur atom or a single bond, more preferably an oxygen atom or a single bond, still more preferably a single bond. In the case where $X^{11}$ represents a substituted nitrogen atom, the substituent is, for example, preferably a substituent selected from Substituent Group A, more preferably an alkyl group, a cycloalkyl group or an aryl group, still more preferably an alkyl group having a carbon number of 1 to 7 or an aryl group having a carbon number of 6 to 12 (number of ring members: from 1 to 2).

$Y^{11}$ represents a linking group or a single bond. The linking group is not particularly limited but is preferably a single bond or a divalent linking group containing a carbon atom, a nitrogen atom, an oxygen atom, a sulfur atom, a silicon atom, a germanium atom or a phosphorus atom, more preferably a single bond or a group selected from Linking Group A shown below.

Linking Group A:

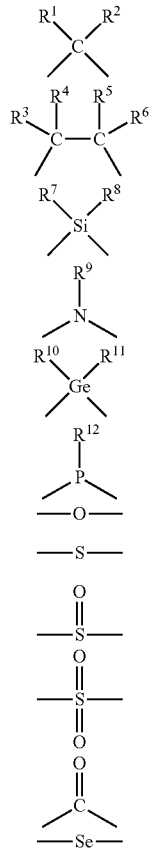

In Linking Group A, each of $R^1$, $R^2$, $R^3$, $R^4$, $R^5$, $R^6$, $R^7$, $R^8$, $R^9$, $R^{19}$, $R^{11}$ and $R^{12}$ ($R^1$ to $R^{12}$) independently represents a hydrogen atom or a substituent selected from substituents including Substituent Group A. In the case where each of $R^1$ to $R^{12}$ represents a substituent, the substituent is preferably a substituent selected from Substituent Group A.

Each of $R^1$ to $R^{12}$ when these can be substituted may further have a substituent, and $R^1$ and $R^2$, $R^3$ and $R^4$, $R^5$ and $R^6$, $R^3$ and $R^5$, $R^3$ and $R^6$, $R^4$ and $R^6$, or $R^{10}$ and $R^{11}$ may combine with each other to form a ring. The further substituent which each of $R^1$ to $R^{12}$ may have is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a halogen atom, an alkylthio group, an arylthio group, an alkyloxy group, an aryloxy group or a halogen atom, still more preferably an alkyl group or an aryl group.

$Y^{11}$ is more preferably a single bond or a substituent selected from Linking Group A. Among these, a single bond, —C($R^1$)($R^2$)—, —C($R^3$)($R^4$)C($R^5$)($R^6$)—, —Si($R^7$)($R^8$)—, —N($R^9$)—, —O—, —S—, —SO—, —SO$_2$— and —CO— are preferred, a single bond, —C($R^1$)($R^2$)—, —C($R^3$)($R^4$)C($R^5$)($R^6$)— Si($R^7$)($R^8$)—, —O— and —S— are more preferred, a single bond —C($R^1$)($R^2$)— and —C($R^3$)($R^4$)C($R^5$)($R^6$)— are still more preferred, and a single bond is yet still more preferred.

In —C($R^1$)($R^2$)—, each of $R^1$ and $R^2$ is preferably a hydrogen atom or a substituent selected from Substituent Group B below. In particular, each of $R^1$ and $R^2$ is preferably a methyl group.

(Substituent Group B)

The substituent includes an alkyl group, a cycloalkyl group, an aryl group, a halogen atom, an amino group, an alkylthio group, an arylthio group, an alkyloxy group, an aryloxy group, a hydroxy group, a mercapto group and a halogen atom. Among these, an alkyl group, a cycloalkyl group, an aryl group, a halogen atom, an alkylthio group, an arylthio group, an alkyloxy group, an aryloxy group and a halogen atom are preferred, and an alkyl group and an aryl group are more preferred.

In —C($R^3$)($R^4$)C($R^5$)($R^6$)—, each of $R^3$, $R^4$, $R^5$ and $R^6$ is preferably a hydrogen atom or a substituent selected from Substituent Group B.

In —Si($R^7$)($R^8$)—, each of $R^7$ and $R^8$ is preferably a hydrogen atom or a substituent selected from Substituent Group B.

In —Ge($R^{10}$)($R^{11}$)—, each of $R^{10}$ and $R^{11}$ is preferably a hydrogen atom or a substituent selected from Substituent Group B.

In —N($R^9$)—, $R^9$ is preferably a hydrogen atom, an alkyl group, a cycloalkyl group or an aryl group, more preferably an alkyl group or an aryl group, still more preferably an aryl group.

In —P($R^{12}$)—, $R^{12}$ has the same meaning as the preferred range of $R^9$.

In formula (1), $L^{11}$ represents a partial structure having an atom bonded to $X^{11}$. The partial structure of $L^{11}$ is preferably a group bonded through a carbon atom, a group bonded through a nitrogen atom, a group bonded through a silicon atom, a group bonded through a phosphorus atom, a group bonded through an oxygen atom, or a group bonded through a sulfur atom, more preferably a group bonded through a carbon atom, a nitrogen atom, an oxygen atom or a sulfur atom, still more preferably a group bonded through a carbon atom or an oxygen atom.

The group bonded through a carbon atom is preferably a substituted or unsubstituted aryl group bonded through a carbon atom, a substituted or unsubstituted 5-membered heteroaryl group bonded through a carbon atom, or a substituted or unsubstituted 6-membered heteroaryl group bonded through a carbon atom, more preferably a substituted or unsubstituted aryl group bonded through a carbon atom, a substituted or unsubstituted nitrogen-containing 5-membered heteroaryl group bonded through a carbon atom, or a nitrogen-containing 6-membered heteroaryl group bonded through a carbon atom, still more preferably a substituted aryl group bonded through a carbon atom.

The group bonded through an oxygen atom is preferably a substituted or unsubstituted hydroxyl group or a substituted or unsubstituted carboxyl group, more preferably a substituted or unsubstituted carboxyl group.

The group bonded through a nitrogen atom is preferably a substituted amino group or a nitrogen-containing 5-membered heteroaryl group bonded through a nitrogen atom, more preferably a nitrogen-containing 5-membered heteroaryl group bonded through a nitrogen atom, still more preferably a substituted carbazole, a substituted pyrrole or a substituted indole.

The group bonded through a phosphorus atom is preferably a substituted phosphino group. The group bonded through a silicon atom is preferably a substituted silyl group. The group bonded through a sulfur atom is preferably a thiol group or a substituted thiol group.

Each of $L^{12}$ and $L^{13}$ represents a carbon atom, a nitrogen atom, an oxygen atom or a phosphorus atom, and $E^{11}$ represents an atomic group for forming a bidentate ligand together with $L^{12}$ and $L^{13}$. The combination of $L^{12}$ and $L^{13}$ is not particularly limited but is preferably nitrogen atom-carbon atom, nitrogen atom-oxygen atom, or oxygen atom-oxygen atom. The bidentate ligand represented by $L^{12}$-$E^{11}$-$L^{13}$ is not particularly limited.

The bidentate ligand includes a ligand represented by any one of the following formulae (1-1) to (1-17):

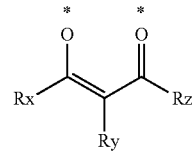

(I-1)

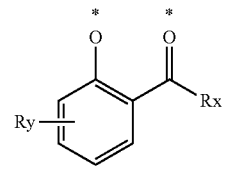

(I-2)

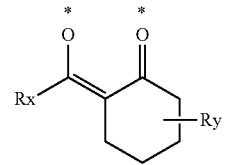

(I-3)

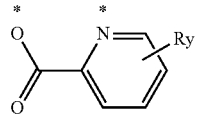

(I-4)

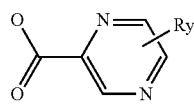

(I-5)

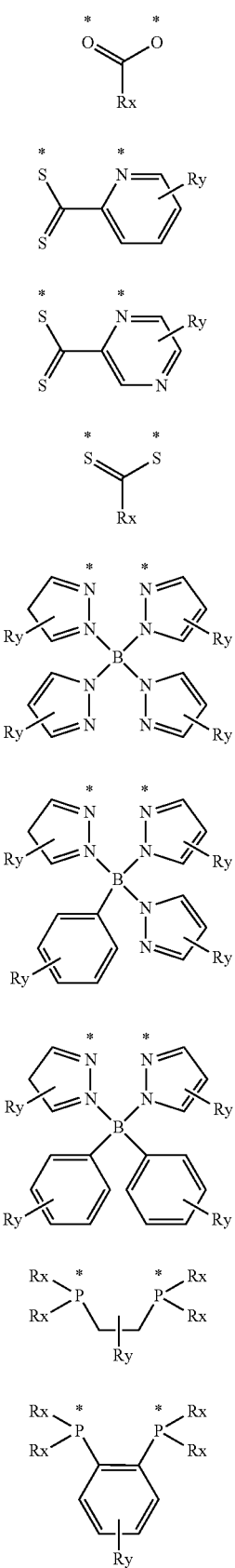
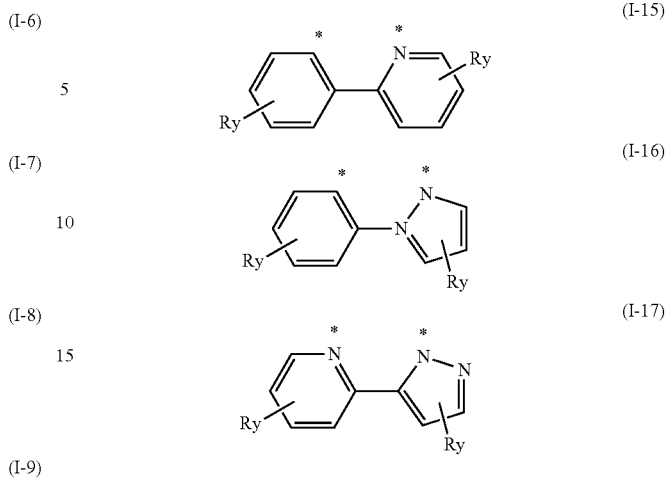

In the formulae, * represents a coordination position to a metal.

Each of Rx, Ry and Rz independently represents a hydrogen atom or a substituent. The substituent includes a substituent selected from Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, an ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a methyl group, an ethyl group, an isopropyl group, a tert-butyl group, a neopentyl group, an isopentyl group, a trifluoromethyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of Rx and Rz is independently, preferably any one of a hydrogen atom, an alkyl group, a perfluoroalkyl group, a fluorine atom and an aryl group, more preferably a hydrogen atom, an alkyl group, an aryl group or a fluorine atom, still more preferably a hydrogen atom or an alkyl group. Ry is preferably any one of a hydrogen atom, an alkyl group, a perfluoroalkyl group, a fluorine atom and an aryl group, more preferably a hydrogen atom, an alkyl group or an aryl group, still more preferably an alkyl group.

Among formulae (1-1) to (1-17), formulae (1-1), (1-4), (1-10), (1-15), (1-16) and (1-17) are preferred, formulae (1-1), (1-4) and (1-15) are more preferred, and formula (1-15) is most preferred.

Specific examples of the bidentate ligand include substituted or unsubstituted phenylpyridine, phenylpyrazole, phenylimidazole, phenyltriazole, phenyltetrazole, pyridylpyridine, imidazolylpyridine, pyrazolylpyridine, triazolylpyridine, pyrazabole, diphenylphosphinoethylene, picolinic acid and acetylacetone. Among these, phenylpyridine, phenylpyrazole, phenylimidazole, pyridylpyridine, pyrazabole, picolinic acid and acetylacetone are preferred, and phenylpyridine, pyridylpyridine, picolinic acid and acetylacetone are more preferred. These groups may be further substituted with the above-described substituent.

k represents an integer of 1 to 3, l represents an integer of 0 to 2, and k+l is 2 or 3. l is preferably 1 or 0, more preferably 0.

$S^{11}$ represents a substituent selected from (a) to (w).

Among these, (a), (d), (e), (g) and (k) to (n) are preferred, (a), (d), (l), (m) and (n) are more preferred, (a), (d), (l) and (m) are still more preferred, (a) and (d) are yet still more preferred, and (a) is most preferred.

Usually, substitution of a branched alkyl group such as (a) to (w) on a ligand raises concern of a deterioration reaction (for example, hydrogen elimination reaction or dimerization reaction) of the benzylic position or a great rise of the drive voltage, and use of such a branched alkyl group is avoided, which reveals at the same time that the effect of the present invention cannot be easily anticipated. This effect is considered to result because the efficiency and durability of a device are improved by the spatial protection and the chromaticity shift after deterioration is suppressed.

Also, considering the balance between the rise in drive voltage and the difficulty of synthesis, (a) and (d) are preferred. It has been difficult to estimate the optimal point in view of durability and suppression of chromaticity shift as well as drive voltage, but various studies have revealed that the structures specified in the present invention are preferred.

n represents an integer of 1 to 4. n is preferably 1 or 2.

The compound represented by formula (1) is preferably represented by the following formula (2):

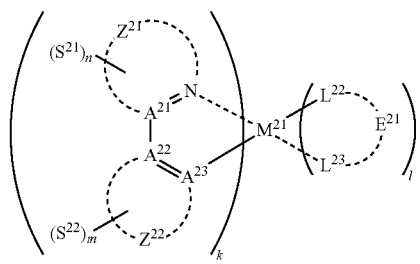

(2)

(In formula (2), $M^{21}$ represents a metal belong to Groups 8 to 11 in the periodic table of elements, each of $A^{21}$ to $A^{23}$ independently represents a nitrogen atom or a carbon atom, $Z^{21}$ represents an aromatic nitrogen-containing heterocyclic ring, $Z^{22}$ represents an aromatic heterocyclic ring or an aromatic hydrocarbon ring, each of $L^{22}$ and $L^{23}$ represents a carbon atom, a nitrogen atom, an oxygen atom or a phosphorus atom, $E^2$ represents an atomic group for forming a bidentate ligand together with $L^{22}$ and $L^{23}$, k represents an integer of 1 to 3, l represents an integer of 0 to 2, k+l is 2 or 3, each of $S^{21}$ and $S^{22}$ independently represents a substituent selected from (a) to (w), each of n and m represents an integer of 0 to 4, n+m is an integer of 1 to 4, and each $S^{21}$ or $S^{22}$ may be the same as or different from every other $S^{21}$ or $S^{22}$).

In formula (2), $M^{21}$, $A^{21}$, $Z^{21}$, $L^{22}$, $L^{23}$, $E^{21}$, $S^{21}$, $S^{22}$, k and l have the same meanings as $M^{11}$, $A^{11}$, $Z^{11}$, $L^{12}$, $L^{13}$, $E^{11}$, $S^{11}$, k and l in formula (1), and the preferred ranges are also the same.

Each of $A^{22}$ and $A^{23}$ represents a nitrogen atom or a carbon atom, and these form an aromatic heterocyclic ring or an aromatic hydrocarbon ring together with $Z^{22}$.

Examples of the aromatic heterocyclic ring or aromatic hydrocarbon ring represented by $Z^{22}$ include a benzene ring, a naphthalene ring, an anthracene ring, a pyrene ring, a phenanthrene ring, a perylene ring, a pyridine ring, a quinoline ring, an isoquinoline ring, a phenanthridine ring, a pyrimidine ring, a pyrazine ring, a pyridazine ring, a triazine ring, a cinnoline ring, an acridine ring, a phthalazine ring, a quinazoline ring, a quinoxaline ring, a naphthyridine ring, a pteridine ring, a pyrrole ring, a pyrazole ring, a triazole ring, an indole ring, a carbazole ring, an indazole ring, a benzimidazole ring, an oxazole ring, a thiazole ring, an oxadiazole ring, a thiadiazole ring, a benzoxazole ring, a benzothiazole ring, an imidazopyridine ring, a thiophene ring, a benzothiophene ring, a furan ring, a benzofuran ring, a phosphole ring, a phosphinine ring and a silole ring.

$Z^{22}$ is preferably a benzene ring, a naphthalene ring, a benzoxazole ring, a pyrazole ring, an imidazole ring, a triazole ring, a pyridine ring, an indole ring or a thiophene ring, more preferably a benzene ring, a pyrazole ring, a pyridine ring, a benzoxazole ring or a thiophene ring.

$A^{22}$ may have a substituent, and those described above as Substituent Group A can be applied to the substituent. Furthermore, $Z^{22}$ may form a condensed ring with other rings.

This substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

Each of n and m represents an integer of 0 to 4, and n+m is an integer of 1 to 4. n+m is preferably 1 or 2.

The compound represented by formula (2) is preferably represented by the following formula (3).

[Compound Represented by Formula (3)]

The compound represented by formula (3) is described in detail.

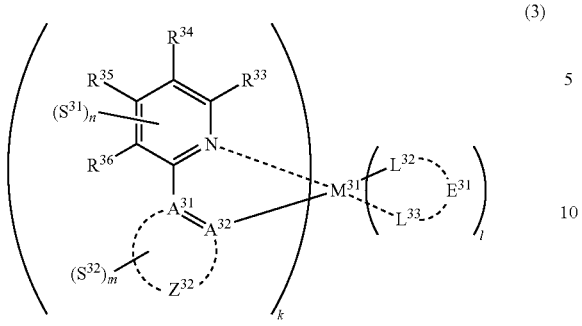

(In formula (3), $M^{31}$ represents iridium, each of $A^{31}$ and $A^{32}$ independently represents a nitrogen atom or a carbon atom, each of $R^{33}$ to $R^{36}$ independently represents a hydrogen atom or a substituent, $Z^{32}$ represents an aromatic heterocyclic ring or an aromatic hydrocarbon ring, each of $L^{32}$ and $L^{33}$ independently represents a carbon atom, a nitrogen atom, an oxygen atom or a phosphorus atom, $E^{31}$ represents an atomic group for forming a bidentate ligand together with $L^{32}$ and $L^{33}$, k represents an integer of 1 to 3, l represents an integer of 0 to 2, k+l is 3, each of $S^{31}$ and $S^{32}$ independently represents a substituent selected from (a) to (w) shown below, each of n and m represents an integer of 0 to 4, n+m is an integer of 1 to 4, and each $S^{31}$ or $S^{32}$ may be the same as or different from every other $S^{31}$ or $S^{32}$).

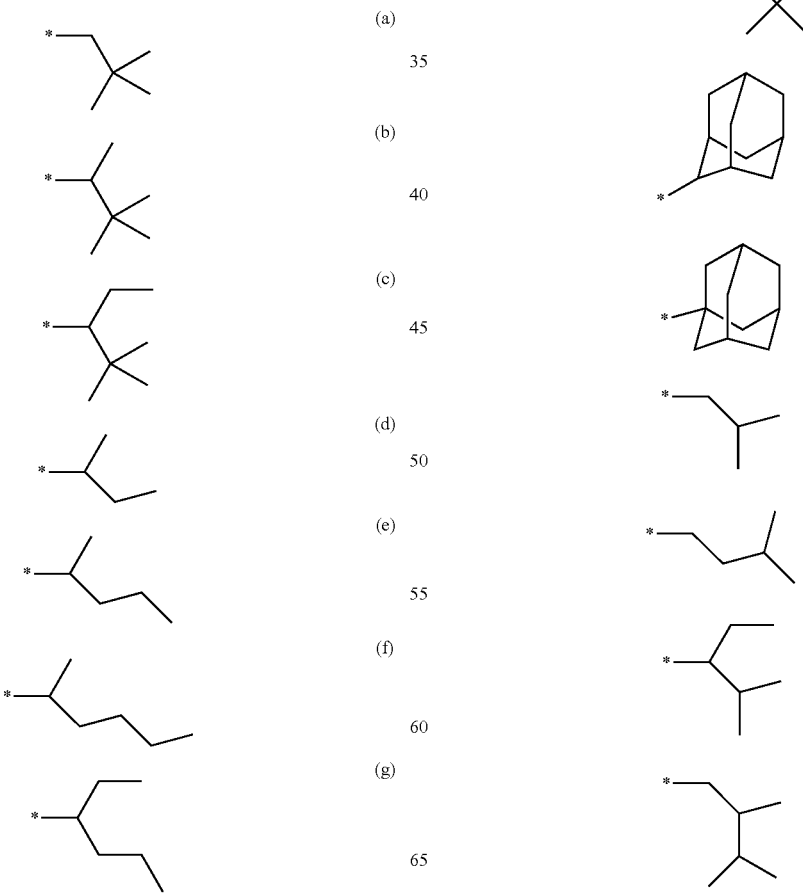

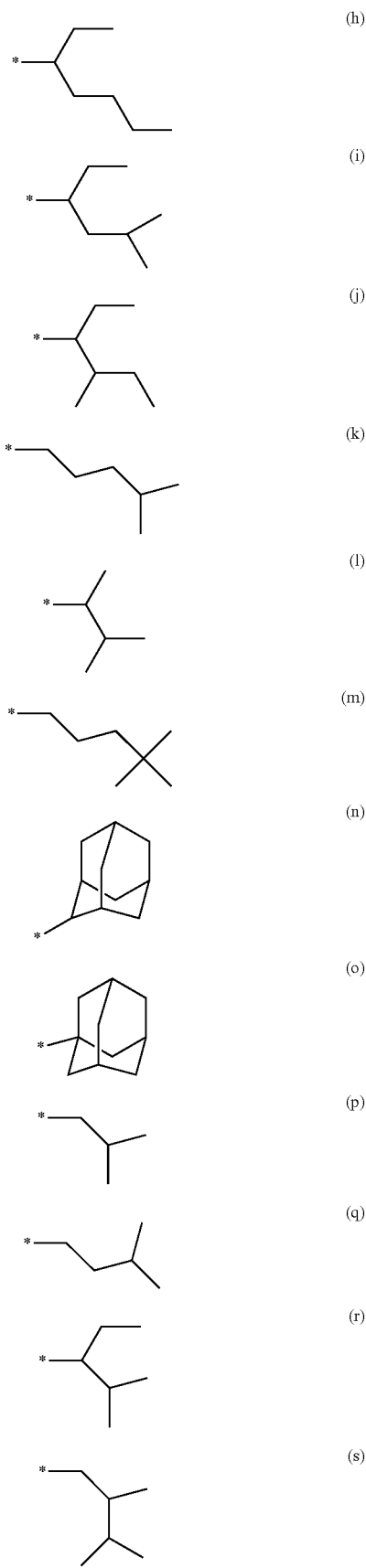

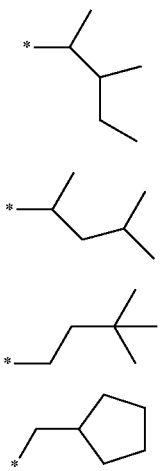

$M^{31}$ is iridium.

k represents an integer of 1 to 3 and is preferably 2 or 3.

Each of $R^{33}$ to $R^{36}$ independently represents a hydrogen atom or a substituent. The substituent includes a substituent selected from Substituent Group A. $R^{33}$ to $R^{36}$ may combine with each other to form a ring.

In the case where each of $R^{33}$ to $R^{36}$ represents a substituent, the substituent is an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

In the case where each of $R^{33}$ to $R^{36}$ represents a substituent, the substituent may be further substituted with a substituent. The further substituent includes Substituent Group A and is preferably an alkyl group, a cycloalkyl group, an aryl group, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

Any combination selected from $R^{33}$ and $R^{34}$, $R^{34}$ and $R^{35}$, and $R^{35}$ and $R^{36}$ may combine with each other to form a benzene ring, and the benzene ring may have one or more substituents. Incidentally, the benzene ring forms a condensed ring with the pyridine ring in formula (3). The substituent which the benzene ring may have includes a group selected from Substituent Group A and is preferably an alkyl group, an alkyl halide group, a halogen atom, an alkyl group-substitutable aryl group or a cyano group, more preferably a methyl group, an ethyl group, an isopropyl group, a tert-butyl group, a trifluoromethyl group, a fluorine atom, an alkyl group-substitutable aryl group or a cyano group, still more preferably a methyl group, an ethyl group, an isopropyl group or a tert-butyl group, yet still more preferably a methyl group, an ethyl group or a tert-butyl group.

The benzene ring which may be formed by combining any combination selected from $R^{33}$ and $R^{34}$, $R^{34}$ and $R^{35}$, and $R^{35}$ and $R^{36}$ with each other preferably has no substituent.

Examples of the aromatic heterocyclic ring or aromatic hydrocarbon ring represented by $Z^{32}$ include a benzene ring, a naphthalene ring, an anthracene ring, a pyrene ring, a phenanthrene ring, a perylene ring, a pyridine ring, a quinoline ring, an isoquinoline ring, a phenanthridine ring, a pyrimidine ring, a pyrazine ring, a pyridazine ring, a triazine ring, a cinnoline ring, an acridine ring, a phthalazine ring, a quinazoline ring, a quinoxaline ring, a naphthyridine ring, a pteridine ring, a pyrrole ring, a pyrazole ring, a triazole ring, an indole ring, a carbazole ring, an indazole ring, a benzimidazole ring, an oxazole ring, a thiazole ring, an oxadiazole ring, a thiadiazole ring, a benzoxazole ring, a benzothiazole ring, an imidazopyridine ring, a thiophene ring, a benzothiophene ring, a furan ring, a benzofuran ring, a phosphole ring, a phosphinine ring and a silole ring.

$Z^{32}$ is preferably a benzene ring, a naphthalene ring, a benzoxazole ring, a pyrazole ring, an imidazole ring, a triazole ring, a pyridine ring, an indole ring or a thiophene ring, more preferably a benzene ring, a pyrazole ring, a pyridine ring, a benzoxazole ring or a thiophene ring, still more preferably a benzene ring, a pyrazole ring, a pyridine ring or a thiophene ring.

$Z^{32}$ may have a substituent, and those described above as Substituent Group A can be applied to the substituent. Furthermore, $Z^{32}$ may form a condensed ring with other rings.

This substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a methyl group, an ethyl group, an isopropyl group, a tert-butyl group, a methoxy group, a trifluoromethyl group, a fluorine atom, an alkyl group-substitutable aryl group or a cyano group, yet still more preferably a methyl group, an ethyl group, an isopropyl group or a tert-butyl group, even yet still more preferably a methyl group, and ethyl group or a tert-butyl group.

$Z^{32}$ preferably has no substituent.

Each of $L^{32}$ and $L^{33}$ represents a carbon atom, a nitrogen atom, an oxygen atom or a phosphorus atom, and $E^{31}$ represents an atomic group for forming a bidentate ligand together with $L^{32}$ and $L^{33}$. The combination of $L^{32}$ and $L^{33}$ is not particularly limited but is preferably a nitrogen atom-a carbon atom, a nitrogen atom-an oxygen atom, or an oxygen atom-an oxygen atom.

The bidentate ligand represented by $L^{32}$-$E^{31}$-$L^{33}$ is not particularly limited, but the bidentate ligand includes a ligand represented by any one of formulae (1-1) to (1-17). Among formulae (1-1) to (1-17), formulae (1-1), (1-4), (1-10), (1-15), (1-16) and (1-17) are preferred, formulae (1-1), (1-4) and (1-15) are more preferred, and formula (1-15) is most preferred. Preferred ranges of Rx, Ry and Rz in formulae (1-1) to (1-17) are the same as above.

Specific examples of the bidentate ligand include substituted or unsubstituted phenylpyridine, phenylpyrazole, phenylimidazole, phenyltriazole, phenyltetrazole, pyridylpyridine, imidazolylpyridine, pyrazolylpyridine, triazolylpyridine, pyrazabole, diphenylphosphinoethylene, picolinic acid and acetylacetone. Among these, phenylpyridine, phenylpyrazole, phenylimidazole, pyridylpyridine, pyrazabole, picolinic acid and acetylacetone are preferred, and phenylpyridine, pyridylpyridine, picolinic acid and acetylacetone are more preferred. These groups may be further substituted with the above-described substituent.

k represents an integer of 1 to 3, l represents an integer of 0 to 2, and k+l is 3. l is preferably 1 or 0, more preferably 0.

$S^{31}$ represents a substituent selected from (a) to (w).

Among these, (a), (d), (e), (g) and (k) to (n) are preferred, (a), (d), (l), (m) and (n) are more preferred, (a), (d), (l) and (m) are still more preferred, (a) and (d) are yet still more preferred, and (a) is most preferred.

Usually, substitution of a branched alkyl group such as (a) to (w) on a ligand raises concern of a deterioration reaction (for example, hydrogen elimination reaction or dimerization reaction) of the benzylic position or a great rise of the drive voltage, and use of such a branched alkyl group is avoided, which reveals at the same time that the effect of the present invention cannot be easily anticipated. This effect is considered to result because the efficiency and durability of a device are improved by the spatial protection and the chromaticity shift after deterioration is suppressed.

Also, considering the balance between the rise in drive voltage and the difficulty of synthesis, (a) and (d) are preferred. It has been difficult to estimate the optimal point in view of durability and suppression of chromaticity shift as well as drive voltage, but various studies have revealed that the structures specified in the present invention are preferred.

Each of n and m represents an integer of 0 to 4, and n+m is an integer of 1 to 4. n+m is preferably 1 or 2.

The compound represented by formula (3) is preferably represented by the following formula (4):

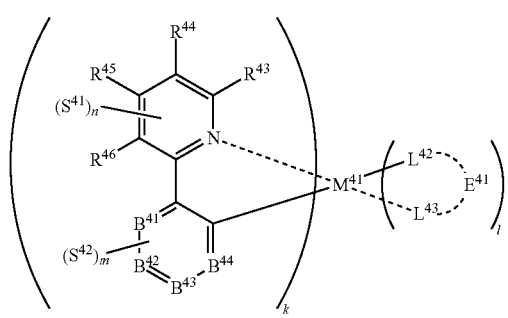

(4)

(In formula (4), $M^{41}$ represents iridium, each of $R^{43}$ to $R^{46}$ independently represents a hydrogen atom or a substituent, each of $B^{41}$ to $B^{44}$ independently represents a nitrogen atom or C—$R^{47}$, $R^{47}$ represents a hydrogen atom or a substituent, each $R^{47}$ may be the same as or different from every other $R^{47}$, each of $L^{42}$ and $L^{43}$ independently represents a carbon atom, a nitrogen atom, an oxygen atom or a phosphorus atom, $E^{41}$ represents an atomic group for forming a bidentate ligand together with $L^{42}$ and $L^{43}$, k represents an integer of 1 to 3, l represents an integer of 0 to 2, k+l is 3, each of $S^{41}$ and $S^{42}$ independently represents a substituent selected from (a) to (w), each of n and m represents an integer of 0 to 4, n+m is an integer of 1 to 4, and each $S^{41}$ or $S^{42}$ may be the same as or different from every other $S^{41}$ or $S^{42}$).

In formula (4), $M^{41}$, $R^{43}$ to $R^{46}$, $L^{42}$, $L^{43}$, $E^{41}$, $S^{41}$, $S^{42}$, n, m, k and l have the same meanings as $M^{31}$, $R^{33}$ to $R^{36}$, $L^{32}$, $L^{33}$, $E^{31}$, $S^{31}$, $S^{31}$, $S^{32}$, n, m, k and l in formula (3), and the preferred ranges are also the same.

Each of $B^{41}$ to $B^{44}$ independently represents a nitrogen atom or C—$R^{47}$, and $R^{47}$ represents a hydrogen atom or a substituent. The combination of $B^{41}$ to $B^{44}$ is not particularly limited but out of $B^{41}$ to $B^{44}$, the number of nitrogen atoms is preferably from 0 to 2, more preferably from 0 to 1.

As for the substituent represented by $R^{47}$, those described above as Substituent Group A can be applied.

Each $R^{47}$ may be the same as or different from every other $R^{47}$. $R^{47}$ may further have a substituent, and those described above as Substituent Group A can be applied to the substituent. Also, $R^{47}$'s may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{47}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

Any combination selected from $R^{43}$ and $R^{44}$, $R^{44}$ and $R^{45}$, and $R^{45}$ and $R^{46}$ may combine with each other to form a benzene ring, and the benzene ring may have a substituent. Incidentally, the benzene ring forms a condensed ring with the pyridine ring in formula (4). The substituent which the benzene ring may have is the same as the substituent which the benzene ring formed by combining any combination selected from $R^{33}$ and $R^{34}$, $R^{34}$ and $R^{35}$, and $R^{35}$ and $R^{36}$ in formula (3) with each other may have.

The compound represented by formula (4) is preferably represented by the following formula (5):

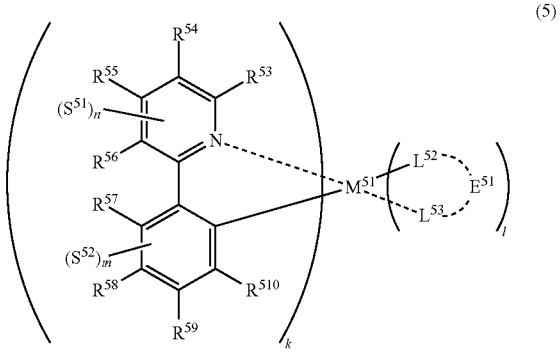

(In formula (5), $M^{51}$ represents iridium, each of $R^{53}$ to $R^{510}$ independently represents a hydrogen atom or a substituent, each of $L^{52}$ and $L^{53}$ independently represents a carbon atom, a nitrogen atom, an oxygen atom or a phosphorus atom, $E^{51}$ represents an atomic group for forming a bidentate ligand together with $L^{52}$ and $L^{53}$, k represents an integer of 1 to 3, l represents an integer of 0 to 2, k+l is 3, each of $S^{51}$ and $S^{52}$ independently represents a substituent selected from (a) to (w), each of n and m represents an integer of 0 to 4, n+m is an integer of 1 to 4, and each $S^{51}$ or $S^{52}$ may be the same as or different from every other $S^{51}$ or $S^{52}$).

In formula (5), $M^{51}$, $L^{52}$, $L^{53}$, $E^{51}$, $S^{51}$, $S^{52}$, k and l have the same meanings as $M^{41}$, $L^{42}$, $L^{43}$, $E^{41}$, $S^{41}$, $S^{42}$, k and l in formula (4), and the preferred ranges are also the same.

Each of $R^{53}$ to $R^{510}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a trifluoromethyl group, a fluorine atom, a methoxy group, an aryl group or a cyano group. In particular, the substituent is preferably a substituted or unsubstituted alkyl group, a trifluoromethyl group, a fluorine atom, a methoxy group, an aryl group or a cyano group, more preferably a methyl group, an ethyl group, an isopropyl group, a tert-butyl group, a trifluoromethyl group, a fluorine atom, an alkyl group-substitutable aryl group or a cyano group, still more preferably a hydrogen atom, a methyl group, an ethyl group, an isopropyl group or a tert-butyl group, yet still more preferably a hydrogen atom, a methyl group, an ethyl group or a tert-butyl group.

In the case where each of $R^{53}$ to $R^{510}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

Any combination selected from $R^{53}$ and $R^{54}$, $R^{54}$ and $R^{55}$, and $R^{55}$ and $R^{56}$ may combine with each other to form a benzene ring, and the benzene ring may have a substituent. Incidentally, the benzene ring forms a condensed ring with the pyridine ring in formula (5). The substituent which the benzene ring may have is the same as the substituent which the benzene ring formed by combining any combination selected from $R^{33}$ and $R^{34}$, $R^{34}$ and $R^{35}$, and $R^{35}$ and $R^{36}$ in formula (3) with each other may have.

Each of n and m represents an integer of 0 to 4, and n+m is an integer of 1 to 4. n+m is preferably 1 or 2.

One preferred embodiment of formula (5) is represented by formula (5-1):

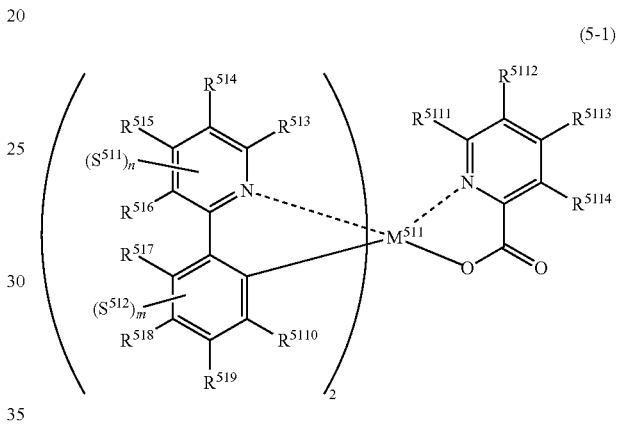

(In formula (5-1), $M^{511}$ represents iridium, each of $R^{513}$ to $R^{5114}$ independently represents a hydrogen atom or a substituent, each of $S^{511}$ and $S^{512}$ independently represents a substituent selected from (a) to (w), each of n and m represents an integer of 0 to 4, n+m is an integer of 1 to 4, and each $S^{511}$ or $S^{512}$ may be the same as or different from every other $S^{511}$ or $S^{512}$).

In formula (5-1), $R^{511}$, $R^{513}$ to $R^{516}$, $R^{517}$ to $R^{5110}$, $S^{511}$, $S^{512}$, n and m have the same meanings as $M^{51}$, $R^{53}$ to $R^{56}$, $R^{57}$ to $R^{510}$, $S^{51}$, $S^{52}$, n and m in formula (5), and the preferred ranges are also the same.

Each of $R^{511}$ to $R^{5114}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a methyl group, a trifluoromethyl group, a fluorine atom, a methoxy group, an aryl group or a cyano group. In particular, the substituent is preferably an alkyl group, a trifluoromethyl group, a fluorine atom, a methoxy group, an aryl group or a cyano group, more preferably an alkyl group or a fluorine atom. Each of $R^{5111}$ to $R^{5114}$ is especially preferably an alkyl group.

Each of $R^{5111}$ to $R^{5114}$ preferably has no substituent.

One preferred embodiment of formula (5) is represented by formula (5-2):

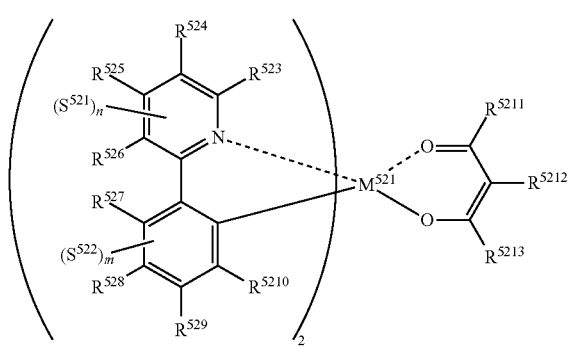

(5-2)

(In formula (5-2), $M^{521}$ represents iridium, each of $R^{523}$ to $R^{5213}$ independently represents a hydrogen atom or a substituent, each of $S^{521}$ and $S^{522}$ independently represents a substituent selected from (a) to (w), each of n and m represents an integer of 0 to 4, n+m is an integer of 1 to 4, and each $S^{521}$ or $S^{522}$ may be the same as or different from every other $S^{521}$ or $S^{522}$).

In formula (5-2), $M^{521}$, $R^{523}$ to $R^{526}$, $R^{527}$ to $R^{5210}$, $R^{521}$, $R^{522}$, n and m have the same meanings as $M^{51}$, $R^{53}$ to $R^{56}$, $R^{57}$ to $R^{510}$, $S^{51}$, $S^{52}$, n and m in formula (5), and the preferred ranges are also the same.

Each of $R^{5211}$ to $R^{5213}$ independently represents a hydrogen atom or may have a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

Each of $R^{5211}$ to $R^{5213}$ is preferably a hydrogen atom, a methyl group or a tert-butyl group.

One preferred embodiment of formula (5) is represented by formula (5-3):

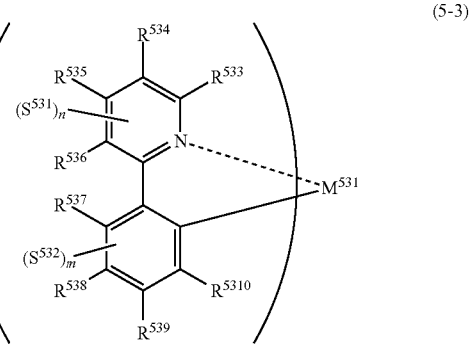

(5-3)

(In formula (5-3), $M^{521}$ represents iridium, each of $R^{533}$ to $R^{5310}$ independently represents a hydrogen atom or a substituent, each of $S^{531}$ and $S^{532}$ independently represents a substituent selected from (a) to (w), each of n and m represents an integer of 0 to 4, n+m is an integer of 1 to 4, and each $S^{531}$ or $S^{532}$ may be the same as or different from every other $S^{531}$ or $S^{532}$).

In formula (5-3), $M^{531}$, $R^{533}$ to $R^{5310}$, $S^{531}$, $S^{532}$, n and m have the same meanings as $M^{51}$, $R^{53}$ to $R^{510}$, $S^{51}$, $S^{52}$, n and m in formula (5), and the preferred ranges are also the same.

One preferred embodiment of formula (5) is represented by formula (5-4):

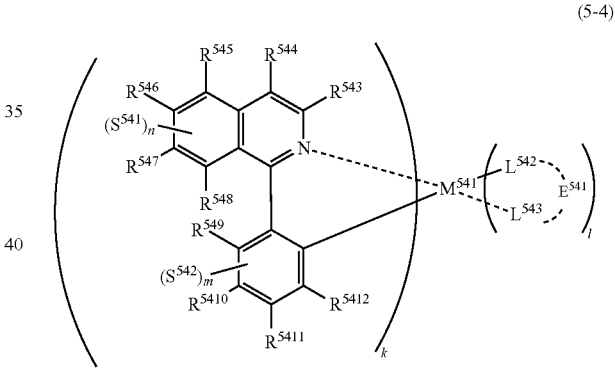

(5-4)

(In formula (5-4), $M^{541}$ represents iridium, each of $R^{543}$ to $R^{5412}$ independently represents a hydrogen atom or a substituent, each of $L^{542}$ and $L^{543}$ independently represents a carbon atom, a nitrogen atom, an oxygen atom or a phosphorus atom, $E^{541}$ represents an atomic group for forming a bidentate ligand together with $L^{542}$ and $L^{543}$, k represents an integer of 1 to 3, l represents an integer of 0 to 2, k+l is 3, each of S541 and $S^{542}$ independently represents a substituent selected from (a) to (w), each of n and m represents an integer of 0 to 4, n+m is an integer of 1 to 4, and each $S^{541}$ or $S^{542}$ may be the same as or different from every other $S^{541}$ or $S^{542}$).

In formula (5-4), $M^{541}$, $L^{542}$, $L^{543}$, $E^{541}$, $R^{543}$ to $R^{5412}$, n and m have the same meanings as $M^{51}$, $L^{52}$, $L^{53}$, $E^{51}$, $R^{53}$ to $R^{56}$, $R^{57}$ to $R^{510}$, n and m in formula (5), and the preferred ranges are also the same.

Each of $S^{541}$ and $S^{542}$ represents a substituent selected from (a) to (w). Among these, (a), (d), (e), (g) and (k) to (n) are preferred, (a), (d), (l), (m) and (n) are more preferred, (a), (d), (l) and (m) are still more preferred, (a) and (d) are yet still more preferred. Particularly, in the case of a compound represented by formula (5-4) having a condensed ring structure, metal complexes are liable to associate with each other and for increasing the dispersibility in an organic film, (a) is most preferred.

k represents an integer of 1 to 3, and k=2 is preferred.

One preferred embodiment of formula (5-4) is represented by formula (5-5):

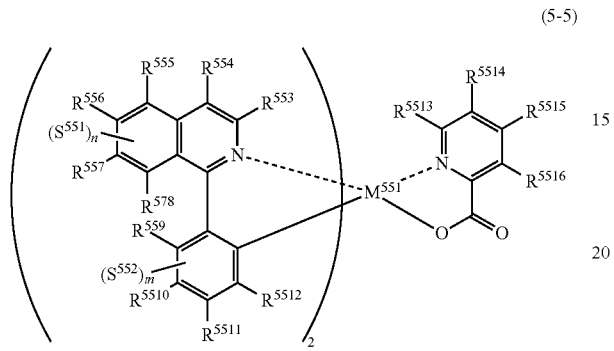

(5-5)

(In formula (5-5), $M^{551}$ represents iridium, each of $R^{553}$ to $R^{5516}$ independently represents a hydrogen atom or a substituent, each of $S^{551}$ and $S^{552}$ independently represents a substituent selected from (a) to (w), each of n and m represents an integer of 0 to 4, n+m is an integer of 1 to 4, and each $S^{551}$ or $S^{552}$ may be the same as or different from every other $S^{551}$ or $S^{552}$).

In formula (5-5), $M^{551}$, $R^{553}$ to $R^{5512}$, $R^{551}$, $R^{552}$, n and m have the same meanings as $M^{541}$, $R^{543}$ to $R^{5412}$, $R^{541}$, $S^{542}$, n and m in formula (5-4), and the preferred ranges are also the same.

Each of $R^{5513}$ to $R^{5516}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of $R^{5513}$ to $R^{5516}$ is preferably a hydrogen atom. One preferred embodiment of formula (5-4) is represented by formula (5-6):

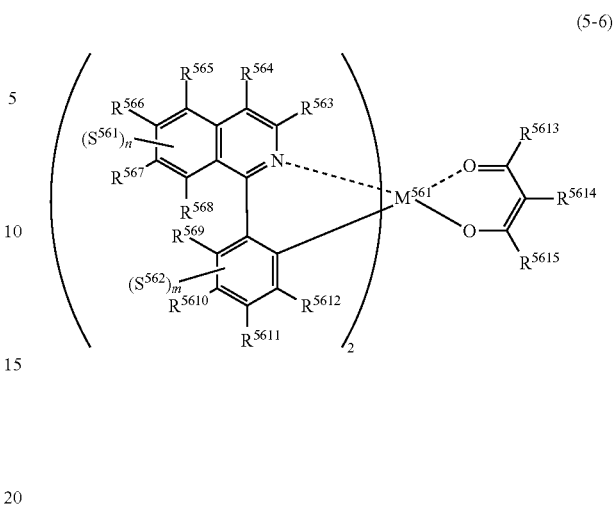

(5-6)

(In formula (5-6), $M^{561}$ represents iridium, each of $R^{563}$ to $R^{5615}$ independently represents a hydrogen atom or a substituent, each of $R^{561}$ and $R^{562}$ independently represents a substituent selected from (a) to (w), each of n and m represents an integer of 0 to 4, n+m is an integer of 1 to 4, and each $S^{561}$ or $S^{562}$ may be the same as or different from every other $S^{561}$ or $S^{562}$).

In formula (5-6), $M^{561}$, $R^{563}$ to $S^{561}$, $S^{562}$, n and m have the same meanings as $M^{541}$, $R^{543}$ to $R^{5412}$, $S^{541}$, $S^{542}$, n and m in formula (5-4), and the preferred ranges are also the same.

Each of $R^{5613}$ to $R^{5615}$ independently represents a hydrogen atom or may have a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

Each of $R^{5613}$ to $R^{5615}$ is preferably a hydrogen atom, a methyl group or a tert-butyl group.

One preferred embodiment of formula (5) is represented by formula (5-7):

(5-7)

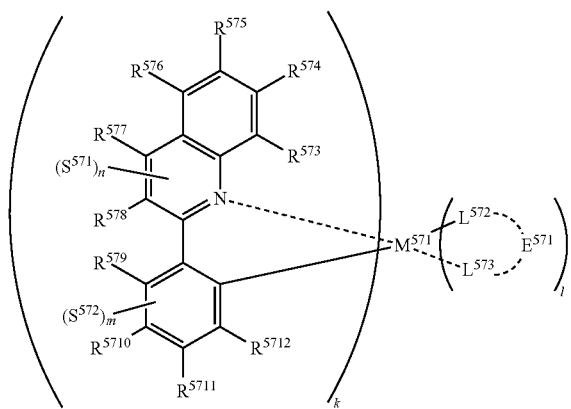

(In formula (5-7), $M^{571}$ represents iridium, each of $R^{573}$ to $R^{5712}$ independently represents a hydrogen atom or a substituent, each of $L^{572}$ and $L^{573}$ independently represents a carbon atom, a nitrogen atom, an oxygen atom or a phosphorus atom, $E^{571}$ represents an atomic group for forming a bidentate ligand together with $L^{572}$ and $L^{573}$, k represents an integer of 1 to 3, l represents an integer of 0 to 2, k+l is 3, each of $S^{571}$ and $S^{572}$ independently represents a substituent selected from (a) to (w), each of n and m represents an integer of 0 to 4, n+m is an integer of 1 to 4, and each $S^{571}$ or $S^{572}$ may be the same as or different from every other $S^{571}$ or $S^{572}$).

In formula (5-7), $M^{571}$, $L^{573}$, $E^{571}$, $R^{573}$ to $R^{5712}$, $S^{571}$, $S^{572}$, n and m have the same meanings as $M^{51}$, $L^{52}$, $L^{53}$, $E^{51}$, $R^{53}$ to $R^{56}$, $R^{57}$ to $R^{510}$, $S^{51}$, $S^{52}$, n and m in formula (5), and the preferred ranges are also the same.

Each of $S^{571}$ and $S^{572}$ represents a substituent selected from (a) to (w). Among these, (a), (d), (e), (g) and (k) to (n) are preferred, (a), (d), (l), (m) and (n) are more preferred, (a), (d), (l) and (m) are still more preferred, (a) and (d) are yet still more preferred. Particularly, in the case of a compound represented by formula (5-7) having a condensed ring structure, metal complexes are liable to associate with each other and for increasing the dispersibility in an organic film, (a) is most preferred.

k represents an integer of 1 to 3, and k=2 is preferred.

One preferred embodiment of formula (5-7) is represented by formula (5-8):

(5-8)

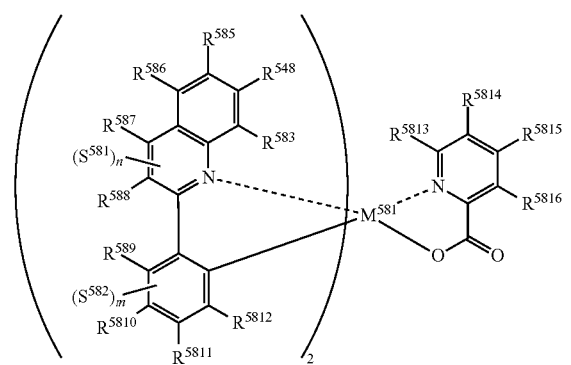

(In formula (5-8), $M^{581}$ represents iridium, each of $R^{583}$ to $R^{5816}$ independently represents a hydrogen atom or a substituent, each of $S^{581}$ and $S^{582}$ independently represents a substituent selected from (a) to (w), each of n and m represents an integer of 0 to 4, n+m is an integer of 1 to 4, and each $S^{581}$ or $S^{582}$ may be the same as or different from every other $S^{581}$ or $S^{582}$).

In formula (5-8), $R^{583}$ to $R^{5812}$, $S^{581}$, $S^{582}$, n and m have the same meanings as $M^{571}$, $R^{573}$ to $R^{5712}$, $S^{571}$, $S^{572}$, n and m in formula (5-7), and the preferred ranges are also the same.

Each of $R^{5813}$ to $R^{5816}$ independently represents a hydrogen atom or a substituent selected from substituents including Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of $R^{5813}$ to $R^{5816}$ is preferably a hydrogen atom.

One preferred embodiment of formula (5-7) is represented by formula (5-9):

(5-9)

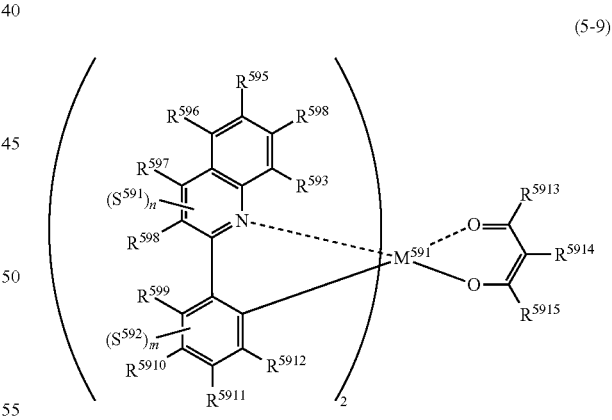

(In formula (5-9), $M^{591}$ represents iridium, each of $R^{593}$ to $R^{5915}$ independently represents a hydrogen atom or a substituent, each of $S^{591}$ and $S^{592}$ independently represents a substituent selected from (a) to (w), each of n and m represents an integer of 0 to 4, n+m is an integer of 1 to 4, and each $S^{591}$ or $S^{592}$ may be the same as or different from every other $S^{591}$ or $S^{592}$).

In formula (5-9), $M^{591}$, $R^{593}$ to $R^{5912}$, $S^{591}$, $S^{592}$, n and m have the same meanings as $M^{571}$, $R^{573}$ to $R^{5712}$, $S^{571}$, $S^{572}$, n and m in formula (5-7), and the preferred ranges are also the same.

Each of $R^{5913}$ to $R^{5915}$ independently represents a hydrogen atom or may have a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of $R^{5913}$ to $R^{5915}$ is preferably a hydrogen atom, a methyl group or a tert-butyl group.

The compound represented by formula (4) is preferably represented by the following formula (6):

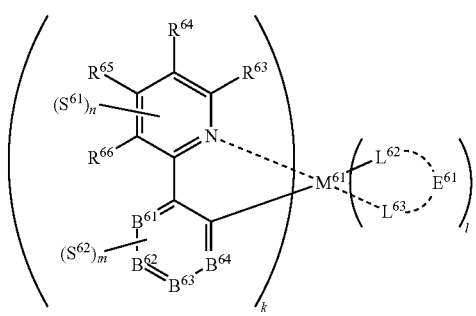

(6)

(In formula (6), $M^{61}$ represents iridium, each of $R^{63}$ to $R^{66}$ independently represents a hydrogen atom or a substituent, each of $B^{61}$ to $B^{63}$ independently represents a nitrogen atom or C—$R^{67}$, $R^{67}$ represents a hydrogen atom or a substituent, each $R^{67}$ may be the same as or different from every other $R^{67}$, each of $L^{62}$ and $L^{63}$ independently represents a carbon atom, a nitrogen atom, an oxygen atom or a phosphorus atom, $E^{61}$ represents an atomic group for forming a bidentate ligand together with $L^{62}$ and $L^{63}$, k represents an integer of 1 to 3, l represents an integer of 0 to 2, k+l is 3, each of $S^{61}$ and $S^{62}$ independently represents a substituent selected from (a) to (w), each of n and m represents an integer of 0 to 4, n+m is an integer of 1 to 4, and each $S^{61}$ or $S^{62}$ may be the same as or different from every other $S^{61}$ or $S^{62}$).

In formula (6), $M^{61}$, $L^{62}$, $L^{63}$, $E^{61}$, $S^{61}$, $S^{62}$, $R^{67}$, k and l have the same meanings as $M^{41}$, $R^{42}$, $L^{43}$, $E^{41}$, $S^{41}$, $S^{42}$, k and l in formula (4), and the preferred ranges are also the same.

$R^{63}$ to $R^{66}$ and $B^{61}$ to $B^{63}$ have the same meanings as $R^{43}$ to $R^{46}$ and $B^{41}$ to $B^{44}$ in formula (4), and the preferred ranges are also the same.

Each of n and m represents an integer of 0 to 4, and n+m is an integer of 1 to 4. n+m is preferably 1 or 2.

One preferred embodiment of formula (6) is represented by formula (6-1):

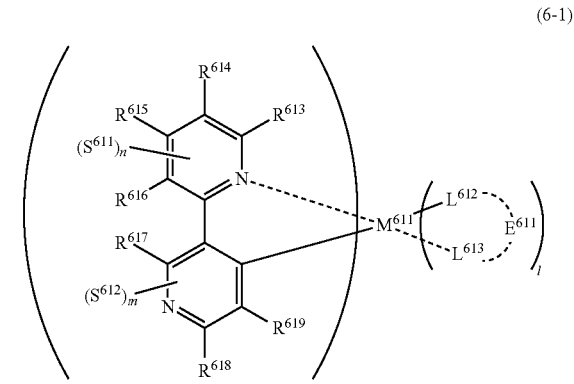

(6-1)

(In formula (6-1), $M^{611}$ represents iridium, each of $R^{613}$ to $R^{619}$ independently represents a hydrogen atom or a substituent, each of $L^{612}$ and $L^{613}$ independently represents a carbon atom, a nitrogen atom, an oxygen atom or a phosphorus atom, $E^{611}$ represents an atomic group for forming a bidentate ligand together with $L^{612}$ and $L^{613}$, k represents an integer of 1 to 3, l represents an integer of 0 to 2, k+l is 3, each of n and m represents an integer of 0 to 4, n+m is an integer of 1 to 4, each of $S^{611}$ and $S^{612}$ independently represents a substituent selected from (a) to (w), and each $S^{611}$ or $S^{612}$ may be the same as or different from every other $S^{611}$ or $S^{612}$).

In formula (6-1), $M^{611}$, $R^{613}$ to $R^{616}$, $L^{612}$, $L^{613}$, $E^{613}$, $E^{611}$, $S^{611}$, $S^{612}$, n, m, k and l have the same meanings as $M^{61}$, $R^{63}$ to $R^{66}$, $L^{62}$, $L^{63}$, $E^{61}$, $S^{61}$, $S^{62}$, n, m, k and l in formula (6), and the preferred ranges are also the same.

Each of $R^{617}$ to $R^{619}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

One preferred embodiment of formula (6-1) is represented by formula (6-2):

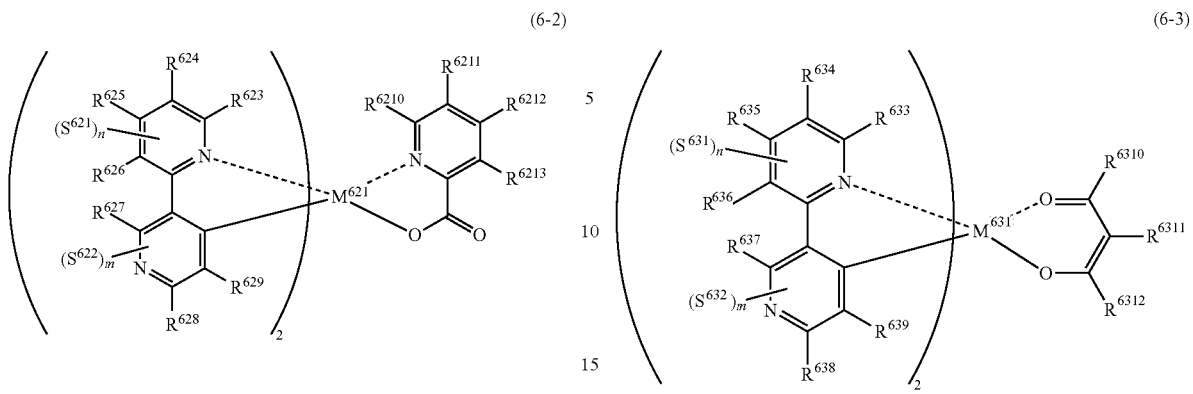

(In formula (6-2), $M^{621}$ represents iridium, each of $R^{623}$ to $R^{629}$ independently represents a hydrogen atom or a substituent, each of $R^{6210}$ to $R^{6213}$ independently represents a hydrogen atom or a substituent, each of $S^{621}$ and $S^{622}$ independently represents a substituent selected from (a) to (w), each of n and m represents an integer of 0 to 4, n+m is an integer of 1 to 4, and each $S^{621}$ or $S^{622}$ may be the same as or different from every other $S^{621}$ or $S^{622}$).

In formula (6-2), $M^{621}$, $R^{623}$ to $R^{626}$, $R^{627}$ to $R^{629}$, $S^{621}$, $S^{622}$, n and m have the same meanings as $M^{611}$, $R^{613}$ to $R^{616}$, $R^{617}$ to $R^{619}$, $S^{611}$, $S^{612}$, n and m in formula (6-1), and the preferred ranges are also the same.

$R^{6210}$ to $R^{6213}$ have the same meanings as $R^{5813}$ to $R^{5816}$ in formula (5-8), and the preferred ranges are also the same.

Each of $R^{623}$ to $R^{626}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

One preferred embodiment of formula (6-1) is represented by formula (6-3):

(In formula (6-3), $M^{631}$ represents iridium, each of $R^{633}$ to $R^{6312}$ independently represents a hydrogen atom or a substituent, each of n and m represents an integer of 0 to 4, n+m is an integer of 1 to 4, each of $S^{631}$ and $S^{632}$ independently represents a substituent selected from (a) to (w), and each $S^{631}$ or $S^{632}$ may be the same as or different from every other $S^{631}$ or $S^{632}$).

In formula (6-3), $M^{631}$, $R^{633}$ to $R^{636}$, $R^{637}$ to $R^{639}$, $S^{631}$, $S^{632}$, n and m have the same meanings as $M^{611}$, $R^{613}$ to $R^{616}$, $R^{617}$ to $R^{619}$, $S^{611}$, $S^{612}$, n and m in formula (6-1), and the preferred ranges are also the same.

Each of $R^{6310}$ to $R^{6312}$ independently represents a hydrogen atom or a substituent selected from substituents including Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of $R^{6310}$ to $R^{6312}$ is preferably a hydrogen atom, a methyl group or a tert-butyl group.

One preferred embodiment of formula (6-1) is represented by formula (6-4):

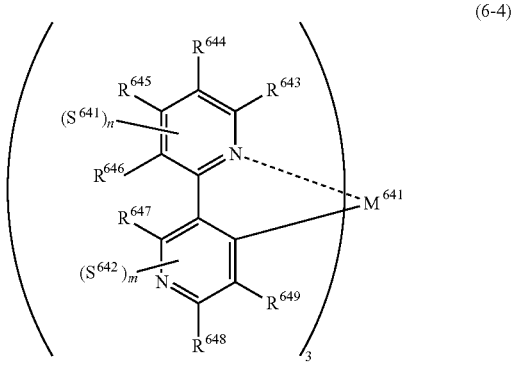

(6-4)

(In formula (6-4), $M^{641}$ represents iridium, each of $R^{643}$ to $R^{649}$ independently represents a hydrogen atom or a substituent, each of $S^{641}$ and $S^{642}$ independently represents a substituent selected from (a) to (w), each of n and m represents an integer of 0 to 4, n+m is an integer of 1 to 4, and each $S^{641}$ or $S^{642}$ may be the same as or different from every other $S^{641}$ or $S^{642}$).

In formula (6-4), $M^{641}$, $R^{643}$ to $R^{646}$, $R^{647}$ to $R^{649}$, $S^{641}$, $S^{642}$, n and m have the same meanings as $M^{611}$, $R^{613}$ to $R^{616}$, $R^{617}$ to $R^{619}$, $S^{611}$, $S^{612}$, n and m in formula (6-1), and the preferred ranges are also the same.

The compound represented by formula (3) is preferably represented by the following formula (7):

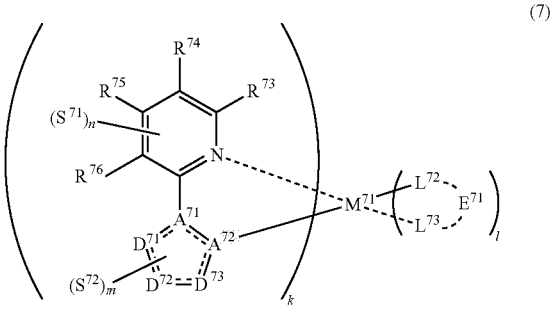

(7)

(In formula (7), $M^{71}$ represents iridium, each of $R^{73}$ to $R^{76}$ independently represents a hydrogen atom or a substituent, each of $A^{71}$ and $A^{72}$ independently represents a nitrogen atom or a carbon atom, each of $D^{71}$ to $D^{73}$ independently represents an atom selected from carbon, nitrogen, oxygen, sulfur and silicon, the bond between atoms in the 5-membered ring formed by $D^{71}$ to $D^{73}$, $A^{71}$ and $A^{72}$ represents a single bond or a double bond, each of $D^{71}$ to $D^{73}$ when these can be further substituted may have a substituent, each of $L^{72}$ and $L^{73}$ represents a carbon atom, a nitrogen atom, an oxygen atom or a phosphorus atom, $E^{71}$ represents an atomic group for forming a bidentate ligand together with $L^{72}$ and $L^{73}$, k represents an integer of 1 to 3, l represents an integer of 0 to 2, k+l is 3, each of $S^{71}$ and $S^{72}$ independently represents a substituent selected from (a) to (w), each of n and m represents an integer of 0 to 4, n+m is an integer of 1 to 4, and each $S^{71}$ or $S^{72}$ may be the same as or different from every other $S^{71}$ or $S^{72}$).

In formula (7), $M^{71}$, $R^{73}$ to $R^{76}$, $L^{72}$, $L^{73}$, $E^{71}$, $S^{71}$, $S^{72}$, n, m, k and l have the same meanings as $M^{31}$, $R^{33}$ to $R^{36}$, $L^{32}$, $L^{33}$, $E^{31}$, $S^{31}$, $S^{32}$, n, m, k and l in formula (3), and the preferred ranges are also the same.

Each of $A^{71}$ and $A^{72}$ represents a nitrogen atom or a carbon atom, and these form an aromatic heterocyclic ring or aromatic hydrocarbon ring together with $D^{71}$ to $D^{73}$.

Each of $D^{71}$ to $D^{73}$ independently represents an atom selected from carbon, nitrogen, oxygen, sulfur and silicon, and the bond between atoms in the 5-membered ring formed by $D^{71}$ to $D^{73}$, $A^{71}$ and $A^{72}$ is not particularly limited but may be any combination of a single bond and a double bond. Each of $D^{71}$ to $D^{73}$ is preferably a carbon atom or a nitrogen atom.

In the 5-membered ring formed by $D^{71}$ to $D^{73}$, $A^{71}$ and $A^{72}$, the number of nitrogen atoms is preferably from 1 to 3, more preferably from 1 to 2.

Each of $D^{71}$ to $D^{73}$ when these can be further substituted may have a substituent selected from Substituent Group A. The substituents may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group, yet still more preferably a methyl group, an ethyl group, an isopropyl group, a tert-butyl group, a trifluoromethyl group, a fluorine atom, an alkyl group-substitutable aryl group or a cyano group, even yet still more preferably a methyl group, a tert-butyl group, a trifluoromethyl group, an alkyl group-substitutable aryl group, a fluorine atom or a cyano group, more preferably a methyl group, a tert-butyl group, a trifluoromethyl group, a fluorine atom or a cyano group, still more preferably a tert-butyl group or a trifluoromethyl group, and most preferably a trifluoromethyl group.

In the 5-membered ring formed by $D^{71}$ to $D^{73}$, $A^{71}$ and $A^{72}$, a combination where each of $A^{71}$ and $D^{71}$ is a nitrogen atom and each of $D^{72}$, $D^{73}$ and $A^{72}$ is a carbon atom and a combination where $D^{71}$ is a sulfur atom and each of $A^{71}$, $A^{72}$, $D^{72}$ and $D^{73}$ is a carbon atom are preferred. These are represented by the following partial structures.

Partial Structure (7-1)

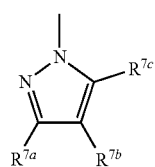

Partial Structure (7-2)

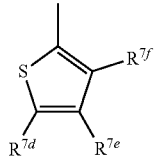

Each of $R^{7a}$ to $R^{7f}$ independently represents a hydrogen atom or a substituent. Each $R^7$ may be the same as or different from every other $R^7$. Also, each of $R^{7a}$ to $R^{7f}$ may further have a substituent, and those described as Substituent Group A can be applied to the substituent.

Furthermore, $R^{7a}$ to $R^{7f}$ may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

Each of $R^{7a}$ to $R^{7f}$ is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amino group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

One preferred embodiment of formula (7) is represented by formula (7-1):

(7-1)

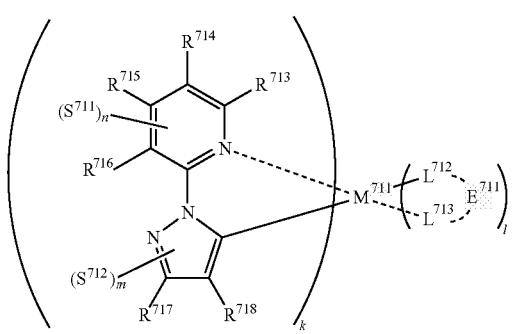

(In formula (7-1), $M^{711}$ represents iridium, each of $R^{713}$ to $R^{718}$ independently represents a hydrogen atom or a substituent, each of $L^{712}$ and $L^{713}$ independently represents a carbon atom, a nitrogen atom, an oxygen atom or a phosphorus atom, $E^{711}$ represents an atomic group for forming a bidentate ligand together with $L^{712}$ and $L^{713}$, k represents an integer of 1 to 3, l represents an integer of 0 to 2, k+l is 3, each of $S^{711}$ and $S^{712}$ independently represents a substituent selected from (a) to (w), each of n and m represents an integer of 0 to 4, n+m is an integer of 1 to 4, and each $S^{711}$ or $S^{712}$ may be the same as or different from every other $S^{711}$ or $S^{712}$).

In formula (7-1), $M^{71}$, $R^{713}$ to $R^{718}$, $L^{712}$, $L^{713}$, $E^{711}$, $S^{711}$, $S^{712}$, n, m, k and l have the same meanings as $M^{71}$, $R^{73}$ to $R^{76}$, $L^{72}$, $L^{73}$, $E^{71}$, $S^{71}$, $S^{72}$, n, m, k and l in formula (7), and the preferred ranges are also the same.

The compound represented by formula (2) is preferably represented by the following formula (8):

(8)

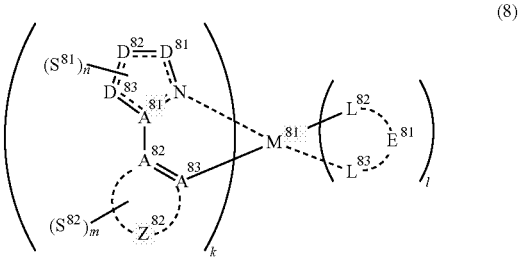

(In formula (8), $M^{81}$ represents a metal belong to Groups 8 to 11 in the periodic table of elements, each of $A^{81}$ to $A^{83}$ independently represents a nitrogen atom or a carbon atom, each of $D^{81}$ to $D^{83}$ independently represents an atom selected from carbon, nitrogen, oxygen, sulfur and silicon, the bond between atoms in the 5-membered ring formed by $D^{81}$ to $D^{83}$, $A^{81}$ and the N atom represents a single bond or a double bond, each of $D^{81}$ to $D^{83}$ when these can be further substituted may have a substituent, $Z^{82}$ represents an aromatic heterocyclic ring or an aromatic hydrocarbon ring, each of $L^{82}$ and $L^{83}$ represents a carbon atom, a nitrogen atom, an oxygen atom or a phosphorus atom, $E^{81}$ represents an atomic group for forming a bidentate ligand together with $L^{82}$ and $L^{83}$, k represents an integer of 1 to 3, l represents an integer of 0 to 2, k+l is 2 or 3, each of $S^{81}$ and $S^{82}$ independently represents a substituent selected from (a) to (w), each of n and m represents an integer of 0 to 4, n+m is an integer of 1 to 4, and each $S^{81}$ or $S^{82}$ may be the same as or different from every other $S^{81}$ or $S^{82}$).

In formula (8), $M^{81}$, $A^{82}$, $A^{83}$, $Z^{82}$, $L^{82}$, $L^{83}$, $E^{81}$, $S^{81}$, $S^{82}$, n, m, k and l have the same meanings as $M^{21}$, $A^{21}$, $A^{22}$, $Z^{22}$, $L^{22}$, $L^{23}$, $E^{21}$, $S^{21}$, $S^{22}$, n, m, k and l in formula (2), and the preferred ranges are also the same.

Each of $D^{81}$ to $D^{83}$ independently represents an atom selected from carbon, nitrogen, oxygen, sulfur and silicon, and the bond between atoms in the 5-membered ring formed by $D^{81}$ to $D^{83}$, $A^{81}$ and the nitrogen atom is not particularly limited but may be any combination of a single bond and a double bond. Each of $D^{81}$ to $D^{83}$ is preferably a carbon atom or a nitrogen atom.

In the 5-membered ring formed by $D^{81}$ to $D^{83}$, $A^{81}$ and the nitrogen atom, the number of nitrogen atoms is preferably from 1 to 3, more preferably from 1 to 2.

Each of $D^{81}$ to $D^{83}$ when these can be further substituted may have a substituent selected from Substituent Group A. The substituents may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

The compound represented by formula (8) is preferably represented by the following formula (9):

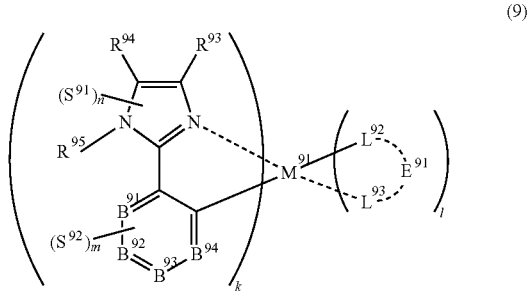

(In formula (9), $M^{91}$ represents a metal belong to Groups 8 to 11 in the periodic table of elements, each of $R^{93}$ and $R^{94}$ independently represents a hydrogen atom or a substituent, $R^{95}$ represents a hydrogen atom or a substituent, each of $B^{91}$ to $B^{94}$ independently represents a nitrogen atom or C—$R^{96}$, $R^{96}$ represents a hydrogen atom or a substituent, each $R^{96}$ may be the same as or different from every other $R^{96}$, each of $L^{92}$ and $L^{93}$ represents a carbon atom, a nitrogen atom, an oxygen atom or a phosphorus atom, $E^{91}$ represents an atomic group for forming a bidentate ligand together with $L^{92}$ and $L^{93}$, k represents an integer of 1 to 3, l represents an integer of 0 to 2, k+l is 2 or 3, each of $S^{91}$ and $S^{92}$ independently represents a substituent selected from (a) to (w), each of n and m represents an integer of 0 to 4, n+m is an integer of 1 to 4, and each $S^{91}$ or $S^{92}$ may be the same as or different from every other $S^{91}$ or $S^{92}$).

In formula (9), $M^{91}$, $L^{92}$, $L^{93}$, $E^{91}$, $S^{91}$, $S^{92}$, n, m, k and l have the same meanings as $M^{81}$, $L^{82}$, $L^{83}$, $E^{81}$, $S^{81}$, $S^{82}$, n, m, k and l in formula (8), and the preferred ranges are also the same.

Each of $B^{91}$ to $B^{94}$ independently represents a nitrogen atom or C—$R^{96}$, and $R^{96}$ represents a hydrogen atom or a substituent. The combination of $B^{91}$ to $B^{94}$ is not particularly limited but out of $B^{91}$ to $B^{94}$, the number of nitrogen atoms is preferably from 0 to 2, more preferably from 0 to 1.

Each of $R^{93}$ and $R^{94}$ independently represents a hydrogen atom or a substituent selected from substituents including Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

$R^{95}$ represents a hydrogen atom or a substituent selected from substituents including Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an alkoxy group, an aryloxy group, a cyano group, a fluorine atom or a heterocyclic group, still more preferably an alkyl group, a cycloalkyl group, a trifluoromethyl group or an aryl group.

As for the substituent represented by $R^{96}$, those described above as Substituent Group A can be applied.

Each $R^{96}$ may be the same as or different from every other $R^{96}$. $R^{96}$ may further have a substituent, and those described above as Substituent Group A can be applied to the substituent. Also, $R^{96}$'s may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{96}$ is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

The compound represented by formula (9) is preferably represented by the following formula (10):

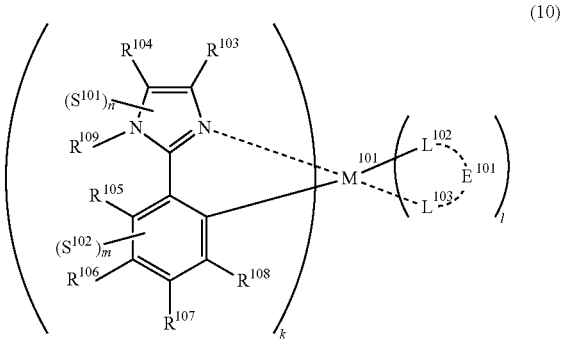

(10)

(In formula (10), $M^{101}$ represents a metal belong to Groups 8 to 11 in the periodic table of elements, each of $R^{103}$ to $R^{108}$ independently represents a hydrogen atom or a substituent, $R^{109}$ represents a hydrogen atom or a substituent, each of $L^{102}$ and $L^{103}$ represents a carbon atom, a nitrogen atom, an oxygen atom or a phosphorus atom, $E^{101}$ represents an atomic group for forming a bidentate ligand together with $L^{102}$ and $L^{103}$, k represents an integer of 1 to 3, l represents an integer of 0 to 2, k+l is 2 or 3, each of $S^{101}$ and $S^{102}$ independently represents a substituent selected from (a) to (w), each of n and m represents an integer of 0 to 4, n+m is an integer of 1 to 4, and each $S^{101}$ or $S^{102}$ may be the same as or different from every other $S^{101}$ or $S^{102}$).

In formula (10), $M^{101}$, $L^{102}$, $L^{103}$, $E^{101}$, $S^{101}$, $S^{102}$, k and l have the same meanings as $M^{91}$, $L^{92}$, $L^{93}$, $E^{91}$, $S^{91}$, $S^{92}$, k and l in formula (9), and the preferred ranges are also the same.

$R^{103}$ to $R^{108}$ have the same meanings as $R^{93}$ and $R^{94}$, and the preferred ranges are also the same.

$R^{109}$ has the same meaning as $R^{95}$, and the preferred range is also the same.

Each of n and m represents an integer of 0 to 4, and n+m is an integer of 1 to 4. n+m is preferably 1 or 2.

The compound represented by formula (9) is preferably represented by the following formula (11):

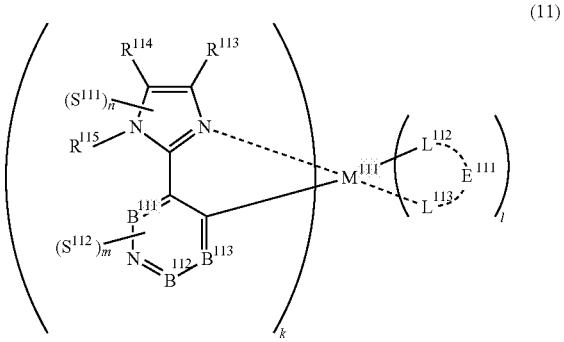

(11)

(In formula (11), $M^{111}$ represents a metal belong to Groups 8 to 11 in the periodic table of elements, each of $R^{113}$ and $R^{114}$ independently represents a hydrogen atom or a substituent, $R^{115}$ represents a hydrogen atom or a substituent, each of $B^{111}$ to $B^{113}$ independently represents a nitrogen atom or C—$R^{116}$, $R^{116}$ represents a hydrogen atom or a substituent, each $R^{116}$ may be the same as or different from every other $R^{116}$, each of $L^{112}$ and $L^{113}$ represents a carbon atom, a nitrogen atom, an oxygen atom or a phosphorus atom, $E^{111}$ represents an atomic group for forming a bidentate ligand together with $L^{112}$ and $L^{113}$, k represents an integer of 1 to 3, l represents an integer of 0 to 2, k+l is 2 or 3, each of $S^{111}$ and $S^{112}$ independently represents a substituent selected from (a) to (w), each of n and m represents an integer of 0 to 4, n+m is an integer of 1 to 4, and each $S^{111}$ or $S^{112}$ may be the same as or different from every other $S^{111}$ or $S^{112}$).

In formula (11), $M^{111}$, $S^{111}$, $S^{112}$, k and l have the same meanings as $M^{91}$, $S^{91}$, $S^{92}$, k and l in formula (9), and the preferred ranges are also the same.

$R^{113}$ and $R^{114}$ have the same meanings as $R^{93}$ and $R^{94}$, and the preferred ranges are also the same.

$R^{115}$ has the same meaning as $R^{95}$, and the preferred range is also the same.

$R^{116}$ has the same meaning as $R^{95}$, and the preferred range is also the same.

$B^{111}$ to $B^{113}$ have the same meanings as $B^{91}$ to $B^{94}$, and the preferred ranges are also the same.

Each of n and m represents an integer of 0 to 4, and n+m is an integer of 1 to 4. n+m is preferably 1 or 2.

One preferred embodiment of formula (11) is represented by formula (11-1):

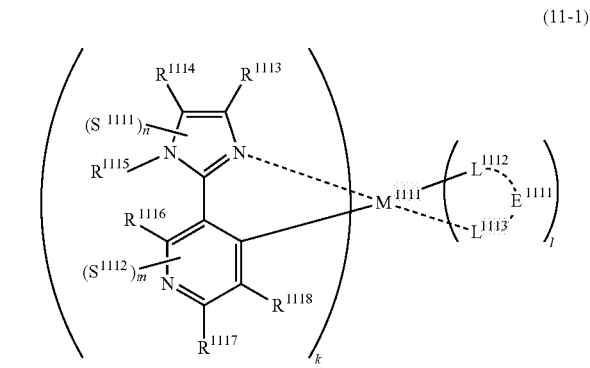

(11-1)

(In formula (11-1), $M^{1111}$ represents a metal belong to Groups 8 to 11 in the periodic table of elements, each of $R^{1113}$ and $R^{1114}$ independently represents a hydrogen atom or a substituent, $R^{1115}$ represents a hydrogen atom or a substituent, each of $R^{1116}$ to $R^{1118}$ independently represents a hydrogen atom or a substituent, each of $L^{1112}$ and $L^{1113}$ represents a carbon atom, a nitrogen atom, an oxygen atom or a phosphorus atom, $E^{1111}$ represents an atomic group for forming a bidentate ligand together with $L^{1112}$ and $L^{1113}$, k represents an integer of 1 to 3, l represents an integer of 0 to 2, k+l is 2 or 3, each of $S^{1111}$ and $S^{1112}$ independently represents a substituent selected from (a) to (w), each of n and m represents an integer of 0 to 4, n+m is an integer of 1 to 4, and each $S^{1111}$ or $S^{1112}$ may be the same as or different from every other $S^{1111}$ or $S^{1112}$).

In formula (11-1), $M^{1111}$, $R^{1113}$, $R^{1114}$, $R^{1115}$, $L^{1112}$, $L^{1113}$, $E^{1111}$, $S^{1111}$, $S^{1112}$, n, m, k and l have the same meanings $R^{91}$, $R^{93}$, $R^{94}$, $R^{95}$, $L^{92}$, $L^{93}$, $E^{91}$, $S^{91}$, $S^{92}$, n, m, k and l in formula (9), and the preferred ranges are also the same.

Each of $R^{1116}$ to $R^{1118}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

One preferred embodiment of formula (11-1) is represented by formula (11-2):

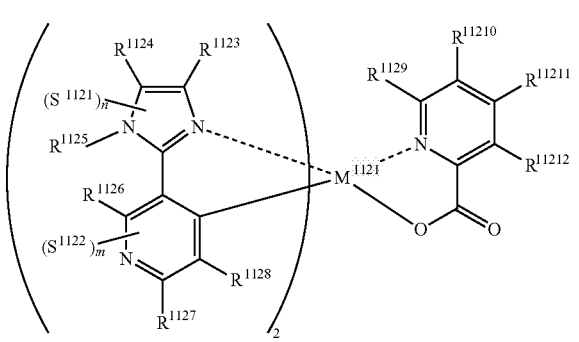

(11-2)

(In formula (11-2), $M^{1121}$ represents a metal belong to Groups 8 to 11 in the periodic table of elements, each of $R^{1123}$ and $R^{1124}$ independently represents a hydrogen atom or a substituent, $R^{1125}$ represents a hydrogen atom or a substituent, each of $R^{1126}$ to $R^{1128}$ and $R^{1129}$ to $R^{11212}$ independently represents a hydrogen atom or a substituent, each of $S^{1121}$ and $S^{1122}$ independently represents a substituent selected from (a) to (w), each of n and m represents an integer of 0 to 4, n+m is an integer of 1 to 4, and each $S^{1121}$ or $S^{1122}$ may be the same as or different from every other $S^{1121}$ or $S^{1122}$).

In formula (11-2), $M^{1121}$, $R^{1123}$, $R^{1124}$, $R^{1125}$, $R^{1126}$ to $R^{1128}$, $S^{1121}$, $S^{1122}$, n and m have the same meanings as $M^{1111}$, $R^{1113}$, $R^{1114}$, $R^{1115}$, $R^{1116}$ to $R^{1118}$, $S^{1111}$, $S^{1112}$, n and m in formula (11-1), and the preferred ranges are also the same.

Each of $R^{1129}$ to $R^{11212}$ independently represents a hydrogen atom or a substituent selected from substituents including Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of $R^{1129}$ to $R^{11212}$ is preferably a hydrogen atom.

One preferred embodiment of formula (11-1) is represented by formula (11-3):

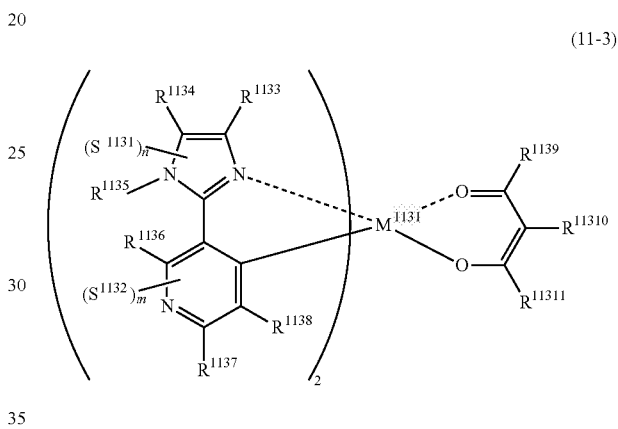

(11-3)

(In formula (11-3), $M^{1131}$ represents a metal belong to Groups 8 to 11 in the periodic table of elements, each of $R^{1133}$ and $R^{1134}$ independently represents a hydrogen atom or a substituent, $R^{1135}$ represents a hydrogen atom or a substituent, each of $R^{1136}$ to $R^{1138}$ and $R^{1139}$ to $R^{11311}$ independently represents a hydrogen atom or a substituent, each of $S^{1131}$ and $S^{1132}$ independently represents a substituent selected from (a) to (w), each of n and m represents an integer of 0 to 4, and n+m is an integer of 1 to 4).

In formula (11-3), $M^{1131}$, $R^{1133}$, $R^{1134}$, $R^{1135}$, $R^{1136}$ to $R^{1138}$, $S^{1131}$, $S^{1132}$, n and m have the same meanings as $M^{1111}$, $R^{1113}$, $R^{1114}$, $R^{1115}$, $R^{1116}$ to $R^{1118}$, $S^{1111}$, $S^{1112}$, n and m in formula (11-1), and the preferred ranges are also the same.

Each of $R^{1139}$ to $R^{11311}$ independently represents a hydrogen atom or a substituent selected from substituents including Substituent Group A. The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amino group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a methyl group, an ethyl group, an isopropyl group, a tert-butyl group, a neopentyl group, an isopentyl group, a trifluoromethyl group, a fluorine atom, a methoxy group, an aryl group or a cyano group.

Each of $R^{1139}$ to $R^{11311}$ is preferably a hydrogen atom or a methyl group.

One preferred embodiment of formula (11-1) is represented by formula (11-4):

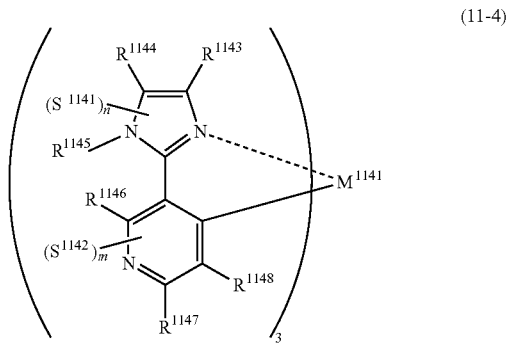

(11-4)

(In formula (11-4), $M^{1141}$ represents a metal belong to Groups 8 to 11 in the periodic table of elements, each of $R^{1143}$ and $R^{1144}$ independently represents a hydrogen atom or a substituent, $R^{1145}$ represents a hydrogen atom or a substituent, each of $R^{1146}$ to $R^{1148}$ independently represents a hydrogen atom or a substituent, each of $S^{1141}$ and $S^{1142}$ independently represents a substituent selected from (a) to (w), each of n and m represents an integer of 0 to 4, n+m is an integer of 1 to 4, and each $S^{1141}$ or $S^{1142}$ may be the same as or different from every other $S^{1141}$ or $S^{1142}$).

In formula (11-4), $M^{1141}$, $R^{1143}$, $R^{1144}$, $R^{1145}$, $R^{1146}$ to $R^{1148}$, $S^{1141}$, $S^{1142}$, n and m have the same meanings as $M^{1111}$, $R^{1113}$, $R^{1114}$, $R^{1115}$, $R^{1116}$ to $R^{1118}$, $S^{1111}$, $S^{1112}$, n and m in formula (11-1), and the preferred ranges are also the same.

The compound represented by formula (8) is preferably represented by the following formula (12):

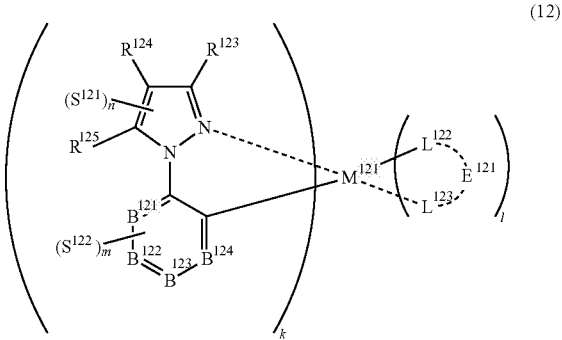

(12)

(In formula (12), $M^{121}$ represents a metal belong to Groups 8 to 11 in the periodic table of elements, each of $R^{123}$ to $R^{125}$ independently represents a hydrogen atom or a substituent, each of $B^{121}$ to $B^{124}$ independently represents a nitrogen atom or C—$R^{126}$, $R^{126}$ represents a hydrogen atom or a substituent, each $R^{126}$ may be the same as or different from every other $R^{126}$, each of $L^{122}$ and $L^{123}$ represents a carbon atom, a nitrogen atom, an oxygen atom or a phosphorus atom, $E^{121}$ represents an atomic group for forming a bidentate ligand together with $L^{122}$ and $L^{123}$, k represents an integer of 1 to 3, l represents an integer of 0 to 2, k+l is 2 or 3, each of $S^{121}$ and $S^{122}$ independently represents a substituent selected from (a) to (w), each of n and m represents an integer of 0 to 4, n+m is an integer of 1 to 4, and each $S^{121}$ or $S^{122}$ may be the same as or different from every other $S^{121}$ or $S^{122}$).

In formula (12), $M^{121}$, $L^{122}$, $L^{123}$, $E^{121}$, $S^{121}$, $S^{122}$, n, m, k and l have the same meanings as $M^{81}$, $L^{82}$, $L^{83}$, $E^{81}$, $S^{81}$, $S^{82}$, n, m, k and l in formula (8), and the preferred ranges are also the same.

Each of $R^{123}$ to $R^{125}$ independently represents a hydrogen atom or a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

Each of $B^{121}$ to $B^{124}$ independently represents a nitrogen atom or C—$R^{126}$, and $R^{126}$ represents a hydrogen atom or a substituent. The combination of $B^{121}$ to $B^{124}$ is not particularly limited but out of $B^{121}$ to $B^{124}$, the number of nitrogen atoms is preferably from 0 to 2, more preferably from 0 to 1.

As for the substituent represented by $R^{126}$, those described above as Substituent Group A can be applied.

Each $R^{126}$ may be the same as or different from every other $R^{126}$. $R^{126}$ may further have a substituent, and those described above as Substituent Group A can be applied to the substituent. Also, $R^{126}$'s may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{126}$ is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group. One preferred embodiment of formula (12) is represented by formula (12-1):

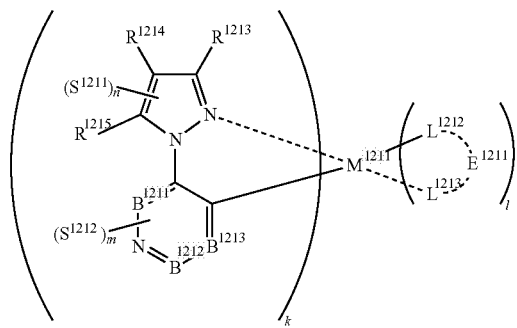

(12-1)

(In formula (12-1), $M^{1211}$ represents a metal belong to Groups 8 to 11 in the periodic table of elements, each of $R^{1213}$ to $R^{1215}$ independently represents a hydrogen atom or a substituent, each of $B^{1211}$ to $B^{1213}$ independently represents a nitrogen atom or C—$R^{1216}$, $R^{1216}$ represents a hydrogen atom or a substituent, each $R^{1216}$ may be the same as or different from every other $R^{1216}$, each of $L^{1212}$ and $L^{1213}$ represents a carbon atom, a nitrogen atom, an oxygen atom or a phosphorus atom, $E^{1211}$ represents an atomic group for forming a bidentate ligand together with $L^{1212}$ and $L^{1213}$, k represents an integer of 1 to 3, l represents an integer of 0 to 2, k+l is 2 or 3, each of $S^{1211}$ and $S^{1212}$ independently represents a substituent selected from (a) to (w), each of n and m represents an integer of 0 to 4, n+m is an integer of 1 to 4, and each $S^{1211}$ or $S^{1212}$ may be the same as or different from every other $S^{1211}$ or $S^{1212}$).

In formula (12-1), $M^{1211}$, $R^{1213}$ to $R^{1215}$, $B^{1211}$ to $B^{1213}$, $L^{1212}$, $L^{1213}$, $E^{1211}$, $S^{1211}$, $S^{1212}$, n, m, k and l have the same meanings as $M^{121}$, $R^{123}$ to $R^{125}$, $B^{121}$ to $B^{124}$, $L^{122}$, $L^{123}$, $E^{121}$, $S^{121}$, $S^{122}$, n, m, k and l in formula (12), and the preferred ranges are also the same.

Formula (12) is preferably represented by formula (12-2).

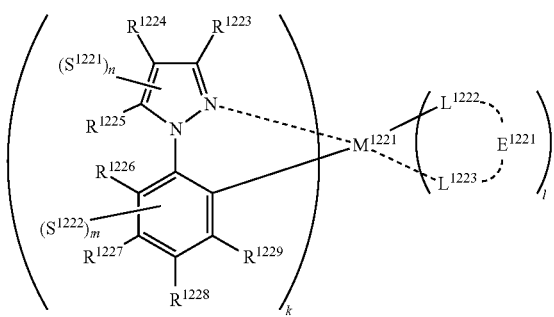

(12-2)

(In formula (12-2), $M^{1221}$ represents a metal belong to Groups 8 to 11 in the periodic table of elements, each of $R^{1223}$ to $R^{1229}$ independently represents a hydrogen atom or a substituent, $R^{1229}$ represents a hydrogen atom or a substituent, each of $L^{1222}$ and $L^{1223}$ represents a carbon atom, a nitrogen atom, an oxygen atom or a phosphorus atom, $E^{1221}$ represents an atomic group for forming a bidentate ligand together with $L^{1222}$ and $L^{1223}$, k represents an integer of 1 to 3, l represents an integer of 0 to 2, k+l is 2 or 3, each of $S^{1221}$ and $S^{1222}$ independently represents a substituent selected from (a) to (w), each of n and m represents an integer of 0 to 4, n+m is an integer of 1 to 4, and each $S^{1221}$ or $S^{1222}$ may be the same as or different from every other $S^{1221}$ or $S^{1222}$).

In formula (12-2), $M^{1221}$, $R^{1223}$ to $R^{1225}$, $L^{1222}$, $L^{1223}$, $E^{1221}$, $S^{1221}$, $S^{1222}$, n, m, k and l have the same meanings as $M^{121}$, $R^{123}$ to $R^{125}$, $L^{122}$, $L^{123}$, $E^{121}$, $S^{121}$, $S^{122}$, n, m, k and l in formula (12), and the preferred ranges are also the same.

Each of $R^{1226}$ to $R^{1229}$ independently represents a hydrogen atom or may have a substituent selected from substituents including Substituent Group A, and the preferred ranges are the same as that of $R^{126}$ in formula (12).

The compound represented by formula (1) is preferably represented by the following formula (13):

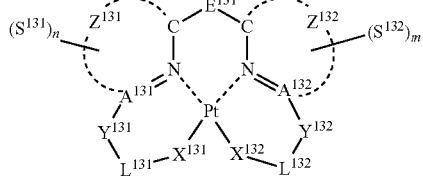

(13)

(In formula (13), each of $A^{131}$ and $A^{132}$ represents a nitrogen atom or a carbon atom, each of $Y^{131}$ and $Y^{132}$ represents a linking group or a single bond, each of $L^{131}$ and $L^{132}$ represents a partial structure having an atom bonded to Pt, each of $Z^{131}$ and $Z^{132}$ represents an aromatic nitrogen-containing heterocyclic ring, each of $X^{131}$ and $X^{132}$ represents an oxygen atom, a sulfur atom, a substituted or unsubstituted nitrogen atom or a single bond, $E^{131}$ represents a divalent linking group, each of $S^{131}$ and $S^{132}$ independently represents a substituent selected from (a) to (w), each of n and m represents an integer of 0 to 4, n+m is an integer of 1 to 4, and each $S^{131}$ or $S^{132}$ may be the same as or different from every other $S^{131}$ or $S^{132}$).

In formula (13) $A^{131}$ to $A^{136}$, $Z^{131}$, $Z^{132}$, $S^{131}$, $S^{132}$, $L^{131}$, $L^{132}$, $X^{131}$, $X^{132}$, $Y^{131}$, $Y^{132}$, n, m, k and l have the same meanings as $A^{11}$ to $A^{13}$, $Z^{11}$, $Z^{12}$, $S^{11}$, $L^{11}$, $X^{11}$, $Y^{11}$, n, m, k and l in formula (1), and the preferred ranges are also the same.

Each of $Y^{131}$ and $Y^{132}$ preferably represents a single bond.

$L^{131}$ preferably represents, together with $X^{131}$ and a carbon atom, a substituted or unsubstituted arylene group bonded to $A^{131}$ through a carbon atom adjacent to the carbon atom bonded to $X^{131}$, together with $X^{131}$ and a carbon atom, a substituted or unsubstituted pyridylene group bonded to $A^{131}$ through a carbon atom adjacent to the carbon atom bonded to $X^{131}$, together with $X^{131}$ and a carbon atom, a substituted or unsubstituted benzofurandiyl group bonded to $A^{131}$ through a carbon atom adjacent to the carbon atom bonded to $X^{131}$, together with $X^{131}$ and a carbon atom, a pyrazolediyl group bonded to $A^{131}$ through a nitrogen atom adjacent to the carbon atom bonded to $X^{131}$, or together with $X^{131}$ and an oxygen atom, a carboxylato group bonded to $A^{131}$ through a carbon atom adjacent to the carbon atom bonded to $X^{131}$.

$L^{132}$ preferably represents, together with $X^{132}$ and a carbon atom, a substituted or unsubstituted arylene group bonded to $A^{132}$ through a carbon atom adjacent to the carbon atom bonded to $X^{132}$, together with $X^{132}$ and a carbon atom, a substituted or unsubstituted pyridylene group bonded to $A^{132}$ through a carbon atom adjacent to the carbon atom bonded to $X^{132}$, together with $X^{132}$ and a carbon atom, a substituted or unsubstituted benzofurandiyl group bonded to $A^{132}$ through a carbon atom adjacent to the carbon atom bonded to $X^{132}$, together with $X^{132}$ and a carbon atom, a pyrazolediyl group bonded to $A^{132}$ through a nitrogen atom adjacent to the carbon atom bonded to $X^{132}$, or together with $X^{132}$ and an oxygen atom, a carboxylato group bonded to $A^{132}$ through a carbon atom adjacent to the carbon atom bonded to $X^{132}$.

Here, the substituent in $L^{131}$ and $L^{132}$ is preferably at least one group selected from a methyl group, a tert-butyl group, a trifluoromethyl group, an alkyl group-substitutable aryl group, a fluorine atom and a cyano group. The aryl group is preferably a phenyl group or a naphthyl group. The aryl group may have a substituent, and the substituent include Substituent Group A and is preferably an alkyl group, an alkyl halide group, a halogen atom or a cyano group, more preferably a methyl group, a tert-butyl group, a trifluoromethyl group, a fluorine atom or a cyano group.

Each of $X^{131}$ and $X^{132}$ preferably represents an oxygen atom or a single bond.

For example, in the case where $L^{131}$ represents a phenylene group, the following structure is preferred.

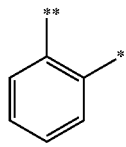

In the structure above, * indicates a bond bonded to $X^{131}$, and ** indicates a bond bonded to $A^{131}$.

For example, in the case where $L^{131}$ represents a pyridylene group, the following structure is preferred.

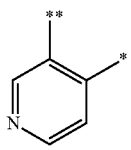

In the structure above, * indicates a bond bonded to $X^{131}$ and ** indicates a bond bonded to $A^{131}$.

For example, in the case where $L^{131}$ represents a benzofurandiyl group, the following structure is preferred.

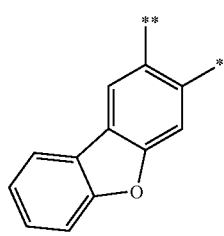

In the structure above, * indicates a bond bonded to $X^{131}$, and ** indicates a bond bonded to $A^{131}$.

For example, in the case where $L^{131}$ represents a pyrazolediyl group, the following structure is preferred.

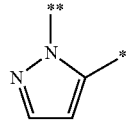

In the structure above, * indicates a bond bonded to $X^{131}$, and ** indicates a bond bonded to $A^{131}$.

For example, in the case where $L^{131}$ represents a carboxylato group, the following structure is preferred.

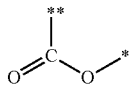

In the structure above, * indicates a bond bonded to $X^{131}$, and ** indicates a bond bonded to $A^{131}$.

$E^{131}$ represents a divalent linking group. The linking group is not particularly limited but is preferably a divalent linking group composed of a single bond, a carbon atom, a nitrogen atom, an oxygen atom, a sulfur atom, a silicon atom or a germanium atom, more preferably a group selected from Linking Group A.

$E^{131}$ is preferably a substituent selected from Linking Group A, and among these, $—C(R^1)(R^2)—$, $—C(R^3)(R^4)C(R^5)(R^6)—$, $—Si(R^7)(R^8)—$, $—N(R^9)—$, $—O—$, $—S—$, $—SO—$, $—SO_2—$ and $—CO—$ are preferred, $—C(R')(R^2)—$, $—C(R^3)(R^4)C(R^5)(R^6)—$, $—Si(R^7)(R^8)—$, and $—S—$ are more preferred, $—C(R')(R^2)—$ and $—C(R^3)(R^4)C(R^5)(R^6)—$ are still more preferred, and $—C(R^1)(R^2)—$ is yet still more preferred.

In $—C(R^1)(R^2)—$, each of $R^1$ and $R^2$ is preferably a hydrogen atom or a substituent selected from Substituent Group B. Each of $R^1$ and $R^2$ is independently preferably an alkyl group or a phenyl group, more preferably a methyl group.

In $—C(R^3)(R^4)_C(R^5)(R^6)—$, each of $R^3$, $R^4$, $R^5$ and $R^6$ is preferably a hydrogen atom or a substituent selected from Substituent Group B.

In $—Si(R^7)(R^8)—$, each of $R^7$ and $R^8$ is preferably a hydrogen atom or a substituent selected from Substituent Group B.

In $—Ge(R^{10})(R^{11})—$, each of $R^{10}$ and $R^{11}$ is preferably a hydrogen atom or a substituent selected from Substituent Group B.

In $—N(R^9)—$, $R^9$ is preferably a hydrogen atom, an alkyl group, a cycloalkyl group or an aryl group, more preferably an alkyl group or an aryl group, still more preferably an aryl group.

In $—P(R^{12})—$, $R^{12}$ has the same meaning as the preferred range of $R^9$.

In formula (13), examples of the aromatic nitrogen-containing heterocyclic ring represented by $Z^{131}$ and $Z^{132}$ include a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an oxazole ring, a benzimidazole ring, a benzothiazole ring, a benzoxazole ring, a quinoxaline ring, a quinazoline ring, a phthalazine ring, a carboline ring, and a ring where a carbon atom of a hydrocarbon ring constituting a carboline ring is further substituted with a nitrogen atom.

Each of $Z^{131}$ and $Z^{132}$ is preferably a pyridine ring, a pyrimidine ring, a pyrazine ring, a benzimidazole ring, an oxadiazole ring, a triazole ring, an imidazole ring, a pyrazole ring, a thiazole ring, an oxazole ring, a benzimidazole ring, a benzothiazole ring, a benzoxazole ring, an isoquinoline ring or a quinoxaline ring, more preferably a pyridine ring, a pyrimidine ring, a pyrazine ring, an imidazole ring, a pyrazole ring, an isoquinoline ring or a quinoxaline ring, still more preferably an isoquinoline ring, a benzoxazole ring, a pyridine ring, an imidazole ring or a pyrazole ring, and most preferably a pyridine ring, an imidazole ring or a pyrazole ring.

The aromatic nitrogen-containing heterocyclic ring represented by $Z^{131}$ and $Z^{132}$ may have a substituent, and those described below as Substituent Group A can be applied to the substituent.

The substituent is preferably a substituted or unsubstituted alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a substituted or unsubstituted alkyl group, a cycloalkyl group, an aryl group, an amino group, an alkoxy group, an aryloxy group, a cyano group, a fluorine atom or a heterocyclic group, still more preferably a methyl group, a tert-butyl group, a trifluoromethyl group, an alkyl group-substitutable aryl group, a fluorine atom or a cyano group, yet still more preferably a methyl group, a tert-butyl group, a trifluoromethyl group, a fluorine atom or a cyano group, even yet still more preferably a methyl group, a tert-butyl group or a fluorine atom, and most preferably a fluorine atom or a methyl group.

As for the substituent which the alkyl group may have, those described as Substituent Group A can be applied. This substituent is preferably a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a cycloalkyl group, an aryl group, an amino group, an alkoxy group, an aryloxy group, a cyano group, a fluorine atom or a heterocyclic group, still more preferably a fluorine atom, a methoxy group, an aryl group or a cyano group, yet still more preferably a fluorine atom or an aryl group.

The compound represented by formula (13) is preferably represented by the following formula (14):

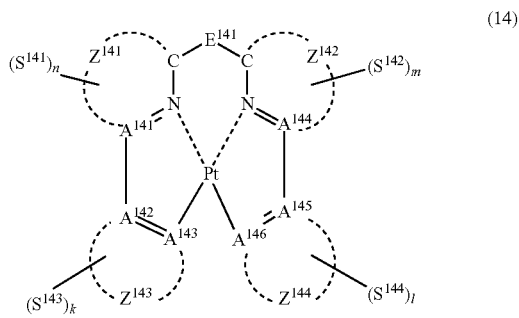

(14)

(In formula (14), each of $A^{141}$ to $A^{146}$ independently represents a nitrogen atom or a carbon atom, each of $Z^{141}$ and $Z^{142}$ independently represents an aromatic nitrogen-containing heterocyclic ring, each of $Z^{143}$ and $Z^{144}$ independently represents an aromatic heterocyclic ring or an aromatic hydrocarbon ring, $E^{141}$ represents a divalent linking group, each of $S^{141}$ to $S^{144}$ independently represents a substituent selected from (a) to (w), each of n, m, k and l represents an integer of 0 to 4, n+m+k+l is an integer of 1 to 4, and each $S^{141}$, $S^{142}$, $S^{143}$ or $S^{144}$ may be the same as or different from every other $S^{141}$, $S^{142}$, $S^{143}$ or $S^{144}$).

In formula (14), $A^{141}$ to $A^{146}$, $Z^{141}$, $Z^{142}$, $S^{141}$ to $S^{144}$, $E^{141}$, n, m, k and l have the same meanings as $A^{131}$ to $A^{133}$, $Z^{131}$, $Z^{132}$, $S^{131}$, $S^{132}$, $E^{131}$, n, m, k and l in formula (13), and the preferred ranges are also the same.

Each of $A^{142}$ and $A^{143}$ represents a nitrogen atom or a carbon atom, and these form an aromatic heterocyclic ring or an aromatic hydrocarbon ring together with $Z^{143}$.

Each of $A^{145}$ and $A^{146}$ represents a nitrogen atom or a carbon atom, and these form an aromatic heterocyclic ring or an aromatic hydrocarbon ring together with $Z^{144}$.

Examples of the aromatic heterocyclic ring or aromatic hydrocarbon ring represented by $Z^{143}$ and $Z^{144}$ include an aryl group (e.g., benzene ring, naphthalene ring, anthracene ring, pyrene ring, phenanthrene ring, perylene ring), a pyridine ring, a quinoline ring, an isoquinoline ring, a phenanthridine ring, a pyrimidine ring, a pyrazine ring, a pyridazine ring, a triazine ring, a cinnoline ring, an acridine ring, a phthalazine ring, a quinazoline ring, a quinoxaline ring, a naphthyridine ring, a pteridine ring, a pyrrole ring, a pyrazole ring, a triazole ring, an indole ring, a carbazole ring, an indazole ring, a benzimidazole ring, an oxazole ring, a thiazole ring, an oxadiazole ring, a thiadiazole ring, a benzoxazole ring, a benzothiazole ring, an imidazopyridine ring, a thiophene ring, a benzothiophene ring, a furan ring, a benzofuran ring, a phosphole ring, a phosphinine ring and a silole ring.

Each of $Z^{143}$ and $Z^{144}$ is preferably a benzene ring, a naphthalene ring, a benzoxazole ring, a pyrazole ring, an imidazole ring, a triazole ring, a pyridine ring, an indole ring or a thiophene ring, more preferably a benzene ring, a pyrazole ring, a pyridine ring, a benzoxazole ring or a thiophene ring, still more preferably an aryl group, a pyridyl group, a benzofuranyl group or a pyrazolyl group.

Each of $Z^{143}$ and $Z^{144}$ may have a substituent, and those described as Substituent Group A can be applied to the substituent. Also, each of $Z^{143}$ and $Z^{144}$ may form a condensed ring with another ring.

The substituent thereof is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a substituted or unsubstituted alkyl group, a cycloalkyl group, an aryl group, an amino group, an alkoxy group, an aryloxy group, a cyano group, a fluorine atom or a heterocyclic group, still more preferably a methyl group, a tert-butyl group, a trifluoromethyl group, an alkyl group-substitutable aryl group, a fluorine atom or a cyano group, yet still more preferably a methyl group, a tert-butyl group, a trifluoromethyl group, a fluorine atom or a cyano group, even yet still more preferably a methyl group, a tert-butyl group or a fluorine atom, and most preferably a fluorine atom or a methyl group.

Each of n and m represents an integer of 0 to 4, and n+m is an integer of 1 to 4. n+m is preferably 1 or 2.

The compound represented by formula (14) is preferably represented by the following formula (15):

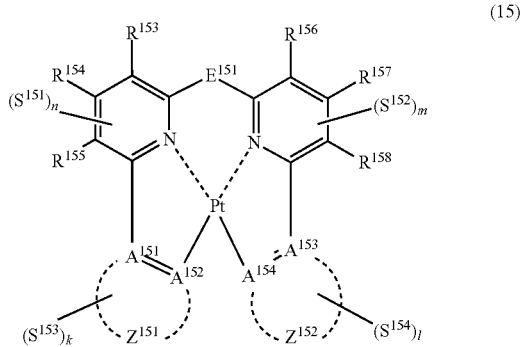

(15)

(In formula (15), each of $A^{151}$ to $A^{154}$ independently represents a nitrogen atom or a carbon atom, each of $R^{153}$ to $R^{158}$ independently represents a hydrogen atom or a substituent, each of $Z^{151}$ and $Z^{152}$ independently represents an aromatic heterocyclic ring or an aromatic hydrocarbon ring, $E^{151}$ represents a divalent linking group, each of 5151 to $S^{154}$ independently represents a substituent selected from (a) to (w), each of n, m, k and l represents an integer of 0 to 4, n+m+k+l is an integer of 1 to 4, and each $S^{151}$, $S^{152}$, $S^{153}$ or $S^{154}$ may be the same as or different from every other $S^{151}$, $S^{152}$, $S^{153}$ or $S^{154}$).

In formula (15), $A^{151}$, $A^{152}$, $A^{153}$, $A^{154}$, $Z^{151}$, $Z^{153}$, $E^{151}$, n m k and l have the same meanings as $A^{142}$, $A^{143}$, $A^{145}$, $A^{146}$, $Z^{143}$, $Z^{144}$, $E^{141}$, $S^{141}$ to $S^{144}$, n, m, k and l in formula (14), and the preferred ranges are also the same.

Each of $R^{153}$ to $R^{158}$ independently represents a hydrogen atom or may have a substituent selected from substituents including Substituent Group A. The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a methyl group, a trifluoromethyl group, a fluorine atom, a methoxy group, an aryl group or a cyano group.

Each of $R^{153}$ to $R^{158}$ is preferably a hydrogen atom, a methyl group, a tert-butyl group, a trifluoromethyl group, an alkyl group-substitutable aryl group, a fluorine atom or a cyano group, more preferably a hydrogen atom, a methyl group, a tert-butyl group, a trifluoromethyl group, a fluorine atom or a cyano group, still more preferably a hydrogen atom, a methyl group, a tert-butyl group or a fluorine atom, yet still more preferably a hydrogen atom, a fluorine atom or a methyl group.

In the case where each of $R^{153}$ to $R^{158}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

The compound represented by formula (15) is preferably represented by the following formula (16):

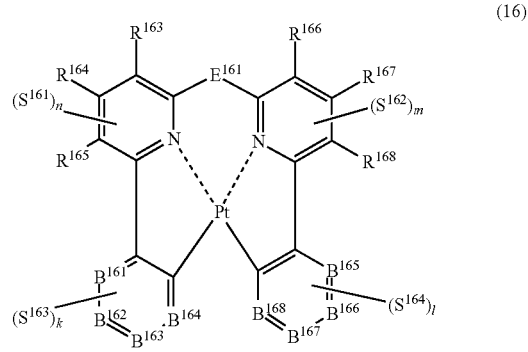

(16)

(In formula (16), each of $R^{163}$ to $R^{168}$ independently represents a hydrogen atom or a substituent, each of $B^{161}$ to $B^{168}$ independently represents a nitrogen atom or C—$R^{169}$, $R^{169}$ represents a hydrogen atom or a substituent, each $R^{169}$ may be the same as or different from every other $R^{169}$, $E^{161}$ represents a divalent linking group, each of $S^{161}$ to $S^{164}$ independently represents a substituent selected from (a) to (w), each of n, m, k and l represents an integer of 0 to 4, n+m+k+l is an integer of 1 to 4, and each $S^{161}$, $S^{162}$, $S^{163}$ or $S^{164}$ may be the same as or different from every other $S^{161}$, $S^{162}$, $S^{163}$ or $S^{164}$).

In formula (16), $R^{163}$ to $R^{168}$, $E^{161}$, $S^{161}$ to $S^{164}$, n, m, k and l have the same meanings as $R^{153}$ to $R^{158}$, $E^{151}$, $S^{151}$ to $S^{154}$, n, m, k and l in formula (15), and the preferred ranges are also the same.

Each of $B^{161}$ to $B^{168}$ independently represents a nitrogen atom or C—$R^{169}$, and $R^{169}$ represents a hydrogen atom or a substituent. The combination of $B^{161}$ to $B^{168}$ is not particularly limited but out of $B^{161}$ to $B^{164}$, the number of nitrogen atoms is preferably from 0 to 2, more preferably from 0 to 1. Also, out of $B^{165}$ to $B^{168}$, the number of nitrogen atoms is preferably from 0 to 2, more preferably from 0 to 1.

As for the substituent represented by $R^{169}$, those described as Substituent Group A can be applied.

Each $R^{169}$ may be the same as or different from every other $R^{169}$. $R^{169}$ may further have a substituent, and those described above as Substituent Group A can be applied to the substituent. Also, $R^{169}$'s may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{169}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an amino group, an alkoxy group, an aryloxy group, a cyano group, a fluorine atom or a heterocyclic group, still more preferably a hydrogen atom, a methyl group, a tert-butyl group, a trifluoromethyl group, an alkyl group-substitutable aryl group, a fluorine atom or a cyano group, yet still more preferably a hydrogen atom, a methyl group, a tert-butyl group, a trifluoromethyl group, a fluorine atom or a cyano group, even yet still more preferably a hydrogen atom, a methyl group, a tert-butyl group or a fluorine atom, and most preferably a hydrogen atom, a fluorine atom, or a methyl group.

In the case where $R^{169}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

The compound represented by formula (15) is preferably represented by the following formula (17):

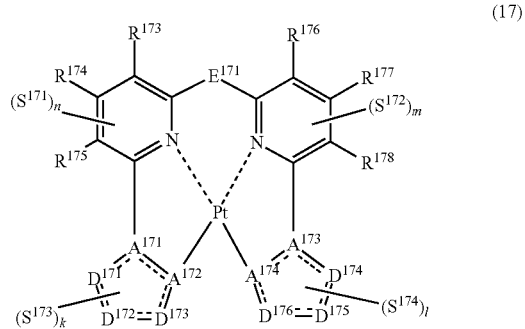

(17)

(In formula (17), each of $R^{173}$ to $R^{178}$ independently represents a hydrogen atom or a substituent, each of $A^{171}$ to $A^{174}$ independently represents a nitrogen atom or a carbon atom, each of $D^{171}$ to $D^{176}$ independently represents an atom selected from carbon, nitrogen, oxygen, sulfur and silicon, the bond between atoms in the 5-membered ring formed by $D^{171}$ to $D^{173}$, $A^{171}$ and $A^{172}$ or by $D^{174}$ to $D^{176}$, $A^{173}$ and $A^{174}$ represents a single bond or a double bond, each of $D^{171}$ to $D^{176}$ when these can be further substituted may have a substituent, $E^{171}$ represents a divalent linking group, each of $S^{171}$ to $S^{174}$ independently represents a substituent selected from (a) to (w), each of n, m, k and l represents an integer of 0 to 4, n+m+k+l is an integer of 1 to 4, and each $S^{171}$, $S^{172}$, $S^{173}$ or $S^{174}$ may be the same as or different from every other $S^{171}$, $S^{173}$ or $S^{174}$).

In formula (17), $R^{173}$ to $R^{178}$, $E^{171}$, $S^{171}$ to $S^{174}$, n, m, k and l have the same meanings as $R^{153}$ to $R^{158}$, $E^{151}$, $S^{151}$ to $S^{154}$, n, m, k and l in formula (15), and the preferred ranges are also the same.

Each of $A^{171}$, $A^{172}$, $A^{173}$ and $A^{174}$ independently represents a nitrogen atom or a carbon atom. $A^{171}$ and $A^{172}$ form an aromatic heterocyclic ring or an aromatic hydrocarbon ring together with $D^{171}$ to $D^{173}$, and $A^{173}$ and $A^{174}$ form an aromatic heterocyclic ring or an aromatic hydrocarbon ring together with $D^{174}$ to $D^{176}$.

Each of $D^{171}$ to $D^{173}$ and $D^{174}$ to $D^{176}$ independently represents an atom selected from carbon, nitrogen, oxygen, sulfur and silicon. The bond between atoms in the 5-membered ring formed by $A^{171}$, $A^{172}$ and $D^{171}$ to $D^{173}$ or by $A^{173}$, $A^{174}$ and $D^{174}$ to $D^{176}$ is not particularly limited but may be any combination of a single bond and a double bond. Each of $D^{171}$ to $D^{173}$ and $D^{174}$ to $D^{176}$ is preferably a carbon atom or a nitrogen atom.

In the 5-membered ring formed by $A^{171}$, $A^{172}$ and $D^{171}$ to $D^{173}$ or by $A^{173}$, $A^{174}$ and $D^{174}$ to $D^{176}$, the number of nitrogen atoms is preferably from 1 to 3, more preferably from 1 to 2.

Each of $A^{171}$ and $A^{173}$ preferably represents a nitrogen torn. Each of $A^{172}$ and $A^{174}$ preferably represents a carbon atom.

Each of $D^{171}$ and $D^{174}$ preferably represents a nitrogen atom. Each of $D^{172}$, $D^{173}$, $D^{175}$ and $D^{176}$ preferably represents C—$R^{179}$. $R^{179}$ represents a hydrogen atom or a substituent. The substituent includes Substituent Group A. The substituents may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{179}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an amino group, an alkoxy group, an aryloxy group, a cyano group, a fluorine atom or a heterocyclic group, still more preferably a hydrogen atom, a substituted or unsubstituted alkyl group, a fluorine atom, a methoxy group, an aryl group or a cyano group, yet still more preferably a hydrogen atom, a methyl group, an ethyl group, an isopropyl group, a tert-butyl group, a trifluoromethyl group, a fluorine atom, an alkyl group-substitutable aryl group or a cyano group, even yet still more preferably a hydrogen atom, a methyl group, a tert-butyl group, a trifluoromethyl group, an alkyl group-substitutable aryl group, a fluorine atom or a cyano group, more preferably a hydrogen atom, a methyl group, a tert-butyl group or a trifluoromethyl group, and still more preferably a hydrogen atom or a trifluoromethyl group.

Each of $D^{171}$ to $D^{173}$ and $D^{174}$ to $D^{176}$ when these can be further substituted may have a substituent selected from Substituent Group A. The substituents may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

The substituent which each of $D^{171}$ to $D^{173}$ and $D^{174}$ to $D^{176}$ may have is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a fluorine atom, a methoxy group, an aryl group or a cyano group. In particular, the substituent is preferably a substituted or unsubstituted alkyl group, a fluorine atom or a cyano group, and most preferably a methyl group, a trifluoromethyl group, a fluorine atom or a cyano group.

The compound represented by formula (14) is preferably represented by the following formula (18):

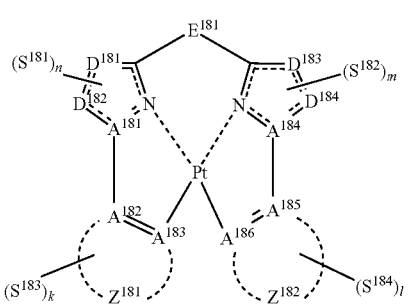

(18)

(In formula (18), each of $A^{181}$ to $A^{186}$ independently represents a nitrogen atom or a carbon atom, each of $D^{181}$ to $D^{184}$ independently represents an atom selected from carbon, nitrogen, oxygen, sulfur and silicon, the bond between atoms in the 5-membered ring formed by $D^{181}$, $D^{182}$, $A^{181}$, the nitrogen atom and the carbon atom or by $D^{183}$, $D^{184}$, $A^{184}$, the nitrogen atom and the carbon atom represents a single bond or a double bond, each of $D^{181}$ to $D^{184}$ when these can be further substituted may have a substituent, each of $Z^{181}$ and $Z^{182}$ independently represents an aromatic heterocyclic ring or an aromatic hydrocarbon ring, $E^{181}$ represents a divalent linking group, each of $S^{181}$ to $S^{184}$ independently represents a substituent selected from (a) to (w), each of n, m, k and l represents an integer of 0 to 4, n+m+k+l is an integer of 1 to 4, and each $S^{181}$, $S^{182}$, $S^{183}$ or $S^{184}$ may be the same as or different from every other $S^{181}$, $S^{182}$, $S^{183}$ or $S^{184}$).

In formula (18), $A^{182}$, $A^{183}$, $A^{185}$, $A^{186}$, $Z^{181}$, $Z^{182}$, $E^{181}$, $S^{181}$ to $S^{184}$, n, m, k and l have the same meanings as $A^{142}$, $A^{143}$, $A^{145}$, $A^{146}$, $Z^{143}$, $Z^{144}$, $E^{141}$, $S^{141}$ to $S^{144}$, n, m, k and l in formula (14), and the preferred ranges are also the same.

Each of $D^{181}$, $D^{182}$, $D^{183}$ and $D^{184}$ independently represents an atom selected from carbon, nitrogen, oxygen, sulfur and silicon. The bond between atoms in the 5-membered ring formed by $D^{181}$, $D^{182}$, $A^{181}$, the nitrogen atom and the carbon atom or by $D^{183}$, $D^{184}$, $A^{184}$, the nitrogen atom and the carbon atom is not particularly limited but may be any combination of a single bond and a double bond. Each of $D^{181}$, $D^{182}$, $D^{183}$ and $D^{184}$ is preferably a carbon atom or a nitrogen atom.

Each of $D^{181}$ to $D^{184}$ preferably represents a nitrogen atom or C–$R^{18}$. $R^{18}$ represents a hydrogen atom or a substituent. The substituent includes Substituent Group A. The substituents may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{18}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfonyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an amino group, an alkoxy group, an aryloxy group, a cyano group, a fluorine atom or a heterocyclic group, still more preferably a hydrogen atom, a substituted or unsubstituted alkyl group, a trifluoromethyl group, a fluorine atom, a methoxy group, an aryl group or a cyano group, yet still more preferably a hydrogen atom, a methyl group, an ethyl group, an isopropyl group, a tert-butyl group, a trifluoromethyl group, a fluorine atom, an alkyl group-substitutable aryl group or a cyano group, even yet still more preferably a hydrogen atom, a methyl group, a tert-butyl group, a trifluoromethyl group, an alkyl group-substitutable aryl group, a fluorine atom or a cyano group, more preferably a hydrogen atom, a methyl group, a tert-butyl group, a trifluoromethyl group, an alkyl group-substitutable aryl group, a fluorine atom or a cyano group, still more preferably a hydrogen atom, a methyl group, a tert-butyl group or an alkyl group-substitutable aryl group, and most preferably a hydrogen atom or a methyl group.

In the 5-membered ring formed by $D^{181}$, $D^{182}$, $A^{181}$, the nitrogen atom and the carbon atom or by $D^{183}$, $D^{184}$, $A^{184}$, the nitrogen atom and the carbon atom, the number of nitrogen atoms is preferably from 1 to 3, more preferably from 1 to 2.

The 5-membered ring formed by $D^{181}$, $D^{182}$, $A^{181}$, the nitrogen atom and the carbon atom or by $D^{183}$, $D^{184}$, $A^{184}$, the nitrogen atom and the carbon atom is preferably an imidazole ring or a pyrazole ring.

Each of $D^{181}$, $D^{182}$, $D^{183}$ and $D^{184}$ when these can be further substituted may have a substituent selected from Substituent Group A. The substituents may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

The substituent is preferably an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group or a silyl group, more preferably a substituted or unsubstituted alkyl group, a cycloalkyl group, an aryl group, an amino group, an alkoxy group, an aryloxy group, a cyano group, a fluorine atom or a heterocyclic group, still more preferably a substituted or unsubstituted alkyl group, a trifluoromethyl group, a fluorine atom, a methoxy group, an aryl group or a cyano group. In particular, the substituent is preferably a substituted or unsubstituted alkyl group, a trifluoromethyl group, a fluorine atom, a methoxy group, an aryl group or a cyano group, and most preferably a substituted or unsubstituted alkyl group, a trifluoromethyl group, a fluorine atom or a cyano group.

The compound represented by formula (18) is preferably represented by the following formula (19):

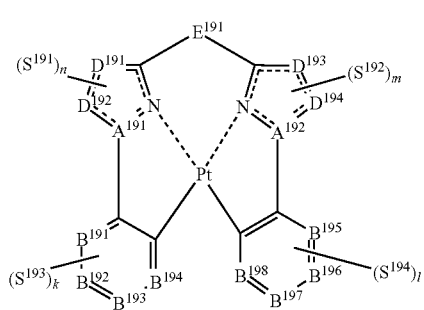

(19)

(In formula (19), each of $A^{191}$ and $A^{192}$ independently represents a nitrogen atom or a carbon atom, each of $D^{191}$ to $D^{194}$ independently represents an atom selected from carbon, nitrogen, oxygen, sulfur and silicon, the bond between atoms in the 5-membered ring formed by $D^{191}$, $D^{192}$, $A^{191}$, the nitrogen atom and the carbon atom or by $D^{193}$, $D^{194}$, $A^{194}$, the nitrogen atom and the carbon atom represents a single bond or a double bond, each of $D^{191}$ to $D^{194}$ when these can be further substituted may have a substituent, each of $B^{191}$ to $B^{198}$ independently represents a nitrogen atom or C—$R^{199}$, $R^{199}$ represents a hydrogen atom or a substituent, each $R^{199}$ may be the same as or different from every other $R^{199}$, $E^{191}$ represents a divalent linking group, each of $S^{191}$ to $S^{194}$ independently represents a substituent selected from (a) to (w), each of n, m, k and l represents an integer of 0 to 4, n+m+k+l is an integer of 1 to 4, and each $S^{191}$, $S^{192}$, $S^{193}$ or $S^{194}$ may be the same as or different from every other $S^{191}$, $S^{192}$, $S^{193}$ or $S^{194}$).

In formula (19), $E^{191}$, $S^{191}$ to $S^{194}$, $D^{191}$ to $D^{194}$, n, m, k and l have the same meanings as $E^{181}$, $S^{181}$ to $S^{184}$, $D^{181}$ to $D^{184}$, n, m, k and k in formula (18), and the preferred ranges are also the same.

Each of $D^{191}$ to $D^{194}$ preferably represents a nitrogen atom or C—$R^{19}$. The preferred range of $R^{19}$ is the same as the preferred range of $R^{18}$ in formula (18).

The 5-membered ring formed by $D^{191}$, $D^{192}$, $A^{191}$, the nitrogen atom and the carbon atom or by $D^{193}$, $D^{194}$, $A^{194}$, the nitrogen atom and the carbon atom is preferably an imidazole ring or a pyrazole ring.

Each of $B^{191}$ to $B^{198}$ independently represents a nitrogen atom or C—$R^{199}$, and $R^{199}$ represents a hydrogen atom or a substituent. The combination of $B^{191}$ to $B^{198}$ is not particularly limited but out of $B^{191}$ to $B^{194}$, the number of nitrogen atoms is preferably from 0 to 2, more preferably from 0 to 1, and out of $B^{195}$ to $B^{198}$, the number of nitrogen atoms is preferably from 0 to 2, more preferably from 0 to 1.

As for the substituent represented by $R^{199}$, those described as Substituent Group A can be applied.

Each $R^{199}$ may be the same as or different from every other $R^{199}$. $R^{199}$ may further have a substituent, and those described above as Substituent Group A can be applied to the substituent. The substituent is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, an alkylthio group, an arylthio group, an alkyloxy group, an aryloxy group or a fluorine atom, still more preferably an alkyl group or an aryl group. Also, $R^{199}$'s may combine with each other to form a condensed ring, and examples of the ring formed include a benzene ring, a pyridine ring, a pyrazine ring, a pyrimidine ring, a triazine ring, a pyridazine ring, a pyrrole ring, a pyrazole ring, an imidazole ring, a triazole ring, an oxazole ring, an oxadiazole ring, a thiazole ring, a thiadiazole ring, a furan ring, a thiophene ring, a selenophene ring, a silole ring, a germole ring and a phosphole ring.

$R^{199}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an amino group, an alkoxy group, an aryloxy group, a cyano group, a fluorine atom or a heterocyclic group, still more preferably a hydrogen atom, a substituted or unsubstituted alkyl group, a fluorine atom, a methoxy group, an aryl group or a cyano group, yet still more preferably a hydrogen atom, a methyl group, a tert-butyl group, a trifluoromethyl group, an alkyl group-substitutable aryl group, a fluorine atom or a cyano group, even yet still more preferably a hydrogen atom, a methyl group, a tert-butyl group, a trifluoromethyl group, a fluorine atom or a cyano group.

The compound represented by formula (19) is preferably represented by the following formula (20):

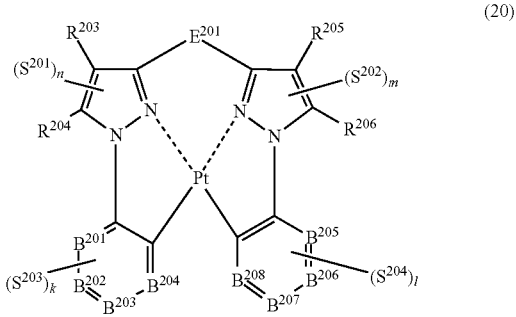

(20)

(In formula (20), each of $R^{203}$ to $R^{206}$ independently represents a hydrogen atom or a substituent, each of $B^{201}$ to $B^{208}$ independently represents a nitrogen atom or C—$R^{207}$, $R^{207}$ represents a hydrogen atom or a substituent, each $R^{207}$ may be the same as or different from every other $R^{207}$, $E^{201}$ represents a divalent linking group, each of n, m, k and l represents an integer of 0 to 4, n+m+k+l is an integer of 1 to 4, each of $S^{201}$ to $S^{204}$ independently represents a substituent selected from (a) to (w), and each $S^{201}$, $S^{202}$, $S^{203}$ or $S^{204}$ may be the same as or different from every other $S^{201}$, $S^{202}$, $S^{203}$ or $S^{204}$).

In formula (20), $E^{201}$, $S^{201}$ to $S^{204}$, $B^{201}$ to $B^{208}$, n, m, k and l have the same meanings as $E^{191}$, $S^{191}$ to $S^{194}$, $B^{191}$ to $B^{198}$, n, m, k and l in formula (19), and the preferred ranges are also the same.

Each of $R^{203}$ to $R^{207}$ represents a hydrogen atom or a substituent, and the substituent includes a substituent selected from substituents including Substituent Group A.

Each of $R^{203}$ to $R^{206}$ is a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, preferably a hydrogen atom, a substituted or unsubstituted alkyl group, a cycloalkyl group, an aryl group, an amino group, an alkoxy group, an aryloxy group, a cyano group, a fluorine atom or a heterocyclic group, more preferably a hydrogen atom, a substituted or unsubstituted alkyl group, a fluorine atom, a methoxy group, an aryl group or a cyano group, still more preferably a hydrogen atom, a methyl group, a tert-butyl group, a trifluoromethyl group, an alkyl group-substitutable aryl group, a fluorine atom or a cyano group, yet still more preferably a hydrogen atom, a methyl group, a tert-butyl group, a trifluoromethyl group, an alkyl group-substitutable aryl group, a fluorine atom or a cyano group, even yet still more preferably a hydrogen atom, a methyl group or a tert-butyl group, and most preferably a hydrogen atom or a methyl group.

$R^{207}$ is a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, preferably a hydrogen atom, a substituted or unsubstituted alkyl group, a cycloalkyl group, an aryl group, an amino group, an alkoxy group, an aryloxy group, a cyano group, a fluorine atom or a heterocyclic group, more preferably a hydrogen atom, a substituted or unsubstituted alkyl group, a fluorine atom, a methoxy group, an aryl group or a cyano group, still more preferably a hydrogen atom, a methyl group, a tert-butyl group, a trifluoromethyl group, an alkyl group-substitutable aryl group, a fluorine atom or a cyano group, yet still more preferably a hydrogen atom, a methyl group, a tert-butyl group, a trifluoromethyl group, a fluorine atom or a cyano group.

In the case where each of $R^{203}$ to $R^{207}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

The compound represented by formula (19) is preferably represented by the following formula (21):

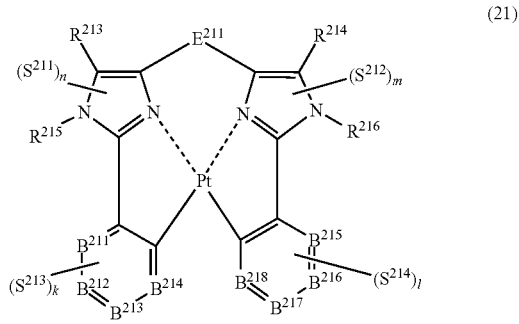

(21)

(In formula (21), each of $R^{213}$ and $R^{214}$ independently represents a hydrogen atom or a substituent, each of $R^{215}$ and $R^{216}$ independently represents a hydrogen atom or a substituent, each of $B^{211}$ to $B^{218}$ independently represents a nitrogen atom or C—$R^{217}$, $R^{217}$ represents a hydrogen atom or a substituent, each $R^{217}$ may be the same as or different from every other $R^{217}$, $E^{211}$ represents a divalent linking group, each of $S^{211}$ to $S^{214}$ independently represents a substituent selected from (a) to (w), each of n, m, k and l, represents an integer of 0 to 4, n+m+k+l is an integer of 1 to 4, and each $S^{211}$, $S^{212}$, $S^{213}$ or $S^{214}$ may be the same as or different from every other $S^{211}$, $S^{212}$, $S^{213}$ or $S^{214}$).

In formula (21), $E^{211}$, $S^{211}$ to $S^{214}$, $B^{211}$ to $B^{218}$, n, m, k and l have the same meanings as $E^{191}$, $S^{191}$ to $S^{194}$, $B^{191}$ to $B^{198}$, n, m, k and l in formula (19), and the preferred ranges are also the same.

Each of $B^{211}$ to $B^{218}$ independently represents a nitrogen atom or C—$R^{217}$, and $R^{217}$ represents a hydrogen atom or a substituent. The substituent includes a substituent selected from substituents including Substituent Group A. $R^{217}$ is a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, preferably a hydrogen atom, a substituted or unsubstituted alkyl group, a cycloalkyl group, an aryl group, an amino group, an alkoxy group, an aryloxy group, a cyano group, a fluorine atom or a heterocyclic group, more preferably a hydrogen atom, a substituted or unsubstituted alkyl group, a fluorine atom, a methoxy group, an aryl group or a cyano group, still more preferably a hydrogen atom, a methyl group, a tert-butyl group, a trifluoromethyl group, an alkyl group-substitutable aryl group, a fluorine atom or a cyano group, yet still more preferably a hydrogen atom, a methyl group, a tert-butyl group, a trifluoromethyl group, a fluorine atom or a cyano group.

In the case where $R^{217}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

The combination of $B^{211}$ to $B^{218}$ is not particularly limited but out of $B^{211}$ to $B^{214}$, the number of nitrogen atoms is preferably from 0 to 2, more preferably from 0 to 1, and out of $B^{215}$ to $B^{218}$, the number of nitrogen atoms is preferably from 0 to 2, more preferably from 0 to 1.

Each of $R^{213}$ and $R^{214}$ independently represents a hydrogen atom or may have a substituent selected from substituents including Substituent Group A.

Each of $R^{213}$ and $R^{214}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an amino group, an alkoxy group, an aryloxy group, a cyano group, a fluorine atom or a heterocyclic group, still more preferably a hydrogen atom, a substituted or unsubstituted alkyl group, a trifluoromethyl group, a fluorine atom, a methoxy group, an aryl group or a cyano group, yet still more preferably a hydrogen atom, a methyl group, a tert-butyl group, a trifluoromethyl group, an alkyl group-substitutable aryl group, a fluorine atom or a cyano group, even yet still more preferably a hydrogen atom, a methyl group, a tert-butyl group or an alkyl group-substitutable aryl group, and most preferably a hydrogen atom or a methyl group.

In the case where each of $R^{213}$ and $R^{214}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

Each of $R^{215}$ and $R^{216}$ represents a hydrogen atom or a substituent selected from substituents including Substituent Group A.

Each of $R^{215}$ and $R^{216}$ is preferably a hydrogen atom, an alkyl group, a cycloalkyl group, an aryl group, an amino group, an alkoxy group, an aryloxy group, an acyl group, an alkoxycarbonyl group, an aryloxycarbonyl group, an acyloxy group, a sulfonylamino group, a sulfamoyl group, a carbamoyl group, an alkylthio group, an arylthio group, a heterocyclic thio group, a sulfonyl group, a sulfinyl group, a ureido group, a phosphoric acid amido group, a hydroxy group, a mercapto group, a halogen atom, a sulfo group, a carboxyl group, a nitro group, a sulfino group, a heterocyclic group, a silyl group or a cyano group, more preferably a hydrogen atom, a substituted or unsubstituted alkyl group, a cycloalkyl group, an aryl group, an alkoxy group, an aryloxy group, a cyano group, a fluorine atom or a heterocyclic group, still more preferably a hydrogen atom, a methyl group, a tert-butyl group, a trifluoromethyl group, an alkyl group-substitutable aryl group, a fluorine atom or a cyano group, yet still more preferably a hydrogen atom, a methyl group, a tert-butyl group or an alkyl group-substitutable aryl group, and most preferably a hydrogen atom or a methyl group.

In the case where each of $R^{215}$ and $R^{216}$ represents a substituent, the substituent may be further substituted with a substituent. The further substituent includes Substituent Group A and is preferably an alkyl group, a cycloalkyl group, an aryl group, a halogen atom, an amino group, an alkylthio group, an arylthio group, an alkyloxy group, an aryloxy group, a hydroxy group, a mercapto group or a halogen atom, more preferably an alkyl group, a cycloalkyl group, an aryl group, a fluorine atom, an alkylthio group, an arylthio group, an alkyloxy group, an aryloxy group or a fluorine atom, still more preferably an alkyl group or an aryl group.

Each of the compounds represented by formulae (1) to (21) may be a polymer compound having the compound in the main or side chain.

The polymer compound may be a homopolymer compound or a copolymer, and the copolymer may be any of a random copolymer, an alternating copolymer and a block copolymer. In the case of a copolymer, the other monomer is preferably a monomer having a charge transport function moiety. Examples of the monomer having a charge transport function include a material having in its partial structure a compound described later as the host material, the material contained in the hole transporting layer, or the material contained in the electron transporting material. A monomer having in its partial structure a compound described as the host material is preferred.

In the case of a polymer compound, the molecular weight is preferably from 2,000 to less than 1,000,000, more preferably from 10,000 to less than 500,000, still more preferably from 10,000 to less than 100,000.
Specific examples of the compound represented by formula (1) for use in the present invention are illustrated below, but the present invention is not limited thereto.
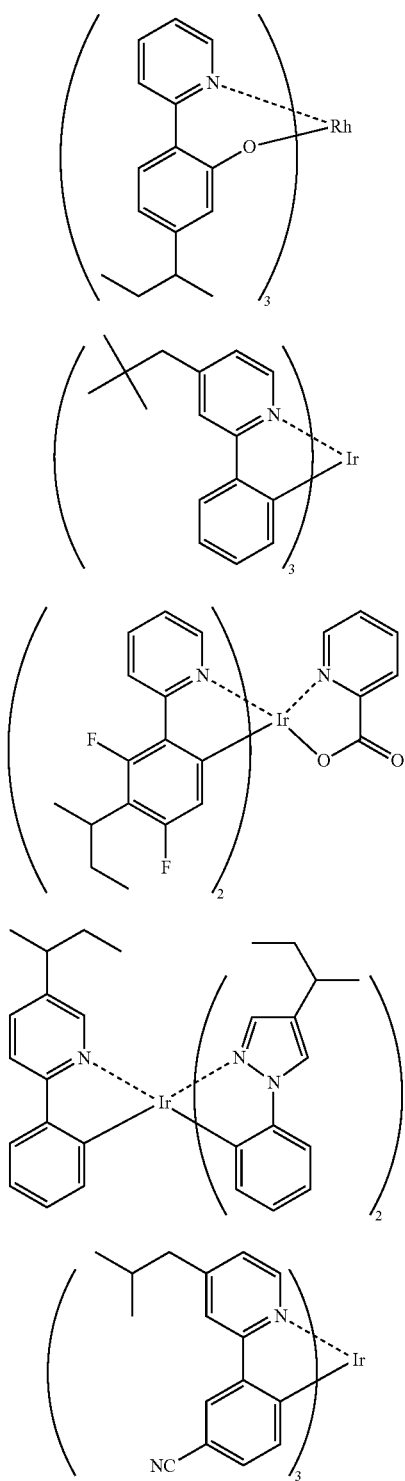
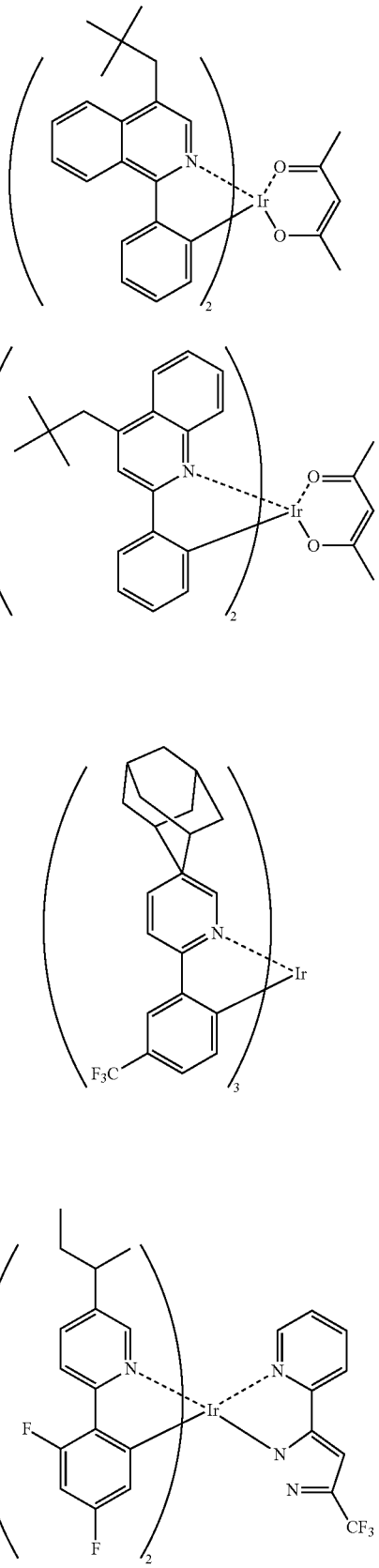

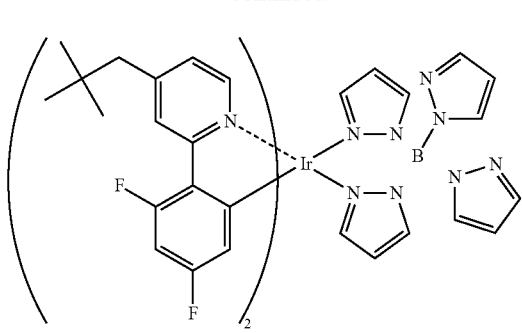
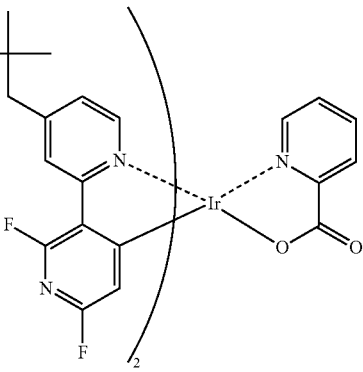
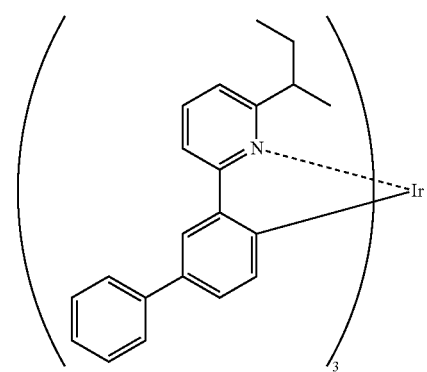
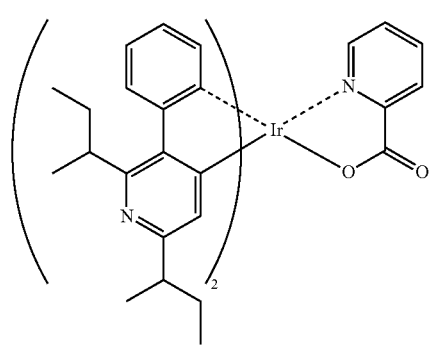
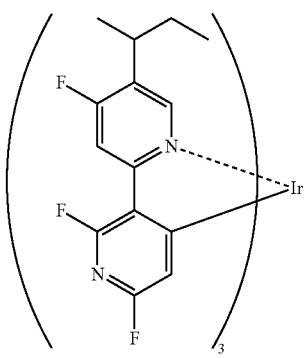
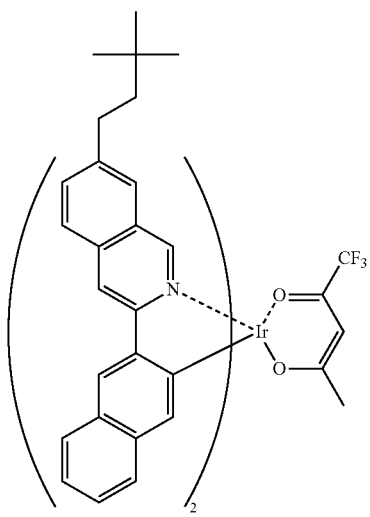
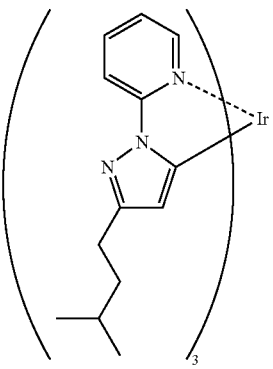
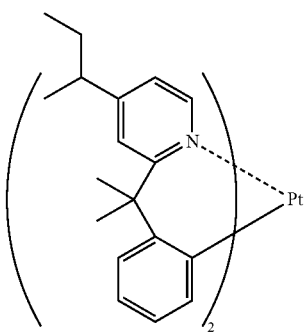

18
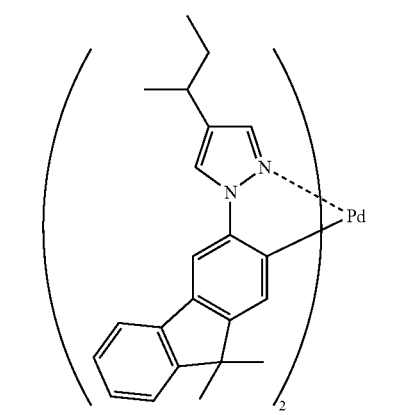
19
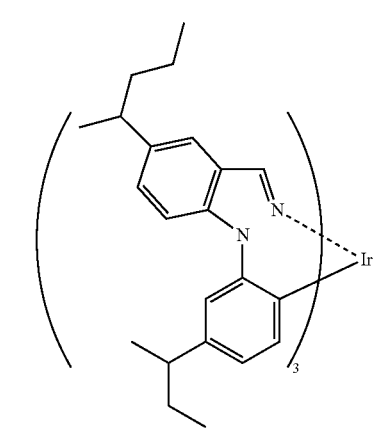
20
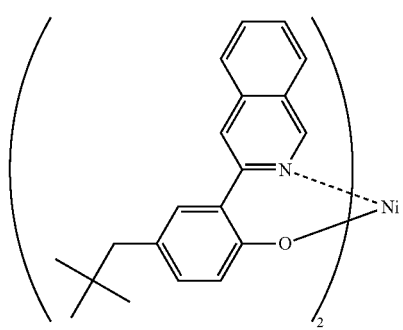
21
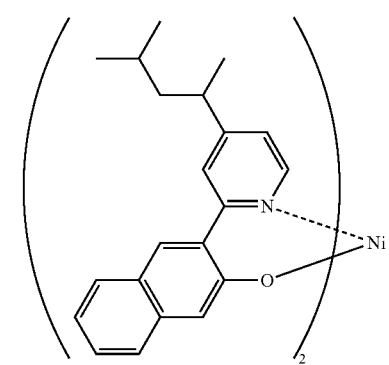
22
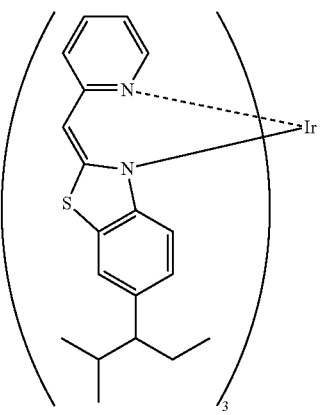
23
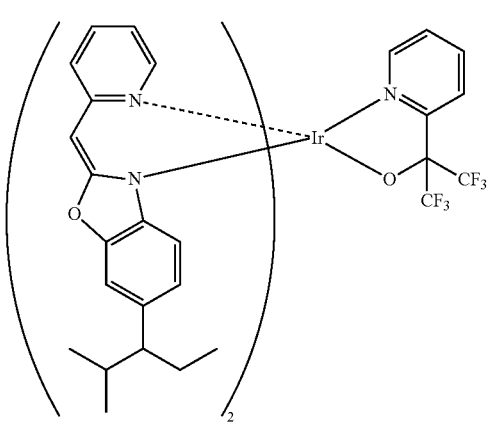
24
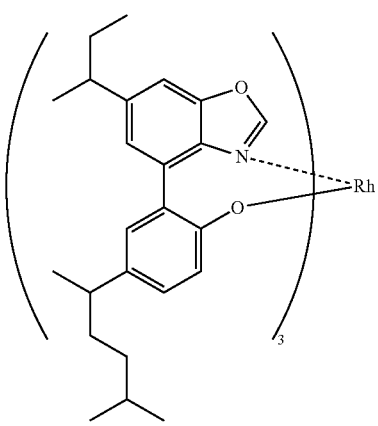
25
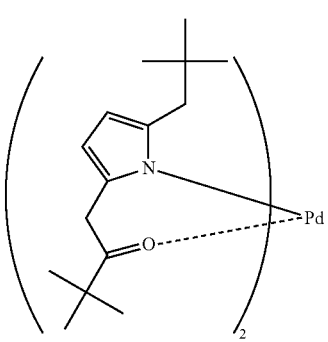

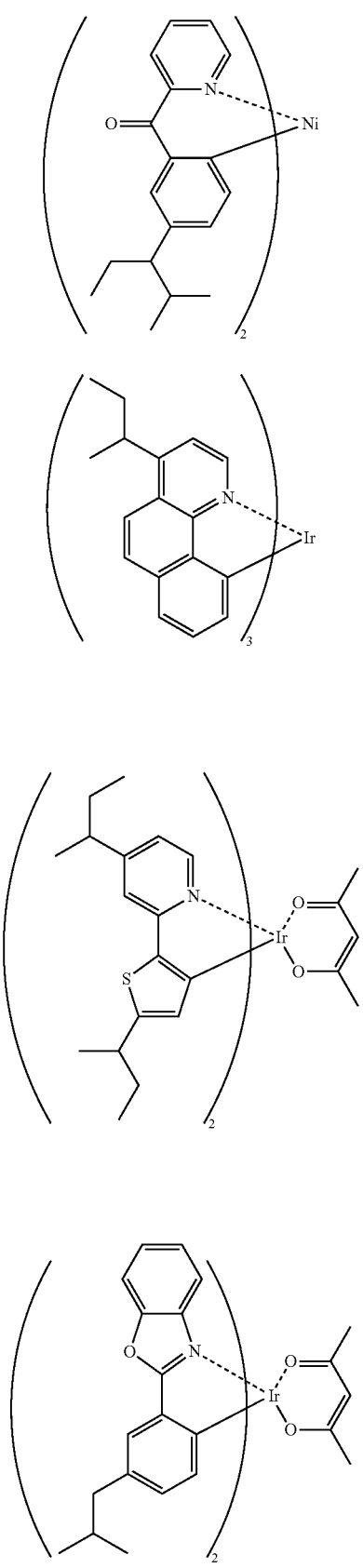
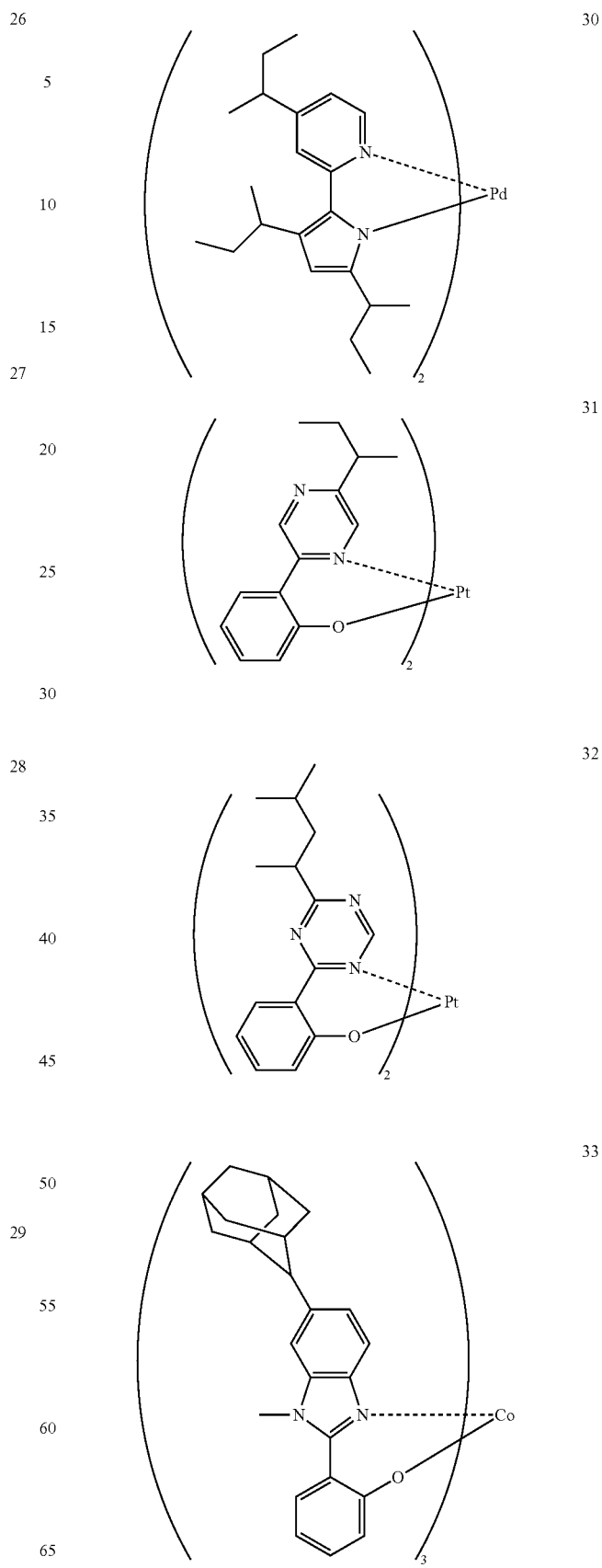

34
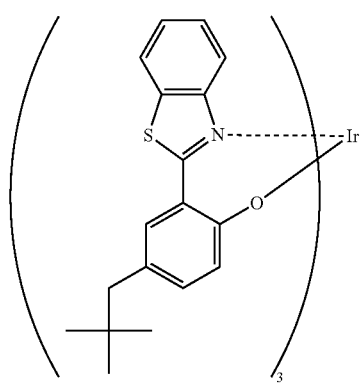
35
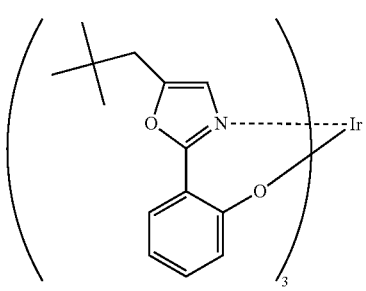
36
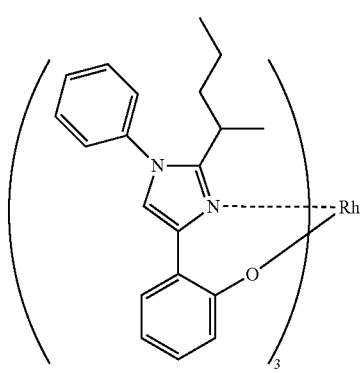
37
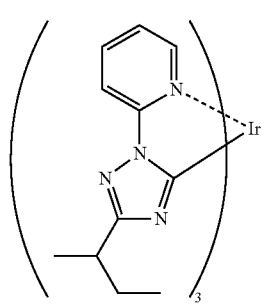
38
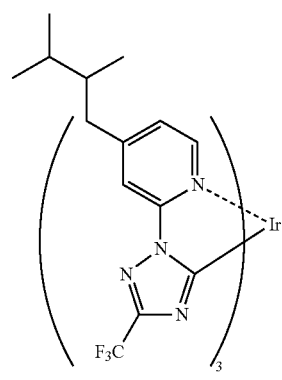
39
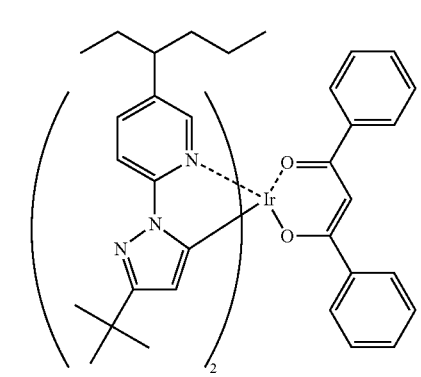
40
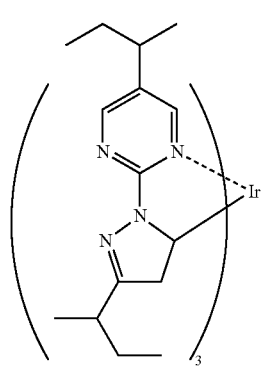
41
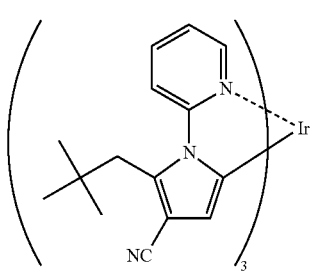

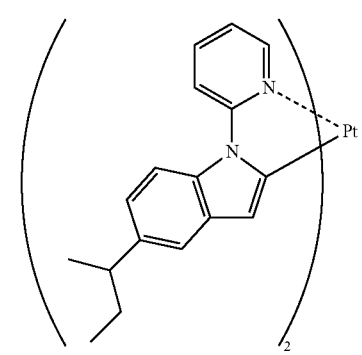
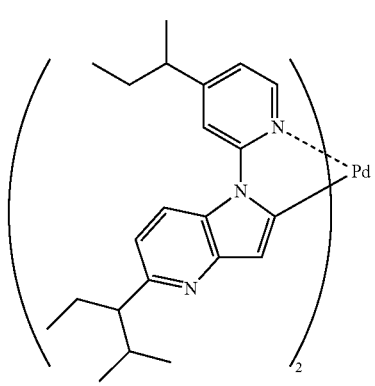
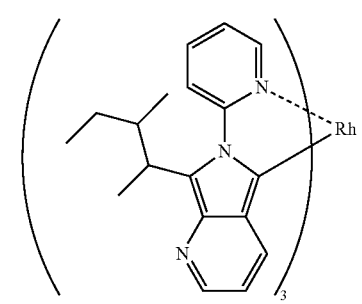
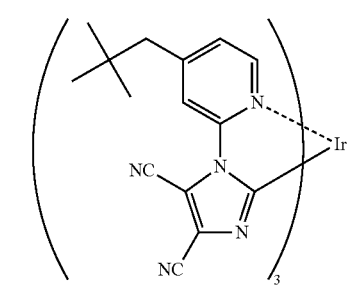
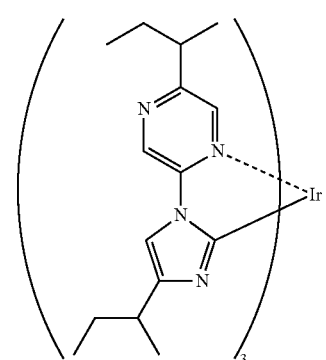
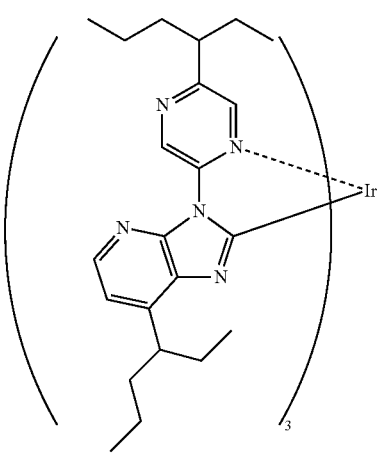
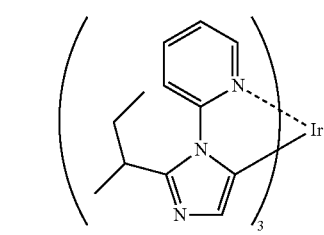
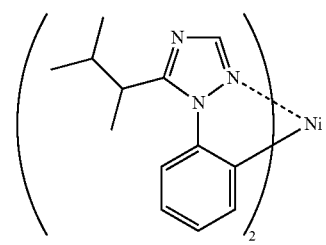
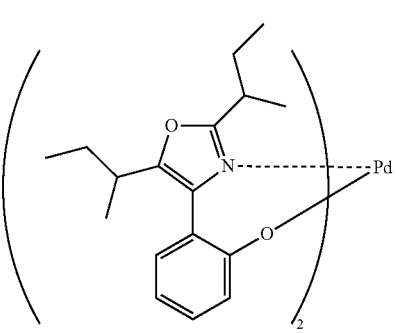

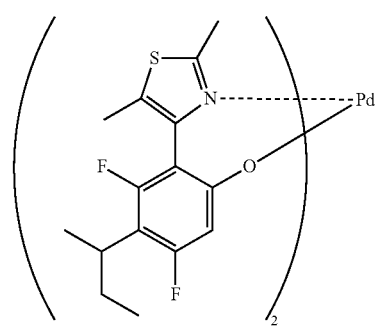
51
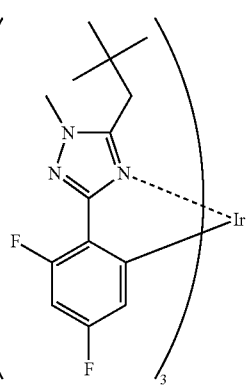
52
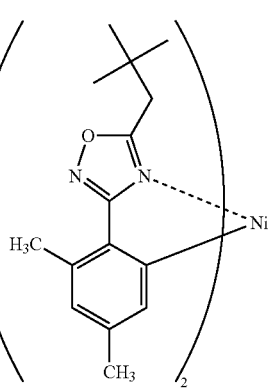
53
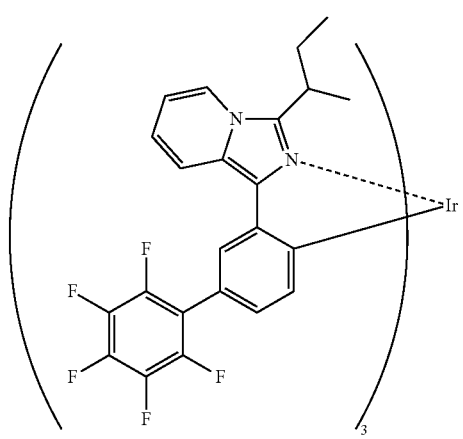
54
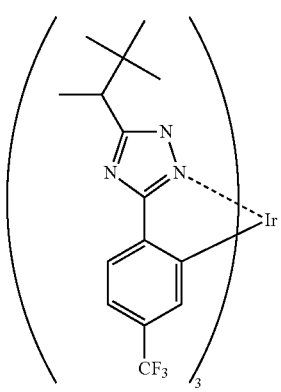
55
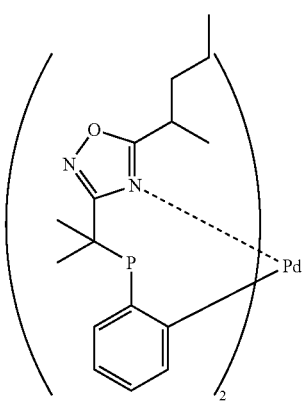
56
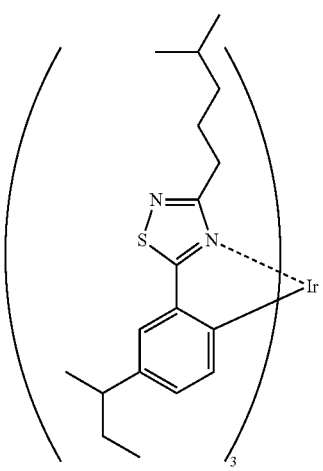
57
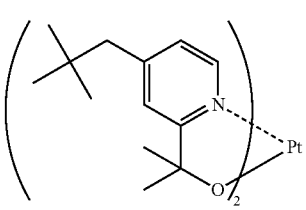
58

91
-continued
59
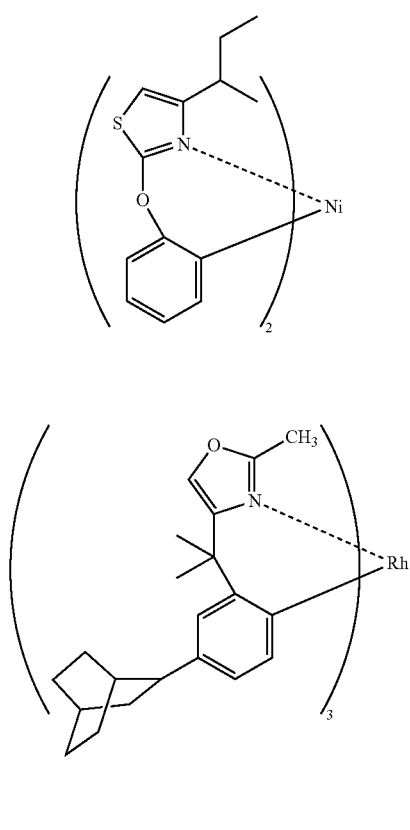
60
61
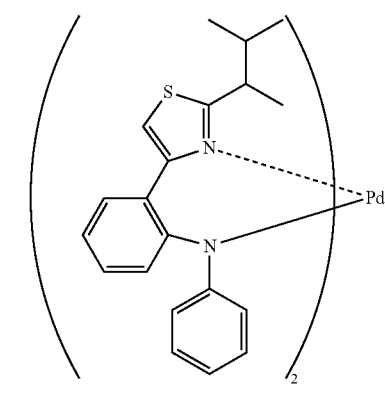
62
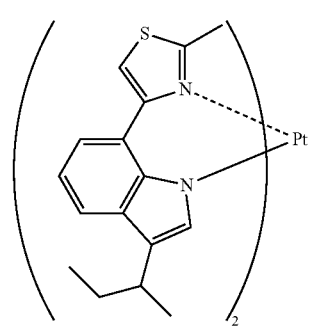
92
-continued
63
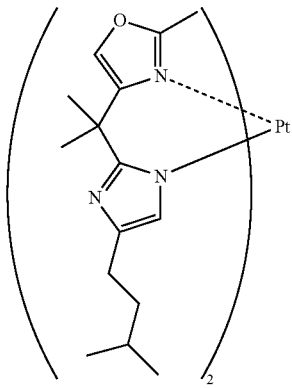
64
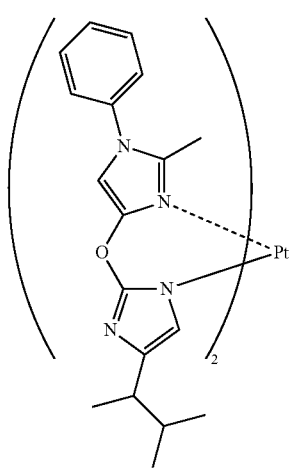
65
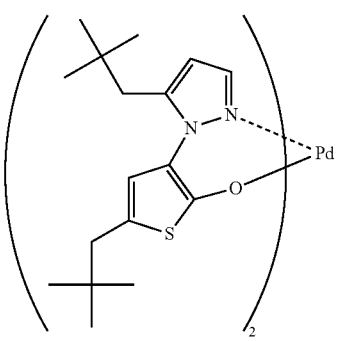
66
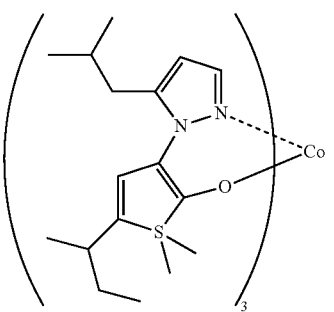

67
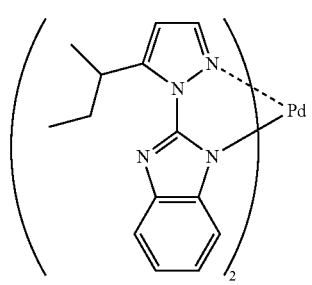
68
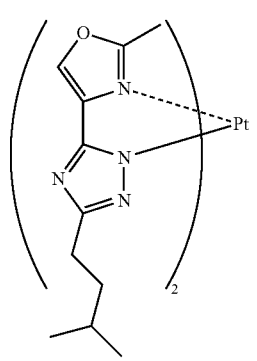
69
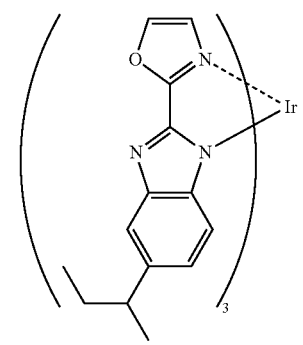
70
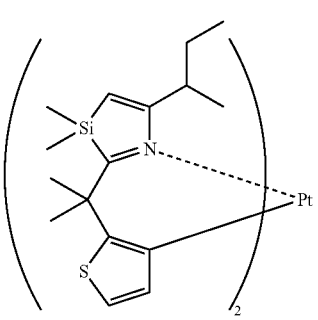
71
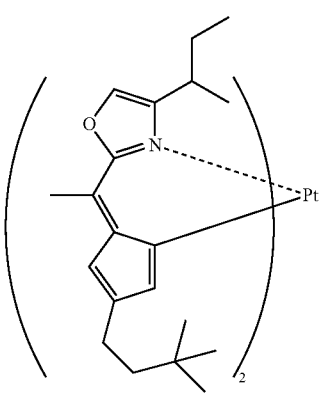
72
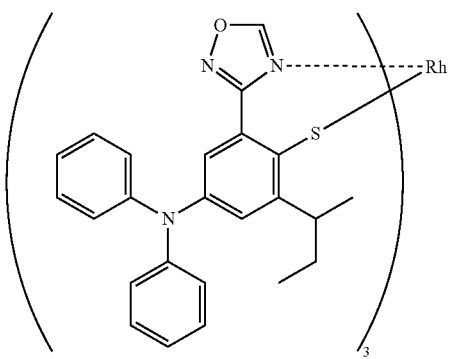
73
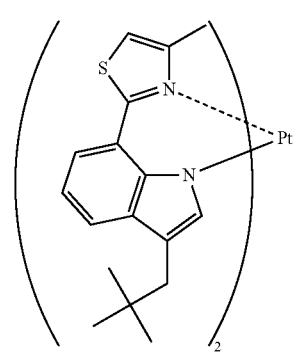
74
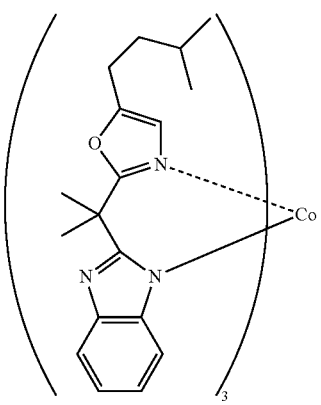

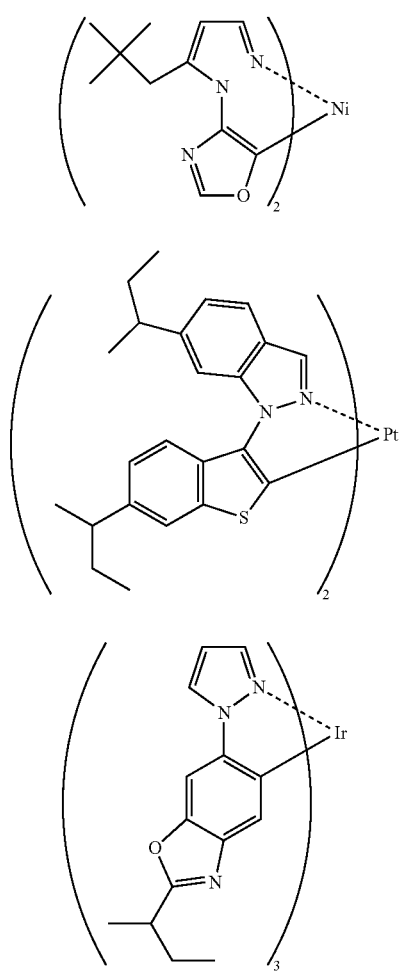
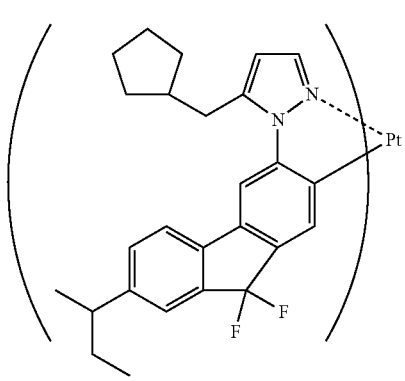
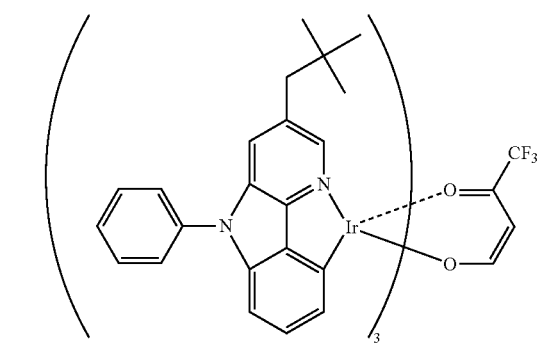
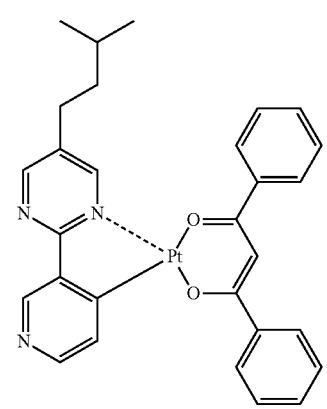
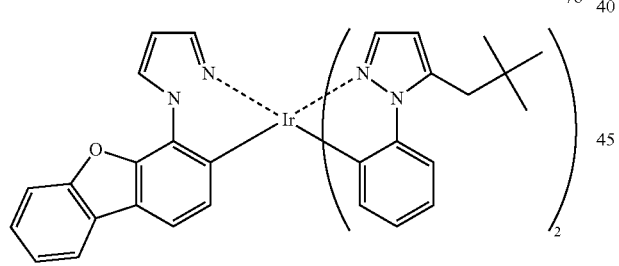
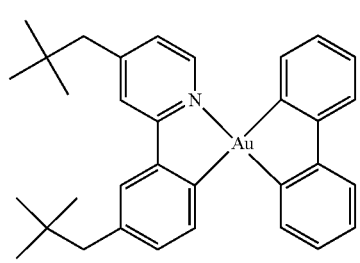

84
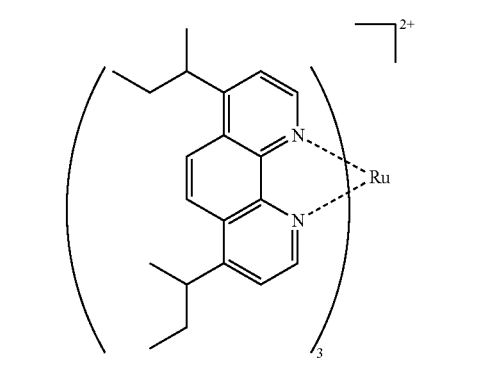
85
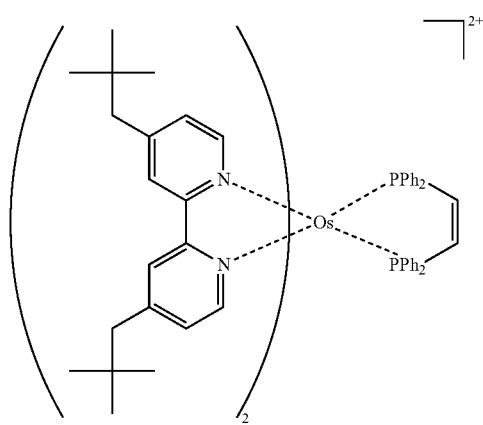
86
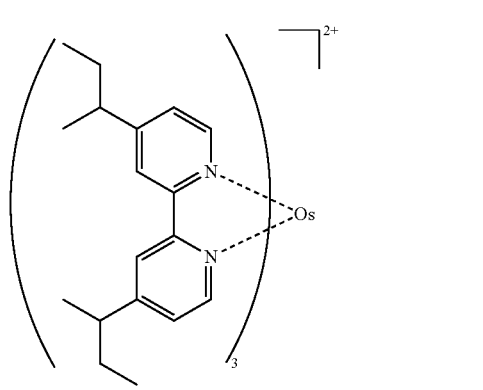
87
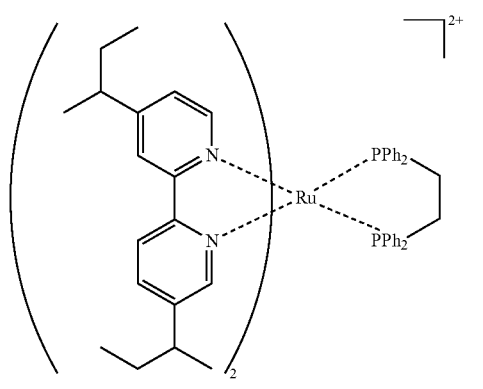
88
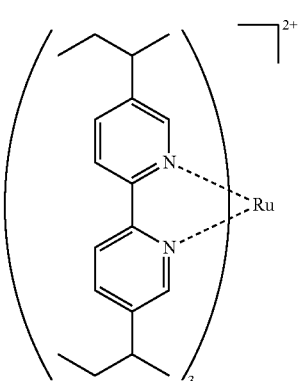
89
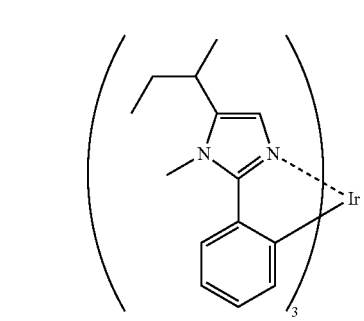
90
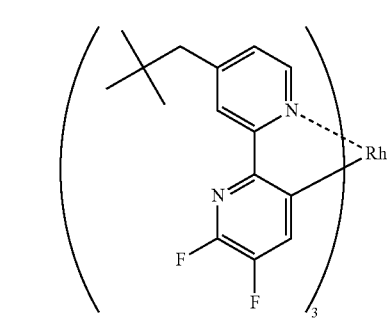
91
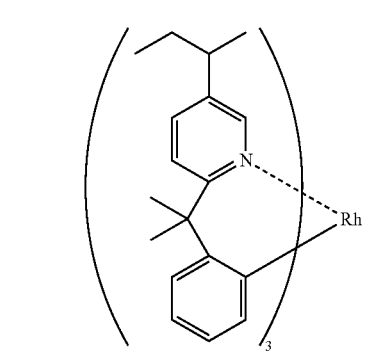

99
-continued
92
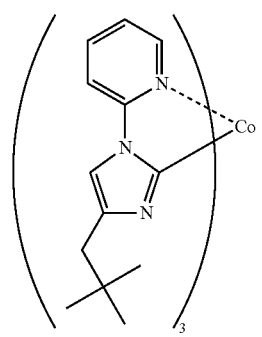
93
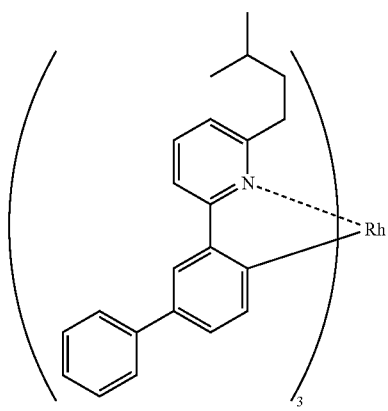
94
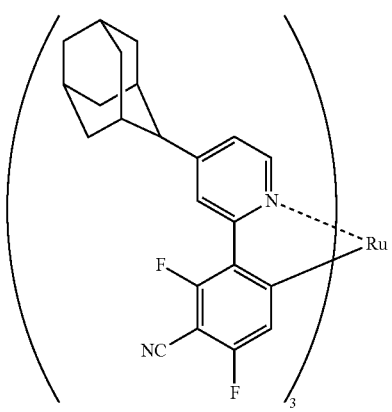
95
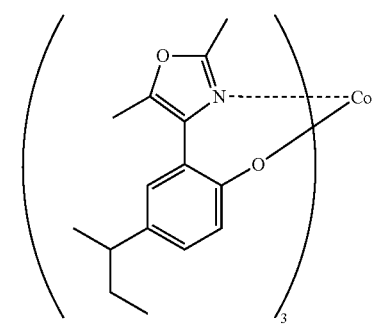
100
-continued
96
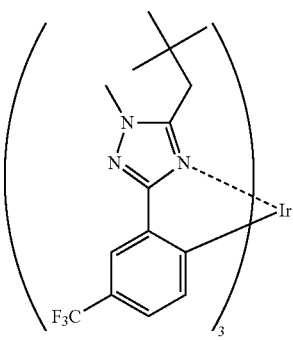
97
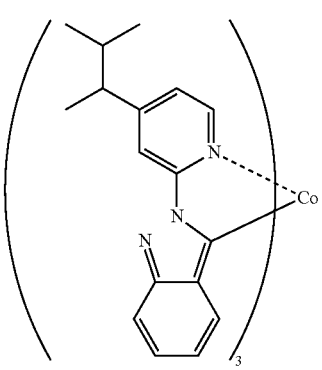
98
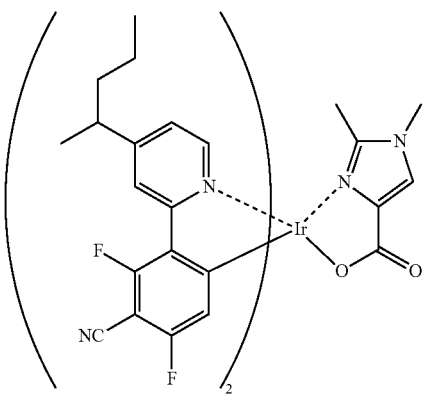
99
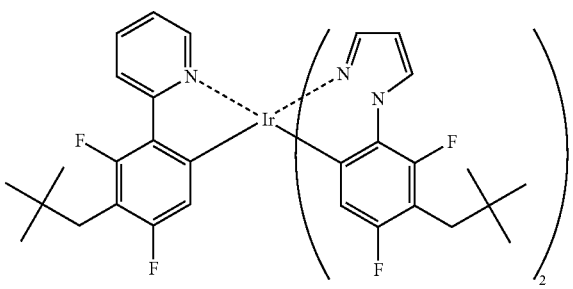

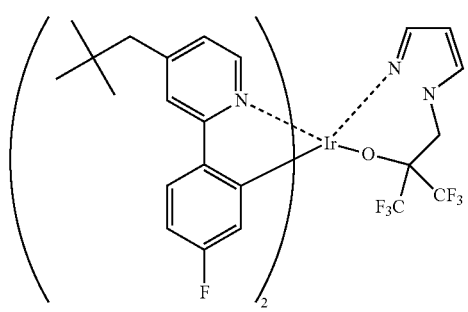
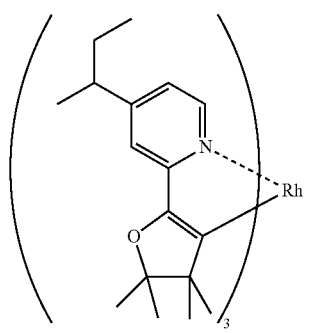
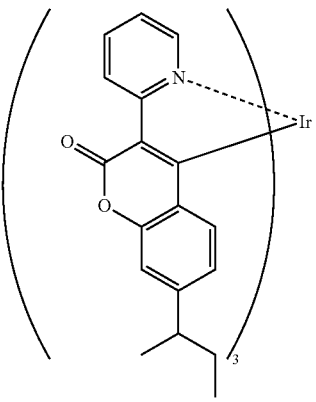
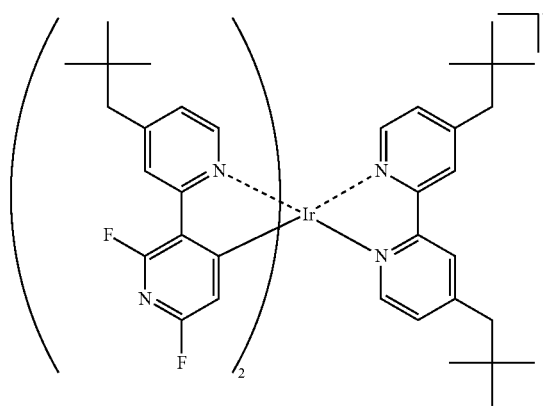
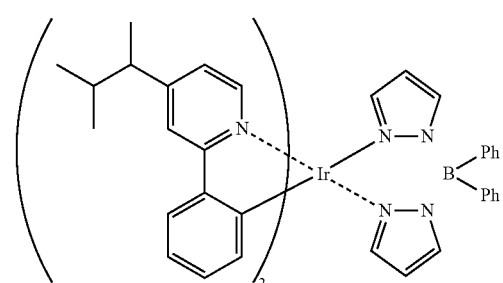
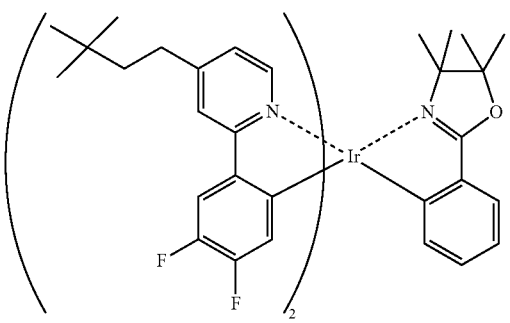
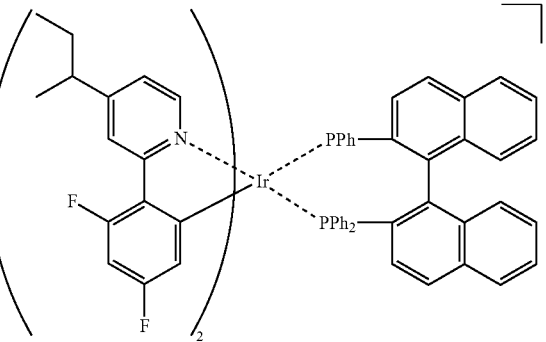
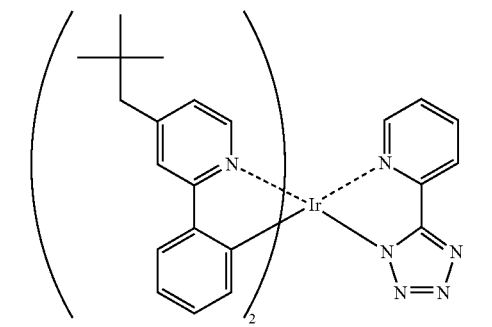

108 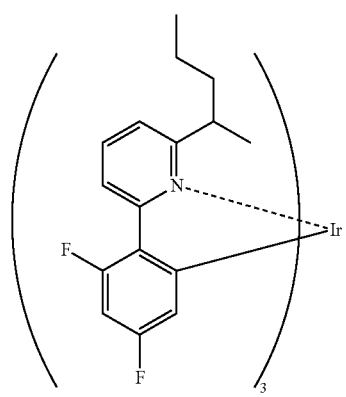
109 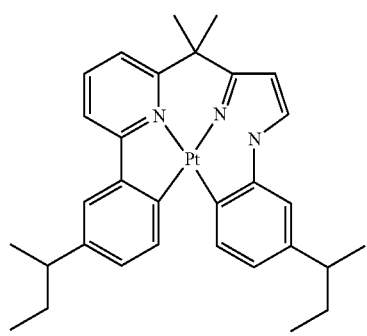
110 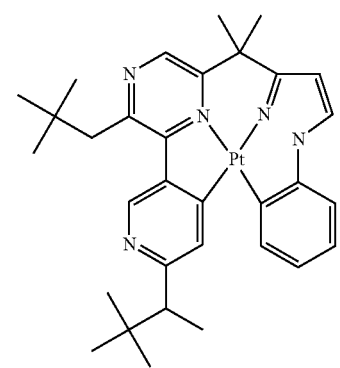
111 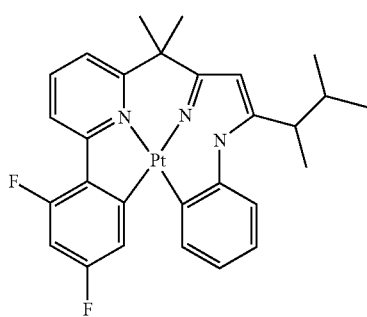
112 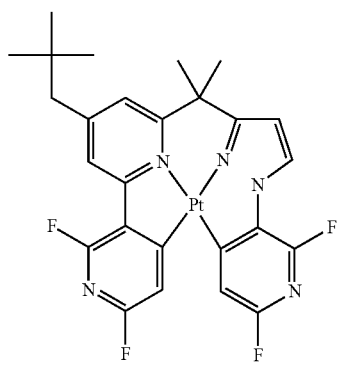
113 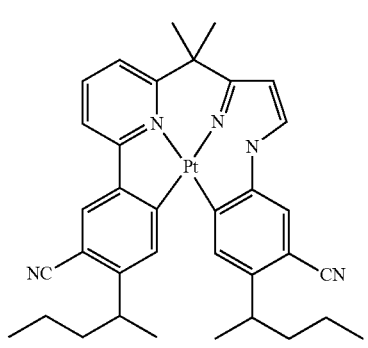
114 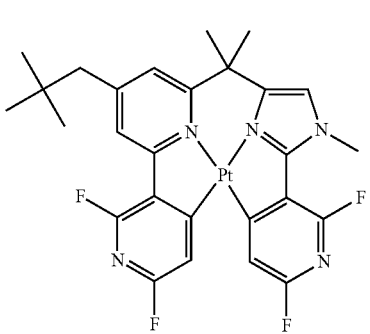
115 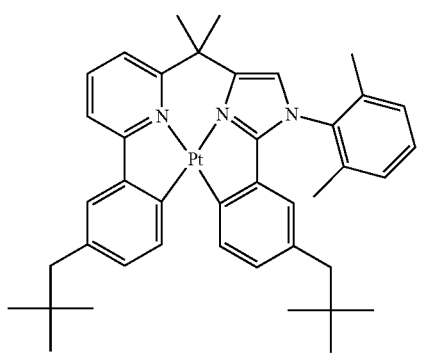

116
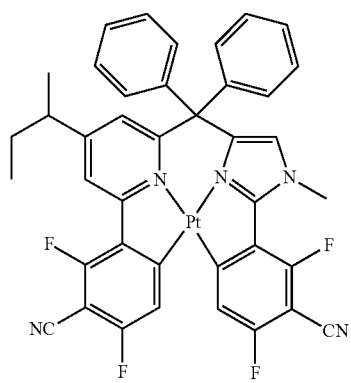
117
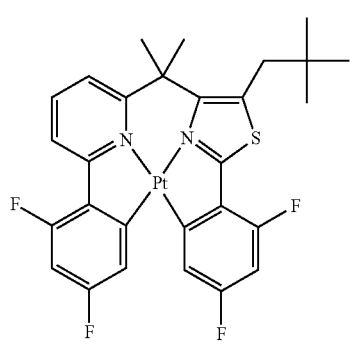
118
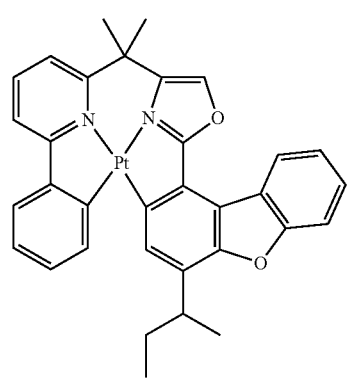
119
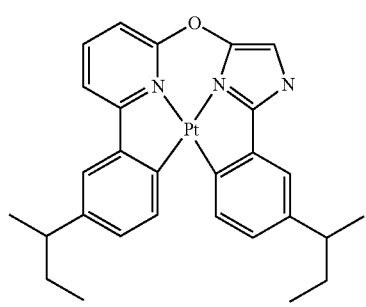
120
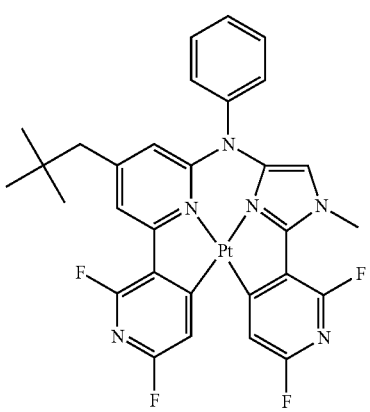
121
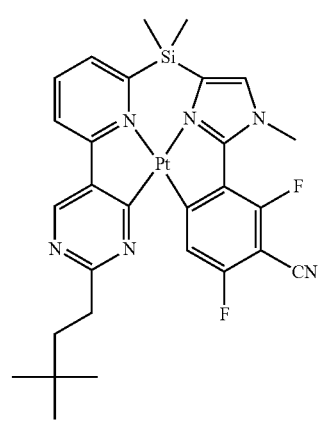
122
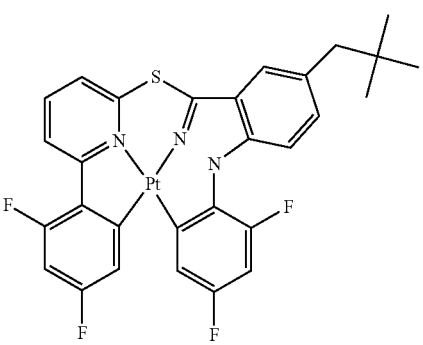
123
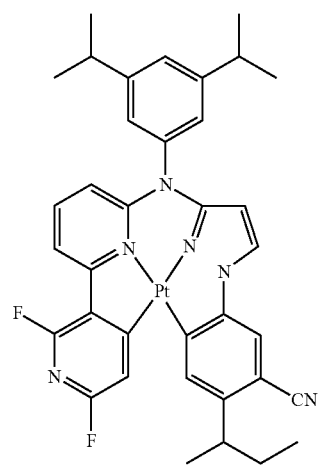

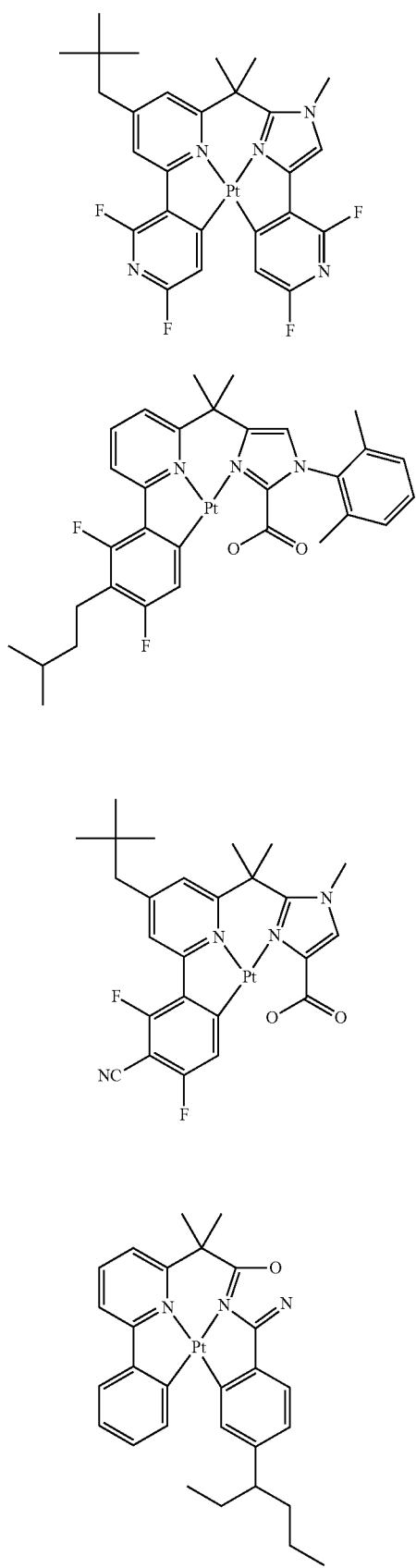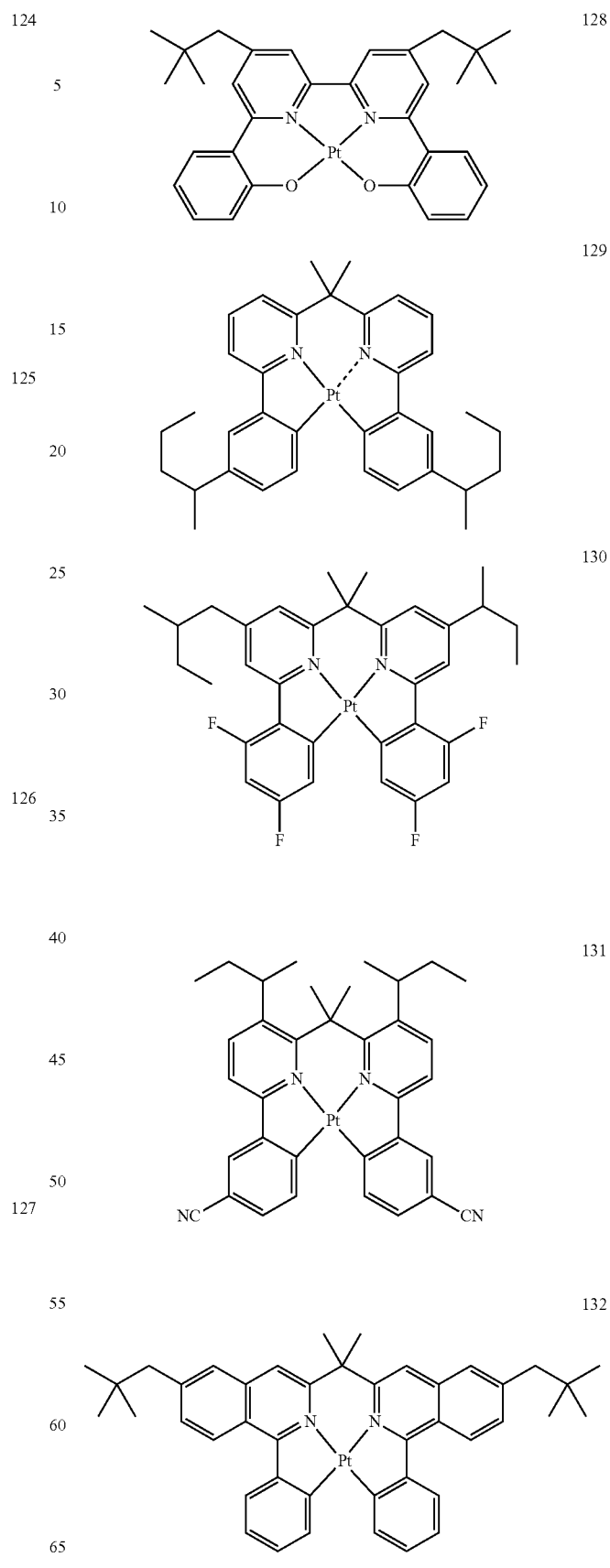

133
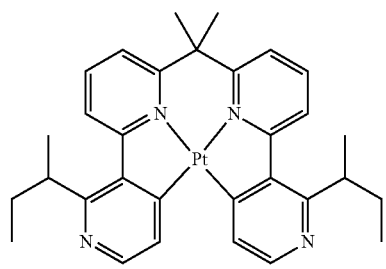
134
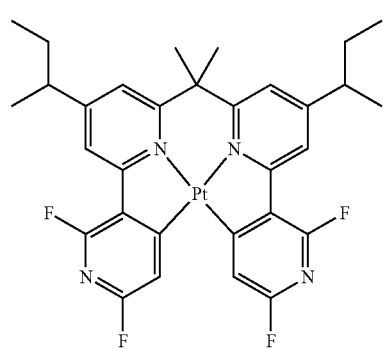
135
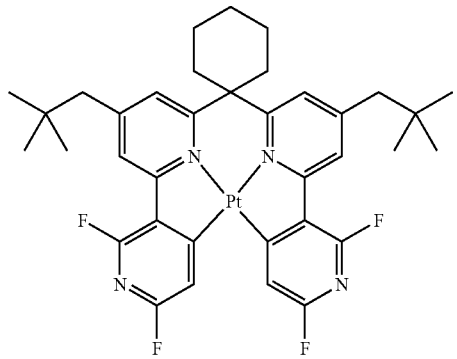
136
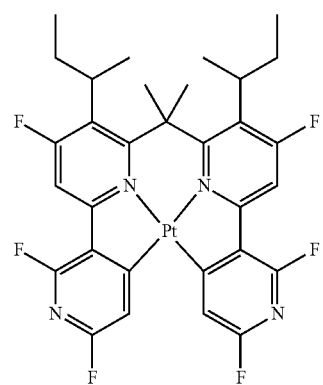
137
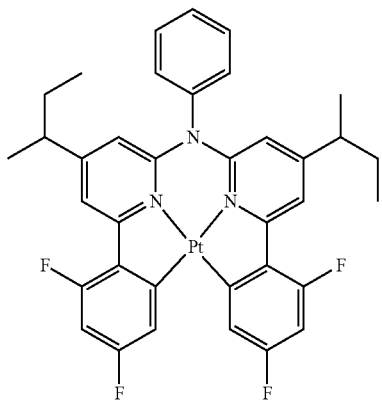
138
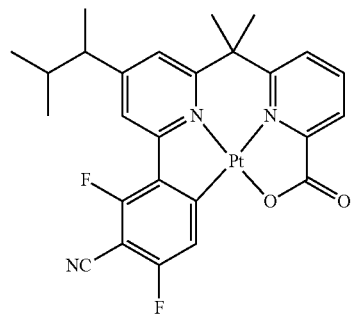
139
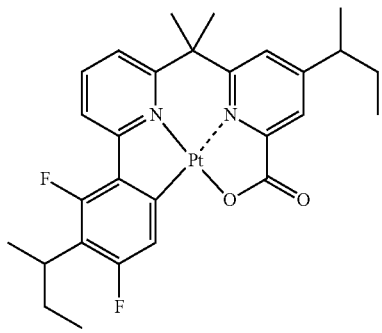
140
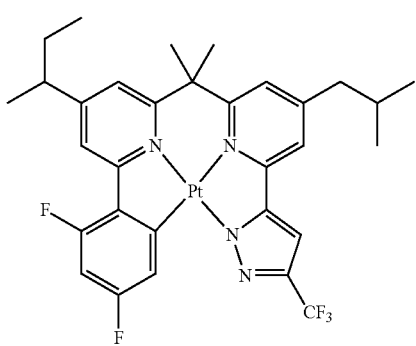

111
-continued
141
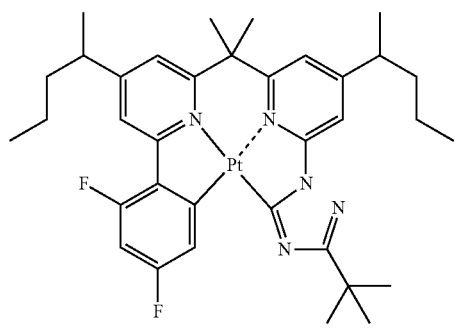
142
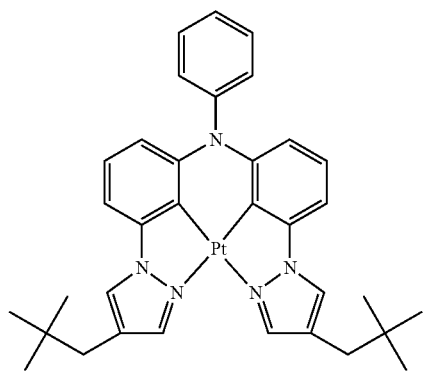
143
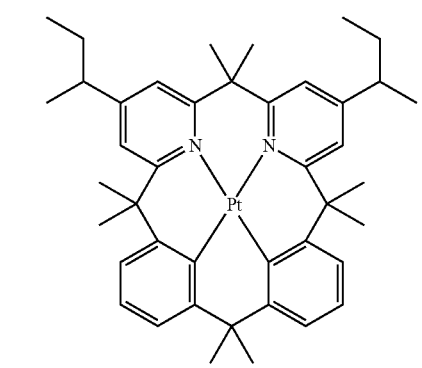
144
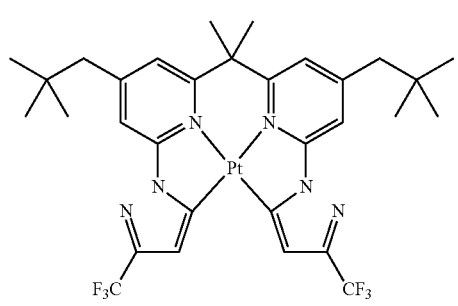
112
-continued
145
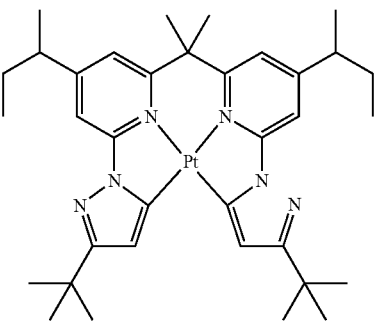
146
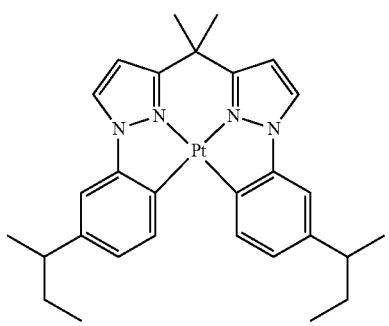
147
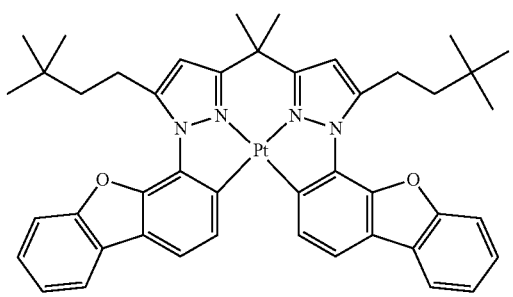
148
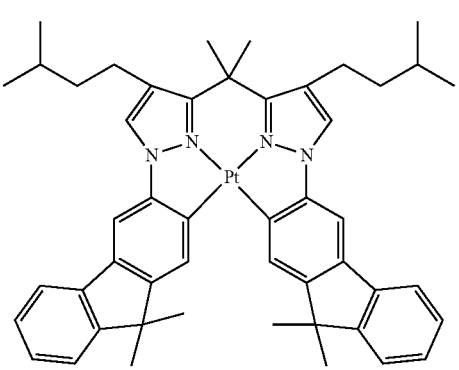
149

150
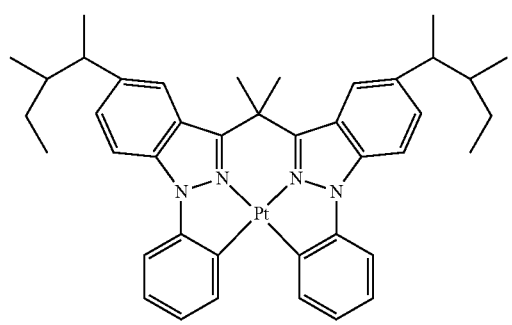
151
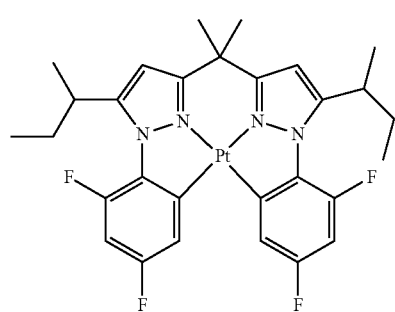
152
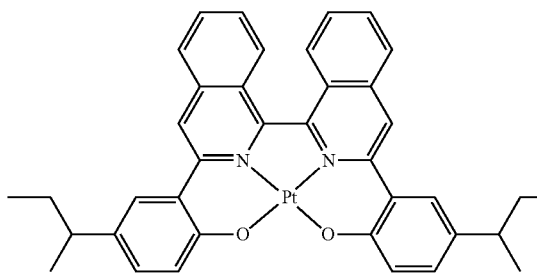
153
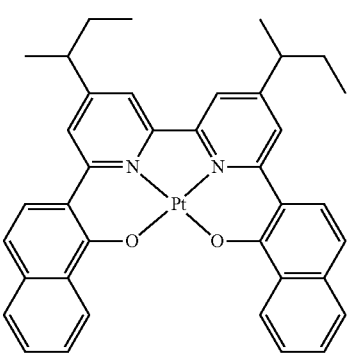
154
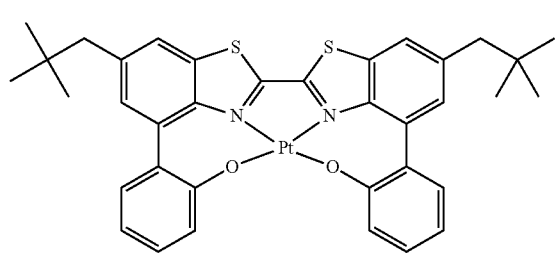
155
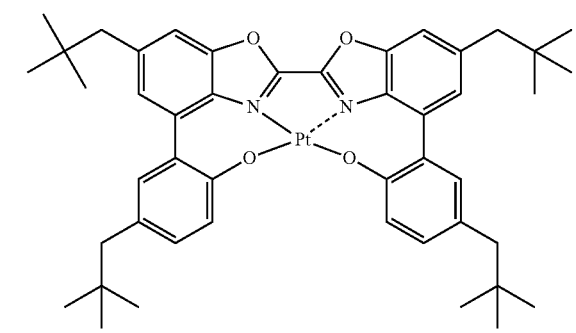
156
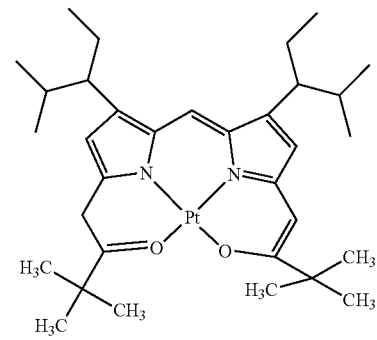
157
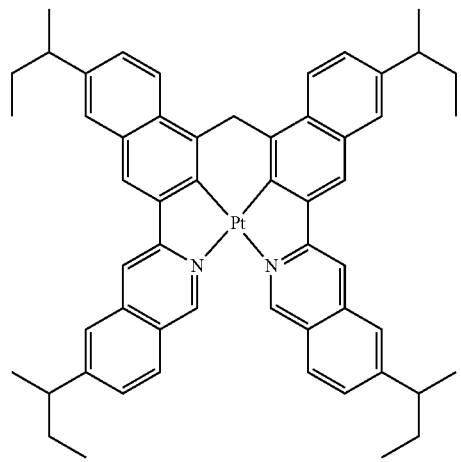
158
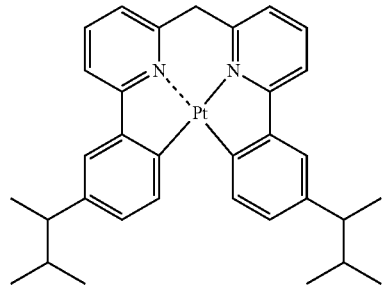

-continued
159
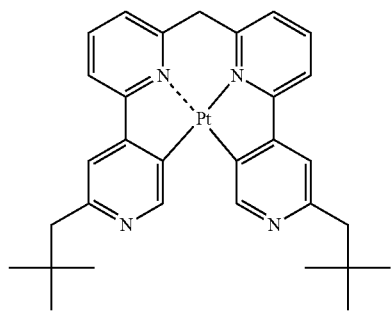
160
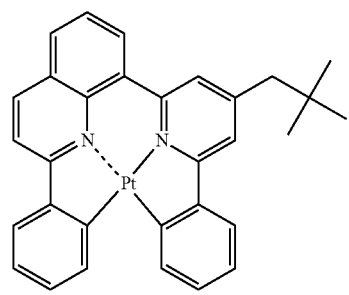
161
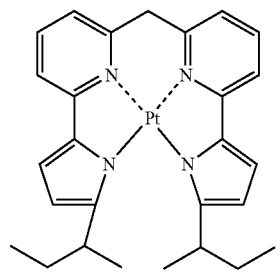
162
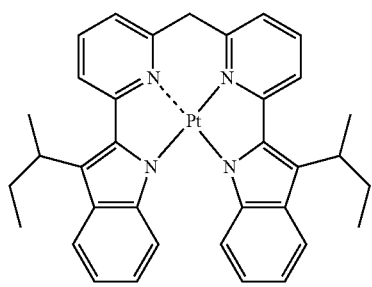
163
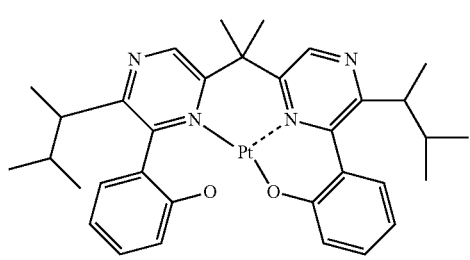
-continued
164
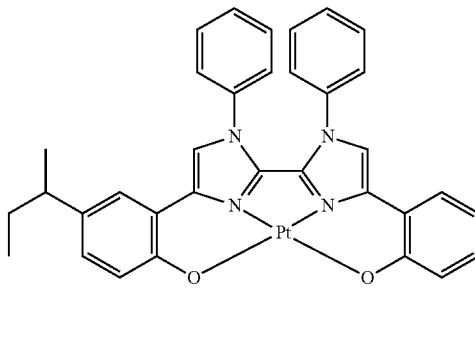
165
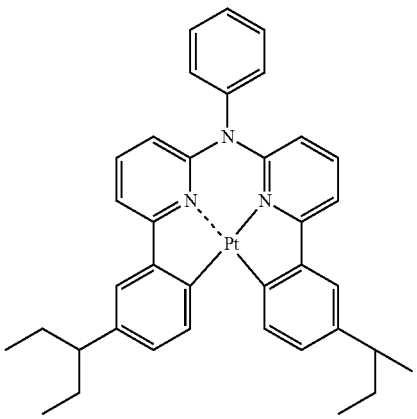
166
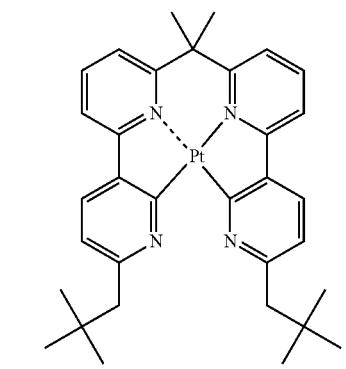
167
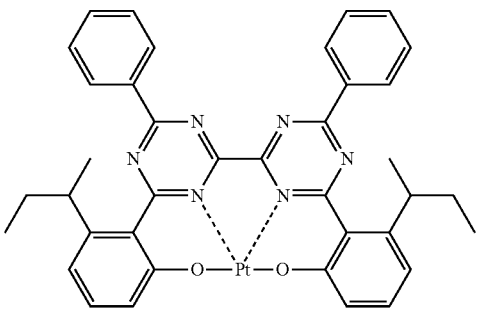

168
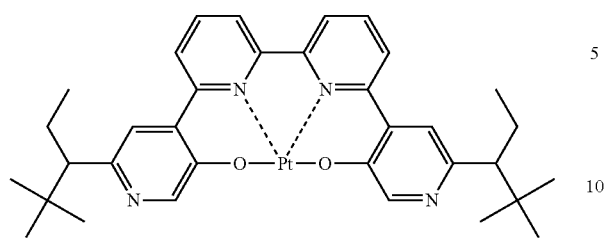
169
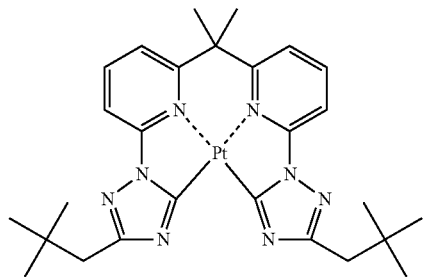
170
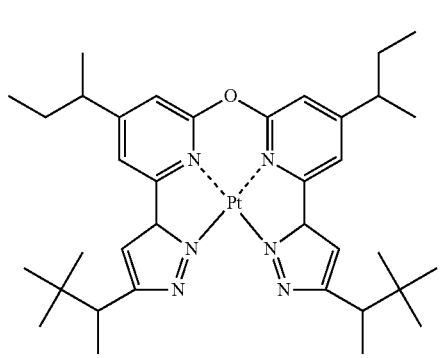
171
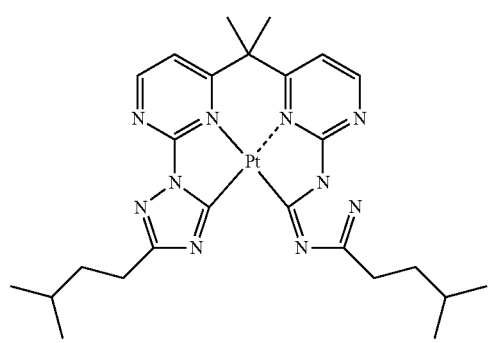
172
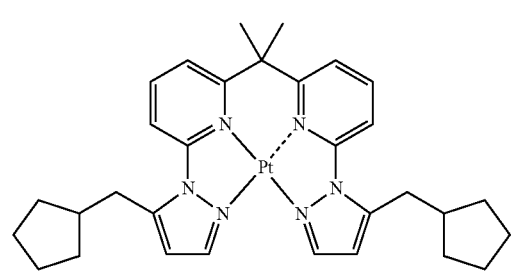
173
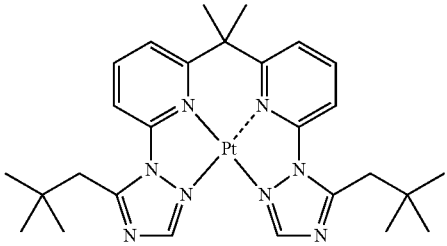
174
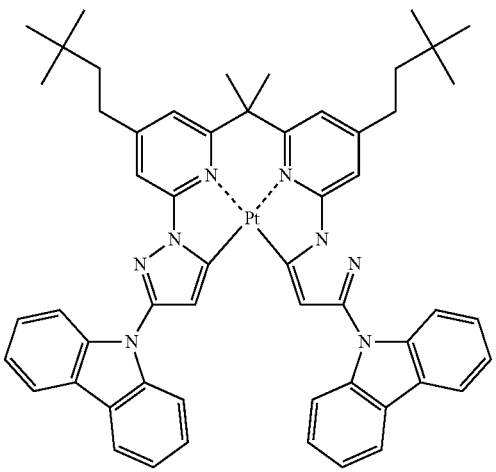
175
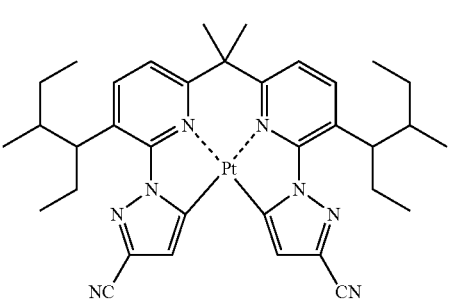
176
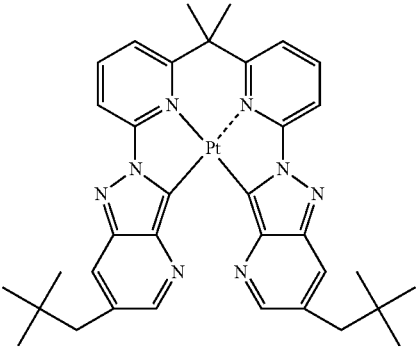

| 119 -continued | | 120 -continued | |
|---|---|---|---|
| 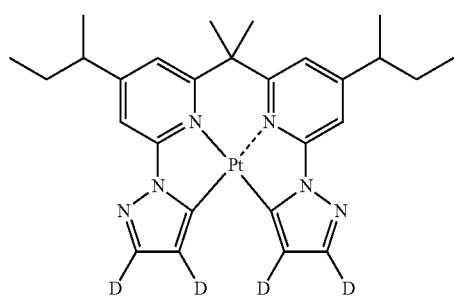 | 177 | 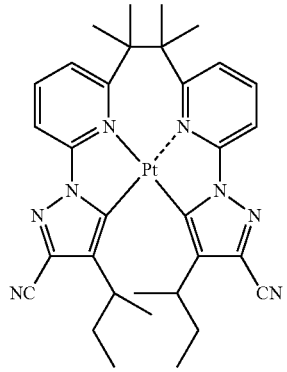 | 181 |
| 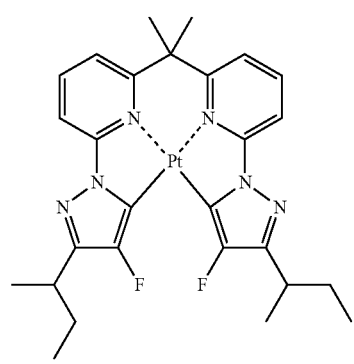 | 178 | 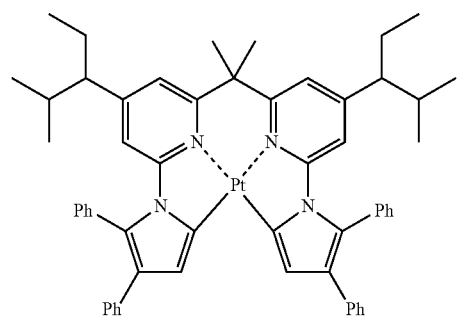 | 182 |
| | 179 | | 183 |
| 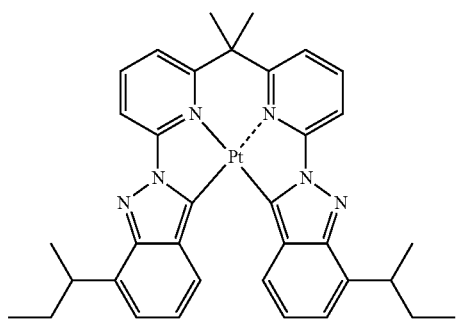 | | 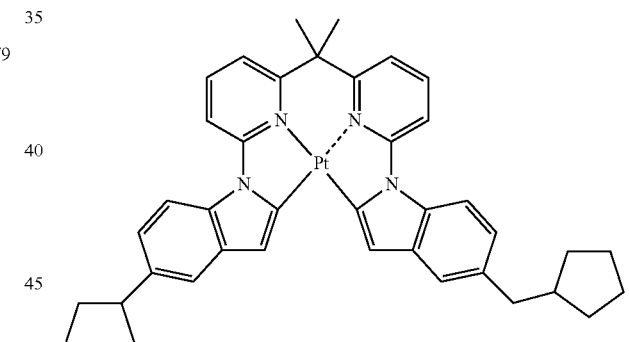 | |
| | 180 | | 184 |
| 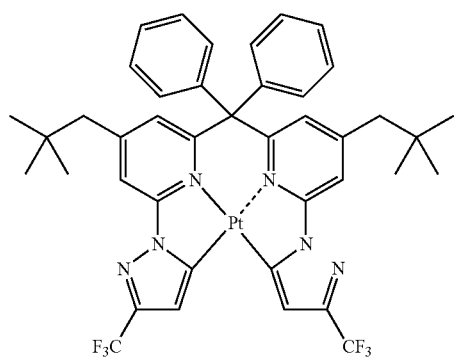 | | 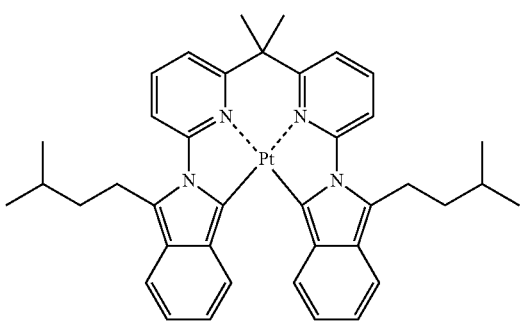 | |

185
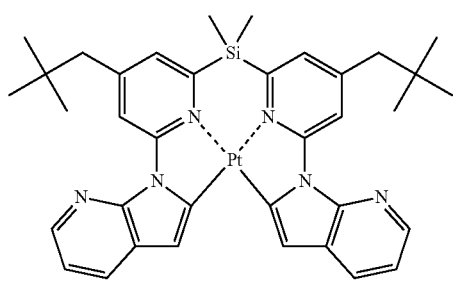
186
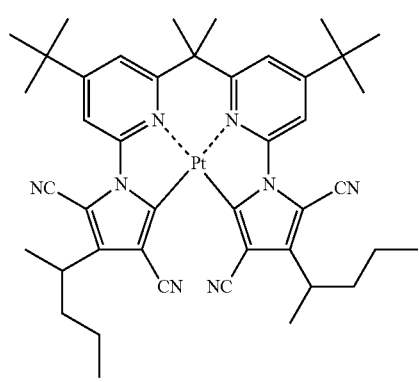
187
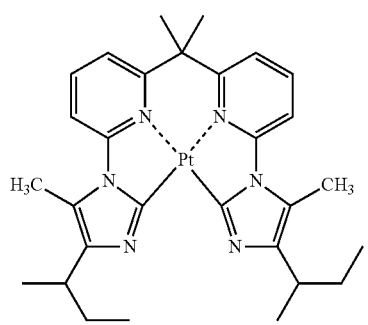
188
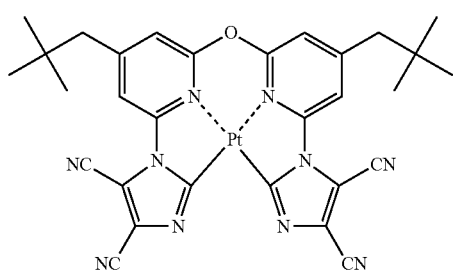
189
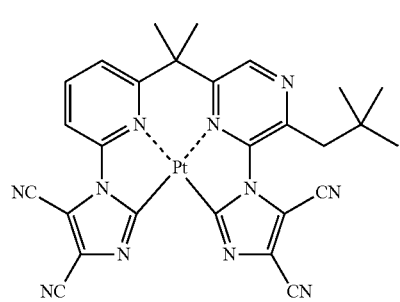
190
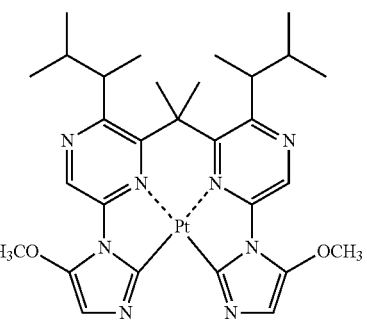
191
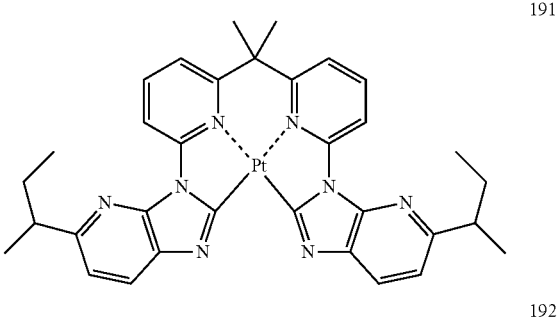
192
193
194
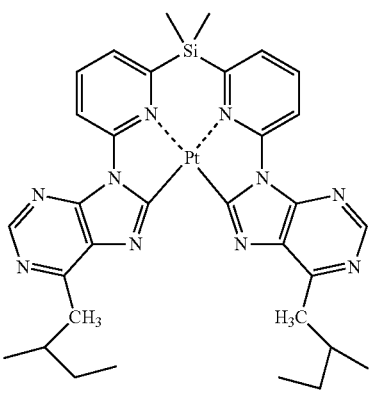

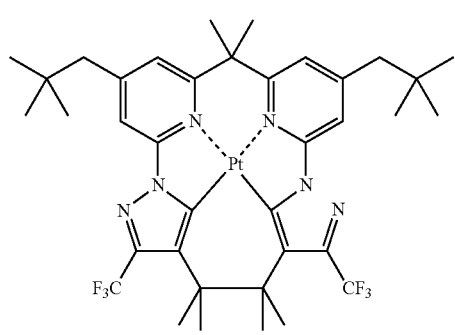
195
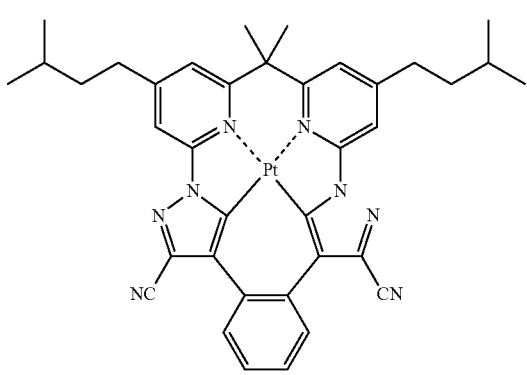
196
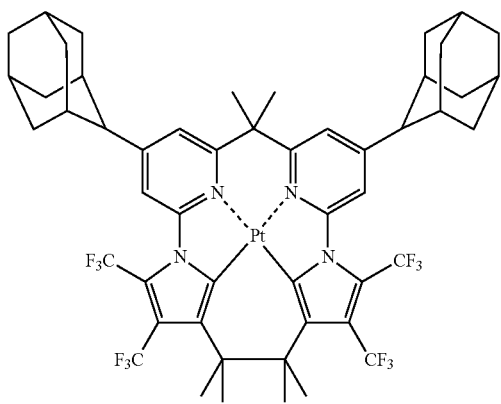
197
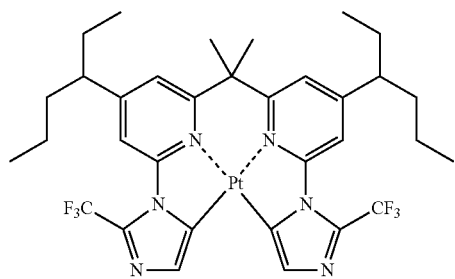
198
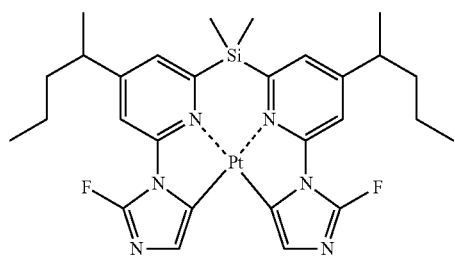
199
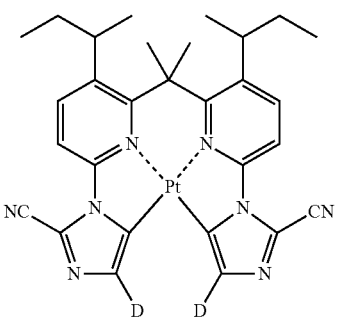
200
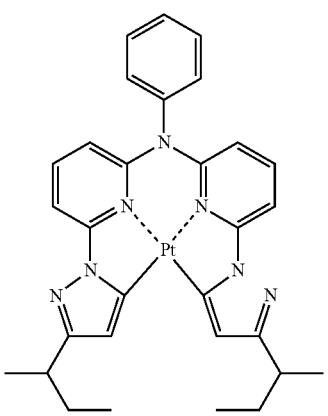
201
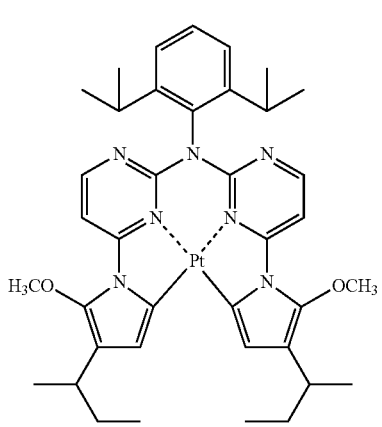
202
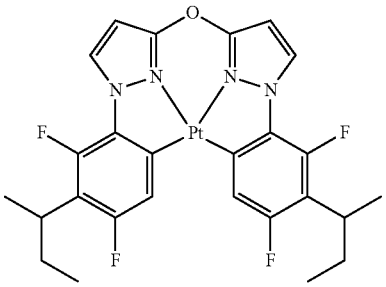
203

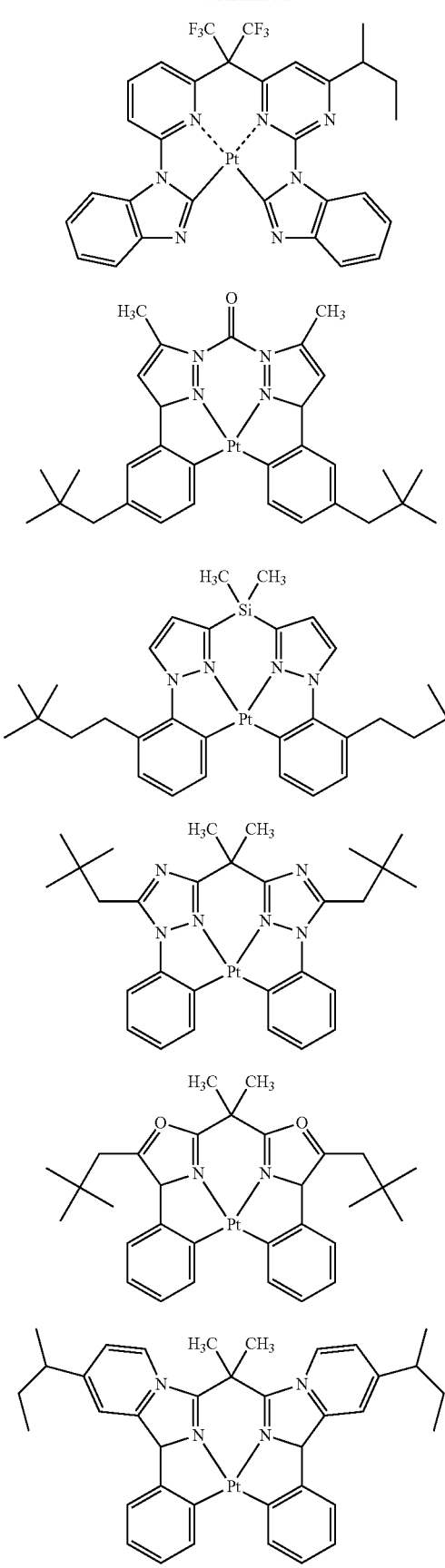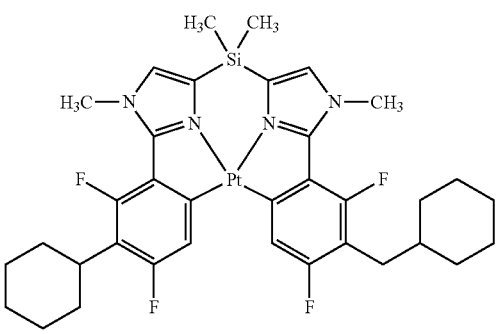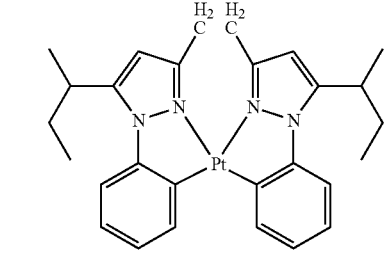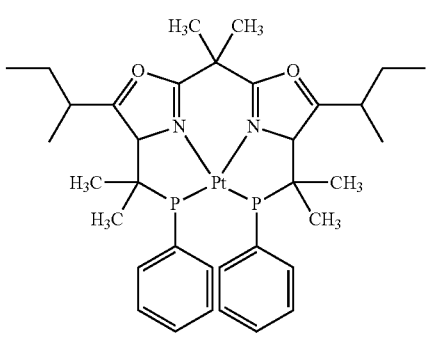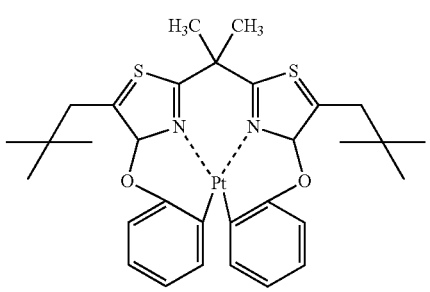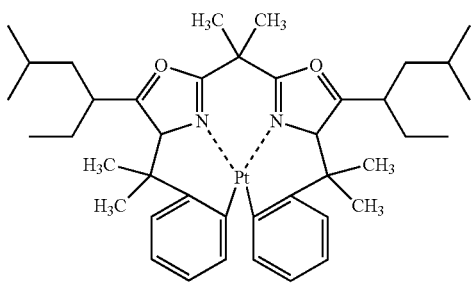

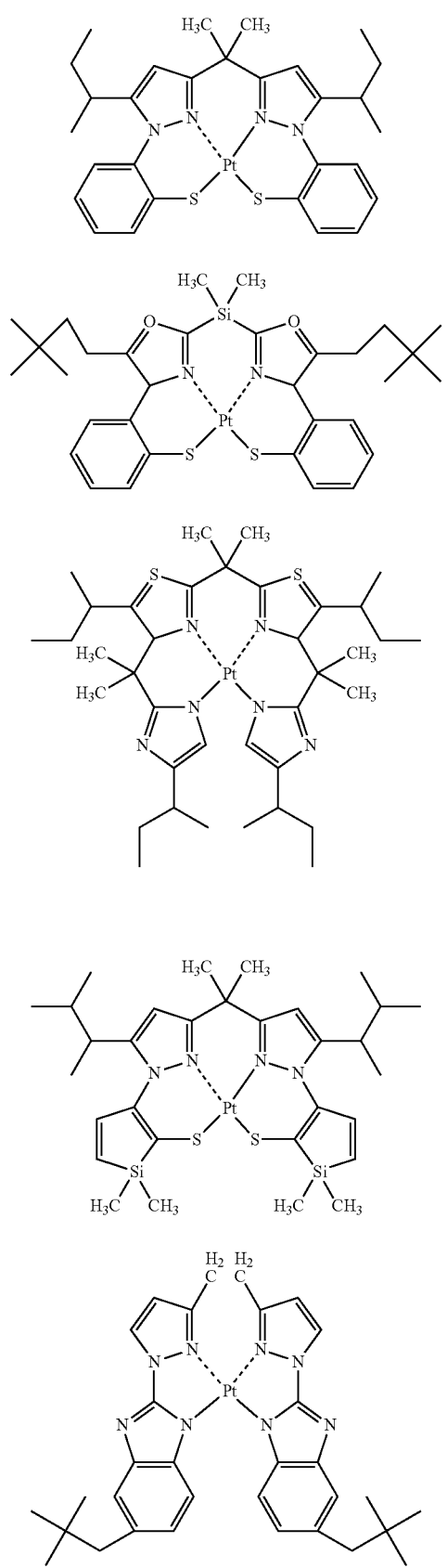
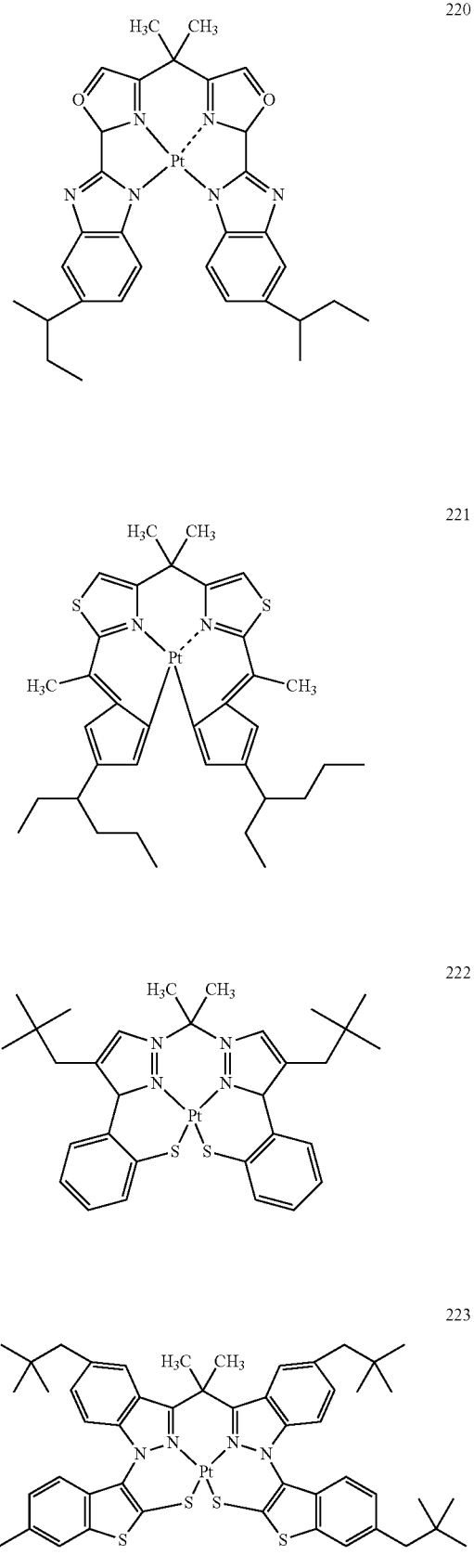

-continued

224

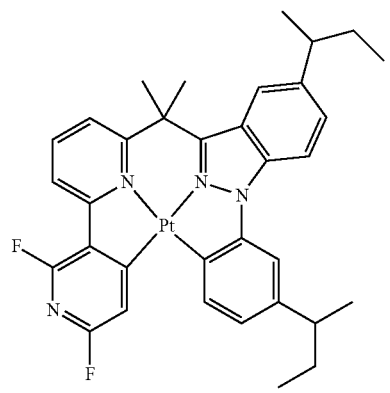

225

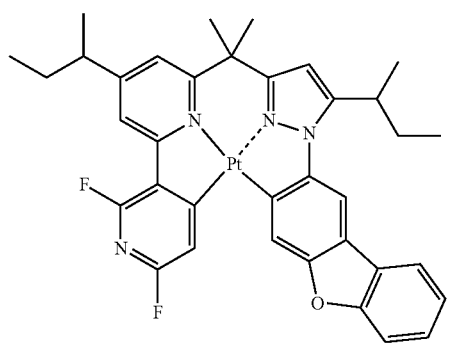

226

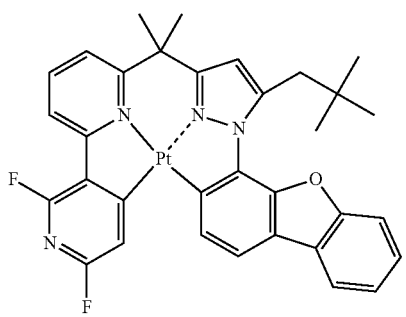

227

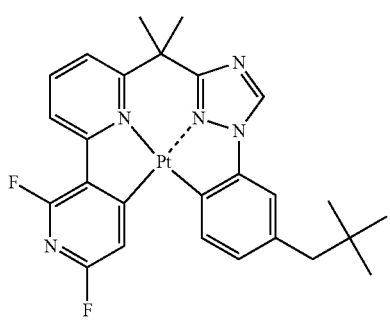

-continued

228

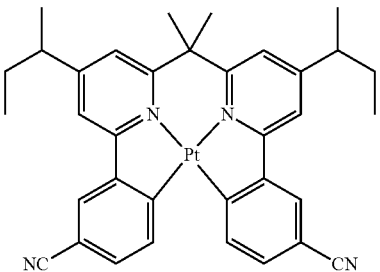

These compounds can be synthesized by various known synthesis methods described, for example, in *Org. Lett.*, 3, 2579-2581 (2001), *Inorg. Chem.*, 30, 1685-1687 (1991), *J. Am. Chem. Soc.*, 123, 4304 (2001), *Inorg. Chem.*, 40, 1704-1711 (2001), *Inorg. chem.*, 41, 3055-3066 (2002), and *Eur. J. Org. Chem.*, 4, 695-709 (2004).

Furthermore, the above-described metal complex compounds can be synthesized by various techniques such as the method described in *Journal of Organic Chemistry*, 53, 786 (1988), G. R. Newkome et al., at page 789, from left column, line 53 to right column, line 7, the method described at page 790, left column, lines 18 to 38, the method described at page 790, right column, lines 19 to 30, a combination thereof, and the method described in *Chemische Berichte*, 113, 2749 (1980), H. Lexy et al., at page 2752, liens 26 to 35.

For example, a ligand or a dissociation product thereof and a metal compound are reacted with or without a solvent (for example, a halogen-based solvent, an alcohol-based solvent, an ether-based solvent, an ester-based solvent, a ketone-based solvent, a nitrile-based solvent, an amide-based solvent, a sulfone-based solvent, a sulfoxide-based solvent or water) in the presence or absence of a base (various inorganic or organic bases, for example, sodium methoxide, tert-butoxy potassium, triethylamine or potassium carbonate) at not higher than room temperature or under heating (in addition to normal heating, microwave heating is also effective), whereby the compound can be obtained.

In the present invention, the compound represented by formula (1) is not limited in its use and may be contained in any layer within the organic layer. The layer into which the compound represented by formula (1) is introduced is preferably any one of a light emitting layer, a hole injection layer, a hole transporting layer, an electron transporting layer, an electron injection layer, an exciton blocking layer and a charge blocking layer.

In the present invention, the compound represented by formula (1) is preferably contained in a light emitting layer so as to more suppress the change in chromaticity at high-temperature driving.

In the case of incorporating the compound represented by formula (1) into a light emitting layer, the compound represented by formula (1) for use in the present invention is preferably contained in an amount of 0.1 to 50 mass %, more preferably from 1 to 50 mass %, still more preferably from 2 to 40 mass %, based on the total mass of the light emitting layer.

Also, in the case of incorporating the compound represented by formula (1) into a layer other than a light emitting layer, the compound is preferably contained in an amount of 0.1 to 100 mass %, more preferably from 10 to 100 mass %, still more preferably from 30 to 100 mass %.

[Organic Electroluminescence Device]

The organic electroluminescence device of the present invention is described in detail below.

The organic electroluminescence device of the present invention is an organic electroluminescence device including a substrate having thereon a pair of electrodes and at least one organic layer between the electrodes, the organic layer containing a light emitting layer, wherein any one layer of the organic layer contains a compound represented by formula (1).

In the organic electroluminescence device of the present invention, the light emitting layer is an organic layer, and the device may have a plurality of organic layers.

In view of property of the luminescence device, at least one electrode of the anode and the cathode is preferably transparent or translucent.

FIG. 1 shows one example of the configuration of the organic electroluminescence device of the present invention. In the organic electroluminescence device 10 of the present invention shown in FIG. 1, a light emitting layer 6 is sandwiched between an anode 3 and a cathode 9 on a supporting substrate 2. More specifically, a hole injection layer 4, a hole transporting layer 5, a light emitting layer 6, a hole blocking layer 7 and an electron transporting layer 8 are stacked in this order between an anode 3 and a cathode 9.

<Configuration of Organic Layer>

The layer configuration of the organic layer is not particularly limited and may be appropriately selected according to the use and purpose of the organic electroluminescence device but is preferably formed on the transparent electrode or back plate. In this case, the organic layer is formed on the front surface or one surface of the transparent electrode or back plate.

The shape, size, thickness and the like of the organic layer are not particularly limited and may be appropriately selected according to the purpose.

Specific examples of the layer configuration include the following configurations, but the present invention is not limited thereto.

Anode/hole transporting layer/light emitting layer/electron transporting layer/cathode Anode/hole transporting layer/light emitting layer/blocking layer/electron transporting layer/cathode Anode/hole transporting layer/light emitting layer/blocking layer/electron transporting layer/electron injection layer/cathode Anode/hole injection layer/hole transporting layer/light emitting layer/blocking layer/electron transporting layer/cathode Anode/hole injection layer/hole transporting layer/light emitting layer/blocking layer/electron transporting layer/electron injection layer/cathode The device configuration, substrate, cathode and anode of an organic electroluminescence device are described in detail, for example, in JP-A-2008-270736, and the matters described therein can be applied to the present invention.

<Substrate>

The substrate for use in the present invention is preferably a substrate which does not scatter or attenuate the light emitted from the organic layer. When the substrate is made from an organic material, it is preferable that the organic material has excellent heat resistance, dimensional stability, solvent resistance, electrical insulation and workability.

<Anode>

The anode is usually sufficient if it has a function as an electrode of supplying a hole to the organic layer. The shape, structure, size and the like thereof are not particularly limited, and the anode material may be appropriately selected from known electrode materials according to the use or purpose of the luminescence device. As described above, the anode is usually provided as a transparent anode.

<Cathode>

The cathode is usually sufficient if it has a function as an electrode of injecting an electron in the organic layer. The shape, structure, size and the like thereof are not particularly limited, and the cathode material may be appropriately selected from known electrode materials according to the use or purpose of the luminescence device.

As for the substrate, anode and cathode, the matters described in JP-A-2008-270736, paragraphs [0070] to [0089] can be applied to the present invention.

<Organic Layer>

The organic layer for use in the present invention is described below.

—Formation of Organic Layer—

In the organic electroluminescence device of the present invention, each organic layer may be suitably formed by any of a dry deposition method such as vapor deposition and sputtering, a transfer method, a printing method and the like.

At least one layer of the organic layer is preferably formed by a wet process.

(Light Emitting Layer)

<Light Emitting Material>

The light emitting material for use in the present invention is preferably a compound represented by formula (1).

The light emitting material in the light emitting layer is generally contained in the light emitting layer, based on the mass of all compounds forming the light emitting layer, in an amount of 0.1 to 50 mass %, and in view of durability and external quantum efficiency, preferably in an amount of from 1 to 50 mass %, still more preferably from 2 to 40 mass %, yet still more preferably from 5 to 30 mass %.

The thickness of the light emitting layer is not particularly limited but usually, the thickness is preferably from 2 to 500 nm, and in view of external quantum efficiency, more preferably from 3 to 200 nm, still more preferably from 5 to 100 nm.

In the device of the present invention, the light emitting layer may be composed of only a light emitting material or may have a mixed layer configuration of a host material and a light emitting material. The light emitting material may be either a fluorescent material or a phosphorescent material and as for the dopant, one kind of a dopant or two or more kinds of dopants may be used. The host material is preferably a charge transport material. As for the host material, one kind of a host material or two or more kinds of host materials may be used, and examples of this configuration include a configuration where an electron transportinging host material and a hole transportinging host material are mixed. Also, the light emitting layer may contain a material having no charge transport property and being incapable of producing luminescence.

Furthermore, the light emitting layer may be a single layer or a multilayer composed of two or more layers. In the case of a plurality of light emitting layers, the compound represented by formula (1) may be contained in two or more light emitting layers. Also, respective light emitting layers may produce luminescence in different colors.

<Host Material>

Examples of the host material contained in the light emitting layer include, other than the compound of the present invention, a compound having a carbazole structure, a compound having an azacarbazole structure, a compound having an indole structure, a compound having an azaindole structure, a compound having a diarylamine structure, a compound having a pyridine structure, a compound having a pyrazine structure, a compound having a triazine structure, a compound having an arylsilane structure, and the materials exemplified later in the paragraphs of hole injection layer, hole transporting layer, electron injection layer and electron transporting layer. Among these, a compound having a carbazole structure and a compound having an indole structure are preferred. Examples thereof include pyrrole, indole, carbazole, CBP (4,4'-di(9-carbazoyl)biphenyl), azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, an aromatic tertiary amine compound, a styrylamine compound, a porphyrin-based compound, a polysilane-based compound, poly(N-vinylcarbazole), an aniline-base copolymer, an electrically conductive polymer oligomer such as thiophene oligomer and polythiophene, an organic silane, a carbon film, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, a fluorine-substituted aromatic compound, a heterocyclic tetracarboxylic anhydride such as naphthaleneperylene, various metal complexes typified by a metal complex of phthalocyanine or 8-quinolinol derivative and a metal complex having metal phthalocyanine, benzoxazole or benzothiazole as the ligand, and derivatives thereof (may have a substituent or form a condensed ring).

In view of color purity, luminous efficiency and drive durability, the lowest triplet excitation energy ($T_1$ energy) of the host material in the light emitting layer for use in the present invention is preferably higher than the $T_1$ energy of the phosphorescent material.

In the present invention, the content of the host compound is not particularly limited but in view of luminous efficiency and drive voltage, the content is preferably from 15 to 95 mass % based on the mass of all compounds forming the light emitting layer.

The thickness of the light emitting layer is not particularly limited but usually, the thickness is preferably from 1 to 500 nm, more preferably from 5 to 200 nm, still more preferably from 10 to 100 nm.

(Fluorescent Material)

Examples of a fluorescent material usable in the invention include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styrylamine derivatives, diketopyrrolopyrrole derivatives, aromatic dimethylidyne derivatives, various kinds of complexes typified by complexes of 8-quinolinol derivatives and complexes of pyrromethene derivatives, polymeric compounds such as polythiophene, polyphenylene and polyphenylenevinylene, and compounds like organic silane derivatives.

(Phosphorescent Material)

Examples of the phosphorescent material which can be used in the present invention include, other than the compound represented by formula (1), phosphorescent compounds described in patent documents such as U.S. Pat. No. 6,303,238B1, U.S. Pat. No. 6,097,147, WO 00/57676, WO 00/70655, WO 01/08230, WO 01/39234A2, WO 01/41512A1, WO 02/02714A2, WO 02/15645A1, WO 02/44189A1, WO 05/19373A2, JP-A-2001-247859, JP-A-2002-302671, JP-A-2002-117978, JP-A-2003-133074, JP-A-2002-235076, JP-A-2003-123982, JP-A-2002-170684, EP 1211257, JP-A-2002-226495, JP-A-2002-234894, JP-A-2001-247859, JP-A-2001-298470, JP-A-2002-173674, JP-A-2002-203678, JP-A-2002-203679, JP-A-2004-357791, JP-A-2006-256999, JP-A-2007-19462, JP-A-2007-84635 and JP-A-2007-96259. Examples of luminescent dopants which are far preferred among those compounds include the Ir complexes, the Pt complexes, the Cu complexes, the Re complexes, the W complexes, the Rh complexes, the Ru complexes, the Pd complexes, the Os complexes, the Eu complexes, the Tb complexes, the Gd complexes, the Dy complexes and the Ce complexes. Of these complexes, Ir complexes, the Pt complexes and the Re complexes are particularly preferable, notably Ir complexes, the Pt complexes and the Re complexes each having at least one kind of coordination bond selected from metal-carbon, metal-nitrogen, metal-oxygen and metal-sulfur coordinate bonds. In terms of luminous efficiency, durability under driving, chromaticity and so on, the Ir complexes, the Pt complexes and the Re complexes each having a polydentate ligand, including a tridentate ligand or higher, are preferred over the others.

The content of the phosphorescent material in the light emitting layer is preferably from 0.1 to 50 mass %, more preferably from 0.2 to 50 mass %, still more preferably from 0.3 to 40 mass %, and most preferably from 20 to 30 mass %, based on the total mass of the light emitting layer.

The content of the phosphorescent material (the compound represented by formula (1) and/or a phosphorescent material used in combination) which can be used in the present invention is preferably from 0.1 to 50 mass %, more preferably from 1 to 40 mass %, and most preferably from 5 to 30 mass %, based on the total mass of the light emitting layer. In particular, within the range of 5 to 30 mass %, the chromaticity of luminescence of the organic electroluminescence device is small in the dependency on the concentration of the phosphorescent material added.

The organic electroluminescence device of the present invention most preferably contains at least one kind of the compound (1) (compound represented by formula (1)) in an amount of 5 to 30 mass % based on the total mass of the light emitting layer.

The organic electroluminescence device preferably further contains a hydrocarbon compound or a derivative thereof, and it is more preferred to contain a hydrocarbon compound in a light emitting layer.

The hydrocarbon compound is preferably a compound represented by the following formula (VI).

By appropriately using the compound represented by formula (VI) together with the light emitting material, the interaction between material molecules can be adequately controlled to make uniform the energy gap and interaction between adjacent molecules, whereby the drive voltage can be more lowered.

Also, the compound represented by formula (VI) for use in the organic electroluminescence device is excellent in chemical stability and less causes a deterioration such as decomposition of the material during driving of the device, so that the organic electroluminescence device can be prevented from reduction in the efficiency or life due to decomposition of the material.

The compound represented by formula (VI) is described below.

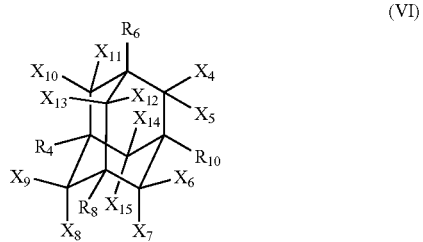

In formula (VI), each of $R_4$, $R_6$, $R_8$, $R_{10}$ and $X_4$ to $X_{15}$ independently represents a hydrogen atom, an alkyl group or an aryl group.

In formula (VI), the alkyl group represented by $R_4$, $R_6$, $R_8$, $R_{10}$ and $X_4$ to $X_{15}$ may be substituted with an adamantane structure or an aryl structure and is preferably an alkyl group having a carbon number of 1 to 70, more preferably from 1 to 50, still more preferably from 1 to 30, yet still more preferably from 1 to 10, even yet still more preferably from 1 to 6, and most preferably a linear alkyl group having a carbon number of 2 to 6.

Examples of the alkyl group represented by each of $R_4$, $R_6$, $R_8$, $R_{10}$ and $X_4$ to $X_{15}$ in the formula (VI) include an n-$C_{50}H_{101}$ group, an n-$C_{30}H_{61}$ group, 3-(3,5,7-triphenyladamantane-1-yl)propyl group (number of carbon atoms: 31), a trityl group (number of carbon atoms: 19), 3-(adamantane-1-yl) propyl group (number of carbon atoms: 13), 9-decalyl group (number of carbon atoms: 10), a benzyl group (number of carbon atoms: 7), a cyclohexyl group (number of carbon atoms: 6), a n-hexyl group (number of carbon atoms: 6), an n-pentyl group (number of carbon atoms: 5), an n-butyl group (number of carbon atoms: 4), an n-propyl group (number of carbon atoms: 3), a cyclopropyl group (number of carbon atoms: 3), an ethyl group (number of carbon atoms: 2) and a methyl group (number of carbon atoms: 1).

The aryl group represented by each of $R_4$, $R_6$, $R_8$, $R_{10}$ and $X_4$ to $X_{15}$ in the formula (VI) may have as a substituent an adamantane structure or an alkyl structure, and the number of carbon atoms the aryl group has is preferably from 6 to 30, far preferably from 6 to 20, further preferably from 6 to 15, especially preferably from 6 to 10, the most preferably is 6.

Examples of the aryl group represented by each of $R_4$, $R_6$, $R_8$, $R_{10}$ and $X_4$ to $X_{15}$ in the formula (VI) include a 1-pyrenyl group (number of carbon atoms: 16), a 9-anthracenyl group (number of carbon atoms: 14), a 1-naphthyl group (number of carbon atoms: 10), a 2-natphthyl group (number of carbon atom: 10), a p-t-butylphenyl group (number of carbon atoms: 10), a 2-m-xylyl group (number of carbon atoms: 8), a 5-m-xylyl group (number of carbon atoms: 8), an o-tolyl group (number of carbon atoms: 7), a m-tolyl group (number of carbon atoms: 7), a p-tolyl group (number of carbon atoms: 7) and a phenyl group (number of carbon atoms: 6).

Although each of $R_4$, $R_6$, $R_8$ and $R_{10}$ in the formula (VI) may be either a hydrogen atom, or an alkyl group, or an aryl group, from the viewpoint that high glass transition temperatures are preferable, it is preferable that at least one of them is an aryl group, it is far preferable that at least two of them are aryl groups, and it is particularly preferable that 3 or 4 of them are aryl groups.

Although each of $X_4$ to $X_{15}$ in the formula (VI) may represent either a hydrogen atom, or an alkyl group, or an aryl group, it is preferable that each stands for a hydrogen atom or an aryl group, especially a hydrogen atom.

The organic electroluminescence devices are made using a vacuum deposition process or a solution coating process, and therefore, in terms of vacuum deposition suitability and solubility, the molecular weight of the compounds represented by the formula (VI) in the invention is preferably 2,000 or below, far preferably 1,200 or below, especially 1,000 or below. Also, from the viewpoint of vacuum deposition suitability, the molecular weight is preferably 250 or above, far preferably 350 or above, particularly preferably 400 or above. This is because, when the compounds have too low molecular weight, their vapor pressure becomes low and change from a vapor phase to a solid phase does not occur, and it is therefore difficult for the compounds to form organic layers.

The compound represented by the formula (VI) is preferably in solid phase at room temperature (25° C.), far preferably solid phase in a range from room temperature to 40° C., especially preferably solid phase in a range from room temperature to 60° C.

In the case of using the compound which, though represented by the formula (VI), is not in solid phase at room temperature, it is possible to form a solid phase at ordinary temperatures by combining the compound with other substances.

Uses of the compound represented by the formula (VI) are not limited, and the compound may be incorporated into any of the organic layers. The layer into which the compound represented by the formula (VI) in the invention is introduced is preferably a layer selected from a light emitting layer, a hole injection layer, a hole transporting layer, an electron transporting layer, an electron injection layer, an exciton block layer and a charge blocking layer, or a combination of two or more of these layers, far preferably a layer selected from the light emitting layer, the hole injection layer, the hole transporting layer, the electron transporting layer and the electron injection layer, or a combination of two or more of these layers, especially preferably a layer selected from the light emitting layer, the hole injection layer and the hole transporting layer, or a combination of at least two of these layers, the most preferably the light emitting layer.

When the compound represented by the formula (VI) is used in an organic layer, its content is required to be limited so as not to inhibit charge transportability, and therefore it is preferable from 0.1% to 70% by mass, far preferable from 0.1% to 30% by mass, especially preferable from 0.1% to 25% by mass.

When the compound represented by the formula (VI) is used in two or more organic layers, its content in each organic layer is preferably in the range specified above.

Only one kind of a compound represented by formula (VI) may be contained in any organic layer, or a plurality of kinds of compounds represented by formula (VI) may be contained in combination in an arbitrary ratio.

Specific preferred examples of the hydrocarbon compound and its derivative are illustrated below, but the present invention is not limited thereto.

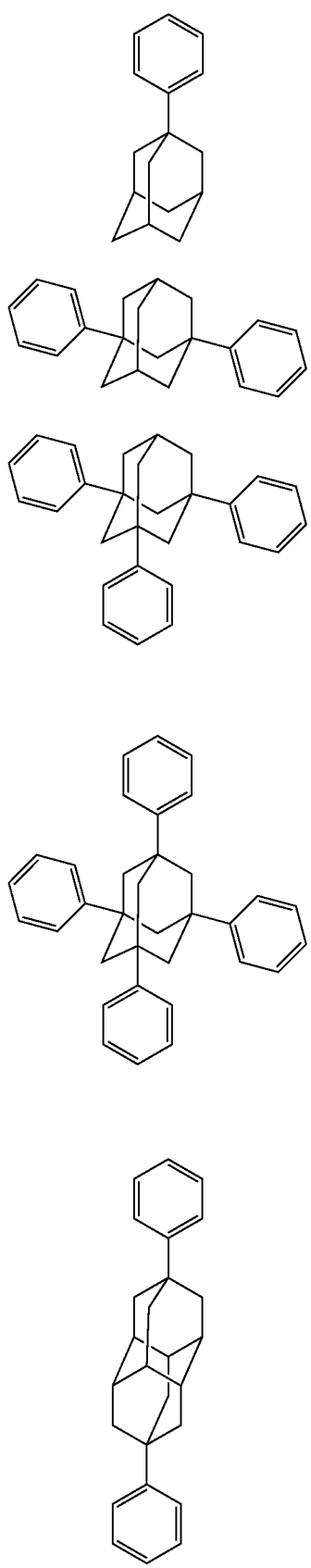
(1-1)
(1-2)
(1-3)
(1-4)
(1-5)
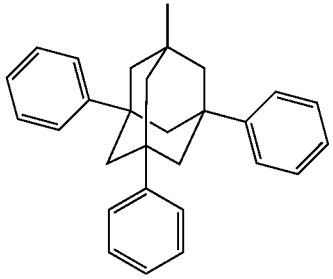
(1-6)
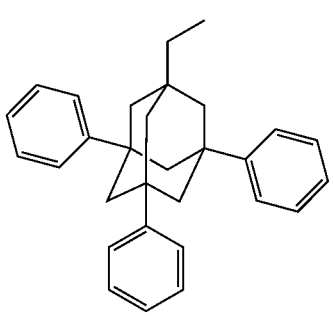
(1-7)
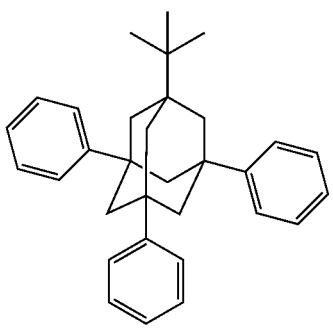
(1-8)
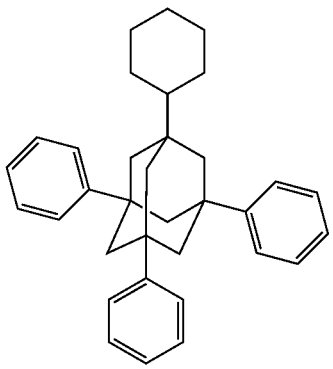
(1-9)

(1-10)
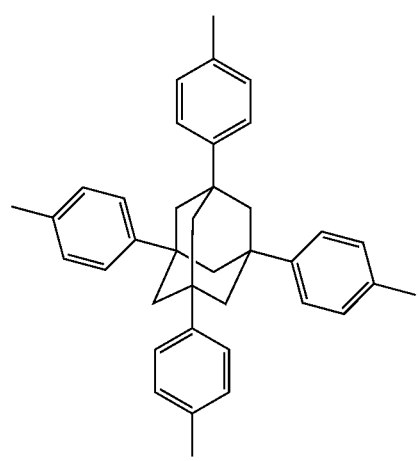
(1-11)
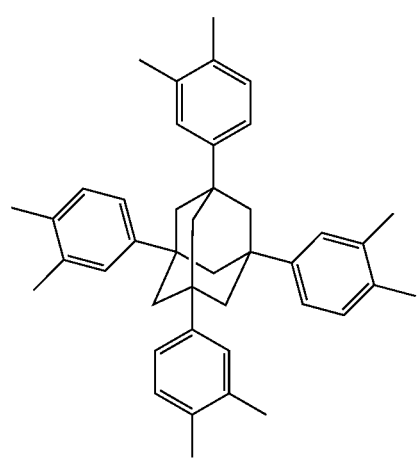
(1-12)
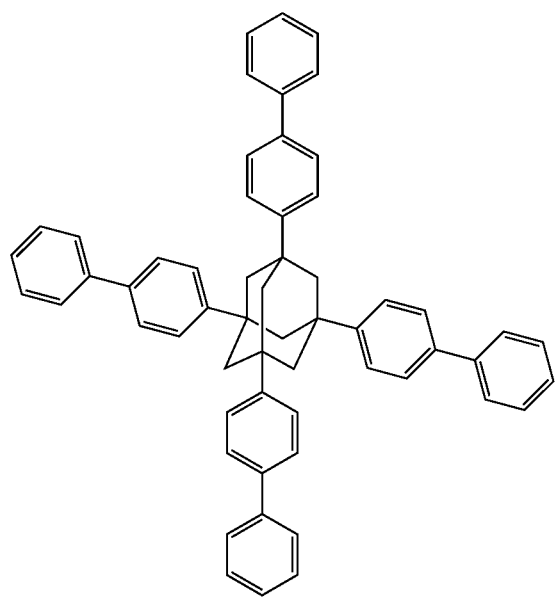
(1-13)
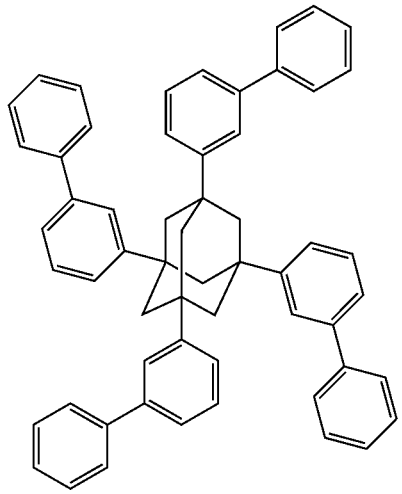
(1-14)
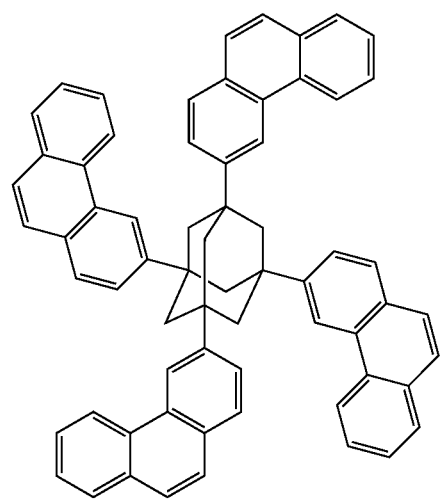
(1-15)
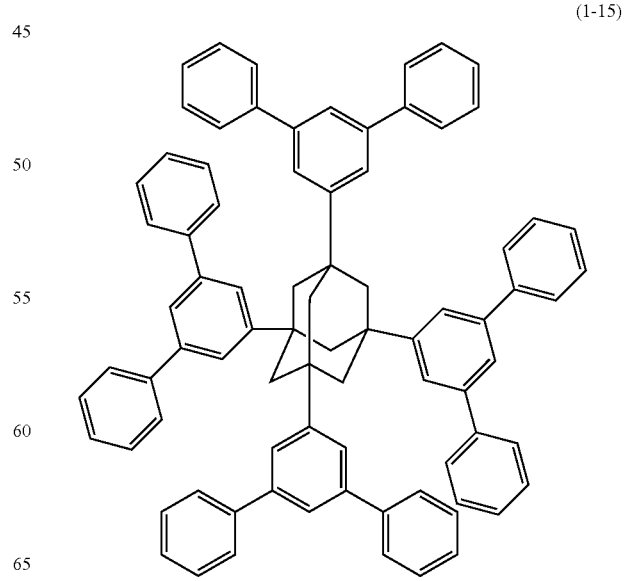

(1-16)
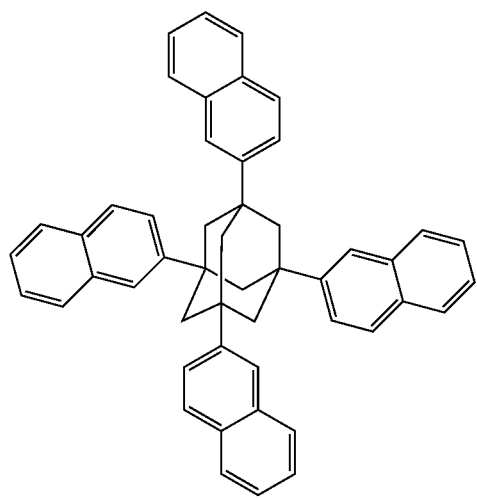
(1-17)
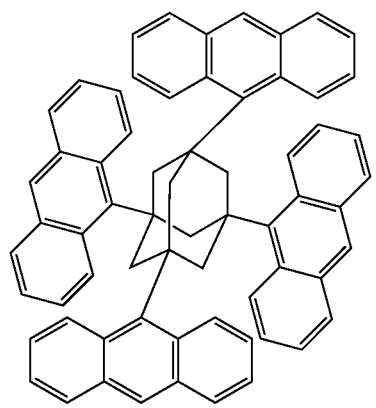
(1-18)
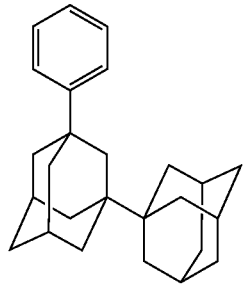
(1-19)
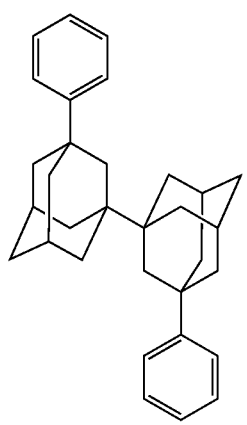
(1-20)
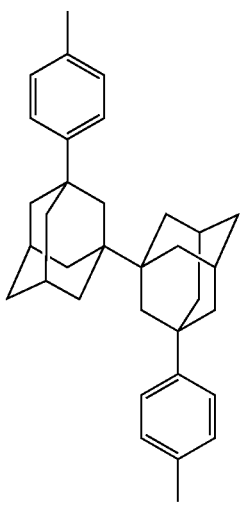
(1-21)
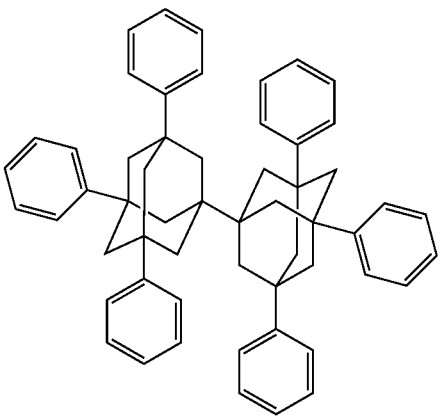
(1-22)
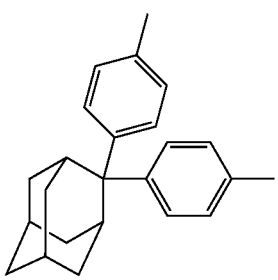

(1-23)
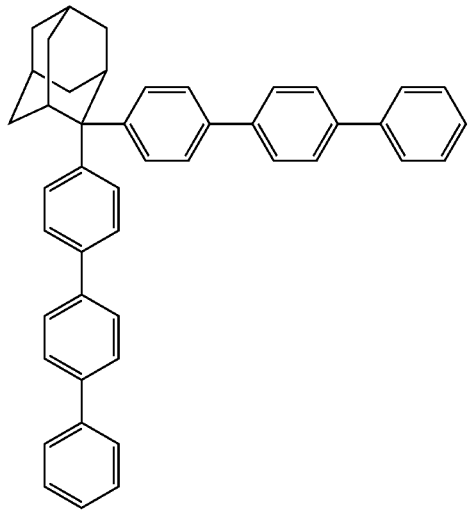
(1-24)
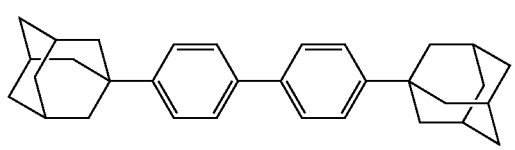
(1-25)
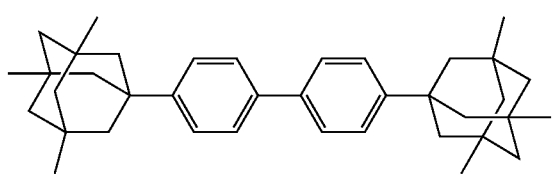
(1-26)
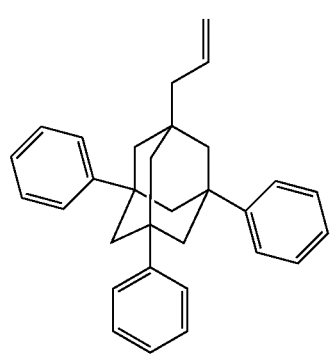
(1-27)
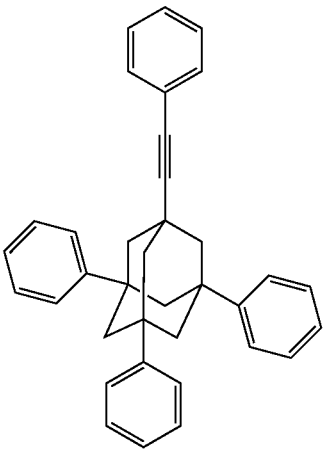
(1-28)
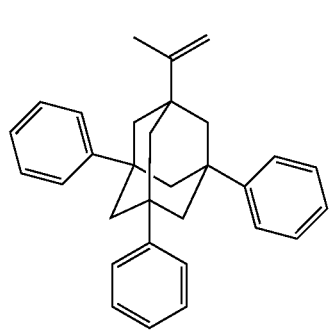
(1-29)
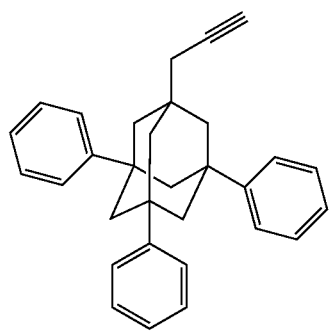
(1-30)
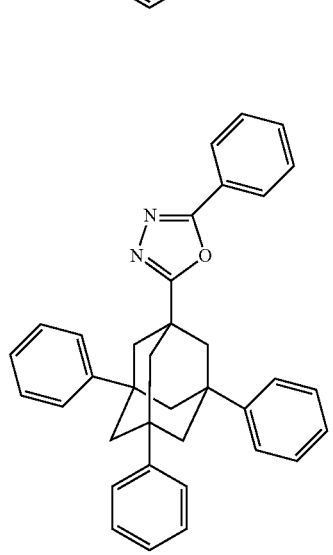

-continued
(1-31)
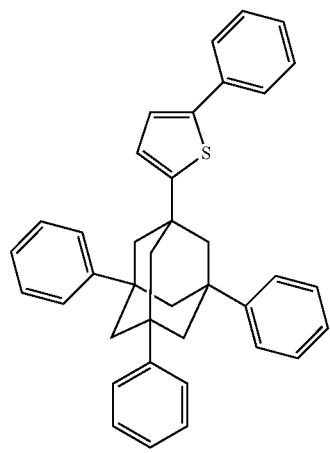
(1-32)
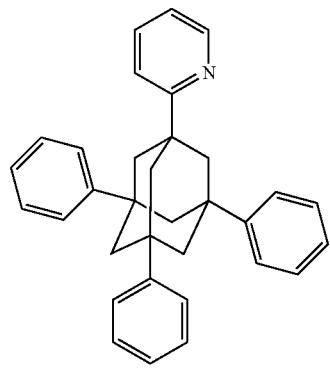
(1-33)
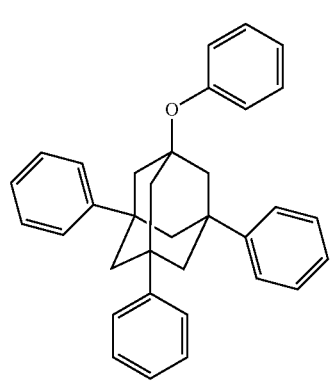
(1-34)
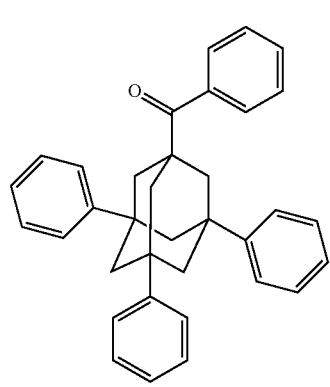
-continued
(1-35)
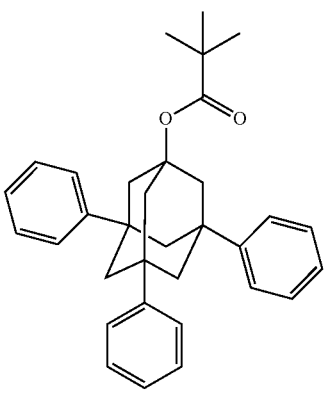
(1-36)
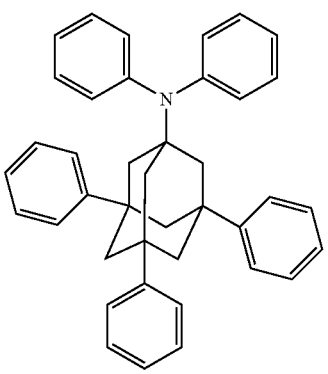
(1-37)
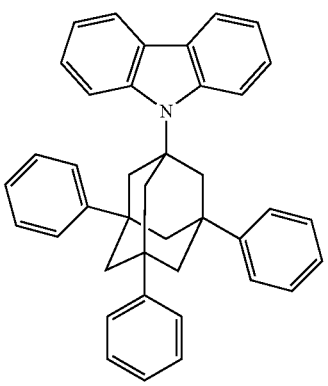
(1-38)
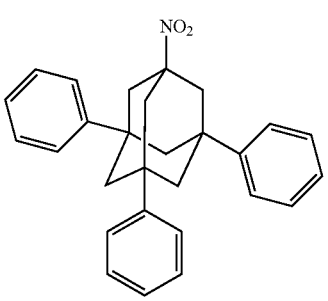

-continued
(1-39)
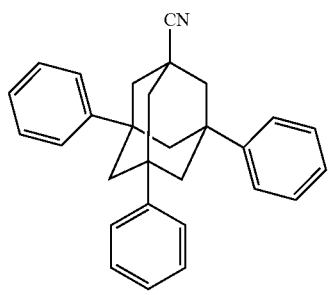
(1-40)
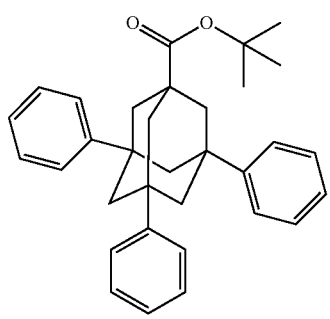
(1-41)
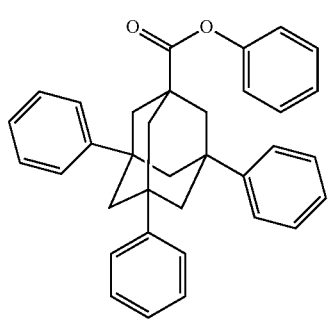
(1-42)
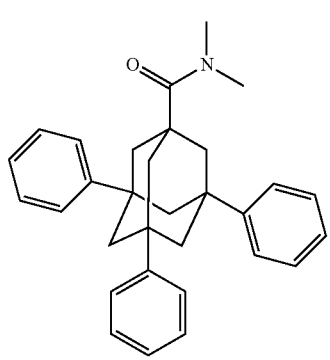
(1-43)
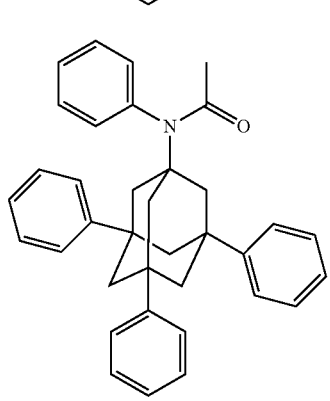
-continued
(1-44)
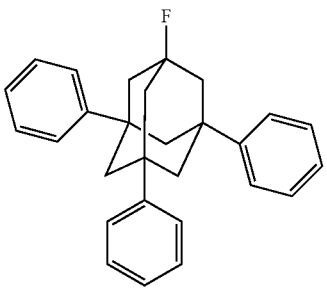
(1-45)
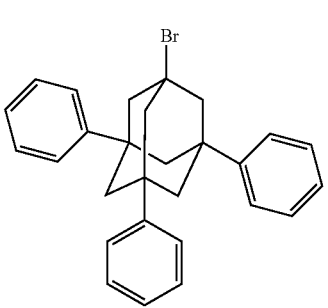
(1-46)
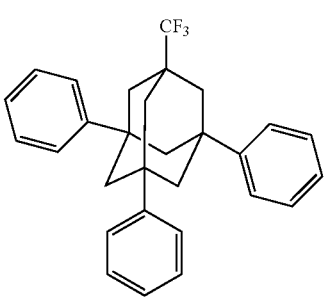
(1-47)
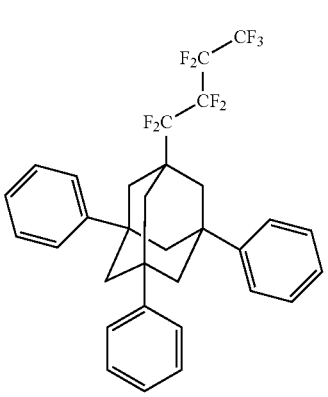
(1-48)
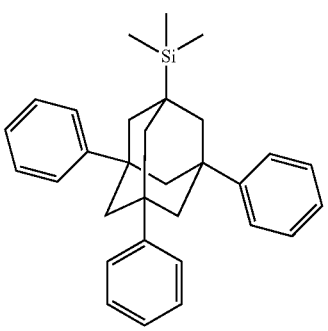

-continued (1-49)

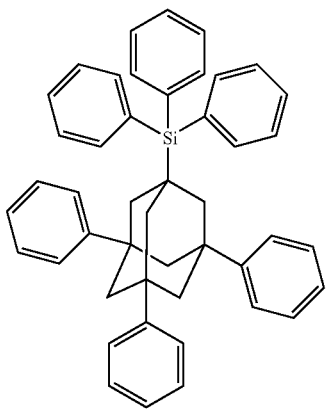

The compound represented by the formula (VI) can be synthesized by appropriately combining adamantane or haloadamantane with haloalkane or alkylmagnesium halide (Grignard reagent). For instance, it is possible to provide coupling between haloadamantane and haloalkane by use of indium (Reference 1). Alternatively, it is possible to convert haloalkane into an alkylcopper reagent and further to couple the reagent to Grignard reagent of an aromatic compound (Reference 2). Further, the coupling of haloalkane can also be performed using an appropriate arylboric acid and a palladium catalyst (Reference 3).
Reference 1: Tetrahedron Lett. 39, 9557-9558 (1998)
Reference 2: Tetrahedron Lett. 39, 2095-2096 (1998)
Reference 3: J. Am. Chem. Soc. 124, 13662-13663 (2002)

The adamantane structure having an aryl group can be synthesized by appropriately combining adamantane or haloadamantane with the corresponding arene or haloarene.

Additionally, even when defined substituents undergo changes under certain synthesis conditions in those production methods or they are unsuitable for carrying out those methods, the intended compounds can be produced with ease by adopting e.g. methods for protecting and deprotecting functional groups (T. W. Greene, Protective Groups in Organic Synthesis, John Wiley & Sons Inc. (1981)). Further, it is also possible to change the order of reaction steps, including a substituent introduction step, as appropriate, if needed.

The thickness of the light emitting layer is not particularly limited but usually, the thickness is preferably from 1 to 500 nm, more preferably from 5 to 200 nm, still more preferably from 10 to 100 nm.

—Hole Injection Layer, Hole transporting Layer—

The hole injection layer and the hole transporting layer are a layer having a function of receiving a hole from the anode or anode side and transporting it to the cathode side.

—Electron Injection Layer, Electron transporting Layer—

The electron injection layer and the electron transporting layer are a layer having a function of receiving an electron from the cathode or cathode side and transporting it to the anode side.

As regards the hole injection layer, hole transporting layer, electron injection layer and electron transporting layer, the matters described in JP-A-2008-270736, paragraphs [0165] to [0167] can be applied to the present invention.

—Hole Blocking Layer—

The hole blocking layer is a layer having a function of blocking the holes transported from an anode side to the light emitting layer from passing on through to the cathode side. In the invention, the hole blocking layer can be provided as an organic layer adjacent to the light emitting layer in the cathode side.

Examples of an organic compound which forms the hole blocking layer include aluminum complexes such as aluminum(III) bis(2-methyl-8-quinolinato) 4-phenylphenolate (abbreviated to BAlq), triazole derivatives, and phenanthroline derivatives such as 2,9-dimethyl-4,7-diphenyl-1,10-phenanthroline (abbreviated to BCP).

The thickness of the hole blocking layer is preferably from 1 nm to 500 nm, far preferably from 5 nm to 200 nm, further preferably from 10 nm to 100 nm.

The hole blocking layer may have either a single-layer structure made up of one or more than one material as recited above or a multiple-layer structure made up of two or more layers which are identical or different in composition.

—Electron Blocking Layer—

The electron blocking layer is a layer having a function of preventing the electrons transported from the cathode side to the light emitting layer from passing through to the anode side. In the invention, the electron blocking layer can be provided as an organic layer adjacent to the light emitting layer on the anode side.

As the examples of the compounds constituting the electron blocking layer, for instance, the hole transporting materials described above can be applied.

The thickness of the electron blocking layer is preferably from 1 nm to 500 nm, more preferably from 5 nm to 200 nm, still more preferably from 10 nm to 100 nm. The electron blocking layer may have a single layer structure composed of one or more of the above materials or may be a multilayer structure composed of two or more layers having the same composition or different compositions.

<Protective Layer>

In the present invention, the entire organic EL device may be protected by a protective layer.

As for the protective layer, the matters described in JP-A-2008-270736, paragraphs [0169] and [0170] can be applied to the present invention.

<Sealing Enclosure>

The device of the present invention may be entirely sealed using a sealing container.

As for the sealing container, the matters described in JP-A-2008-270736, paragraph [0171] can be applied to the present invention.

(Drive)

Luminescence of the organic electroluminescence device of the present invention can be obtained by applying a DC (if desired, an AC component may be contained) voltage (generally from 2 to 15 volts) or a DC current between the anode and the cathode.

As for the driving method of the organic electroluminescence device of the present invention, the driving methods described, for example, in JP-A-2-148687, JP-A-6-301355, JP-A-5-29080, JP-A-7-134558, JP-A-8-234685, JP-A-8-241047, Japanese Patent 2784615, and U.S. Pat. Nos. 5,828,429 and 6,023,308 can be applied.

The light collection efficiency of the luminescence device of the present invention can be enhanced by various known measures. For example, the light collection efficiency and the external quantum efficiency can be enhanced by processing the substrate surface shape (for example, forming a fine uneven pattern), by controlling the refractive index of the substrate, ITO layer or organic layer, or by controlling the film thickness of the substrate, ITO layer or organic layer.

The organic electroluminescence device of the present invention preferably has a maximum luminescence wavelength of 400 to 465 nm.

The luminescence device of the present invention may be in a so-called top emission system of collecting light from the anode side.

The present organic EL devices may have resonator structure. For instance, each device has on a transparent substrate a multilayer film mirror made up of a plurality of laminated films that have different refractive indices, a transparent or translucent electrode, a light emitting layer and a metal electrode which are superposed on top of each other. Reflections of light produced in the light emitting layer occur repeatedly between the multilayer film mirror and the metal electrode which function as reflector plates, thereby producing resonance.

In another aspect, the transparent or translucent electrode and the metal electrode function as reflector plates, respectively, on the transparent substrate, and reflections of light produced in the light emitting layer occur repeatedly between the reflector plates, thereby producing resonance.

In order to form a resonance structure, the optical distance determined from effective refractive indices of the two reflector plates, and refractive indices and thicknesses of each layers sandwiched between the two reflector plates are adjusted to have optimum values for achieving the desired resonance wavelength. The calculating formula in the first aspect case is described in JP-A-9-180883, and that in the second aspect case is described in JP-A-2004-127795.

(Use of Luminescence Device of the Present Invention)

The present luminescence devices can be used suitably for light luminous apparatus, pixels, indication devices, displays, backlights, electrophotographic devices, illumination light sources, recording light sources, exposure light sources, readout light sources, sign, billboards, interior decorations or optical communications, especially preferably for devices driven in a region of high-intensity luminescence, such as illumination apparatus and display apparatus.

Next the present light luminous apparatus is explained by reference to FIG. 2.

The present light luminous apparatus incorporates any one of the present organic electroluminescence devices.

Figure 2:
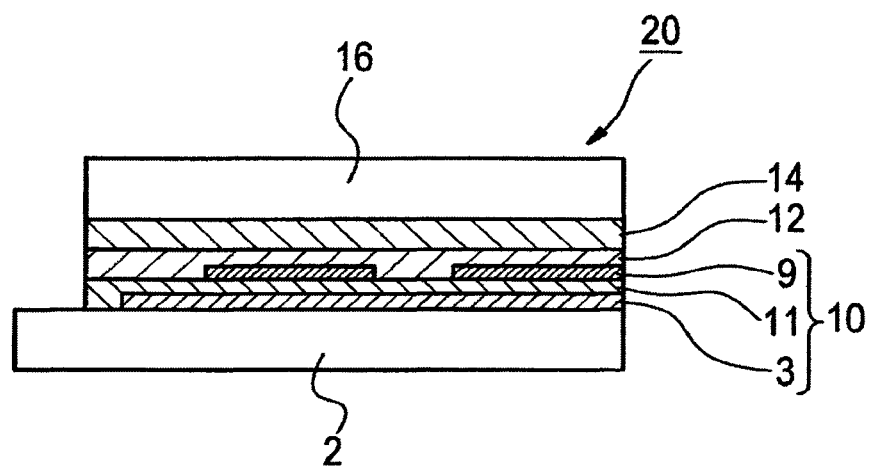
FIG. 2 is a schematic view showing one example of the light emission apparatus according to the present invention.

FIG. 2 is a cross-sectional diagram schematically showing one example of the present light luminous apparatus.

The light luminous apparatus 20 in FIG. 2 includes a transparent substrate 2 (supporting substrate), an organic electroluminescence device 10, a sealing enclosure 16 and so on.

The organic electroluminescence device 10 is formed by stacking on the substrate 2 an anode 3 (first electrode), an organic layer 11 and a cathode 9 (second electrode) in the order of mention. In addition, a protective layer 12 is superposed on the cathode 9, and on the protective layer 12 a sealing enclosure 16 is further provided via an adhesive layer 14. Incidentally, part of each of the electrodes 3 and 9, a diaphragm and an insulating layer are omitted in FIG. 2.

Herein, a light cure adhesive such as epoxy resin, or a thermosetting adhesive can be used for the adhesive layer 14. Alternatively, a thermosetting adhesive sheet may be used as the adhesive layer 14.

The present light emission apparatus has no particular restrictions as to its uses, and specifically, it can be utilized e.g. as not only illumination apparatus but also display apparatus of a television set, a personal computer, a mobile phone, an electronic paper or the like.

The illumination apparatus according to an embodiment of the present invention is described below by referring to FIG. 3.

Figure 3:
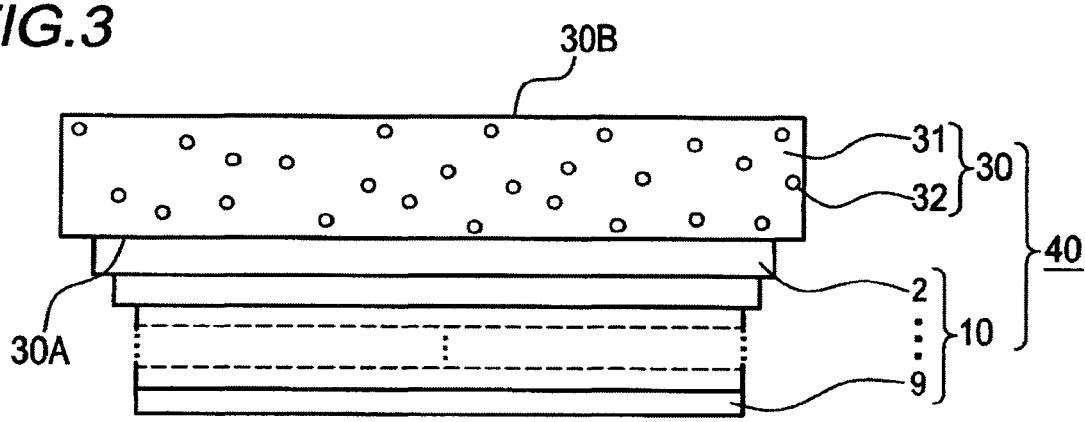
FIG. 3 is a schematic view showing one example of the illumination apparatus according to the present invention.

The illumination apparatus 40 according to an embodiment of the present invention contains, as shown in FIG. 3, the above-described organic electroluminescence device 10 and a light scattering member 30. More specifically, the illumination apparatus 40 is configured such that the substrate 2 of the organic electroluminescence device 10 and the light scattering member 30 are in contact with each other.

The light scattering member 30 is not particularly limited as long as it can scatter light, but in FIG. 3, a member obtained by dispersing fine particles 32 in a transparent substrate 31 is used. Suitable examples of the transparent substrate 31 include a glass substrate, and suitable examples of the fine particle 32 include a transparent resin fine particle. As the glass substrate and the transparent resin fine particle, a known product can be used for both. In such an illumination apparatus 40, when light emitted from the organic electroluminescence device 10 is incident on the light incident surface 30A of the scattering member 30, the incident light is scattered by the light scattering member and the scattered light is output as illuminating light from the light output surface 30B.

EXAMPLES

The present invention is described in greater detail below by referring to Examples, but the embodiment of the present invention is not limited thereto.

[Synthesis of Compound 2]

Compound 2 was synthesized according to the following scheme.

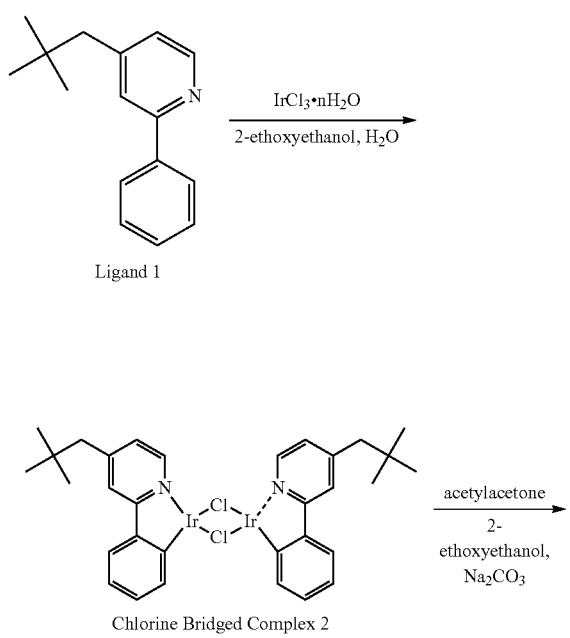

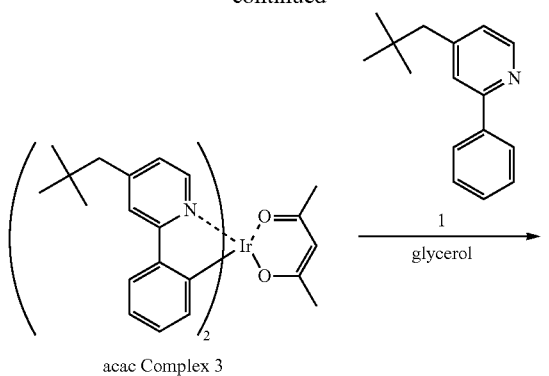

acac Complex 3

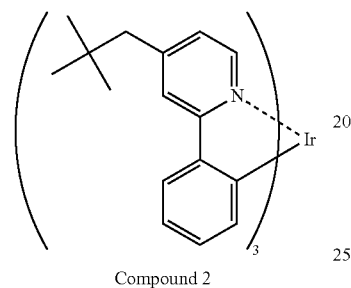

Compound 2

In a nitrogen atmosphere, 2.1 equivalents of Ligand 1 and 1 equivalent of iridium chloride n-hydrate were reacted in a mixed solvent of 2-ethoxyethanol/H$_2$O (=3:1) by refluxing at the boiling point for 5 hours to obtain Chlorine Linked Complex 2. In 2-ethoxyethanol, Chlorine Linked Complex 2 and 3 equivalents of acetylacetone were refluxed at the boiling point for 3 hours in the co-presence of sodium carbonate to obtain acac Complex 3. Subsequently, acac Complex 3 and 1.5 equivalents of Ligand 1 were reacted in glycerol at 200° C., whereby the objective Compound 2 was synthesized.

[Synthesis of Compound 228]

Compound 228 was synthesized according to the following scheme.

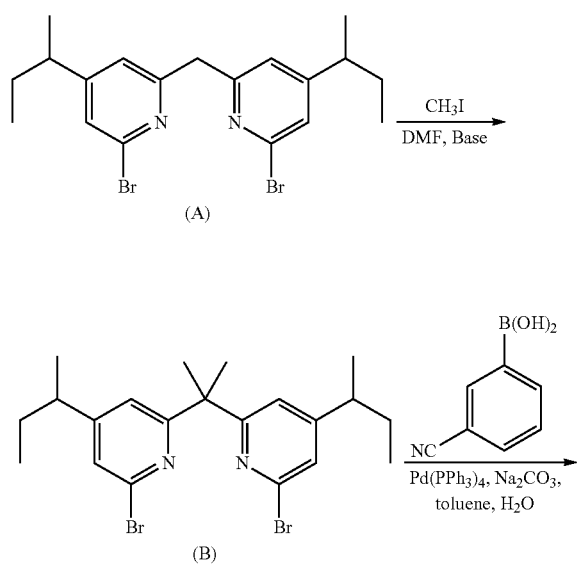

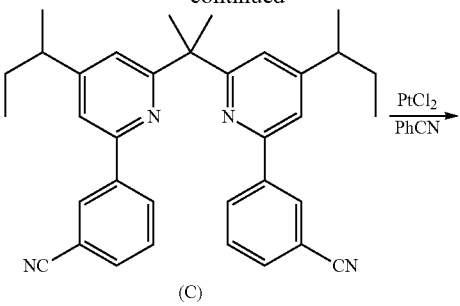

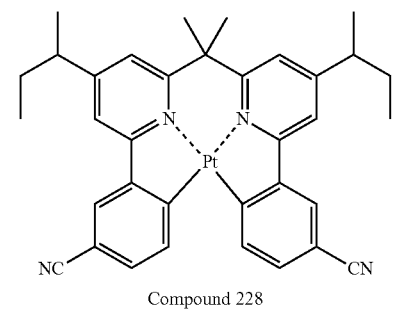

Compound 228

From 1 to 1.2 equivalents of a base such as lithium diisopropylamide, potassium tert-butoxide and sodium hydride was added to an N,N-dimethylformamide solution of Compound (A) at 0° C. to room temperature, and the reaction was allowed to proceed at 0° C. to room temperature for about 30 minutes. Thereto, from 1.5 to 4 equivalents of methyl iodide was added and after monomethylation through reaction at room temperature for about 30 minutes, from 1 to 1.2 equivalents of the base described above and excess methyl iodide were again reacted under the same conditions to obtain Dimethyl Substitution (B) in a yield of 70 to 99%.

In the process of obtaining Compound (C) from Compound (B), Compound (B) as well as from 2 to 3 equivalents of sodium carbonate and from 0.05 to 0.2 equivalents of tetrakis(triphenylphosphine)palladium(0) were dissolved in a toluene/ethanol/water mixed solvent or a 1,2-dimethoxyethane/water mixed solvent, and the solution was heated to a temperature of 70° C. to heat-refluxing temperature and stirred for 2 to 24 hours, whereby Compound (C) was synthesized.

In the process of obtaining Compound 157 from Compound (C), Compound (C) and from 1 to 1.5 equivalents of platinum chloride were dissolved in benzonitrile, and the solution was heated to a temperature of 130° C. to heat-refluxing temperature (boiling point of benzonitrile: 191° C.) and stirred for 30 minutes to 4 hours, whereby the compound was synthesized. Compound 228 was purified by recrystallization using chloroform or ethyl acetate, silica gel column chromatography, sublimation purification or the like.

A-1
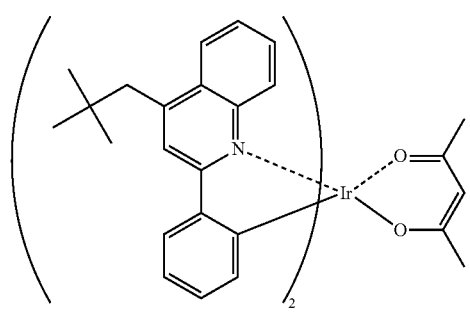
A-2
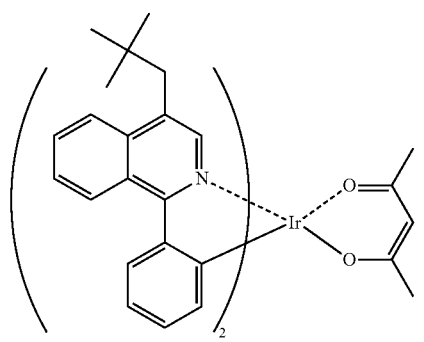
A-51
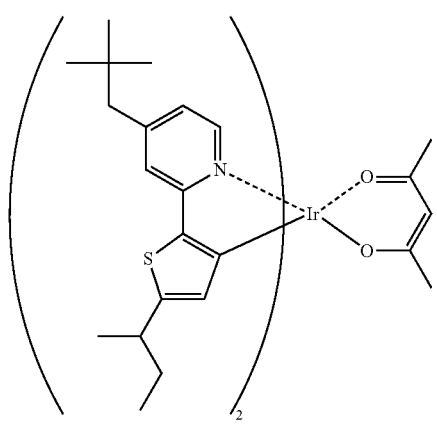
A-52
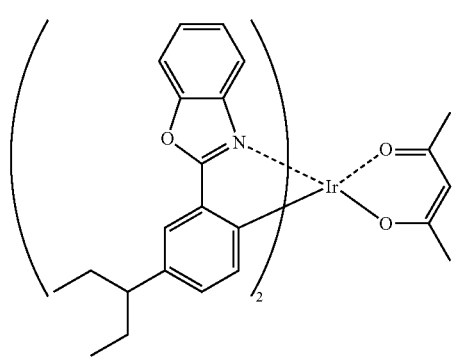
A-53
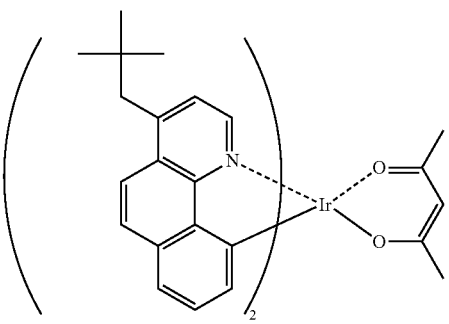
B-1
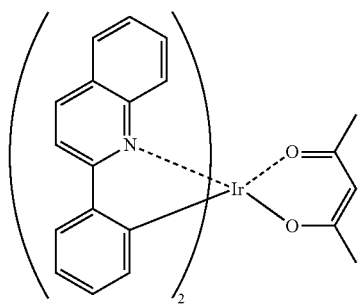
B-2
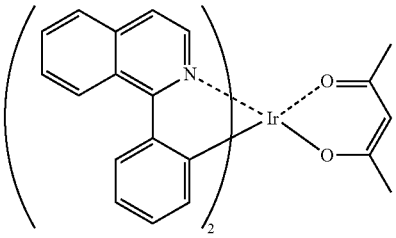
B-3
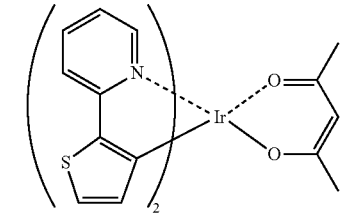
B-4
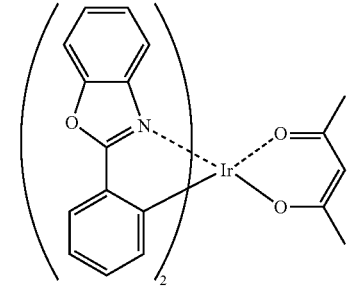
B-5
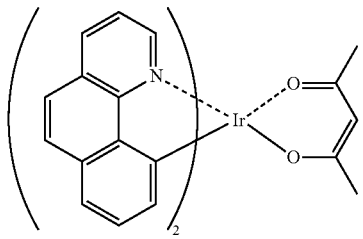

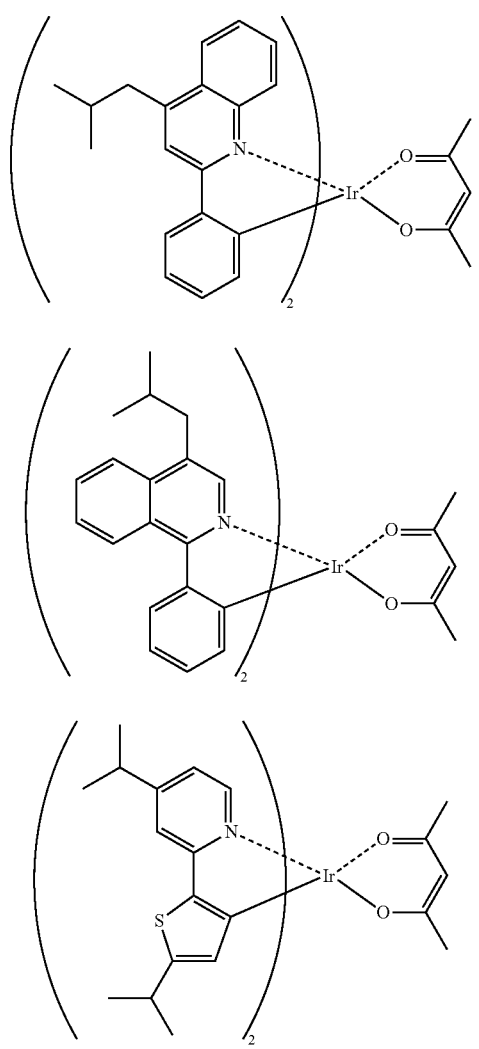

C-1

C-2

C-3

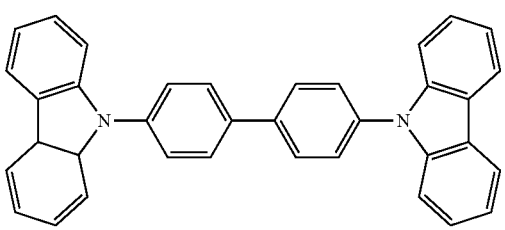

H-1

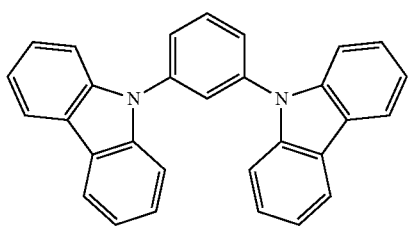

H-2

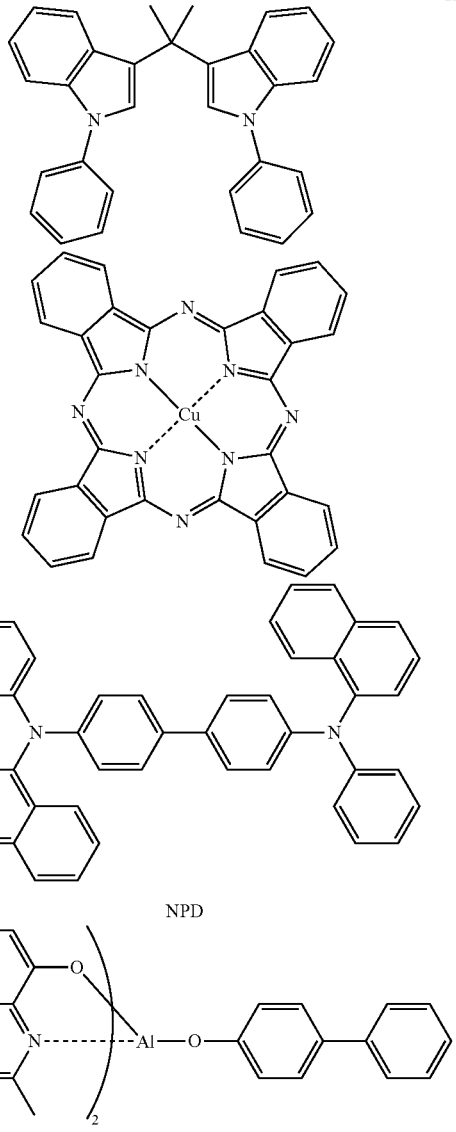

H-3

NPD

BAlq

Copper Phthalocyanine

Example 1

Example 1-1

A 0.5 mm-thickness 2.5 cm-square glass substrate having thereon ITO film (produced by GEOMATEC Corporation, surface resistance: 10 Ω/sq.) was placed in a cleaning vessel and subjected to ultrasonic cleaning in 2-propanol and then to a UV-ozone treatment for 30 minutes. On this transparent anode (ITO film), the following organic layers (organic compound layers) were sequentially deposited by the vacuum deposition method.

Unless otherwise indicated, the vapor deposition rate in Examples of the present invention is 0.2 nm/sec. The vapor deposition rate was measured using a crystal oscillator. In the following, the film thickness is a value as measured also by using a crystal oscillator.

After placing the cleaned ITO substrate in a vapor deposition apparatus, copper phthalocyanine was deposited to a thickness of 10 nm (first layer), and NPD (N,N'-di-α-naphthyl-N,N'-diphenyl)-benzidine) was deposited thereon to a thickness of 40 nm (second layer). Furthermore, H-1 and Compound A-1 of the present invention in a ratio of 95:5 (by mass) were deposited thereon to a thickness of 30 nm (third layer/light emitting layer), and BAlq [aluminum bis-(2-methyl-8-quinolinato)-4-phenylphenolate] was deposited thereon to a thickness of 40 nm (fourth layer). Thereafter, lithium fluoride was deposited thereon to a thickness of 3 nm, and aluminum was further deposited to a thickness of 60 nm. The obtained laminate was placed in an argon gas-purged glove box without exposing to the atmosphere and then encapsulated using a stainless steel-made sealing can and an ultraviolet curable adhesive (XNR5516HV, produced by Nagase-Ciba Ltd.) to produce the organic EL device of Example 1-1. A DC voltage was applied to the organic EL device to produce luminescence by using Source Measure Unit Model 2400 manufactured by Toyo Corp., as a result, luminescence derived from Compound A-1 of the present invention was obtained.

Examples 1-2 to 1-4 and Comparative Examples 1-1 to 1-9

The devices of Examples 1-2 to 1-4 and Comparative Examples 1-1 to 1-9 were produced in the same manner as in Example 1-1 except for changing the materials used in Example 1-1 to the materials shown in Table 1. A DC voltage was applied to the organic EL device to produce luminescence by using Source Measure Unit Model 2400 manufactured by Toyo Corp., as a result, luminescence derived from respective light emitting materials was obtained.

(Measurement of Drive Voltage)

Each of the organic electroluminescence devices of Examples 1-1 to 1-4 and Comparative Examples 1-1 to 1-9 was set in an emission spectrum-measuring system (ELS1500) manufactured by Shimadzu Corporation, and the applied voltage at a luminance of 1,000 cd/m$^2$ was measured.

(Evaluation of Drive Durability)

Each of the organic electroluminescence devices of Examples 1-1 to 1-4 and Comparative Examples 1-1 to 1-9 was set in OLED Test System Model ST-D manufactured by Tokyo System Development Co., Ltd. and driven under the conditions of a constant-current mode and an initial luminance of 1,000 cd/m$^2$, and the half-luminance time was measured.

(Evaluation of External Quantum Efficiency)

With respect to the organic electroluminescence devices of Examples 1-1 to 1-4 and Comparative Examples 1-1 to 1-9, a DC voltage was applied to the EL device to produce luminescence by using Source Measure Unit Model 2400 manufactured by Toyo Corp., and the external quantum efficiency (%) was calculated from the frontal luminance at 1,000 cd/m$^2$.

(Evaluation of Chromaticity)

A DC voltage was applied to obtain a luminance of 1,000 cd/m$^2$, and the emission spectrum was measured by an emission spectrum-measuring system (ELS1500) manufactured by Shimadzu Corporation to calculate the chromaticity (CIE chromaticity).

TABLE 1

| | Light Emitting Layer | | Drive Voltage at 100 cd/m$^2$ (V) | External Quantum Efficiency at 100 cd/m$^2$ (%) | Half-Luminance Time at 1000 cd/m$^2$ (relative value) | Initial Chromaticity | Chromaticity after Decrease to Half Luminance |
|---|---|---|---|---|---|---|---|
| | Light Emitting Material | Host Material | | | | | |
| Comparative Example 1-1 | B-1 | H-1 | 7.6 | 13.8 | 100 | (0.61, 0.38) | (0.65, 0.33) |
| Comparative Example 1-2 | B-2 | H-1 | 8.4 | 14.0 | 106 | (0.65, 0.32) | (0.68, 0.29) |
| Comparative Example 1-3 | B-3 | H-1 | 7.3 | 11.6 | 76 | (0.50, 0.49) | (0.53, 0.45) |
| Comparative Example 1-4 | B-4 | H-1 | 7.1 | 10.1 | 56 | (0.39, 0.56) | (0.46, 0.50) |
| Comparative Example 1-5 | B-5 | H-1 | 7.3 | 14.6 | 82 | (0.41, 0.57) | (0.44, 0.52) |
| Example 1-1 | A-1 | H-1 | 7.3 | 14.2 | 122 | (0.60, 0.37) | (0.61, 0.36) |
| Example 1-2 | A-2 | H-1 | 8.1 | 14.8 | 138 | (0.66, 0.33) | (0.65, 0.31) |
| Example 1-3 | A-51 | H-1 | 7.0 | 12.7 | 88 | (0.50, 0.49) | (0.50, 0.48) |
| Comparative Example 1-6 | A-52 | H-1 | 6.7 | 11.9 | 75 | (0.40, 0.56) | (0.42, 0.54) |
| Example 1-4 | A-53 | H-1 | 7.1 | 15.2 | 97 | (0.41, 0.56) | (0.42, 0.55) |
| Comparative Example 1-7 | C-1 | H-1 | 7.4 | 13.9 | 107 | (0.61, 0.38) | (0.63, 0.35) |
| Comparative Example 1-8 | C-2 | H-1 | 8.2 | 14.4 | 112 | (0.65, 0.32) | (0.67, 0.30) |
| Comparative Example 1-9 | C-3 | H-1 | 7.1 | 10.8 | 73 | (0.50, 0.49) | (0.53, 0.46) |

It is seen that in Examples 1-1 to 1-4, a compound represented by formula (1) is used as the light emitting material and therefore, the device exhibits a long half-luminance time and is excellent in terms of durability as compared with Comparative Examples 1-1 to 1-9. Also, the chromaticity shift is less caused at the device deterioration.
Example 2
Example 2-1
A-6
A-30
A-31
A-32
A-33
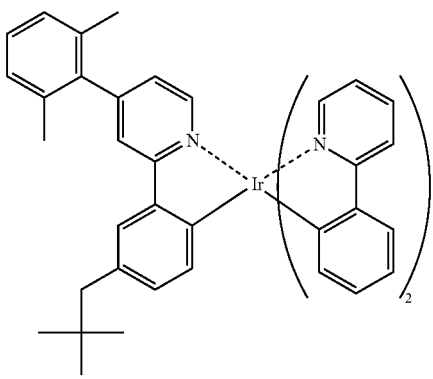
A-34
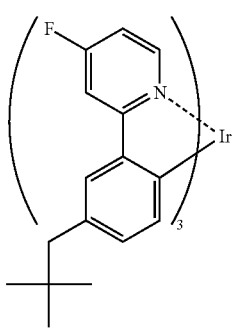
A-35
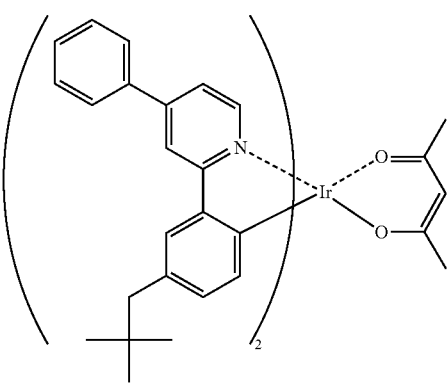
A-36
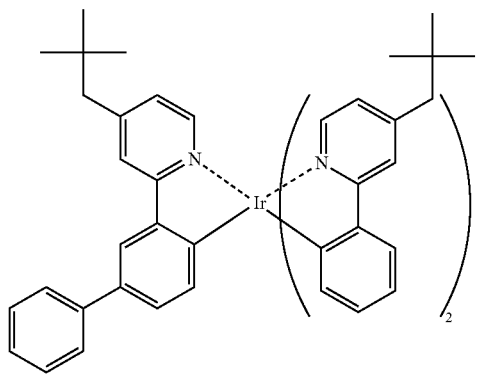

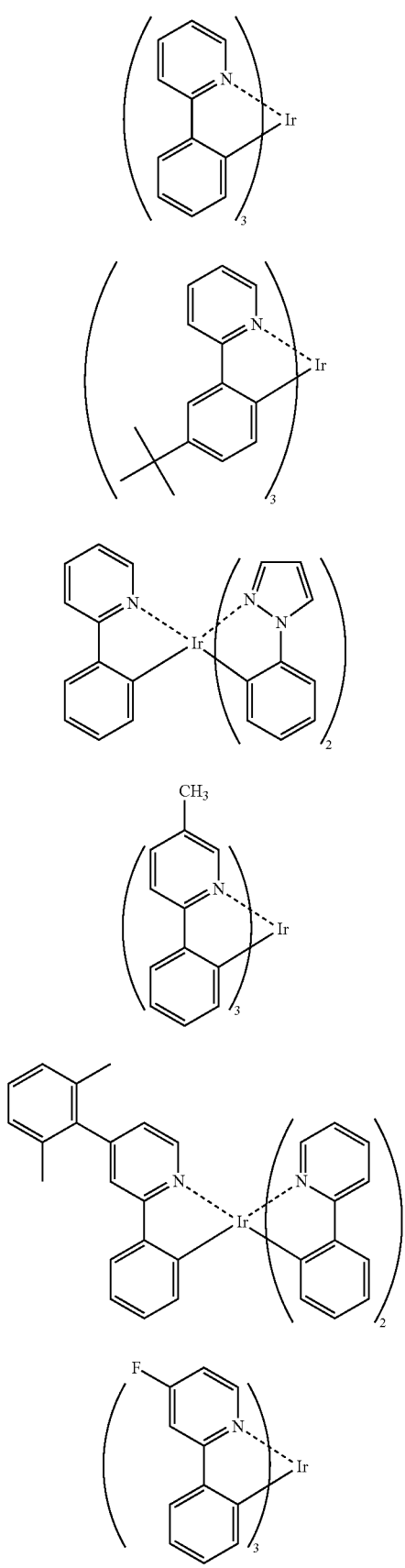
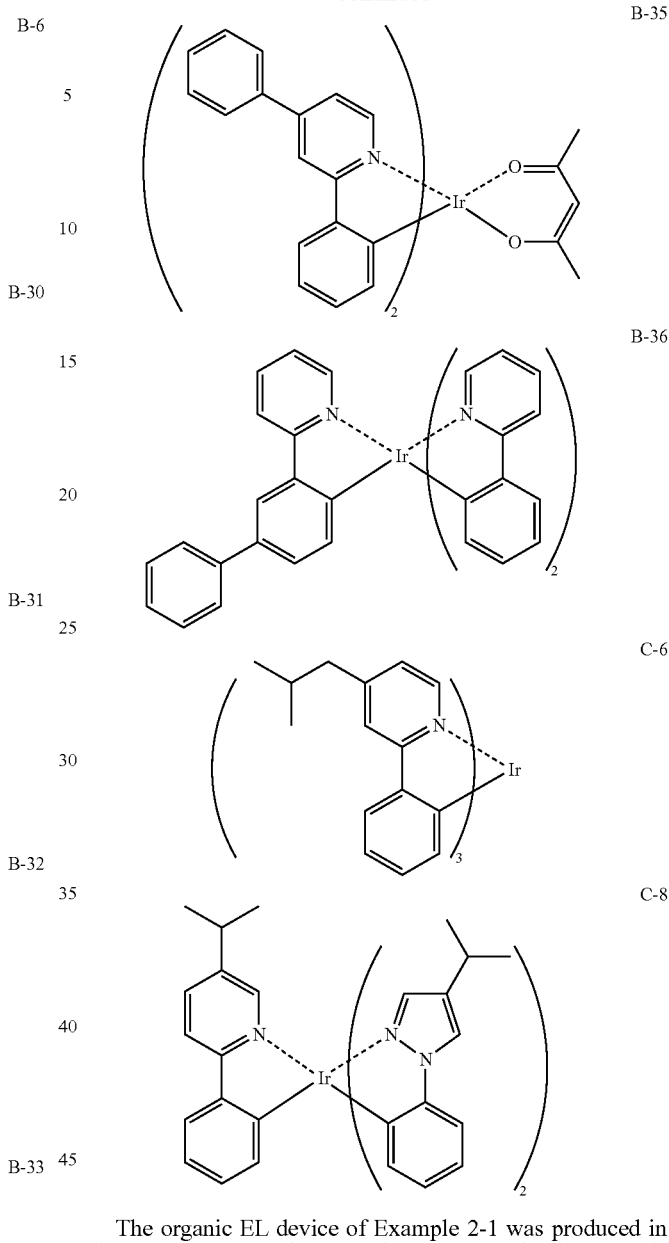

The organic EL device of Example 2-1 was produced in the same manner as in Example 1-1 except that in Example 1-1, the film of the third layer (light emitting layer) was deposited (film thickness: 50 nm) by changing the compositional ratio to H-1 and A-6 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-6 was obtained.

Examples 2-2 to 2-8 and Comparative Examples 2-1 to 2-10

The devices of Examples 2-2 to 2-8 and Comparative Examples 2-1 to 2-10 were produced in the same manner as in Example 2-1 except for changing the materials used in Example 2-1 to the materials shown in Table 2. A DC voltage was applied to the organic EL device to produce luminescence by using Source Measure Unit Model 2400 manufactured by Toyo Corp., as a result, luminescence derived from respective light emitting materials was obtained.

TABLE 2

|  | Light Emitting Layer | | Drive Voltage at 100 cd/m² (V) | External Quantum Efficiency at 100 cd/m² (%) | Half-Luminance Time at 1000 cd/m² (relative value) | Initial Chromaticity | Chromaticity after Decrease to Half Luminance |
|---|---|---|---|---|---|---|---|
|  | Light Emitting Material | Host Material | | | | | |
| Comparative Example 2-1 | B-6 | H-1 | 8.1 | 13.3 | 100 | (0.29, 0.64) | (0.32, 0.60) |
| Comparative Example 2-2 | B-30 | H-1 | 9.3 | 9.8 | 75 | (0.30, 0.63) | (0.33, 0.62) |
| Comparative Example 2-3 | B-31 | H-1 | 8.4 | 11.6 | 73 | (0.28, 0.61) | (0.30, 0.58) |
| Comparative Example 2-4 | B-32 | H-1 | 8.3 | 10.5 | 51 | (0.30, 0.63) | (0.32, 0.61) |
| Comparative Example 2-5 | B-33 | H-1 | 8.4 | 11.8 | 84 | (0.31, 0.62) | (0.35, 0.60) |
| Comparative Example 2-6 | B-34 | H-1 | 7.9 | 13.5 | 71 | (0.29, 0.59) | (0.34, 0.62) |
| Comparative Example 2-7 | B-35 | H-1 | 8.2 | 9.2 | 65 | (0.33, 0.59) | (0.36, 0.62) |
| Comparative Example 2-8 | B-36 | H-1 | 8.2 | 12.2 | 144 | (0.32, 0.62) | (0.35, 0.60) |
| Example 2-1 | A-6 | H-1 | 7.7 | 13.9 | 122 | (0.28, 0.65) | (0.29, 0.66) |
| Example 2-2 | A-30 | H-1 | 9.0 | 10.4 | 88 | (0.31, 0.64) | (0.32, 0.64) |
| Example 2-3 | A-31 | H-1 | 7.6 | 14.4 | 85 | (0.25, 0.62) | (0.26, 0.60) |
| Example 2-4 | A-32 | H-1 | 7.9 | 11.2 | 60 | (0.29, 0.64) | (0.30, 0.63) |
| Example 2-5 | A-33 | H-1 | 8.0 | 13.3 | 104 | (0.32, 0.61) | (0.33, 0.60) |
| Example 2-6 | A-34 | H-1 | 7.5 | 14.5 | 95 | (0.30, 0.60) | (0.31, 0.61) |
| Example 2-7 | A-35 | H-1 | 7.9 | 10.4 | 80 | (0.34, 0.59) | (0.33, 0.60) |
| Example 2-8 | A-36 | H-1 | 8.2 | 13.3 | 188 | (0.30, 0.63) | (0.31, 0.62) |
| Comparative Example 2-9 | C-6 | H-1 | 7.9 | 13.4 | 105 | (0.28, 0.64) | (0.32, 0.62) |
| Comparative Example 2-10 | C-8 | H-1 | 8.2 | 12.4 | 65 | (0.27, 0.60) | (0.29, 0.64) |

It is seen that in Examples 2-1 to 2-8, a compound represented by formula (1) is used as the light emitting material and therefore, the device exhibits a long half-luminance time and is excellent in terms of durability as compared with Comparative Examples 2-1 to 2-10. Also, the chromaticity shift is less caused at the device deterioration.

Example 3

Example 3-1

-continued

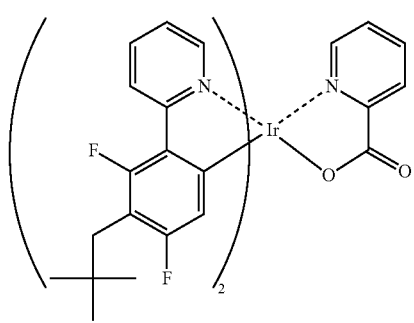

A-37

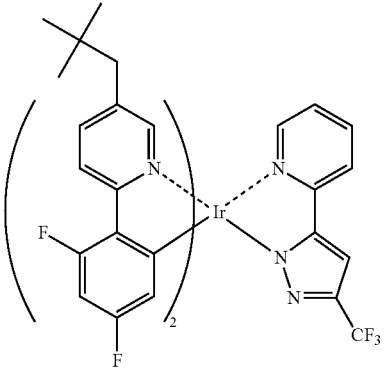

A-38

A-39

A-40
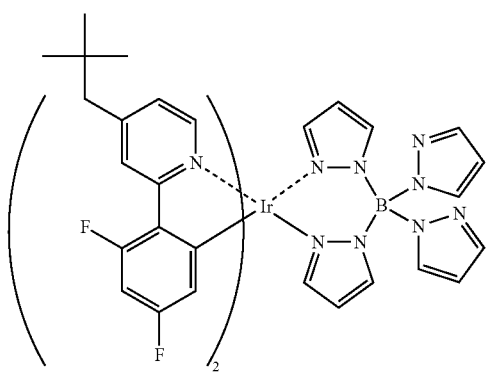
A-14
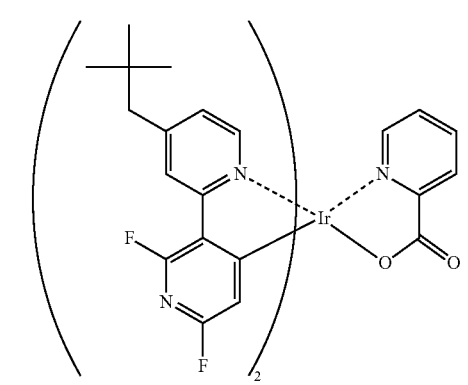
A-41
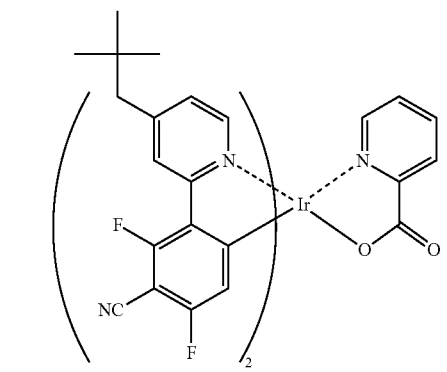
B-10
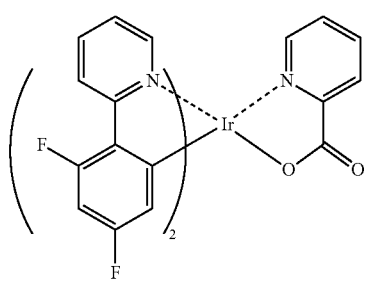
B-11
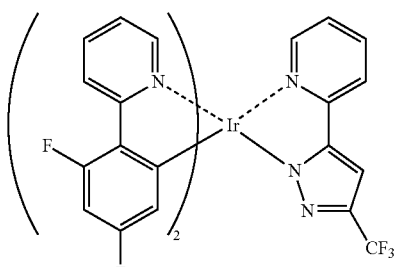
B-12
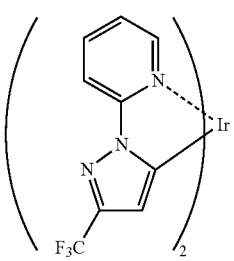
B-13
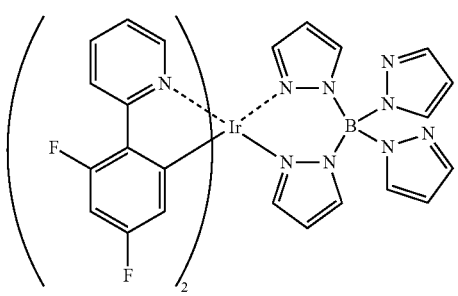
B-14
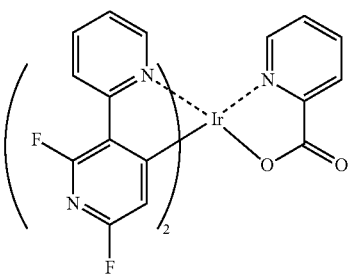
B-41
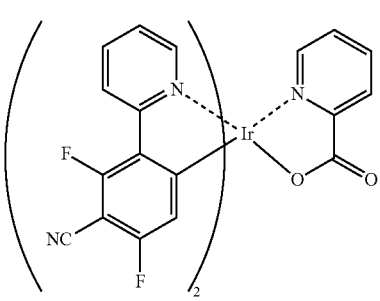

-continued

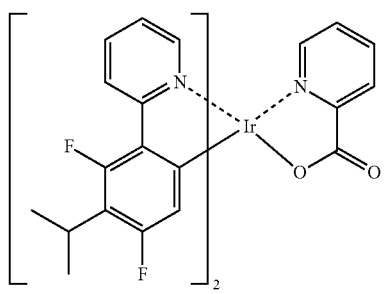
C-10

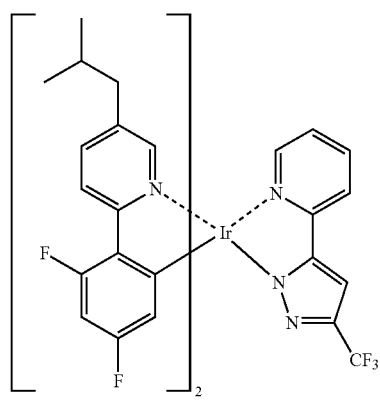
C-11

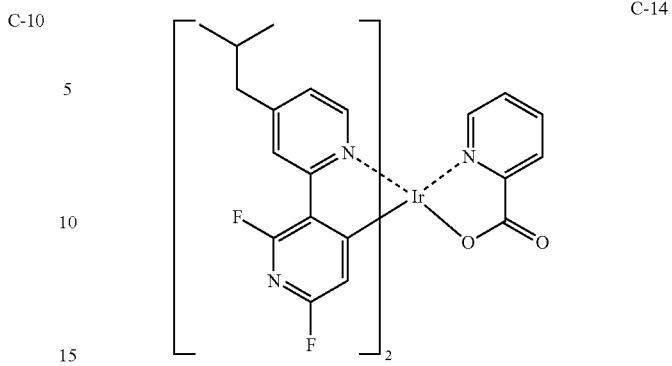
C-14

The organic EL device of Example 3-1 was produced in the same manner as in Example 1-1 except that in Example 1-1, the film of the third layer (light emitting layer) was deposited (film thickness: 50 nm) by changing the compositional ratio to H-2 and A-37 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-37 was obtained.

Examples 3-2 to 3-6 and Comparative Examples 3-1 to 3-9

The devices of Examples 3-2 to 3-6 and Comparative Examples 3-1 to 3-9 were produced in the same manner as in Example 3-1 except for changing the materials used in Example 3-1 to the materials shown in Table 3. A DC voltage was applied to the organic EL device to produce luminescence by using Source Measure Unit Model 2400 manufactured by Toyo Corp., as a result, luminescence derived from respective light emitting materials was obtained.

TABLE 3

|  | Light Emitting Layer | | Drive Voltage at 100 cd/m² (V) | External Quantum Efficiency at 100 cd/m² (%) | Half-Luminance Time at 1000 cd/m² (relative value) | Chromaticity | |
| --- | --- | --- | --- | --- | --- | --- | --- |
|  | Light Emitting Material | Host Material |  |  |  | Initial Chromaticity | after Decrease to Half Luminance |
| Comparative Example 3-1 | B-10 | H-2 | 8.1 | 9.2 | 100 | (0.17, 0.32) | (0.19, 0.39) |
| Comparative Example 3-2 | B-11 | H-3 | 8.8 | 7.8 | 43 | (0.17, 0.29) | (0.21, 0.35) |
| Comparative Example 3-3 | B-12 | H-3 | 10.4 | 3.6 | 16 | (0.17, 0.26) | (0.20, 0.35) |
| Comparative Example 3-4 | B-13 | H-2 | 7.9 | 8.7 | 83 | (0.17, 0.28) | (0.22, 0.35) |
| Comparative Example 3-5 | B-14 | H-2 | 8.3 | 9.5 | 71 | (0.17, 0.22) | (0.21, 0.30) |
| Comparative Example 3-6 | B-41 | H-2 | 8.2 | 9.5 | 77 | (0.18, 0.24) | (0.21, 0.32) |
| Example 3-1 | A-37 | H-2 | 8.1 | 9.6 | 124 | (0.18, 0.33) | (0.18, 0.36) |
| Example 3-2 | A-38 | H-3 | 8.6 | 8.9 | 60 | (0.18, 0.29) | (0.19, 0.31) |
| Example 3-3 | A-39 | H-3 | 10.1 | 4.3 | 26 | (0.18, 0.29) | (0.18, 0.30) |
| Example 3-4 | A-40 | H-2 | 7.5 | 9.2 | 95 | (0.17, 0.28) | (0.19, 0.31) |
| Example 3-5 | A-14 | H-2 | 7.8 | 9.9 | 103 | (0.17, 0.23) | (0.18, 0.25) |

TABLE 3-continued

| | Light Emitting Layer | | Drive Voltage at 100 cd/m² (V) | External Quantum Efficiency at 100 cd/m² (%) | Half-Luminance Time at 1000 cd/m² (relative value) | Initial Chromaticity | Chromaticity after Decrease to Half Luminance |
|---|---|---|---|---|---|---|---|
| | Light Emitting Material | Host Material | | | | | |
| Example 3-6 | A-41 | H-2 | 7.6 | 9.8 | 113 | (0.18, 0.26) | (0.19, 0.28) |
| Comparative Example 3-7 | C-10 | H-2 | 8.1 | 9.4 | 103 | (0.18, 0.33) | (0.19, 0.39) |
| Comparative Example 3-8 | C-11 | H-3 | 8.9 | 7.9 | 45 | (0.17, 0.30) | (0.20, 0.34) |
| Comparative Example 3-9 | C-14 | H-2 | 8.1 | 9.4 | 80 | (0.17, 0.23) | (0.21, 0.29) |

It is seen that in Examples 3-1 to 3-6, a compound represented by formula (1) is used as the light emitting material and therefore, the device exhibits a long half-luminance time and is excellent in terms of durability as compared with Comparative Examples 3-1 to 3-9. Also, the chromaticity shift is less caused at the device deterioration.

Example 4

Example 4-1

A-42

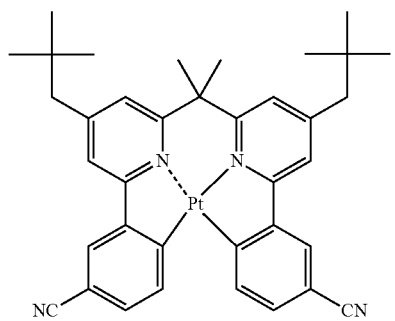

A-17

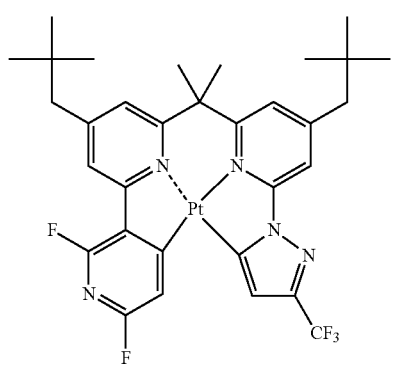

A-18

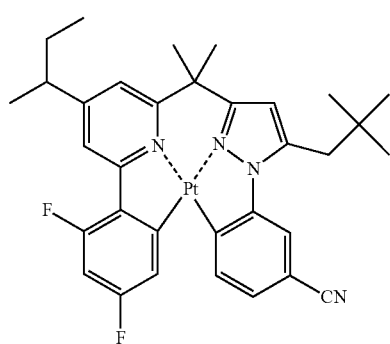

-continued

A-43

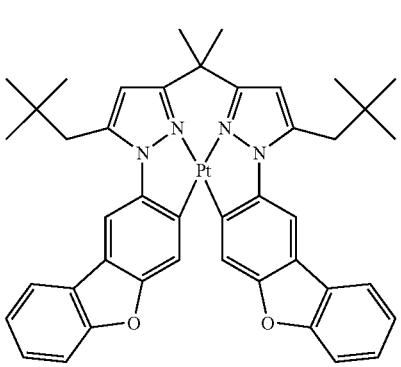

A-44

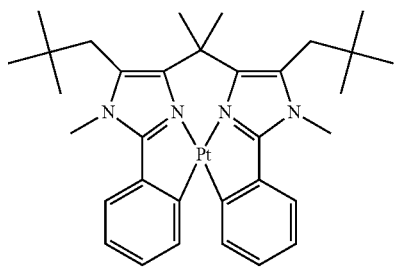

A-45

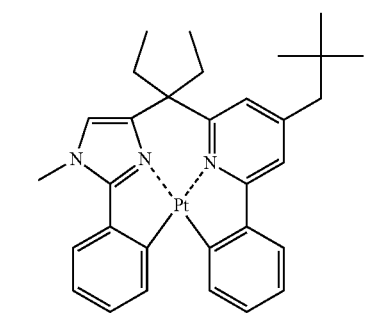

-continued
A-46
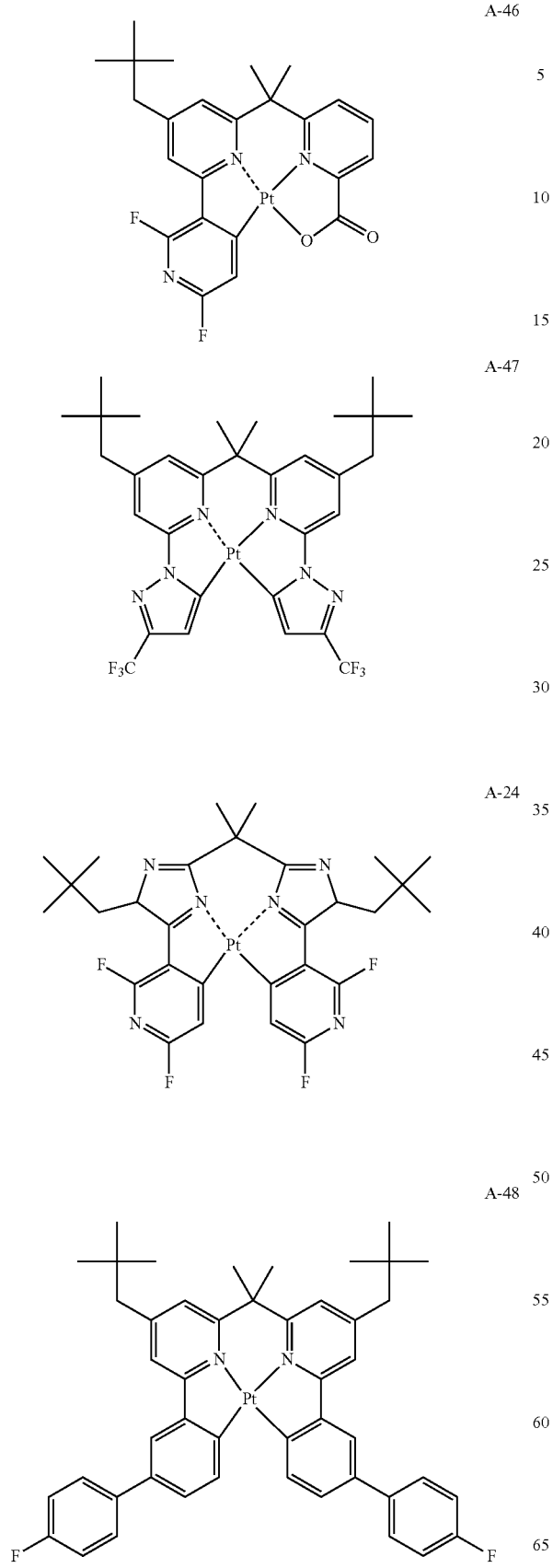
A-47
A-24
A-48
-continued
A-49
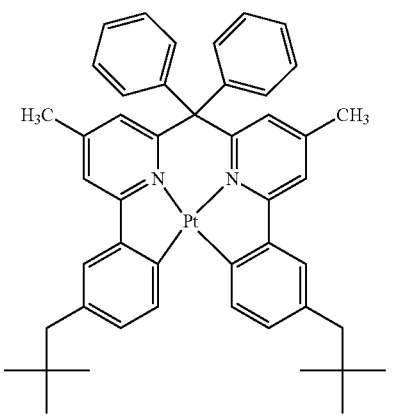
A-50
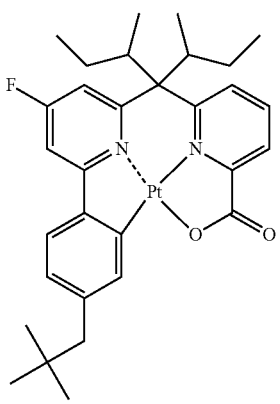
B-16
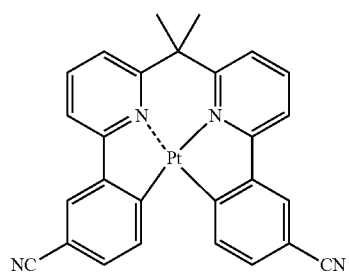
B-17
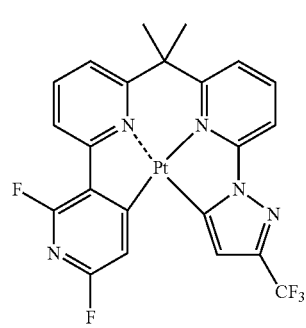

B-18
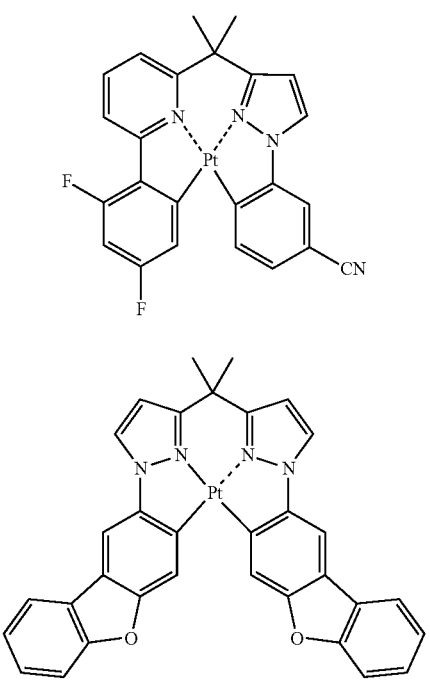
B-19
B-20
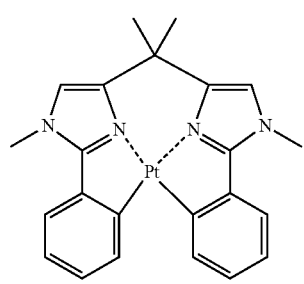
B-45
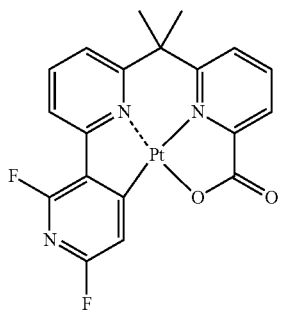
B-22
B-23
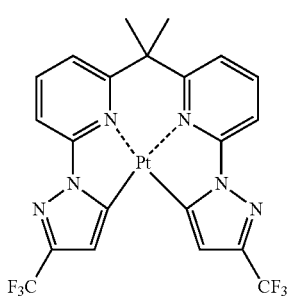
B-24
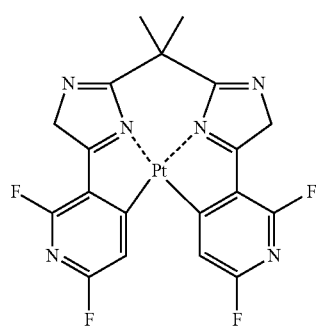
B-48
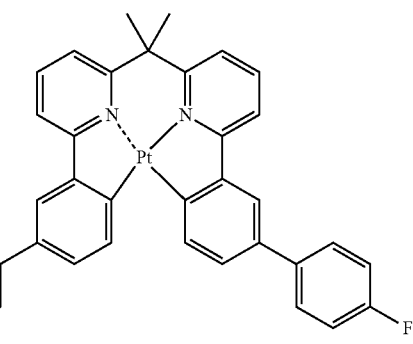
B-49
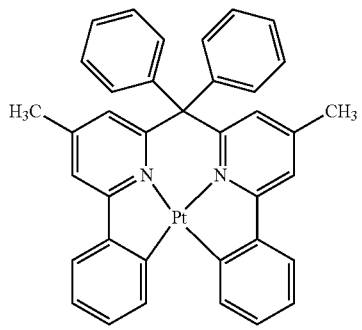
B-50
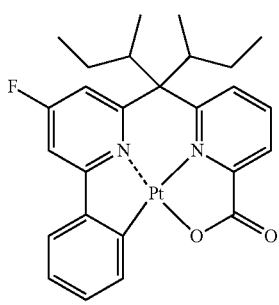

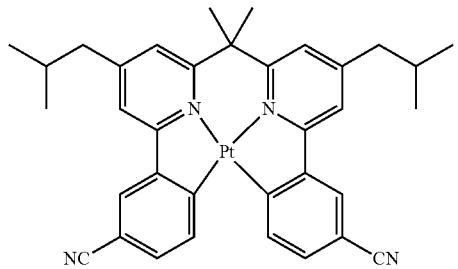

C-16

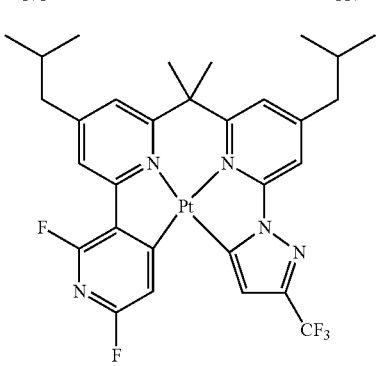

C-17

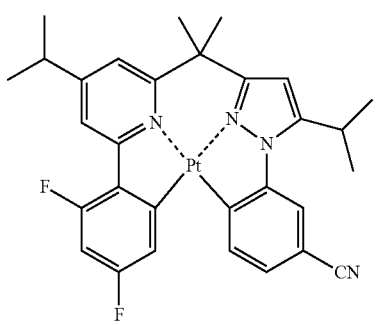

C-18

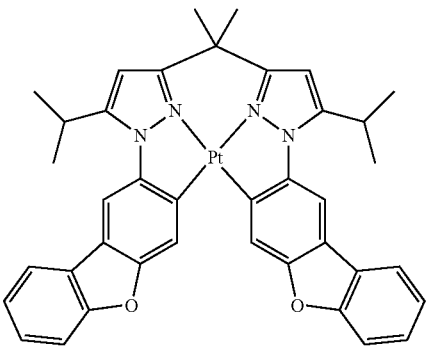

C-19

The organic EL device of Example 4-1 was produced in the same manner as in Example 1-1 except that in Example 1-1, the film of the third layer (light emitting layer) was deposited (film thickness: 50 nm) by changing the compositional ratio to H-2 and A-42 of 95:5 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-42 was obtained.

Examples 4-2 to 4-12 and Comparative Examples 4-1 to 4-15

The devices of Examples 4-2 to 4-12 and Comparative Examples 4-1 to 4-15 were produced in the same manner as in Example 4-1 except for changing the materials used in Example 4-1 to the materials shown in Table 4. A DC voltage was applied to the organic EL device to produce luminescence by using Source Measure Unit Model 2400 manufactured by Toyo Corp., as a result, luminescence derived from respective light emitting materials was obtained.

TABLE 4

| | Light Emitting Layer | | Drive | External Quantum | Half-Luminance | | Chromaticity |
| | Light Emitting Material | Host Material | Voltage at 100 cd/m$^2$ (V) | Efficiency at 100 cd/m$^2$ (%) | Time at 1000 cd/m$^2$ (relative value) | Initial Chromaticity | after Decrease to Half Luminance |
|---|---|---|---|---|---|---|---|
| Comparative Example 4-1 | B-16 | H-2 | 8.6 | 9.9 | 100 | (0.29, 0.63) | (0.34, 0.63) |
| Comparative Example 4-2 | B-17 | H-3 | 9.8 | 7.9 | 59 | (0.17, 0.29) | (0.24, 0.35) |
| Comparative Example 4-3 | B-18 | H-3 | 9.4 | 8.5 | 57 | (0.17, 0.29) | (0.23, 0.35) |
| Comparative Example 4-4 | B-19 | H-2 | 9.9 | 7.7 | 52 | (0.20, 0.29) | (0.26, 0.35) |
| Comparative Example 4-5 | B-20 | H-2 | 8.9 | 8.2 | 55 | (0.21, 0.30) | (0.26, 0.34) |
| Comparative Example 4-6 | B-45 | H-2 | 9.5 | 7.0 | 55 | (0.23, 0.38) | (0.27, 0.43) |
| Comparative Example 4-7 | B-23 | H-2 | 9.9 | 6.8 | 28 | (0.16, 0.24) | (0.22, 0.30) |
| Comparative Example 4-8 | B-24 | H-3 | 8.9 | 7.8 | 46 | (0.20, 0.30) | (0.26, 0.35) |
| Comparative Example 4-9 | B-48 | H-2 | 9.6 | 8.6 | 123 | (0.40, 0.56) | (0.43, 0.55) |
| Comparative Example 4-10 | B-49 | H-2 | 9.7 | 7.9 | 90 | (0.33, 0.61) | (0.37, 0.60) |
| Comparative Example 4-11 | B-50 | H-2 | 9.1 | 8.6 | 74 | (0.31, 0.60) | (0.35, 0.58) |
| Example 4-1 | A-42 | H-2 | 7.7 | 11.4 | 126 | (0.29, 0.61) | (0.30, 0.62) |

TABLE 4-continued

| | Light Emitting Layer | | Drive | External Quantum | Half-Luminance | Chromaticity | |
|---|---|---|---|---|---|---|---|
| | Light Emitting Material | Host Material | Voltage at 100 cd/m$^2$ (V) | Efficiency at 100 cd/m$^2$ (%) | Time at 1000 cd/m$^2$ (relative value) | Initial Chromaticity | after Decrease to Half Luminance |
| Example 4-2 | A-17 | H-3 | 8.8 | 7.8 | 73 | (0.16, 0.28) | (0.20, 0.33) |
| Example 4-3 | A-18 | H-3 | 9.1 | 9.2 | 68 | (0.18, 0.30) | (0.18, 0.30) |
| Example 4-4 | A-43 | H-2 | 7.3 | 9.6 | 69 | (0.21, 0.31) | (0.22, 0.32) |
| Example 4-5 | A-44 | H-2 | 7.7 | 9.9 | 74 | (0.22, 0.30) | (0.23, 0.33) |
| Example 4-6 | A-45 | H-2 | 7.8 | 9.8 | 59 | (0.25, 0.65) | (0.27, 0.63) |
| Example 4-7 | A-46 | H-2 | 8.6 | 8.3 | 77 | (0.22, 0.35) | (0.23, 0.37) |
| Example 4-8 | A-47 | H-2 | 9.2 | 7.5 | 46 | (0.16, 0.24) | (0.20, 0.27) |
| Example 4-9 | A-24 | H-3 | 8.3 | 8.2 | 55 | (0.19, 0.29) | (0.23, 0.33) |
| Example 4-10 | A-48 | H-2 | 9.4 | 8.9 | 146 | (0.39, 0.58) | (0.40, 0.57) |
| Example 4-11 | A-49 | H-2 | 9.5 | 8.2 | 101 | (0.35, 0.61) | (0.36, 0.60) |
| Example 4-12 | A-50 | H-2 | 9.1 | 8.8 | 87 | (0.32, 0.63) | (0.33, 0.61) |
| Comparative Example 4-12 | C-16 | H-2 | 8.4 | 10.3 | 104 | (0.29, 0.63) | (0.33, 0.62) |
| Comparative Example 4-13 | C-17 | H-3 | 9.4 | 7.9 | 64 | (0.17, 0.29) | (0.23, 0.34) |
| Comparative Example 4-14 | C-18 | H-3 | 9.4 | 8.5 | 57 | (0.17, 0.29) | (0.23, 0.35) |
| Comparative Example 4-15 | C-19 | H-2 | 9.3 | 8.2 | 49 | (0.20, 0.29) | (0.26, 0.34) |

It is seen that in Examples 4-1 to 4-12, a compound represented by formula (1) is used as the light emitting material and therefore, the device exhibits a long half-luminance time and is excellent in terms of durability as compared with Comparative Examples 4-1 to 4-15. Also, the chromaticity shift is less caused at the device deterioration.

Example 5

Example 5-1

A 0.5 mm-thick 2.5 cm-square glass substrate having thereon ITO film (produced by GEOMATEC Corporation, surface resistance: 10 Ω/sq.) was placed in a cleaning vessel and subjected to ultrasonic cleaning in 2-propanol and then to a UV-ozone treatment for 30 minutes. On this substrate, a solution obtained by diluting poly(3,4-ethylenedioxythiophene)-polystyrene sulfonate (PEDOT/PSS) to 70% with pure water was coated by means of a spin coater to provide a hole transporting layer of 50 nm in thickness, and a methylene chloride solution having dissolved therein H-1 and A-1 in a ratio of 95/5 (by mass) was further coated by means of a spin coater to obtain a light emitting layer of 30 nm in thickness. Thereafter, BAlq [aluminum bis-(2-methyl-8-quinolinato)-4-phenylphenolate] was deposited thereon to a thickness of 40 nm (fourth layer). On this organic compound layer, lithium fluoride of 0.5 nm as a cathode buffer layer and aluminum of 150 nm as a cathode were deposited in a vapor deposition apparatus. The obtained laminate was placed in an argon gas-purged glove box without exposing to the atmosphere and then encapsulated using a stainless steel-made sealing can and an ultraviolet curable adhesive (XNR5516HV, produced by Nagase-Ciba Ltd.) to produce the organic EL device of Example 5-1. A DC voltage was applied to the organic EL device to produce luminescence by using Source Measure Unit Model 2400 manufactured by Toyo Corp., as a result, luminescence derived from Compound A-1 of the present invention was obtained.

Examples 5-2 to 5-3 and Comparative Examples 5-1 to 5-5

The devices of Examples 5-2 to 5-3 and Comparative Examples 5-1 to 5-5 were produced in the same manner as in Example 5-1 except for changing the materials used in Example 5-1 to the materials shown in Table 5. A DC voltage was applied to the organic EL device to produce luminescence by using Source Measure Unit Model 2400 manufactured by Toyo Corp., as a result, luminescence derived from respective light emitting materials was obtained.

TABLE 5

| | Light Emitting Layer | | Drive | External Quantum | Half-Luminance | Chromaticity | |
|---|---|---|---|---|---|---|---|
| | Light Emitting Material | Host Material | Voltage at 100 cd/m$^2$ (V) | Efficiency at 100 cd/m$^2$ (%) | Time at 1000 cd/m$^2$ (relative value) | Initial Chromaticity | after Decrease to Half Luminance |
| Comparative Example 5-1 | B-1 | H-1 | 11.2 | 8.3 | 100 | (0.61, 0.38) | (0.66, 0.31) |
| Comparative Example 5-2 | B-3 | H-1 | 11.8 | 6.7 | 66 | (0.49, 0.49) | (0.53, 0.45) |
| Comparative Example 5-3 | B-5 | H-1 | 11.1 | 9.2 | 62 | (0.41, 0.57) | (0.44, 0.52) |
| Comparative Example 5-4 | C-1 | H-1 | 10.9 | 8.4 | 107 | (0.61, 0.37) | (0.65, 0.33) |
| Comparative Example 5-5 | C-3 | H-1 | 11.3 | 6.9 | 70 | (0.50, 0.49) | (0.53, 0.47) |

TABLE 5-continued

| | Light Emitting Layer | | Drive | External Quantum | Half-Luminance | Chromaticity | |
|---|---|---|---|---|---|---|---|
| | Light Emitting Material | Host Material | Voltage at 100 cd/m² (V) | Efficiency at 100 cd/m² (%) | Time at 1000 cd/m² (relative value) | Initial Chromaticity | after Decrease to Half Luminance |
| Example 5-1 | A-1 | H-1 | 10.4 | 8.9 | 127 | (0.60, 0.37) | (0.62, 0.35) |
| Example 5-2 | A-51 | H-1 | 10.2 | 7.7 | 83 | (0.51, 0.49) | (0.53, 0.47) |
| Example 5-3 | A-53 | H-1 | 10.1 | 10.1 | 85 | (0.42, 0.56) | (0.40, 0.55) |

It is seen that in Examples 5-1 to 5-3, a compound represented by formula (1) is used as the light emitting material and therefore, the device exhibits a long half-luminance time and is excellent in terms of durability as compared with Comparative Examples 5-1 to 5-5. Also, the chromaticity shift is less caused at the device deterioration.

Example 6

Example 6-1

The organic EL device of Example 6-1 was produced in the same manner as in Example 5-1 except that in Example 5-1, the film of the third layer (light emitting layer) was deposited (film thickness: 50 nm) by changing the compositional ratio to H-1 and A-6 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-6 was obtained.

Examples 6-2 to 6-5 and Comparative Examples 6-1 to 6-6

The devices of Examples 6-2 to 6-5 and Comparative Examples 6-1 to 6-6 were produced in the same manner as in Example 6-1 except for changing the materials used in Example 6-1 to the materials shown in Table 6. A DC voltage was applied to the organic EL device to produce luminescence by using Source Measure Unit Model 2400 manufactured by Toyo Corp., as a result, luminescence derived from respective light emitting materials was obtained.

TABLE 6

| | Light Emitting Layer | | Drive | External Quantum | Half-Luminance | Chromaticity | |
|---|---|---|---|---|---|---|---|
| | Light Emitting Material | Host Material | Voltage at 100 cd/m² (V) | Efficiency at 100 cd/m² (%) | Time at 1000 cd/m² (relative value) | Initial Chromaticity | after Decrease to Half Luminance |
| Comparative Example 6-1 | B-6 | H-1 | 11.6 | 8.3 | 100 | (0.29, 0.64) | (0.33, 0.59) |
| Comparative Example 6-2 | B-31 | H-1 | 12.1 | 6.8 | 73 | (0.28, 0.61) | (0.32, 0.67) |
| Comparative Example 6-3 | B-33 | H-1 | 11.3 | 7.1 | 81 | (0.32, 0.62) | (0.36, 0.60) |
| Comparative Example 6-4 | B-34 | H-1 | 11.3 | 8.3 | 70 | (0.30, 0.59) | (0.35, 0.61) |
| Comparative Example 6-5 | B-36 | H-1 | 11.1 | 7.8 | 137 | (0.32, 0.62) | (0.35, 0.60) |
| Example 6-1 | A-6 | H-1 | 10.5 | 8.9 | 113 | (0.27, 0.65) | (0.29, 0.63) |
| Example 6-2 | A-31 | H-1 | 10.8 | 7.7 | 86 | (0.27, 0.60) | (0.28, 0.62) |
| Example 6-3 | A-33 | H-1 | 11.7 | 7.0 | 88 | (0.31, 0.61) | (0.32, 0.61) |
| Example 6-4 | A-34 | H-1 | 11.1 | 8.5 | 75 | (0.29, 0.61) | (0.31, 0.60) |
| Example 6-5 | A-36 | H-1 | 10.7 | 8.1 | 171 | (0.31, 0.63) | (0.32, 0.61) |
| Comparative Example 6-6 | C-6 | H-1 | 11.2 | 8.4 | 106 | (0.28, 0.64) | (0.31, 0.60) |

It is seen that in Examples 6-1 to 6-5, a compound represented by formula (1) is used as the light emitting material and therefore, the device exhibits a long half-luminance time and is excellent in terms of durability as compared with Comparative Examples 6-1 to 6-6. Also, the chromaticity shift is less caused at the device deterioration.

Example 7

Example 7-1

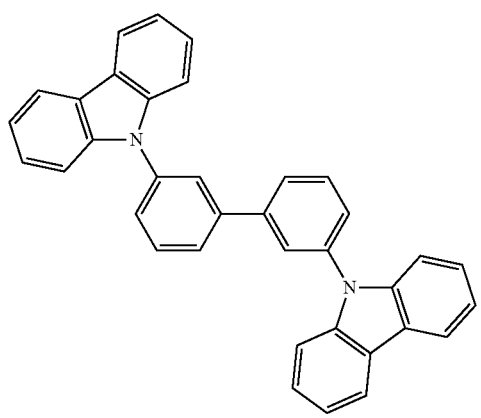

H-4

The organic EL device of Example 7-1 was produced in the same manner as in Example 5-1 except that in Example 5-1, the solution of the third layer (light emitting layer) was coated (film thickness: 50 nm) by changing the compositional ratio to H-4 and A-37 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-37 was obtained.

Examples 7-2 to 7-4 and Comparative Examples 7-1 to 7-6

The devices of Examples 7-2 to 7-4 and Comparative Examples 7-1 to 7-6 were produced in the same manner as in Example 7-1 except for changing the materials used in Example 7-1 to the materials shown in Table 7. A DC voltage was applied to the organic EL device to produce luminescence by using Source Measure Unit Model 2400 manufactured by Toyo Corp., as a result, luminescence derived from respective light emitting materials was obtained.

Example 8

Example 8-1

The organic EL device of Example 8-1 was produced in the same manner as in Example 5-1 except that in Example 5-1, the solution of the third layer (light emitting layer) was coated (film thickness: 50 nm) by changing the compositional ratio to H-4 and A-42 of 95:5 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-42 was obtained.

Examples 8-2 to 8-7 and Comparative Examples 8-1 to 8-10

The devices of Examples 8-2 to 8-7 and Comparative Examples 8-1 to 8-10 were produced in the same manner as in Example 8-1 except for changing the materials used in

TABLE 7

| | Light Emitting Layer | | Drive | External Quantum | Half-Luminance | | Chromaticity |
| | Light Emitting Material | Host Material | Voltage at 100 cd/m$^2$ (V) | Efficiency at 100 cd/m$^2$ (%) | Time at 1000 cd/m$^2$ (relative value) | Initial Chromaticity | after Decrease to Half Luminance |
|---|---|---|---|---|---|---|---|
| Comparative Example 7-1 | B-10 | H-4 | 14.1 | 5.8 | 100 | (0.17, 0.32) | (0.20, 0.40) |
| Comparative Example 7-2 | B-14 | H-4 | 13.9 | 6.1 | 75 | (0.17, 0.22) | (0.21, 0.30) |
| Comparative Example 7-3 | B-12 | H-4 | 13.8 | 2.2 | 18 | (0.17, 0.27) | (0.21, 0.36) |
| Comparative Example 7-4 | B-41 | H-4 | 14.1 | 6.0 | 80 | (0.18, 0.25) | (0.21, 0.31) |
| Example 7-1 | A-37 | H-4 | 13.2 | 6.7 | 117 | (0.18, 0.33) | (0.19, 0.35) |
| Example 7-2 | A-14 | H-4 | 13.2 | 6.8 | 93 | (0.17, 0.22) | (0.18, 0.25) |
| Example 7-3 | A-39 | H-4 | 13.5 | 2.5 | 25 | (0.18, 0.29) | (0.20, 0.32) |
| Example 7-4 | A-41 | H-4 | 13.9 | 6.2 | 92 | (0.18, 0.27) | (0.20, 0.29) |
| Comparative Example 7-5 | C-10 | H-4 | 13.8 | 6.0 | 102 | (0.18, 0.32) | (0.20, 0.41) |
| Comparative Example 7-6 | C-14 | H-4 | 13.7 | 6.3 | 83 | (0.18, 0.22) | (0.20, 0.28) |

It is seen that in Examples 7-1 to 7-4, a compound represented by formula (1) is used as the light emitting material and therefore, the device exhibits a long half-luminance time and is excellent in terms of durability as compared with Comparative Examples 7-1 to 7-6. Also, the chromaticity shift is less caused at the device deterioration.

Example 8-1 to the materials shown in Table 8. A DC voltage was applied to the organic EL device to produce luminescence by using Source Measure Unit Model 2400 manufactured by Toyo Corp., as a result, luminescence derived from respective light emitting materials was obtained.

TABLE 8

| | Light Emitting Layer | | Drive | External Quantum | Half-Luminance | | Chromaticity |
| | Light Emitting Material | Host Material | Voltage at 100 cd/m$^2$ (V) | Efficiency at 100 cd/m$^2$ (%) | Time at 1000 cd/m$^2$ (relative value) | Initial Chromaticity | after Decrease to Half Luminance |
|---|---|---|---|---|---|---|---|
| Comparative Example 8-1 | B-16 | H-4 | 13.3 | 6.1 | 100 | (0.29, 0.60) | (0.34, 0.63) |
| Comparative Example 8-2 | B-17 | H-4 | 14.5 | 4.7 | 64 | (0.17, 0.29) | (0.25, 0.37) |
| Comparative Example 8-3 | B-18 | H-4 | 14.1 | 5.7 | 61 | (0.19, 0.30) | (0.23, 0.36) |
| Comparative Example 8-4 | B-20 | H-4 | 14.0 | 5.1 | 41 | (0.23, 0.64) | (0.30, 0.62) |

TABLE 8-continued

| | Light Emitting Layer | | Drive Voltage at 100 cd/m² (V) | External Quantum Efficiency at 100 cd/m² (%) | Half-Luminance Time at 1000 cd/m² (relative value) | Initial Chromaticity | Chromaticity after Decrease to Half Luminance |
|---|---|---|---|---|---|---|---|
| | Light Emitting Material | Host Material | | | | | |
| Comparative Example 8-5 | B-22 | H-4 | 15.5 | 4.3 | 32 | (0.16, 0.24) | (0.20, 0.28) |
| Comparative Example 8-6 | B-23 | H-4 | 14.7 | 5.2 | 121 | (0.41, 0.56) | (0.44, 0.53) |
| Comparative Example 8-7 | B-49 | H-4 | 14.5 | 5.8 | 87 | (0.31, 0.61) | (0.35, 0.59) |
| Example 8-1 | A-42 | H-4 | 12.3 | 6.9 | 116 | (0.29, 0.62) | (0.31, 0.62) |
| Example 8-2 | A-17 | H-4 | 13.3 | 5.5 | 77 | (0.18, 0.30) | (0.20, 0.34) |
| Example 8-3 | A-18 | H-4 | 13.6 | 6.4 | 72 | (0.18, 0.30) | (0.20, 0.33) |
| Example 8-4 | A-44 | H-4 | 12.7 | 6.4 | 60 | (0.23, 0.65) | (0.27, 0.62) |
| Example 8-5 | A-46 | H-4 | 14.4 | 5.1 | 44 | (0.16, 0.24) | (0.23, 0.32) |
| Example 8-6 | A-47 | H-4 | 13.8 | 6.0 | 133 | (0.39, 0.58) | (0.40, 0.57) |
| Example 8-7 | A-49 | H-4 | 13.4 | 6.4 | 93 | (0.31, 0.63) | (0.32, 0.62) |
| Comparative Example 8-8 | C-16 | H-4 | 13.0 | 6.3 | 104 | (0.29, 0.61) | (0.33, 0.62) |
| Comparative Example 8-9 | C-17 | H-4 | 14.2 | 4.9 | 67 | (0.17, 0.30) | (0.23, 0.36) |
| Comparative Example 8-10 | C-18 | H-4 | 14.0 | 5.9 | 65 | (0.19, 0.30) | (0.22, 0.35) |

It is seen that in Examples 8-1 to 8-7, a compound represented by formula (1) is used as the light emitting material and therefore, the device exhibits a long half-luminance time and is excellent in terms of durability as compared with Comparative Examples 8-1 to 8-10. Also, the chromaticity shift is less caused at the device deterioration.

Example 9

Example 9-1

A-6

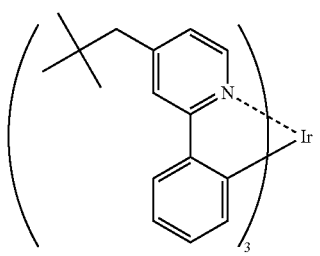

A-25

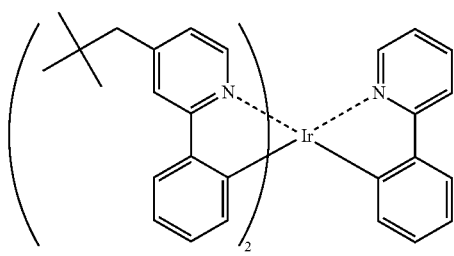

A-26

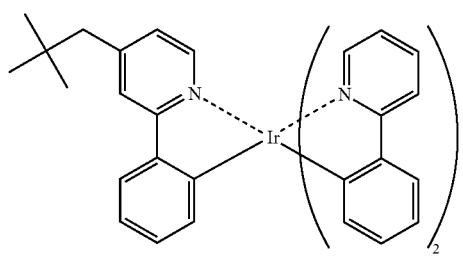

A-27

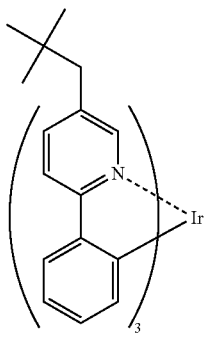

A-28

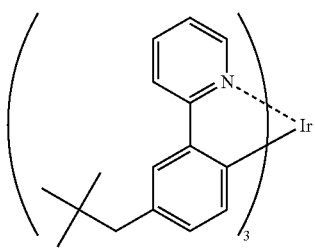

A-29

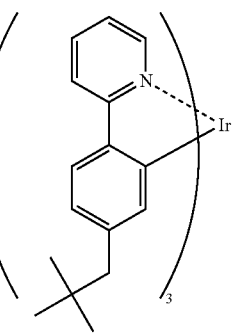

-continued

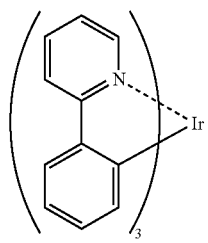
B-6

The organic EL device of Example 9-1 was produced in the same manner as in Example 1-1 except that in Example 1-1, the film of the third layer (light emitting layer) was deposited (film thickness: 50 nm) by changing the compositional ratio to H-1 and A-6 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-6 was obtained.

Examples 9-2 to 9-6 and Comparative Example 9-1

The devices of Examples 9-2 to 9-6 and Comparative Example 9-1 were produced in the same manner as in Example 9-1 except for changing the materials used in Example 9-1 to the materials shown in Table 9. A DC voltage was applied to the organic EL device to produce luminescence by using Source Measure Unit Model 2400 manufactured by Toyo Corp., as a result, luminescence derived from respective light emitting materials was obtained.

TABLE 9

|  | Light Emitting Layer | | Drive Voltage at 100 cd/m² (V) | External Quantum Efficiency at 100 cd/m² (%) | Half-Luminance Time at 1000 cd/m² (relative value) | Initial Chromaticity | Chromaticity after Decrease to Half Luminance |
| --- | --- | --- | --- | --- | --- | --- | --- |
|  | Light Emitting Material | Host Material |  |  |  |  |  |
| Comparative Example 9-1 | B-6 | H-1 | 8.1 | 13.3 | 100 | (0.29, 0.64) | (0.32, 0.60) |
| Example 9-1 | A-6 | H-1 | 7.7 | 13.9 | 122 | (0.28, 0.65) | (0.29, 0.64) |
| Example 9-2 | A-25 | H-1 | 7.8 | 13.8 | 120 | (0.29, 0.64) | (0.30, 0.63) |
| Example 9-3 | A-26 | H-1 | 8.0 | 13.3 | 108 | (0.29, 0.64) | (0.31, 0.62) |
| Example 9-4 | A-27 | H-1 | 7.8 | 13.5 | 67 | (0.30, 0.62) | (0.31, 0.63) |
| Example 9-5 | A-28 | H-1 | 7.9 | 13.7 | 119 | (0.31, 0.63) | (0.31, 0.62) |
| Example 9-6 | A-29 | H-1 | 7.7 | 13.8 | 116 | (0.29, 0.64) | (0.30, 0.63) |

It is seen that in Examples 9-1 to 9-6, a compound represented by formula (1) is used as the light emitting material and therefore, although the degree of effect differs according to the number of partial structures and the substitution position, the device exhibits a long half-luminance time and is excellent in terms of durability as compared with Comparative Example 9-1. Also, the chromaticity shift is less caused at the device deterioration.

Example 10

Example 10-1

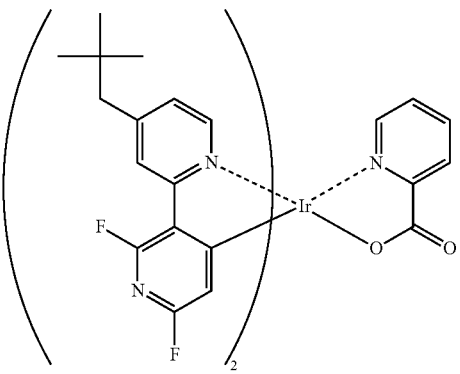
A-14

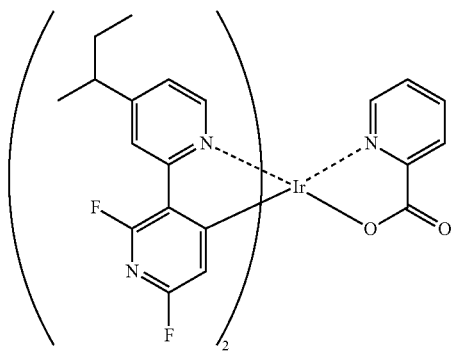
A-31

-continued

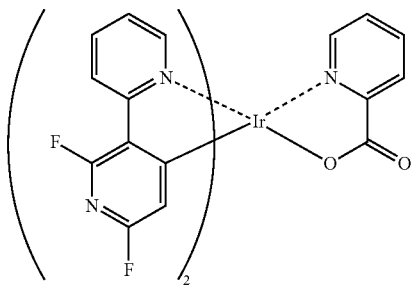
B-14

-continued

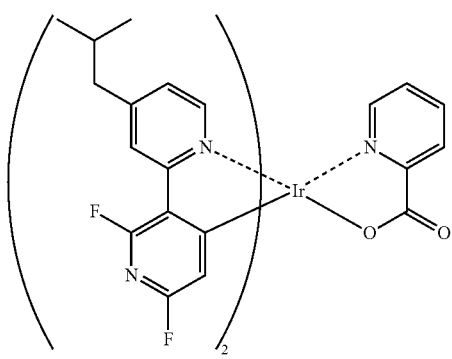

C-14

The organic EL device of Example 10-1 was produced in the same manner as in Example 1-1 except that in Example 1-1, the film of the third layer (light emitting layer) was deposited (film thickness: 50 nm) by changing the compositional ratio to H-2 and A-14 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-14 was obtained.

Example 10-2 and Comparative Examples 10-1 to 10-3

The devices of Example 10-2 and Comparative Examples 10-1 to 10-3 were produced in the same manner as in Example 10-1 except for changing the materials used in Example 10-1 to the materials shown in Table 10. A DC voltage was applied to the organic EL device to produce luminescence by using Source Measure Unit Model 2400 manufactured by Toyo Corp., as a result, luminescence derived from respective light emitting materials was obtained.

It is seen that in Examples 10-1 and 10-2, a compound represented by formula (1) is used as the light emitting material and therefore, although the degree of effect differs according to the number of partial structures and the substitution position, the device exhibits a long half-luminance time and is excellent in terms of durability as compared with Comparative Examples 10-1 and 10-3. Also, the chromaticity shift is less caused at the device deterioration.

Example 11

Example 11-1

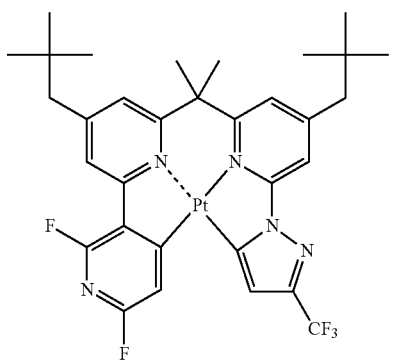

A-17

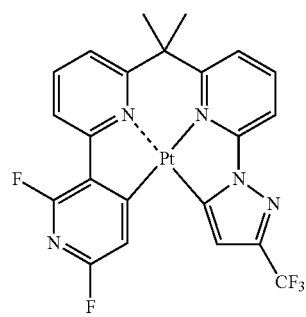

B-17

TABLE 10

| | Light Emitting Layer | | Drive | External Quantum | Half-Luminance | | Chromaticity |
| | Light Emitting Material | Host Material | Voltage at 100 cd/m² (V) | Efficiency at 100 cd/m² (%) | Time at 1000 cd/m² (relative value) | Initial Chromaticity | after Decrease to Half Luminance |
| --- | --- | --- | --- | --- | --- | --- | --- |
| Comparative Example 10-1 | B-14 | H-2 | 8.3 | 9.5 | 100 | (0.17, 0.22) | (0.21, 0.30) |
| Comparative Example 10-2 | C-14 | H-2 | 8.1 | 9.4 | 113 | (0.17, 0.23) | (0.21, 0.29) |
| Example 10-1 | A-14 | H-2 | 7.8 | 9.9 | 145 | (0.17, 0.23) | (0.18, 0.25) |
| Example 10-2 | A-30 | H-2 | 7.8 | 9.8 | 138 | (0.17, 0.22) | (0.19, 0.24) |
| Comparative Example 10-3 | A-31 | H-2 | 8.0 | 9.7 | 121 | (0.17, 0.23) | (0.19, 0.26) |

-continued

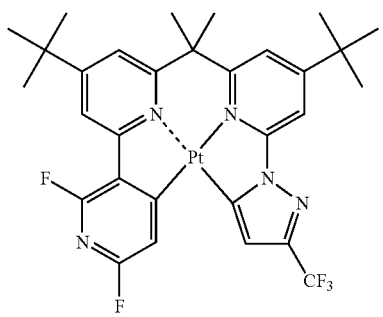
B-25

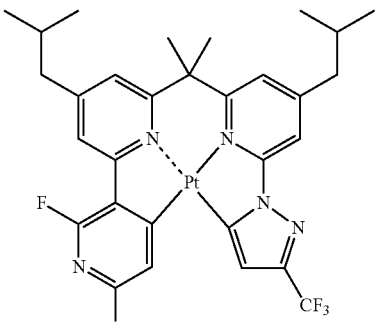
C-17

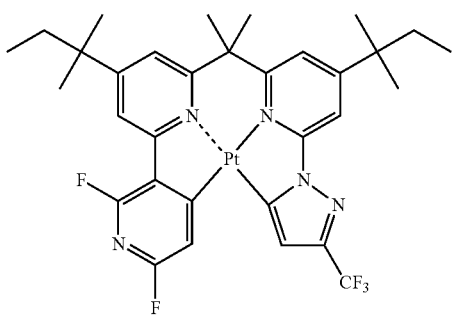
B-26

The organic EL device of Example 11-1 was produced in the same manner as in Example 1-1 except that in Example 1-1, the film of the third layer (light emitting layer) was deposited (film thickness: 50 nm) by changing the compositional ratio to H-3 and A-17 of 93:7 (by mass) from H-1 and A-1 of 95:5 (by mass). A DC voltage was applied to the organic EL device to produce luminescence by using Source Measure Unit Model 2400 manufactured by Toyo Corp., as a result, luminescence derived from A-17 was obtained.

Comparative Examples 11-1 to 11-4

The devices of Comparative Examples 11-1 to 11-4 were produced in the same manner as in Example 11-1 except for changing the materials used in Example 11-1 to the materials shown in Table 11. A DC voltage was applied to the organic EL device to produce luminescence by using Source Measure Unit Model 2400 manufactured by Toyo Corp., as a result, luminescence derived from respective light emitting materials was obtained.

TABLE 11

| | Light Emitting Layer | | Drive | External Quantum | Half-Luminance | | Chromaticity |
|---|---|---|---|---|---|---|---|
| | Light Emitting Material | Host Material | Voltage at 100 cd/m$^2$ (V) | Efficiency at 100 cd/m$^2$ (%) | Time at 1000 cd/m$^2$ (relative value) | Initial Chromaticity | after Decrease to Half Luminance |
| Comparative Example 11-1 | B-17 | H-3 | 9.8 | 7.9 | 100 | (0.17, 0.29) | (0.24, 0.35) |
| Example 11-1 | A-17 | H-3 | 8.8 | 7.8 | 124 | (0.16, 0.28) | (0.20, 0.33) |
| Comparative Example 11-2 | B-25 | H-3 | 10.7 | 6.9 | 121 | (0.16, 0.28) | (0.20, 0.32) |
| Comparative Example 11-3 | B-26 | H-3 | 10.8 | 7.0 | 111 | (0.16, 0.29) | (0.21, 0.33) |
| Comparative Example 11-4 | C-17 | H-3 | 9.4 | 7.9 | 108 | (0.17, 0.29) | (0.23, 0.34) |

It is seen that in Example 11-1, a compound represented by formula (1) is used as the light emitting material and therefore, the device exhibits a long half-luminance time and is excellent in terms of durability as compared with Comparative Examples 11-1 and 11-4. Also, the chromaticity shift is less caused at the device deterioration. In Comparative Examples 11-2 and 11-3, high durability and little chromaticity shift are obtained, but the device disadvantageously suffers from high drive voltage and low efficiency.

While the present invention has been shown and described with reference to certain exemplary embodiments thereof, it will be understood by those skilled in the art that various changes modifications may be made therein without departing from the spirit and scope of the present invention as defined by the appended claims.

What is claimed is:

1. A compound selected from the group consisting of:

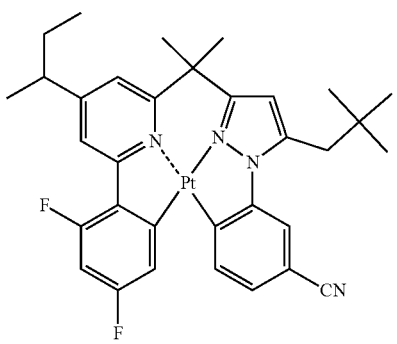

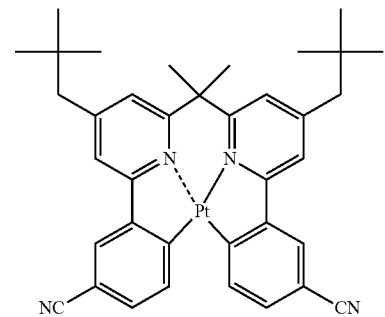

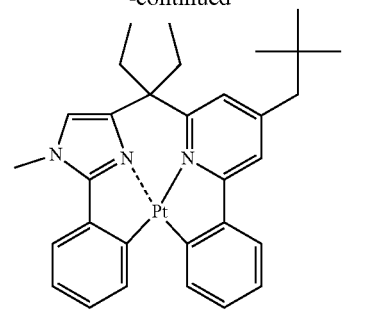

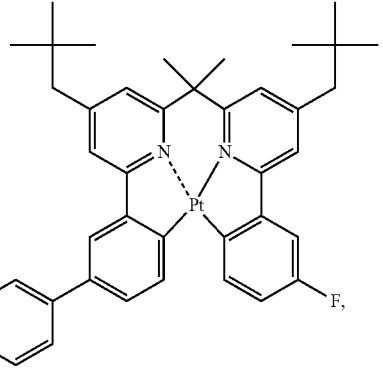

and

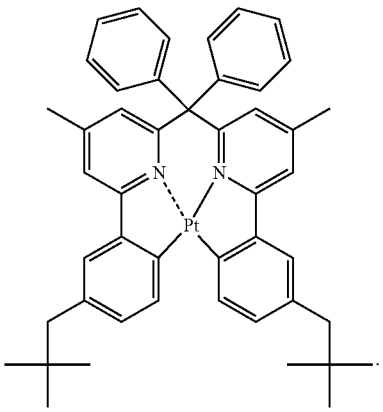

2. A material comprising the compound of claim 1.

3. An organic electroluminescence device comprising a substrate; a pair of electrodes on the substrate; and at least one organic layer containing a light emitting layer between the electrodes, wherein the organic layer comprises a compound of claim 1.

* * * * *